(12) United States Patent
Tsubuku et al.

(10) Patent No.: US 9,825,181 B2
(45) Date of Patent: Nov. 21, 2017

(54) TRANSISTOR, CIRCUIT, SEMICONDUCTOR DEVICE, DISPLAY DEVICE, AND ELECTRONIC DEVICE

(71) Applicant: Semiconductor Energy Laboratory Co., Ltd., Kanagawa-ken (JP)

(72) Inventors: Masashi Tsubuku, Saitama (JP);
Kazuya Sugimoto, Kanagawa (JP);
Tsutomu Murakawa, Kanagawa (JP);
Motoki Nakashima, Kanagawa (JP);
Shinpei Matsuda, Kanagawa (JP);
Noritaka Ishihara, Kanagawa (JP);
Daisuke Kurosaki, Tochigi (JP);
Toshimitsu Obonai, Tochigi (JP);
Hiroshi Kanemura, Tochigi (JP);
Junichi Koezuka, Tochigi (JP)

(73) Assignee: Semiconductor Energy Laboratory Co., Ltd. (JP)

( * ) Notice: Subject to any disclaimer, the term of this patent is extended or adjusted under 35 U.S.C. 154(b) by 0 days.

(21) Appl. No.: 15/374,356

(22) Filed: Dec. 9, 2016

(65) Prior Publication Data

US 2017/0170326 A1 Jun. 15, 2017

(30) Foreign Application Priority Data

Dec. 11, 2015 (JP) ................................ 2015-242567
May 20, 2016 (JP) ................................ 2016-101521
Aug. 19, 2016 (JP) ................................ 2016-161264

(51) Int. Cl.
*H01L 29/22* (2006.01)
*H01L 29/786* (2006.01)
(Continued)

(52) U.S. Cl.
CPC ...... *H01L 29/7869* (2013.01); *H01L 27/1052* (2013.01); *H01L 29/24* (2013.01);
(Continued)

(58) Field of Classification Search
CPC .......... H01L 29/7869; H01L 29/78696; H01L 21/02565; H01L 29/42384; H01L 29/41733; H01L 29/4908
See application file for complete search history.

(56) References Cited

U.S. PATENT DOCUMENTS 5,731,856 A 3/1998 Kim et al.
5,744,864 A 4/1998 Cillessen et al.
(Continued)

FOREIGN PATENT DOCUMENTS

EP 1 737 044 A1 12/2006
EP 2 226 847 A2 9/2010
(Continued)

OTHER PUBLICATIONS

Devynck, F. et al., "Charge Transition Levels of Carbon-, Oxygen-, and Hydrogen-Related Defects at the SiC/SiO2 Interface Through Hybrid Functionals, " Physical Review B, vol. 84, p. 235320-1-235320-18, 2011.

(Continued)

*Primary Examiner* — Roy Potter
(74) *Attorney, Agent, or Firm* — Husch Blackwell LLP

(57) ABSTRACT

A transistor in which a change in characteristics is small is provided. A circuit, a semiconductor device, a display device, or an electronic device in which a change in characteristics of the transistor is small is provided. The transistor includes an oxide semiconductor; a channel region is formed in the oxide semiconductor; the channel region contains indium, an element M, and zinc; the element M is one or more selected from aluminum, gallium, yttrium, tin, boron, silicon, titanium, iron, nickel, germanium, zirconium, molybdenum, lanthanum, cerium, neodymium, hafnium, tantalum, tungsten, and magnesium; a gate insulator contains silicon and oxygen whose atomic number is 1.5 times or more as large as the atomic number of silicon; the carrier (Continued)

density of the channel region is higher than or equal to $1 \times 10^9$ cm$^{-3}$ and lower than or equal to $5 \times 10^{16}$ cm$^{-3}$; and the energy gap of the channel region is higher than or equal to 2.7 eV and lower than or equal to 3.1 eV.

24 Claims, 58 Drawing Sheets

(51) Int. Cl.
  *H01L 29/24*    (2006.01)
  *H01L 29/423*   (2006.01)
  *H03K 17/687*   (2006.01)
  *H01L 27/105*   (2006.01)
  *G09G 3/20*    (2006.01)

(52) U.S. Cl.
  CPC .. *H01L 29/42364* (2013.01); *H01L 29/42384* (2013.01); *H01L 29/78696* (2013.01); *H03K 17/687* (2013.01); *G09G 3/2092* (2013.01)

(56) References Cited

U.S. PATENT DOCUMENTS

| | | | |
|---|---|---|---|
| 6,294,274 B1 | 9/2001 | Kawazoe et al. | |
| 6,563,174 B2 | 5/2003 | Kawasaki et al. | |
| 6,727,522 B1 | 4/2004 | Kawasaki et al. | |
| 7,049,190 B2 | 5/2006 | Takeda et al. | |
| 7,061,014 B2 | 6/2006 | Hosono et al. | |
| 7,064,346 B2 | 6/2006 | Kawasaki et al. | |
| 7,105,868 B2 | 9/2006 | Nause et al. | |
| 7,211,825 B2 | 5/2007 | Shih et al | |
| 7,282,782 B2 | 10/2007 | Hoffman et al. | |
| 7,297,977 B2 | 11/2007 | Hoffman et al. | |
| 7,323,356 B2 | 1/2008 | Hosono et al. | |
| 7,385,224 B2 | 6/2008 | Ishii et al. | |
| 7,402,506 B2 | 7/2008 | Levy et al. | |
| 7,411,209 B2 | 8/2008 | Endo et al. | |
| 7,453,065 B2 | 11/2008 | Saito et al. | |
| 7,453,087 B2 | 11/2008 | Iwasaki | |
| 7,462,862 B2 | 12/2008 | Hoffman et al. | |
| 7,468,304 B2 | 12/2008 | Kaji et al. | |
| 7,501,293 B2 | 3/2009 | Ito et al. | |
| 7,674,650 B2 | 3/2010 | Akimoto et al. | |
| 7,732,819 B2 | 6/2010 | Akimoto et al. | |
| 8,344,374 B2 * | 1/2013 | Yamazaki | H01L 27/1214 257/43 |
| 8,471,256 B2 * | 6/2013 | Yamazaki | H01L 27/1225 257/59 |
| 8,547,771 B2 | 10/2013 | Koyama | |
| 8,878,174 B2 * | 11/2014 | Sakata | G11C 11/40 257/43 |
| 8,995,174 B2 | 3/2015 | Koyama | |
| 9,035,301 B2 * | 5/2015 | Takahashi | H01L 27/14663 257/43 |
| 2001/0046027 A1 | 11/2001 | Tai et al. | |
| 2002/0056838 A1 | 5/2002 | Ogawa | |
| 2002/0132454 A1 | 9/2002 | Ohtsu et al. | |
| 2003/0189401 A1 | 10/2003 | Kido et al. | |
| 2003/0218222 A1 | 11/2003 | Wager, III et al. | |
| 2004/0038446 A1 | 2/2004 | Takeda et al. | |
| 2004/0127038 A1 | 7/2004 | Carcia et al. | |
| 2005/0017302 A1 | 1/2005 | Hoffman | |
| 2005/0199959 A1 | 9/2005 | Chiang et al. | |
| 2006/0035452 A1 | 2/2006 | Carcia et al. | |
| 2006/0043377 A1 | 3/2006 | Hoffman et al. | |
| 2006/0091793 A1 | 5/2006 | Baude et al. | |
| 2006/0108529 A1 | 5/2006 | Saito et al. | |
| 2006/0108636 A1 | 5/2006 | Sano et al. | |
| 2006/0110867 A1 | 5/2006 | Yabuta et al. | |
| 2006/0113536 A1 | 6/2006 | Kumomi et al. | |
| 2006/0113539 A1 | 6/2006 | Sano et al. | |
| 2006/0113549 A1 | 6/2006 | Den et al. | |
| 2006/0113565 A1 | 6/2006 | Abe et al. | |
| 2006/0169973 A1 | 8/2006 | Isa et al. | |
| 2006/0170111 A1 | 8/2006 | Isa et al. | |
| 2006/0197092 A1 | 9/2006 | Hoffman et al. | |
| 2006/0208977 A1 | 9/2006 | Kimura | |
| 2006/0228974 A1 | 10/2006 | Thelss et al. | |
| 2006/0231882 A1 | 10/2006 | Kim et al. | |
| 2006/0238135 A1 | 10/2006 | Kimura | |
| 2006/0244107 A1 | 11/2006 | Sugihara et al. | |
| 2006/0284171 A1 | 12/2006 | Levy et al. | |
| 2006/0284172 A1 | 12/2006 | Ishii | |
| 2006/0292777 A1 | 12/2006 | Dunbar | |
| 2007/0024187 A1 | 2/2007 | Shin et al. | |
| 2007/0046191 A1 | 3/2007 | Saito | |
| 2007/0052025 A1 | 3/2007 | Yabuta | |
| 2007/0054507 A1 | 3/2007 | Kaji et al. | |
| 2007/0090365 A1 | 4/2007 | Hayashi et al. | |
| 2007/0108446 A1 | 5/2007 | Akimoto | |
| 2007/0152217 A1 | 7/2007 | Lai et al. | |
| 2007/0172591 A1 | 7/2007 | Seo et al. | |
| 2007/0187678 A1 | 8/2007 | Hirao et al. | |
| 2007/0187760 A1 | 8/2007 | Furuta et al. | |
| 2007/0194379 A1 | 8/2007 | Hosono et al. | |
| 2007/0252928 A1 | 11/2007 | Ito et al. | |
| 2007/0272922 A1 | 11/2007 | Kim et al. | |
| 2007/0287296 A1 | 12/2007 | Chang | |
| 2008/0006877 A1 | 1/2008 | Mardilovich et al. | |
| 2008/0038882 A1 | 2/2008 | Takechi et al. | |
| 2008/0038929 A1 | 2/2008 | Chang | |
| 2008/0050595 A1 | 2/2008 | Nakagawara et al. | |
| 2008/0073653 A1 | 3/2008 | Iwasaki | |
| 2008/0083950 A1 | 4/2008 | Pan et al. | |
| 2008/0106191 A1 | 5/2008 | Kawase | |
| 2008/0128689 A1 | 6/2008 | Lee et al. | |
| 2008/0129195 A1 | 6/2008 | Ishizaki et al. | |
| 2008/0166834 A1 | 7/2008 | Kim et al. | |
| 2008/0182358 A1 | 7/2008 | Cowdery-Corvan et al. | |
| 2008/0224133 A1 | 9/2008 | Park et al. | |
| 2008/0254569 A1 | 10/2008 | Hoffman et al. | |
| 2008/0258139 A1 | 10/2008 | Ito et al. | |
| 2008/0258140 A1 | 10/2008 | Lee et al. | |
| 2008/0258141 A1 | 10/2008 | Park et al. | |
| 2008/0258143 A1 | 10/2008 | Kim et al. | |
| 2008/0296568 A1 | 12/2008 | Ryu et al. | |
| 2009/0068773 A1 | 3/2009 | Lai et al. | |
| 2009/0073325 A1 | 3/2009 | Kuwabara et al. | |
| 2009/0114910 A1 | 5/2009 | Chang | |
| 2009/0134399 A1 | 5/2009 | Sakakura et al. | |
| 2009/0152506 A1 | 6/2009 | Umeda et al. | |
| 2009/0152541 A1 | 6/2009 | Maekawa et al. | |
| 2009/0278122 A1 | 11/2009 | Hosono et al. | |
| 2009/0280600 A1 | 11/2009 | Hosono et al. | |
| 2010/0065844 A1 | 3/2010 | Tokunaga | |
| 2010/0092800 A1 | 4/2010 | Itagaki et al. | |
| 2010/0109002 A1 | 5/2010 | Itagaki et al. | |
| 2015/0280691 A1 | 10/2015 | Koyama | |
| 2017/0170325 A1 | 6/2017 | Koezuka et al. | |

FOREIGN PATENT DOCUMENTS

| | | |
|---|---|---|
| JP | 60-198861 A | 10/1985 |
| JP | 63-210022 A | 8/1988 |
| JP | 63-210023 A | 8/1988 |
| JP | 63-210024 A | 8/1988 |
| JP | 63-215519 A | 9/1988 |
| JP | 63-239117 A | 10/1988 |
| JP | 63-265818 A | 11/1988 |
| JP | 05-251705 A | 9/1993 |
| JP | 08-264794 A | 10/1996 |
| JP | 11-505377 | 5/1999 |
| JP | 2000-044236 A | 2/2000 |
| JP | 2000-150900 A | 5/2000 |
| JP | 2002-076356 A | 3/2002 |
| JP | 2002-289859 A | 10/2002 |
| JP | 2003-086000 A | 3/2003 |
| JP | 2003-086808 A | 3/2003 |
| JP | 2004-103957 A | 4/2004 |
| JP | 2004-273614 A | 9/2004 |

(56) References Cited

FOREIGN PATENT DOCUMENTS

| | | |
|---|---|---|
| JP | 2004-273732 A | 9/2004 |
| JP | 2012-257187 | 12/2012 |
| WO | WO 2004/114391 A1 | 12/2004 |

OTHER PUBLICATIONS

Munekuni, S. et al., "Various Types of Nonbridging Oxygen Hole Center in High-Purity Silica Glass," Journal of Applied Physics, vol. 68, No. 3, pp. 1212-1217, 1990.

Douglas, E.A. et al., "Measurement of $SiO_2/InZnGaO_4$ Heterojunction Band Offsets by X-Ray Photoelectron Spectroscopy," Applied Physics Letters, vol. 98, p. 242110-1-242110-3, 2011.

Alam, M.A. et al., "A Comprehensive Model of PMOS NBTI Degradation," Microelectronics Reliability, vol. 45, pp. 71-81, 2005.

Saito, N. et al., "Amorphous In—Ga—Zn-Oxide TFTs with High Stability against Bias Temperature Stress," IDW '10, Proceedings of the 17th International Display Workshops, pp. 1855-1858.

Douglas, E.A. et al., "Measurement of $SiO_2/InZnGaO_4$ Heterojunction Band Offsets by X-Ray Photoelectron Spectroscopy," Applied Physics Letters, vol. 98, No. 24, p. 242110-1-242110-3, 2011.

Alam, M.A. et al., "A Comprehensive Model of PMOS NBTI Degradation," Microelectronics Reliablity, vol. 45, No. 1, pp. 71-81, 2005.

Asakuma, N. et al., "Crystallization and Reduction of SOL-Gel-Derived Zinc Oxide Films by Iradiation With Ultraviolet Lamp," Jounal of SOL-Gel Science and Technology, 2003, vol. 26, pp. 181-184.

Asaoka, Y. et al., "29.1: Polarizer-Free Reflective LCD Combined With Ultra Low-Power Driving Technology," SID Digest '09; SID International Symposium Digest of Technical Papers, May 31, 2009, pp. 395-398.

Chern, H.N. et al., "An Analytical Model for the Above-Threshold Characteristics of Polysilicon Thin-Film Transistors," IEEE Transactions on Electron Devices, Jul. 1, 1995, vol. 1995, vol. 42, No. 7, 1240-1246.

Cho, D-H. et al., "21.2:Al and Sn-Doped Zinc Indium Oxide Thin Film Transistors for AMOLED Back-Plane," SID DIGEST '09: SID International Symposium Digest of Technical Papers, May 31, 2009, pp. 280-283.

Clark, S.J. et al., "First Principles Methods Using CASTEP," Zeitschrift fur Kristallographie, 2005, vol. 220, pp. 567-570.

Coates, D. et al., "Optical Studies of the Amorphous Liquid-Cholesteric Liquid Crystal Transition: The Blue Phase," Physics Letters, Sep. 10, 1973, vol. 45A No. 2, pp. 115-116.

Costello, M.J. et al., "Electron Microscopy of a Cholesteric Liquid Crystal and its Blue Phase," Physical Review. A, May 1, 1984, vol. 29, No. 5, pp. 2957-2959.

Dembo, H. et al., "RFCPUS on Glass and Plastic Substrates Fabricated by TFT Transfer Technology," IEDM 05: Technical Digest of International Electron Devices Meeting, Dec. 5, 2005, pp. 1067-1069.

Fortunato, E.M.C. et al., "Wide-Bandgap High-Mobility ZnO Thin-Film Transistors Produced at Room Temperature," Applied Physics Letters, Sep. 27, 2004, vol. 85, No. 13, pp. 2541-2543

Fung, T.C. et al., "2-D Numerical Simulation of High Performance Amorphous In—Ga—Zn—O TFTs for Flat Panel Displays," AM-FPD '08 Digest of Technical Papers, Jul. 2, 2008, pp. 251-252, The Japan Society of Applied Physics.

Godo, H. et al., "P-9: Numerical Analysis on Temperature Dependence of Characteristics of Amorphous In—Ga—Zn-Oxide TFT," SID Digest '09: SID International Symposium Digest of Technical Papers, May 31, 2009, pp. 1110-1112.

Godo, H. et al., "Temperature Dependence of Characteristics and Electronic Structure for Amorphous In—Ga—Zn-Oxide TFT," AM-FPD '09 Digest of Technical Papers, Jul. 1, 2009, pp. 41-44.

Hayashi, R. et al., "42.1: Invited Paper: Improved Amorphous In—Ga—Zn—O TFTs," SID Digest '08: SID International Symposium Digest of Technical Papers, May 20, 2008, vol. 39, pp. 621-624.

Hirao, T. et al., "Novel Top-Gate Zinc Oxide Thin-Film Transistors (ZnO TFTs) for AMLCDs," Journal of the Society for Information Display, 2007, vol. 15, No. 1, pp. 17-22.

Hosono, H. et al., "Working Hypothesis to Explore Novel Wide Band Gap Electrically Conducting Amorphous Oxides and Examples," Journal of Non-Crystalline Solids, 1996, vol. 198-200, pp. 165-169.

Hosono, H., "68.3: Invited Paper:Transparent Amorphous Oxide Semiconductors for High Performance TFT," SID Digest '07: SID International Symposium Digest of Technical Papers, 2007, vol. 38, pp. 1830-1833.

Hsieh, H-H. et al., "P-29: Modeling of Amorphous Oxide Semiconductor Thin Film Transistors and Subgap Density of States," SID Digest '08: SID International Symposium Digest of Technical Papers, May 20, 2008, vol. 39, pp. 1277-1280.

Ikeda, T. et al., "Full-Functional System Liquid Crystal Display Using CG-Silicon Technology," SID Digest '04: SID International Symposium Digest of Technical Papers, 2004, vol. 35, pp. 860-863.

Janotti, A. et al., "Native Point Defects in ZnO," Physical Review. B, Oct. 4, 2007, vol. 76, No. 16, pp. 165202-1-165202-22.

Janotti, a. et al., "Oxygen Vacancies in ZnO," Applied Physics Letters, 2005, vol. 87, pp, 122102-1-122102-3.

Jin, D-U. et al., "65.2: Distinguished Paper:World-Largest (6.5") Flexible Full Color Top Emission AMOLED Display on Plastic Film and its Bending Properties," SID Digest '09: SID International Symposium Digest of Technical Papers, May 31, 2009, pp. 983-985.

Kanno, H. et al., "White Stacked Electrophosphorecent Organic Light-Emitting Devices Employing MOO3 as a Charge-Generation Layer," Advanced Materials, 2006, vol. 18, No. 3, pp. 339-342.

Kikuchi, H. et al., "39.1: Invited Paper:Optically Isotropic Nano-Structured Liquid Crystal Composites for Display Applications," SID Digest '09: SID International Symposium Digest of Technical Papers, May 31, 2009, pp. 578-581.

Kikuchi, H. et al., "62.2: Invited Paper:Fast Electro-Optical Switching in Polymer-Stabilized Liquid Crystalline Blue Phases for Display Application," SID Digest '07: SID International Symposium Digest of Technical Papers, 2007, vol. 38, pp. 1737-1740.

Kikuchi, H. et al., "Polymer-Stabilized Liquid Crystal Blue Phases," Nature Materials, Sep. 2, 2002, vol. 1, pp. 64-68.

Kim, S. et al., "High-Performance Oxide Thin Film Transistors Passivated by Various Gas Plasmas," 214th ECS Meeting, 2008, No. 2317, ECS.

Kimizuka, N. et al., "Spinel,YbFe2O4, and Yb2Fe3O7 Types of Structures for Compounds in the In2O3 and Sc2O3—A2O3—BO Systems [A; Fe, Ga, Or Al; B: Mg, Mn, Fe, Nl, Vu, Or Zn] at Temperatures over 1000° C.," Journal of Solid State Chemistry, 1985, vol. 60, pp. 382-384

Kimizuka, N. et al., "Syntheses and Single-Crystal Data of Homologous Compounds, In2O3(ZnO)m (m=3, 4, and 5), InGaO3(ZnO)3, and Ga2O3 (ZnO)m (m=7, 8, 9, and 16) in the In2O3—ZnGa2O4—ZnO System," Journal of Solid State Chemistry, Apr. 1, 1995, vol. 116, No. 1, pp. 170-178.

Kitzerow, H-S. et al., "Observation of Blue Phases in Chiral Networks," Liquid Crystals, 1993, vol. 14, No. 3, pp. 911-916.

Kurokawa, Y. et al., "UHF RFCPUS on Flexible and Glass Substrates for Secure RFID Systems," Journal of Solid-State Circuits , 2008, vol. 43, No. 1, pp. 292-299.

Lany, S. et al., "Dopability, Intrinsic Conductivity, and Nonstoichiometry of Transparent Conducting Oxides," Physical Review Letters, Jan. 26, 2007, vol. 98, pp. 045501-1045501-4.

Lee, H.N. et al., "Current Status of, Challenges to, and Perspective View of AM-OLED,"IDW '06: Proceedings of the 13th International Display Workshops, Dec. 7, 2006, pp. 663-666.

Lee, J-H. et al., "World's Largest (15-Inch) XGA AMLCD Panel Using IGZO Oxide TFT," SID Digest '08: SID International Symposium Digest of Technical Papers, May 20, 2008, vol. 39, pp. 624-628.

(56) References Cited

OTHER PUBLICATIONS

Lee, M-H. et al., "15.4: Excellent Performance of Indium-Oxide-Based Thin-Film Transistors by DC Sputtering," SID Digest '09: SID International Symposium Digest of Technical Papers, May 31, 2009, pp. 191-193.

Li, C. et al., "Modulated Structures of Homologous Compounds InMO3(ZnO)m (M=In,Ga; m=Integer) Described by Four-Dimensional Superspace Group," Journal of Solid State Chemistry, 1998, vol. 139, pp. 347-355.

Masuda, S. et al., "Transparent Thin Film Transistors Using ZnO as an Active Channel Layer and Their Electrical Properties," Journal of Applied Physics, Feb. 1, 2003, vol. 93, No. 3, pp. 1624-1630.

Meiboom, S. et al., "Theory of the Blue Phase of Cholesteric Liquid Crystals," Physical Review Letters, May 4, 1981, vol. 46, No. 18, pp. 1216-1219.

Miyasaka, M., "SUFTLA Flexible Microelectronics on Their Way to Business," SID Digest '07: SID International Symposium Digest of Technical Papers, 2007, vol. 38, pp. 1673-1676.

Mo, Y-G. et al., "Amorphous Oxide TFT Backplanes for Large Size AMOLED Displays," IDW '08: Proceedings of the 6th International Display Workshops, Dec. 3, 2008, pp. 581-584.

Nakamura, M. et al., "The Phase Relations in the In2O3—Ga2ZnO4—ZnO System at 1350° C.," Journal of Solid State Chemistry, Aug. 1, 1991, vol. 93, No. 2, pp. 298-315.

Nakamura, M., "Synthesis of Homologous Compound with New Long-Period Structure," NIRIM Newsletter, Mar. 1, 1995, vol. 150, 1-4.

Nomura, K. et al., "Amorphous Oxide Semiconductors for High-Performance Flexible Thin-Film Transistors," Japanese Journal of Applied Physics, 2006, vol. 45, No. 5B, pp. 4303-4308.

Nomura, K. et al., "Carrier Transport in Transparent Oxide Semiconductor with Intrinsic Structural Randomness Probed Using Single-Crystalline InGaO3(ZnO)5 Films," Applied Physics Letters, Sep. 13, 2004, vol. 85, No. 11, pp. 1993-1995.

Nomura, K. et al., "Room-Temperature Fabrication of Transparent Flexible Thin-Film Transistors Using Amorphous Oxide Semiconductors," Nature, Nov. 25, 2004, vol. 432, pp. 488-492.

Nomura, K. et al., "Thin-Film Transistor Fabricated in Single-Crystalline Transparent Oxide Semiconductor," Science, May 23, 2003, vol. 300, No. 5623, pp. 1269-1272.

Nowatari, H. et al., "60.2: Intermediate Connector With Suppressed Voltage Loss for White Tandem OLEDs," SID Digest '09: SID International Symposium Digest of Technical Papers, May 31, 2009, vol. 40, pp. 899-902.

Oba, F. et al., "Defect Energetics in ZnO: A Hybrid Hartree-Fock Density Functional Study," Physical Review. B, 2008, vol. 77, pp. 245202-1245202-6.

Oh, M.S. et al., "Improving the Gate Stability of ZnO Thin-Film Transistors With Aluminum Oxide Dielectric Layers," Journal of the Electrochemical Society, 2008, vol. 155, No. 12, pp. H1009-H1014.

Ohara, H. et al., "21.3: 4.0 In. QVGA AMOLED Display Using In—Ga—Zn—Oxide TFTs With a Novel Passivation Layer," SID Digest '09: SID International Symposium Digest of Technical Papers, May 31, 2009, pp. 284-287.

Ohara, H. et al., "Amorphous In—Ga—Zn-Oxide TFTs with Suppressed Variation for 4.0 inch QVGA AMOLED Dispay," AM-FPD '09 Digest of Technical Papers, Jul. 1, 2009, pp. 227-230, The Japan Society of Applied Physics.

Orita, M. et al., "Amorphous Transparent Conductive Oxide InGaO3(ZnO)m (m<4):a Zn4s Conductor," Philosophical Magazine, 2001, vol. 81, No. 5, pp. 501-515.

Orita, M. et al., "Mechanism of Electrical Conductivity of Transparent InGaZnO4," Physical Review. B, Jan. 15, 2000, vol. 61, No. 3, pp. 1811-1816.

Osada, T. et al., "15.2: Development of Driver-Integrated Panel using Amorphous In—Ga—Zn-Oxide TFT," SID Digest '09: SID International Symposium Digest of Technical Papers, May 31, 2009, pp. 184-187.

Osada, T. et al., "Development of Driver-Integrated Panel Using Amorphous In—Ga—Zn-Oxide TFT," AM-FPD '09 Digest of Technical Papers, Jul. 1, 2009, pp. 33-36.

Park, J-S. et al., "Amorphous Indium-Gallium-Zinc Oxide TFTs and Their Application for Large Size AMOLED," AM-FPD '08 Digest of Technical Papers, Jul. 2, 2008, pp. 275- 278.

Park, J.S. et al., "Dry Etching of ZnO Films and Plasma-Induced Damage to Optical Properties," Journal of Vacuum Science & Technology B, Mar. 1, 2003, vol. 21, No. 2, pp. 800-803.

Park, J-S. et al., "Electronic Transport Properties of Amorphous Indium-Gallium-Zinc Oxide Semiconductor Upon Exposure to Water," Applied Physics Letters, 2008, vol. 92, pp. 072104-1-072104-3.

Park, J.C. et al., "High Performance Amorphous Oxide Thin Film Transistors with Self-Aligned Top-Gate Structure," IEDM 09: Technical Digest of International Electron Devices Meeting, Dec. 7, 2009, pp. 191-194.

Park, J-S. et al., "Improvements in the Device Characteristics of Amorphous Indium Gallium Zinc Oxide Thin-Film Transistors by Ar Plasma Treatment," Applied Physics Letters, Jun. 26, 2007, vol. 90, No. 26, pp. 262106-1-262106-3.

Park, S. et al., "Challenge to Future Displays: Transparent AM-OLED Driven by PEALD Grown ZnO TFT," IMID '07 Digest, 2007, pp. 1249-1252.

Park, Sang-Hee et al., "42.3: Transparent ZnO Thin Film Transistor for the Application of High Aperture Ratio Bottom Emission AM-OLED Display," SID Digest '08: SID International Symposium Digest of Technical Papers, May 20, 2008, vol. 39, pp. 629-632.

Prins, M.W.J. et al., "A Ferroelectric Transparent Thin-Film Transistor," Applied Physics Letters, Jun. 17, 1996, vol. 68, No. 25, pp. 3650-3652.

Sakata, J. et al., "Development of 4.0-In. AMOLED Display With Driver Circuit Using Amorphous In—Ga—Zn-Oxide TFTs," IDW '09: Proceedings of the 16th International Display Workshops, 2009, pp. 689-692.

Son, K-S. et al., "42.4L: Late-News Paper: 4 Inch QVGA AMOLED Driven by the Threshold Voltage Controlled Amprphous GIZO (Ga2O3—In2O3—ZnO) TFT," SID Digest '08 SID International Symposium Digest of Technical Papers, May 20, 2008, vol. 39, pp. 633-636.

Takahashi, M. et al., "Theoretical Analysis of IGZO Transparent Amorphous Oxide Semiconductor," IDW '08: Proceedings of the 15th International Display Workshops, Dec. 3, 2008, pp. 1637-1640.

Tsuda, K. et al., "Ultra Low Power Consumption Technologies for Mobile TFT-LCDs," IDW '02: Proceedings of the 9th International Display Workshops, Dec. 4, 2002, pp. 295- 298.

Ueno, K. et al., "Field-Effect Transistor on SrTiO3 With Sputtered Al2O3 Gate Insulator," Applied Physics Letters, Sep. 1, 2003, vol. 83, No. 9, pp. 1755-1757.

Van de Walle, C.G., "Hydrogen as a Cause of Doping in Zinc Oxide," Physical Review Letters, Jul. 31, 2000, vol. 85, No. 5, pp. 1012-1015.

\* cited by examiner

FIG. 25A
FIG. 25B
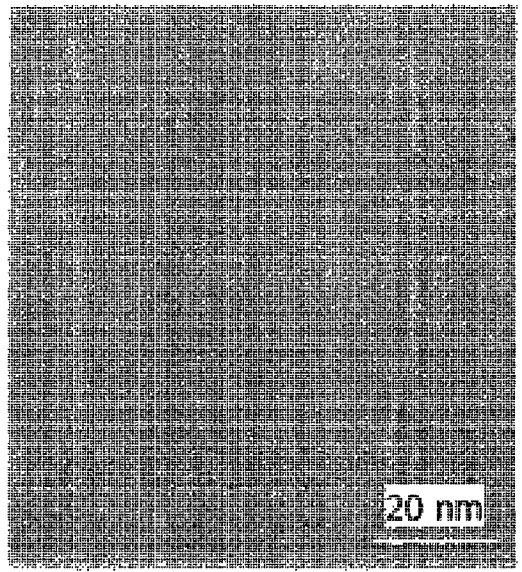
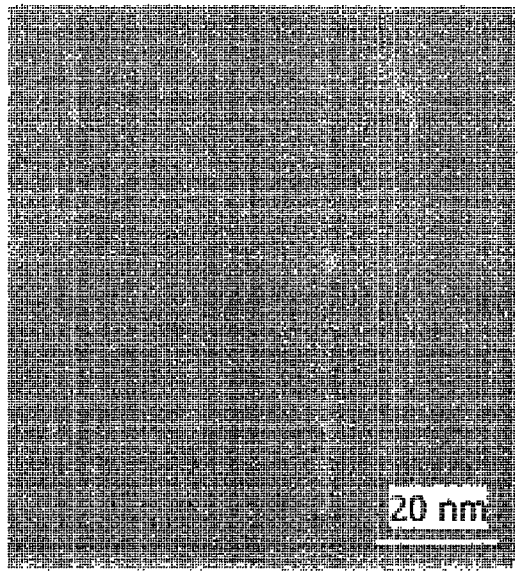

9100

9200

9101

9201

9102

9201

9201

TRANSISTOR, CIRCUIT, SEMICONDUCTOR DEVICE, DISPLAY DEVICE, AND ELECTRONIC DEVICE

BACKGROUND OF THE INVENTION

1. Field of the Invention

The present invention relates to, for example, a semiconductor, a transistor, a circuit, and a semiconductor device. The present invention relates to, for example, a method for manufacturing a semiconductor, a transistor, a circuit, and a semiconductor device. The present invention relates to, for example, a display device, a light-emitting device, a lighting device, a power storage device, a memory device, a processor, and an electronic device. The present invention relates to a method for manufacturing a display device, a liquid crystal display device, a light-emitting device, a memory device, and an electronic device. The present invention relates to a driving method of a transistor, a circuit, a semiconductor device, a display device, a liquid crystal display device, a light-emitting device, a memory device, and an electronic device.

Note that one embodiment of the present invention is not limited to the above technical field. The technical field of one embodiment of the invention disclosed in this specification and the like relates to an object, a method, or a manufacturing method. In addition, one embodiment of the present invention relates to a process, a machine, manufacture, or a composition of matter.

In this specification and the like, a semiconductor device generally means a device that can function by utilizing semiconductor characteristics. A display device, a light-emitting device, a lighting device, an electro-optical device, a semiconductor circuit, and an electronic device include a semiconductor device in some cases.

2. Description of the Related Art

It is known that a transistor including an oxide semiconductor has an extremely low leakage current in an off state. For example, a low-power-consumption CPU utilizing a characteristic of an extremely low leakage current of the transistor including an oxide semiconductor is disclosed (see Patent Document 1).

Silicon oxide is used as a gate insulator of a transistor in some cases. It is known that, in the case where silicon oxide is used as a gate insulator, defects such as E'-center or a hydrogen-complexed oxygen vacancy (a defect caused by a hydrogen atom which is placed in an oxygen vacancy to bridge between two silicon atoms (also referred to as hydrogen bridge defect)) disclosed in Non-Patent Document 1, nonbridging oxygen hole center (NBOHC) disclosed in Non-Patent Document 2, and the like are formed as a defect state of a gate insulator at an interface between a semiconductor and the gate insulator of a transistor.

Non-Patent Document 3 discloses a method of estimating an energy band diagram of $SiO_2$ and $InGaZnO_4$ by X-ray photoelectron spectroscopy (XPS).

In addition, Non-Patent Document 4 discloses a reaction diffusion (R-D) model as a degradation model of a reliability test called negative bias temperature instability (NBTI) in a PMOS transistor.

REFERENCE

Patent Document

[Patent Document 1] Japanese Published Patent Application No. 2012-257187

Non-Patent Document

[Non-Patent Document 1] Fabien Devynck et al., "Charge transition levels of carbon-, oxygen-, and hydrogen-related defects at the $SiC/SiO_2$ interface through hybrid functionals", *Physical Review B*, vol. 84, p. 235320, 2011.

[Non-Patent Document 2] Shuji Munekuni et al., "Various types of nonbridging oxygen hole center in high-purity silica glass", *Journal of Applied Physics*, vol. 68, No. 3, pp. 1212-1217, 1990.

[Non-Patent Document 3] E. A. Douglas et al., "Measurement of $SiO_2/InZnGaO_4$ heterojunction band offsets by x-ray photoelectron spectroscopy", *Applied Physics Letters*, vol. 98, p. 242110, 2011.

[Non-Patent Document 4] M. A. Alam et al., "A comprehensive model of PMOS NBTI degradation", *MICROELECTRONICS RELIABILITY*, vol. 45, pp. 71-81, 2005.

SUMMARY OF THE INVENTION

An object of one embodiment of the present invention is to provide a transistor in which a change in characteristics is small. Another object of one embodiment of the present invention is to provide a transistor in which a change in threshold value is small.

A circuit of one embodiment of the present invention includes a transistor. An object of one embodiment of the present invention is to provide a circuit in which a change in characteristics of the transistor included in the circuit is small. Another object of one embodiment of the present invention is to provide a circuit in which a change in threshold value of the transistor included in the circuit is small.

An object of one embodiment of the present invention is to provide a semiconductor device in which a change in characteristics of the transistor is small. Another object of one embodiment of the present invention is to provide a display device in which a change in characteristics of the transistor is small. Another object of one embodiment of the present invention is to provide an electronic device in which a change in characteristics of the transistor is small.

An object of one embodiment of the present invention is to provide a highly reliable semiconductor device. Another object of one embodiment of the present invention is to provide a highly reliable display device. Another object of one embodiment of the present invention is to provide a highly reliable electronic device.

An object of one embodiment of the present invention is to provide a novel circuit. Another object of one embodiment of the present invention is to provide a novel device. Another object of one embodiment of the present invention is to provide a novel electronic device.

One embodiment of the present invention does not necessarily achieve all the objects listed above and only needs to achieve at least one of the objects. The description of the above objects does not disturb the existence of other objects. Other objects will be apparent from and can be derived from the description of the specification, the drawings, the claims, and the like.

One embodiment of the present invention is a transistor including an oxide semiconductor, a gate insulator, and a gate electrode. A channel region is formed in the oxide semiconductor. The channel region contains indium, an element M and zinc. The element M is one or more selected from aluminum, gallium, yttrium, tin, boron, silicon, titanium, iron, nickel, germanium, zirconium, molybdenum, lanthanum, cerium, neodymium, hafnium, tantalum, tungsten, and magnesium. The gate insulator contains silicon and oxygen. In the gate insulator, the number of oxygen atoms is 1.5 times or more as large as the number of silicon atoms. The carrier density of the channel region is higher than or equal to $1\times10^9$ cm$^{-3}$ and lower than or equal to $5\times10^{16}$ cm$^{-3}$. The energy gap of the channel region is higher than or equal to 2.7 eV and lower than or equal to 3.1 eV. In the above structure, the gate insulator has a defect state, and an energy difference between the defect state and the conduction band minimum of the channel region is preferably 0.2 eV or more and 1.0 eV or less.

In the above-described structure, it is preferable that the gate insulator be in contact with either an upper surface or a lower surface of the first region, that the atomic proportions of the indium, the element M and the zinc be expressed by x, y, and z, respectively, that $x/(x+y+z)$ be greater than or equal to 0.33 and less than or equal to 0.7, and that $y/(x+y+z)$ be greater than or equal to 0.08 and less than or equal to 0.33.

Another embodiment of the present invention is transistor including a first oxide semiconductor, a second oxide semiconductor, a gate insulator, and a gate electrode. The first oxide semiconductor includes a first region. The second oxide semiconductor includes a second region in contact with the first oxide semiconductor. The gate insulator includes a region in contact with the second region. A channel region is formed in the first region. The first region and the second region contain indium, an element M, and zinc. The element M is one or more selected from aluminum, gallium, yttrium, tin, boron, silicon, titanium, iron, nickel, germanium, zirconium, molybdenum, lanthanum, cerium, neodymium, hafnium, tantalum, tungsten, and magnesium. The gate insulator contains silicon and oxygen. In the gate insulator, the number oxygen atoms is 1.5 times or more as large as the number of silicon atoms. The carrier density of the first region is higher than or equal to $1\times10^9$ cm$^{-3}$ and lower than or equal to $5\times10^{16}$ cm$^{-3}$. The energy gap of the first region is higher than or equal to 2.7 eV and lower than or equal to 3.1 eV. The energy gap of the second region is larger than the energy gap of the first region by 0.15 eV or more and 2 eV or less.

In the above-described structure, it is preferable that the atomic proportions of the indium, the element M, and the zinc contained in the first region be expressed by x1, y1, and z1, respectively, that $x1/(x1+y1+z1)$ be greater than or equal to 0.33 and less than or equal to 0.7, and that $y1/(x1+y1+z1)$ be greater than or equal to 0.08 and less than or equal to 0.33.

In the above-described structure, it is preferable that the gate insulator have a trap state, that an energy difference between the trap state and the conduction band minimum of the first region be 0.2 eV or more and 1.0 eV or less, and that an energy difference between the trap state and the conduction band minimum of the second region be −0.2 eV or more and 0.8 eV or less.

In the above-described structure, it is preferable that the thickness of the second region be greater than or equal to 1 nm and less than or equal to 20 nm. In the above-described structure, it is preferable that a channel length of the transistor be greater than or equal to 0.01 μm and less than or equal to 15 μm in a region, and that a threshold value when a potential difference of 0.1 V or more and 30 V or less is applied between a drain and a source of the transistor be greater than or equal to −0.5 V and less than or equal to 2 V. In the above-described structure, it is preferable that the gate insulator include a region having a thickness greater than or equal to 5 nm and less than or equal to 200 nm.

Another embodiment of the present invention is a circuit including any of the above-described transistors, in which voltage higher than or equal to −1 V and lower than or equal to 20 V is applied between the source and the gate electrode of the transistor.

Another embodiment of the present invention is a semiconductor device including the above-described circuit.

Another embodiment of the present invention is an electronic device including the above-described semiconductor device.

Another embodiment of the present invention is a display device including the above-described electronic device.

Another embodiment of the present invention is a display device including the above-described circuit, in which the circuit is a gate driver of the display device.

Another embodiment of the present invention is any of the above-described display devices including any one or more of a touch sensor, a speaker, and an imaging device.

Another embodiment of the present invention is an electronic device including any of the above-described display devices.

According to one embodiment of the present invention, a transistor in which a change in characteristics is small can be provided. According to one embodiment of the present invention, a transistor in which a change in threshold value is small can be provided.

A circuit of one embodiment of the present invention includes a transistor. According to one embodiment of the present invention, a circuit in which a change in characteristics of the transistor included in the circuit is small can be provided. According to one embodiment of the present invention, a circuit in which a change in threshold value of the transistor included in the circuit is small can be provided.

According to one embodiment of the present invention, a semiconductor device in which a change in characteristics of the transistor is small can be provided. According to one embodiment of the present invention, a display device in which a change in characteristics of the transistor is small can be provided. According to one embodiment of the present invention, an electronic device in which a change in characteristics of the transistor is small can be provided.

According to one embodiment of the present invention, a highly reliable semiconductor device can be provided. According to one embodiment of the present invention, a highly reliable display device can be provided. According to one embodiment of the present invention, a highly reliable electronic device can be provided.

According to one embodiment of the present invention, a novel circuit can be provided. According to one embodiment of the present invention, a novel device can be provided. According to one embodiment of the present invention, a novel electronic device can be provided.

Note that the description of these effects does not disturb the existence of other effects. One embodiment of the present invention does not necessarily achieve all the effects listed above. Other effects will be apparent from and can be derived from the description of the specification, the drawings, the claims, and the like.

BRIEF DESCRIPTION OF THE DRAWINGS

FIGS. 25A and 25B are cross-sectional TEM images of an a-like OS.

DETAILED DESCRIPTION OF THE INVENTION

Figure 1A:
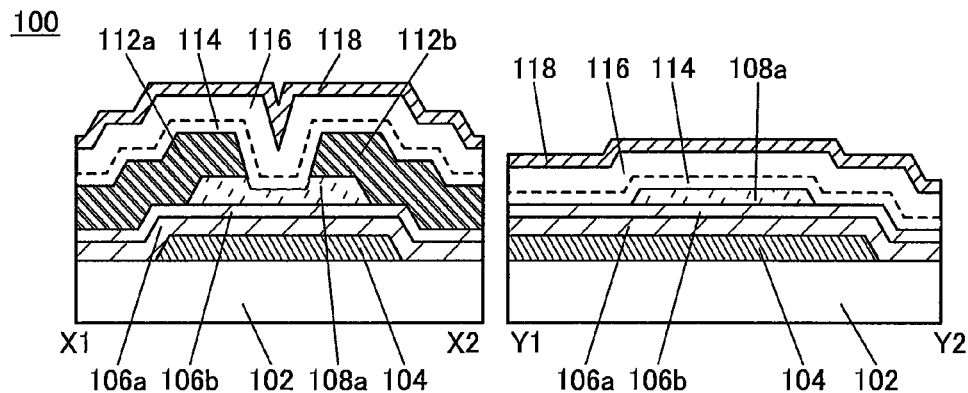
FIGS. 1A to 1C illustrate a transistor of one embodiment of the present invention.

Embodiments of the present invention will be described in detail with the reference to the drawings. However, the present invention is not limited to the following description, and it is easily understood by those skilled in the art that modes and details disclosed herein can be modified in various ways. Furthermore, the present invention is not construed as being limited to description of the following embodiments. In describing structures of the invention with reference to the drawings, common reference numerals are used for the same portions in different drawings. Note that the same hatched pattern is applied to similar parts, and the similar parts are not especially denoted by reference numerals in some cases.

Note that the size, the thickness of films (layers), or regions in drawings is sometimes exaggerated for clarification.

In this specification, the terms "film" and "layer" can be interchanged with each other.

Voltage usually refers to a potential difference between a given potential and a reference potential (e.g., a source potential or a ground potential (GND)). Voltage can be referred to as a potential and vice versa.

Note that the ordinal numbers such as "first" and "second" are used for convenience and do not denote the order of steps or the stacking order of layers. Therefore, for example, the term "first" can be replaced with the term "second", "third", or the like as appropriate. In addition, the ordinal numbers in this specification and the like do not correspond to the ordinal numbers which specify one embodiment of the present invention in some cases.

Note that a "semiconductor" has characteristics of an "insulator" in some cases when the conductivity is sufficiently low, for example. Further, a "semiconductor" and an "insulator" cannot be strictly distinguished from each other in some cases because a border therebetween is not clear. Accordingly, a "semiconductor" in this specification can be called an "insulator" in some cases. Similarly, an "insulator" in this specification can be called a "semiconductor" in some cases.

Further, a "semiconductor" has characteristics of a "conductor" in some cases when the conductivity is sufficiently high, for example. Further, a "semiconductor" and a "conductor" cannot be strictly distinguished from each other in some cases because a border therebetween is not clear. Accordingly, a "semiconductor" in this specification can be called a "conductor" in some cases. Similarly, a "conductor" in this specification can be called a "semiconductor" in some cases.

Note that an impurity in a semiconductor refers to, for example, elements other than the main components of the semiconductor. For example, an element with a concentration of lower than 0.1 atomic % is an impurity. When an impurity is contained, the density of states (DOS) may be formed in a semiconductor, the carrier mobility may be decreased, or the crystallinity may be decreased. In the case where the semiconductor is an oxide semiconductor, examples of an impurity which changes characteristics of the semiconductor include Group 1 elements, Group 2 elements, Group 13 elements, Group 14 elements, Group 15 elements, and transition metals other than the main components; specifically, there are hydrogen (included in water), lithium, sodium, silicon, boron, phosphorus, carbon, and nitrogen, for example. In the case of an oxide semiconductor, an oxygen vacancy is sometimes formed by entry of impurities such as hydrogen. In the case where the semiconductor is silicon, examples of an impurity which changes characteristics of the semiconductor include oxygen, Group 1 elements except hydrogen, Group 2 elements, Group 13 elements, and Group 15 elements.

Note that the channel length refers to, for example, the distance between a source (a source region or a source electrode) and a drain (a drain region or a drain electrode) in a region where a semiconductor (or a portion where a current flows in a semiconductor when a transistor is on) and a gate electrode overlap with each other or a region where a channel is formed in a top view of the transistor. In one transistor, channel lengths in all regions are not necessarily the same. In other words, the channel length of one transistor is not limited to one value in some cases. Therefore, in this specification, the channel length is any one of values, the maximum value, the minimum value, or the average value in a region where a channel is formed.

The channel width refers to, for example, the length of a portion where a source and a drain face each other in a region where a semiconductor (or a portion where a current flows in a semiconductor when a transistor is on) and a gate electrode overlap with each other, or a region where a channel is formed. In one transistor, channel widths in all regions are not necessarily the same. In other words, the channel width of one transistor is not limited to one value in some cases. Therefore, in this specification, the channel width is any one of values, the maximum value, the minimum value, or the average value in a region where a channel is formed.

Note that depending on a transistor structure, a channel width in a region where a channel is formed actually (hereinafter referred to as an effective channel width) is different from a channel width shown in a top view of a transistor (hereinafter referred to as an apparent channel width) in some cases. For example, in a transistor having a three-dimensional structure, an effective channel width is greater than an apparent channel width shown in a top view of the transistor, and its influence cannot be ignored in some cases. For example, in a miniaturized transistor having a three-dimensional structure, the proportion of a channel region formed in a side surface of a semiconductor is high in some cases. In that case, an effective channel width obtained when a channel is actually formed is greater than an apparent channel width shown in the top view.

In a transistor having a three-dimensional structure, an effective channel width is difficult to measure in some cases. For example, to estimate an effective channel width from a design value, it is necessary to assume that the shape of a semiconductor is known as an assumption condition. Therefore, in the case where the shape of a semiconductor is not known accurately, it is difficult to measure an effective channel width accurately.

Therefore, in this specification, in a top view of a transistor, an apparent channel width that is a length of a portion where a source and a drain face each other in a region where a semiconductor and a gate electrode overlap with each other is referred to as a surrounded channel width (SCW) in some cases. Further, in this specification, in the case where the term "channel width" is simply used, it may denote a surrounded channel width and an apparent channel width. Alternatively, in this specification, in the case where the term "channel width" is simply used, it may denote an effective channel width in some cases. Note that the values of a channel length, a channel width, an effective channel width, an apparent channel width, a surrounded channel width, and the like can be determined by obtaining and analyzing a cross-sectional TEM image and the like.

Note that in the case where electric field mobility, a current value per channel width, and the like of a transistor are obtained by calculation, a surrounded channel width may be used for the calculation. In that case, the values might be different from those calculated by using an effective channel width.

Note that in this specification, the description "A has a shape such that an end portion extends beyond an end portion of B" may indicate, for example, the case where at least one of end portions of A is positioned on an outer side than at least one of end portions of B in a top view or a cross-sectional view. Thus, the description "A has a shape such that an end portion extends beyond an end portion of B" can be read as the description "one end portion of A is positioned on an outer side than one end portion of B in a top view", for example.

In this specification, the term "parallel" indicates that the angle formed between two straight lines is greater than or equal to −10° and less than or equal to 10°, and accordingly also includes the case where the angle is greater than or equal to −5° and less than or equal to 5°. A term "substantially parallel" indicates that the angle formed between two straight lines is greater than or equal to −30° and less than or equal to 30°. The term "perpendicular" indicates that the angle formed between two straight lines is greater than or equal to 80° and less than or equal to 100°, and accordingly also includes the case where the angle is greater than or equal to 85° and less than or equal to 95°. A term "substantially perpendicular" indicates that the angle formed between two straight lines is greater than or equal to 60° and less than or equal to 120°.

In this specification, trigonal and rhombohedral crystal systems are included in a hexagonal crystal system.

Furthermore, in this specification, any of the embodiments and the examples below can be combined as appropriate. In the case where some structural examples are given in one embodiment or example, any of the structure examples can be combined as appropriate.

Embodiment 1

In this embodiment, a transistor and the like of one embodiment of the present invention will be described.

A transistor of one embodiment of the present invention can be used for a circuit, a display element, and the like of one embodiment of the present invention. A semiconductor device of one embodiment of the present invention includes the circuit, the display element, and the like. An electronic device of one embodiment of the present invention includes the semiconductor device. In addition, the electronic device of one embodiment of the present invention preferably includes a display device. The display device preferably includes the semiconductor device of one embodiment of the present invention.

The transistor of one embodiment of the present invention preferably includes an oxide semiconductor. In addition, the transistor of one embodiment of the present invention preferably includes an oxide semiconductor in a channel region.

The oxide semiconductor included in the transistor preferably contains indium and zinc. In addition, the oxide semiconductor preferably contains an element M. The element M is aluminum, gallium, yttrium, tin, or the like. Other elements that can be used as the element M include boron, silicon, titanium, iron, nickel, germanium, zirconium, molybdenum, lanthanum, cerium, neodymium, hafnium, tantalum, tungsten, magnesium, and the like.

An oxide semiconductor containing In has high carrier mobility (electron mobility), for example. In addition, an oxide semiconductor containing Zn is easily crystallized. An oxide semiconductor containing an element M functioning as a stabilizer has a large energy gap, for example.

The circuit, the semiconductor device, the display device, and the electronic device of one embodiment of the present invention each preferably include a transistor including an oxide semiconductor.

The current in an off state (off-state current) of the transistor including an oxide semiconductor of one embodiment of the present invention can be reduced. With the use of the transistor including an oxide semiconductor, data can be held for a long period of time. Therefore, the interval between writing operations of data can be made longer. Accordingly, power consumption of the circuit, the semiconductor device, the display device, the electronic device, and the like can be reduced.

The off-state current of the transistor including an oxide semiconductor in a channel region is less than $10^{-21}$ A, for example. For example, even when an element has a channel width W of $1\times10^6$ μm and a channel length L of 10 μm, an off-state current can be less than or equal to the measurement limit of a semiconductor parameter analyzer, i.e., less than or equal to $1\times10^{-13}$ A, at voltage (drain voltage) between a source electrode and a drain electrode of from 1 V to 10 V.

In a display device, for example, an electrical signal such as an image signal can be held for a longer period of time, and the interval between writing operations can be made longer when the power is on. Accordingly, the frequency of refresh operation can be reduced, which leads to an effect of suppressing power consumption. In addition, a high-definition display device can be achieved in some cases by using the transistor including an oxide semiconductor. The display quality of the display device can be improved in some cases by using the transistor including an oxide semiconductor. As described above, the transistor including an oxide semiconductor in a channel region has excellent characteristics.

Here, in the case where the transistor is used for a circuit, voltage is applied between a source and a drain and between the source and a gate of the transistor in accordance with the operation of the circuit. A change in transistor characteristics might cause malfunction of the circuit. In addition, power consumption of the circuit might be increased by the change in transistor characteristics. The performance of a semiconductor device, a display device, and an electronic device including the circuit might be degraded by the change in transistor characteristics. Thus, it is preferred that the change in transistor characteristics due to the operation of the circuit be as small as possible.

There is a threshold value as a parameter for evaluating transistor characteristics. In this specification, the threshold value refers to gate voltage at which a channel is formed. For example, the threshold value can be calculated from a curve obtained in a graph where the horizontal axis indicates the gate voltage $V_g$, and the vertical axis indicates the square root of drain current $I_d$ ($V_g$-$\sqrt{I_d}$ characteristics); the threshold value corresponds to the gate voltage $V_g$ at the intersection of an extrapolated tangent line having the highest inclination with the square root of drain current (current flowing between a gate and a source) $I_{ds}$ of 0 (i.e., $I_d$ of 0 A). Alternatively, a threshold value is defined as $V_{gs}$ at which $I_{ds}$ [A]×L [μm]÷W [μm], where a channel length is L and a channel width is W, is calculated to be $1\times10^{-9}$ [A] in some cases.

To make a change in transistor characteristics due to the operation of the circuit or the like smaller, the present inventors considered a relationship between trap states at an interface between a gate insulator and an oxide semiconductor and in the gate insulator and a change in threshold value of a transistor including the oxide semiconductor in a channel region. As a result, they have found that a change in transistor characteristics can be suppressed by changing a band offset of the oxide semiconductor.

<Example of Stress Test>

First, the amounts of change in threshold value before and after application of stress to a transistor were measured.

Hereinafter, voltage applied between a gate and a source is referred to as $V_{gs}$, and voltage between a drain and a source is referred to as $V_{ds}$. Stress was assumed as follows: $V_{gs}=V_1$ [V] and $V_{ds}=0$ V. $V_1$ was measured under three conditions of 10 V, 30 V, and 40 V. As the measurement temperature, three conditions of 80° C., 100° C., and 125° C. were used.

As the transistor structure, the structure of a transistor 100 illustrated in FIG. 1A was used. Details of FIG. 1A will be described later. The transistor 100 includes an oxide semiconductor 108a, a conductor 112a functioning as a source electrode, a conductor 112b functioning as a drain electrode, a conductor 104 functioning as a gate electrode, and insulators 106a and 106b functioning as a gate insulator.

In the transistor subjected to a stress test, a 400-nm-thick silicon nitride film was used as the insulator 106a, and a 50-nm-thick silicon oxynitride film was used as the insulator 106b. Here, in the silicon oxynitride film, the atomic proportion of oxygen is higher than the atomic proportion of nitrogen.

In addition, a 35-nm-thick In—Ga—Zn oxide film was used as the oxide semiconductor 108a. The In—Ga—Zn oxide was deposited by a sputtering method using a polycrystalline metal oxide target with an atomic ratio of In:Ga:Zn=1:1:1.

Here, for example, the insulator 106a was deposited by a plasma enhanced chemical vapor deposition (PECVD) method using silane, nitrogen, and ammonia. The insulator 106b was deposited by a PECVD method under the conditions where silane and dinitrogen monoxide were used at gas flow rates of 20 sccm and 3000 sccm, respectively, the pressure was 40 Pa, and the power was 100 W. The oxide semiconductor 108 was deposited by a sputtering method under the conditions where a polycrystalline metal oxide target with an atomic ratio of In:Ga:Zn=1:1:1 was used, the substrate temperature was 300° C., argon and oxygen were used at gas flow rates of 20 sccm and 10 sccm, respectively, the pressure was 0.4 Pa, and the power was 100 W (DC power source).

Tungsten was used as the conductor 104. A metal layer including three layers was used as the conductors 112a and 112b. In the metal layer, tungsten, aluminum, and titanium were stacked in this order from the lowest side.

Figure 2:
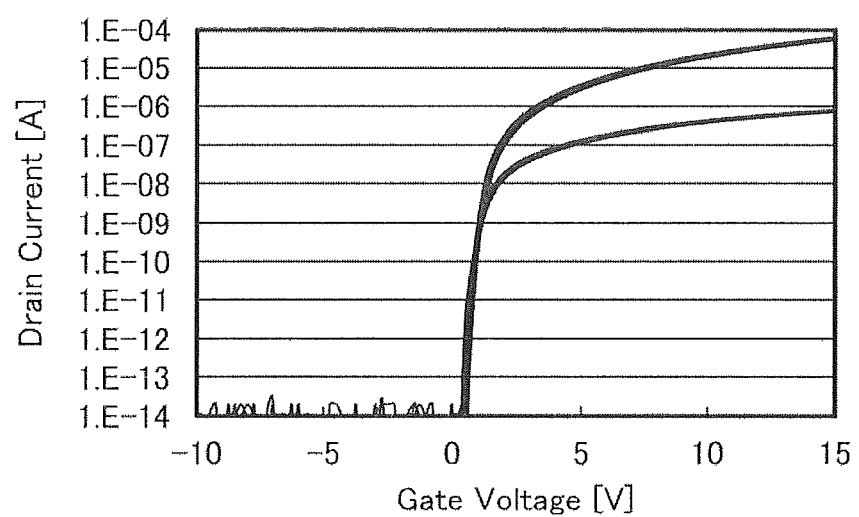
FIG. 2 shows $I_{ds}$–$V_{gs}$ characteristics of a transistor.

FIG. 2 shows $I_{ds}$-$V_{gs}$ characteristics of the transistors, whose channel lengths L are 6 μm and channel widths W are 50 μm.

Figure 3:
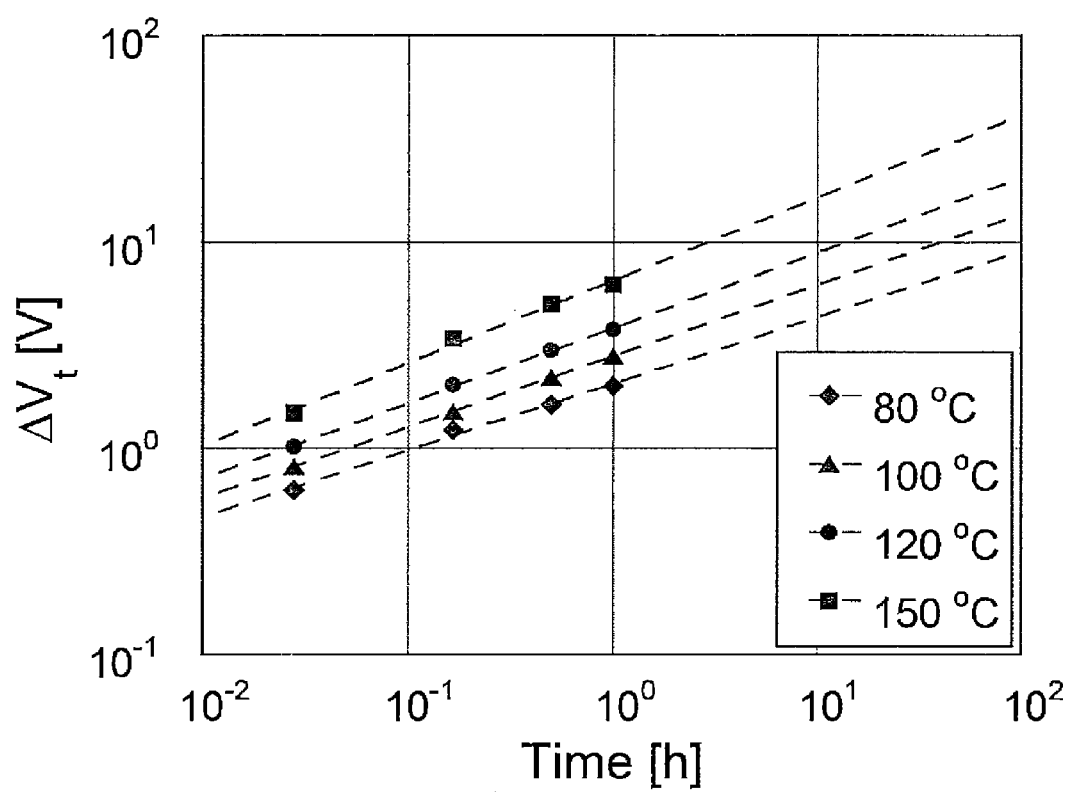
FIG. 3 shows a change over time in the threshold value of a transistor.

FIG. 3 is a graph in which the stress application time is plotted on the horizontal axis and a change in threshold value (hereinafter referred to as $\Delta V_{th}$) is plotted on the vertical axis at $V_1$ of 30 V. A threshold value (hereinafter referred to as $V_{th}$) is calculated from $I_{ds}$-$V_{gs}$ characteristics at $V_{ds}$ of 10 V. Here, $I_{ds}$ is current flowing between a gate and a source.

Figure 4:
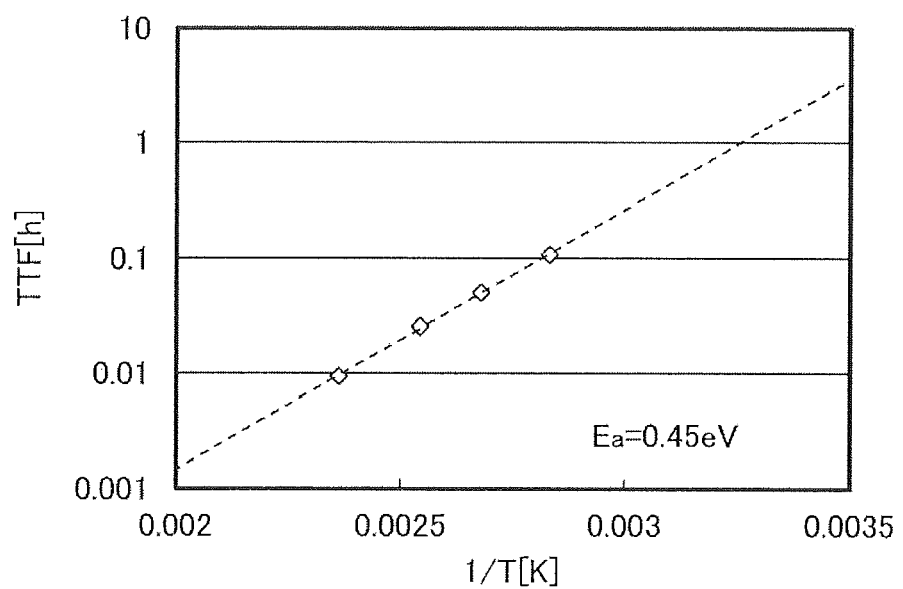
FIG. 4 shows time required for a change in the threshold value of a transistor.

The time needed for a change of $\Delta V_{th}$ to be 1 V was estimated as time to fail (hereinafter referred as TTF). FIG. 4 is a graph in which TTF is plotted on the vertical axis and the inverse of the absolute temperature of measurement temperature (1/T) was plotted on the horizontal axis at $V_{gs}$ of 30 V.

An activation energy $E_a$ can be obtained by approximating the data of FIG. 4 by Formula 1. Here, in Formula 1, A and k represent a constant and the Boltzmann constant, respectively.

[Formula 1]

$$TTF = Ae^{Ea/kT} \quad (1)$$

When the voltages $V_1$ are 10 V, 30 V, and 40 V, the activation energies $E_a$ were 0.51 eV, 0.45 eV, and 0.39 eV, respectively.

Next, a phenomenon that causes a change in threshold value was considered.

<Band Structure 1>

Referring to a method disclosed in Non-Patent Document 3, energy of an energy gap, a depth of a valence band, and a depth of a conduction band were estimated by XPS measurement. Silicon oxynitride was used as the gate insulator. In addition, an In—Ga—Zn oxide was deposited as the oxide semiconductor by a sputtering method using a polycrystalline metal oxide target with an atomic ratio of In:Ga:Zn=1:1:1.

Figure 5:
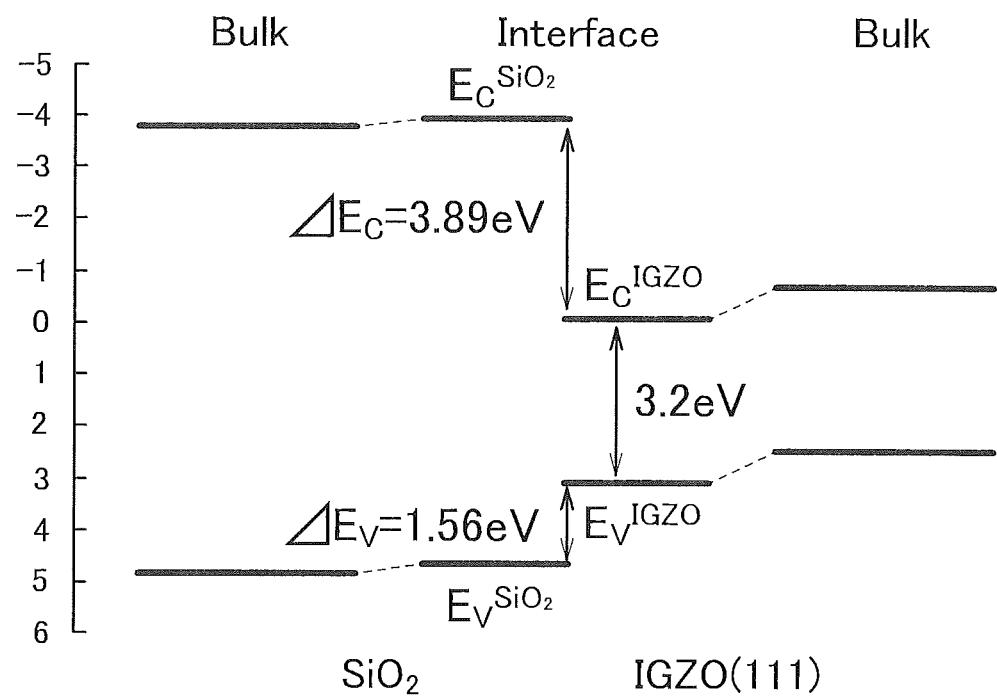
FIG. 5 shows a band structure of an oxide semiconductor and a gate insulator.

FIG. 5 shows the valence band and conduction band of each of the oxide semiconductor and the gate insulator. Here, bulk regions and an interface region between the gate insulator and the oxide semiconductor are shown.

<Conduction Band>

Next, the conduction band of each of the gate insulator and the oxide semiconductor when $V_{gs}$ is changed is calculated using electron affinities and ionization potentials calculated from actual measurement which is described with reference to FIG. 5. The ATLAS software produced by Silvaco Inc. was used for the calculation. The work function of the gate electrode was set to 4.7 eV, and the electron affinities of the gate insulator and the oxide semiconductor were set to 0.9 eV and 4.6 eV, respectively. The ionization potentials of the gate insulator and the oxide semiconductor were set to 9.5 eV and 7.8 eV, respectively, and the energy gaps of the gate insulator and the oxide semiconductor were set to 8.6 eV and 3.2 eV, respectively. The relative permittivity of the gate insulator and the relative permittivity of the oxide semiconductor were set to 4.1 and 15, respectively.

Figure 6A:
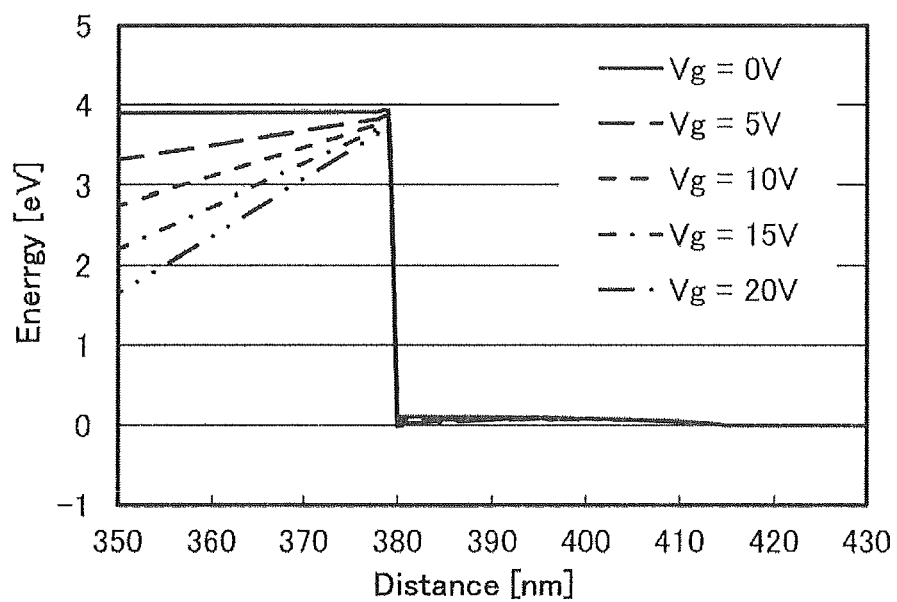
FIGS. 6A and 6B show the conduction bands of an oxide semiconductor and a gate insulator.
Figure 6B:
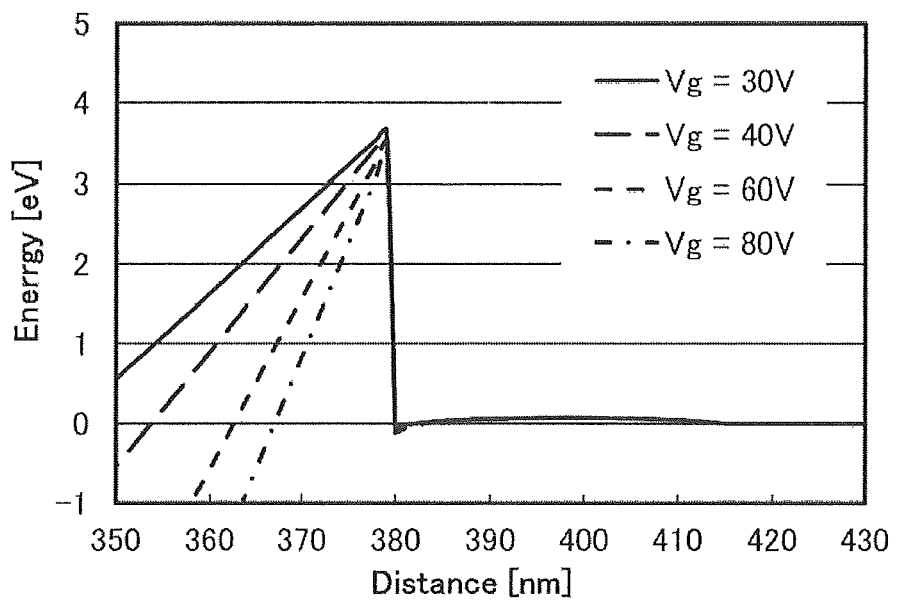

FIGS. 6A and 6B show the conduction band of each of the oxide semiconductor and the gate insulator obtained by calculation. The energy of the conduction band is shown with the Fermi level as a reference. FIGS. 6A and 6B show results obtained by calculation at the voltages $V_{gs}$ of 0 V, 5 V, 10 V, 15 V, 20 V, 30 V, 40 V, 60 V, and 80 V. According to FIGS. 6A and 6B, the conduction band of the gate insulator at the interface with the oxide semiconductor gets gradually lower than the Fermi level as $V_{gs}$ increases. In addition, electron mobility, i.e., accumulation of carriers of the oxide semiconductor at the interface with the gate insulator was estimated from FIGS. 6A and 6B. The results are shown in FIG. 7.

Figure 7:
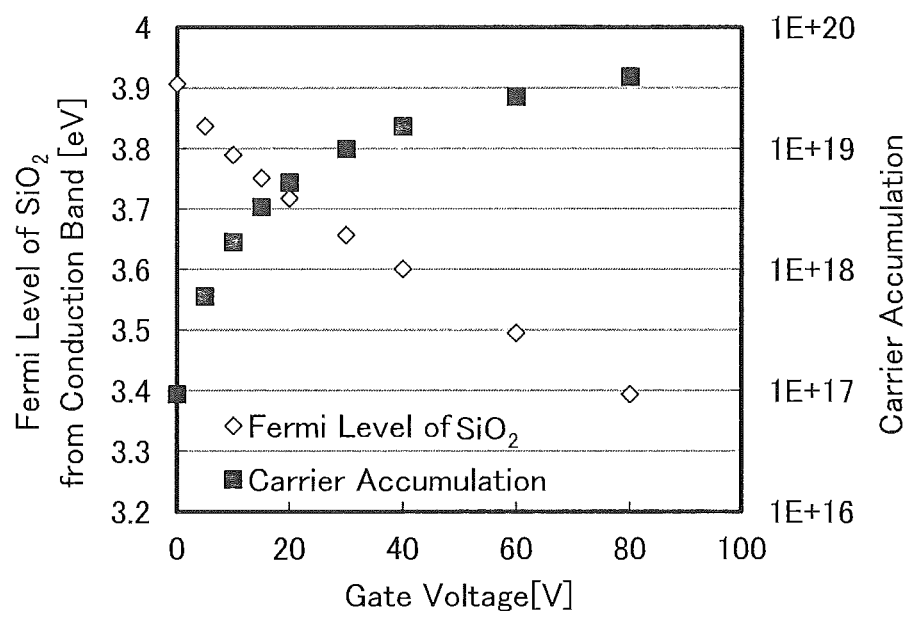
FIG. 7 shows the electron density of an oxide semiconductor and the conduction band of a gate insulator.

FIG. 7 is a graph in which $V_{gs}$ is plotted on the horizontal axis and the Fermi levels of the oxide semiconductor and the gate insulator at the interface with the oxide semiconductor are plotted on the vertical axis as white rhombuses. In addition, electron mobility of the oxide semiconductor at the interface with the gate insulator was plotted on the vertical axis as black squares.

<Estimation of Transistor Characteristics>

Next, a change in the Fermi level of the gate insulator and the $I_{ds}$-$V_{gs}$ characteristics of the transistor in the case where the energy gap of the oxide semiconductor is changed are calculated. The ATLAS software produced by Silvaco Inc. was used for the calculation. The conditions shown in Table 1 were used for each parameter.

TABLE 1

| | | |
|---|---|---|
| Channel | Channel length | 6 μm |
| | Channel width | 50 μm |
| Oxide semiconductor | Electron affinity | Depending on conditions |
| | $E_g$ | Depending on conditions |
| | Relative permittivity | 15 |
| | Donor density | Depending on conditions |
| | Donor density (under source and drain) | 5.00 E18 cm$^{-3}$ |
| | Electron mobility | 10 cm$^2$/(V · s) |
| | Hole mobility | 0.01 cm$^2$/(V · s) |
| | Nc | 5.00 E18 cm$^{-3}$ |
| | Nv | 5.00 E18 cm$^{-3}$ |
| | Thickness | 25 nm |
| Gate insulator | EOT | 280 nm |
| Insulator 114 | EOT | 508 nm |
| Gate electrode | Work function | 5 eV |

Figure 11:
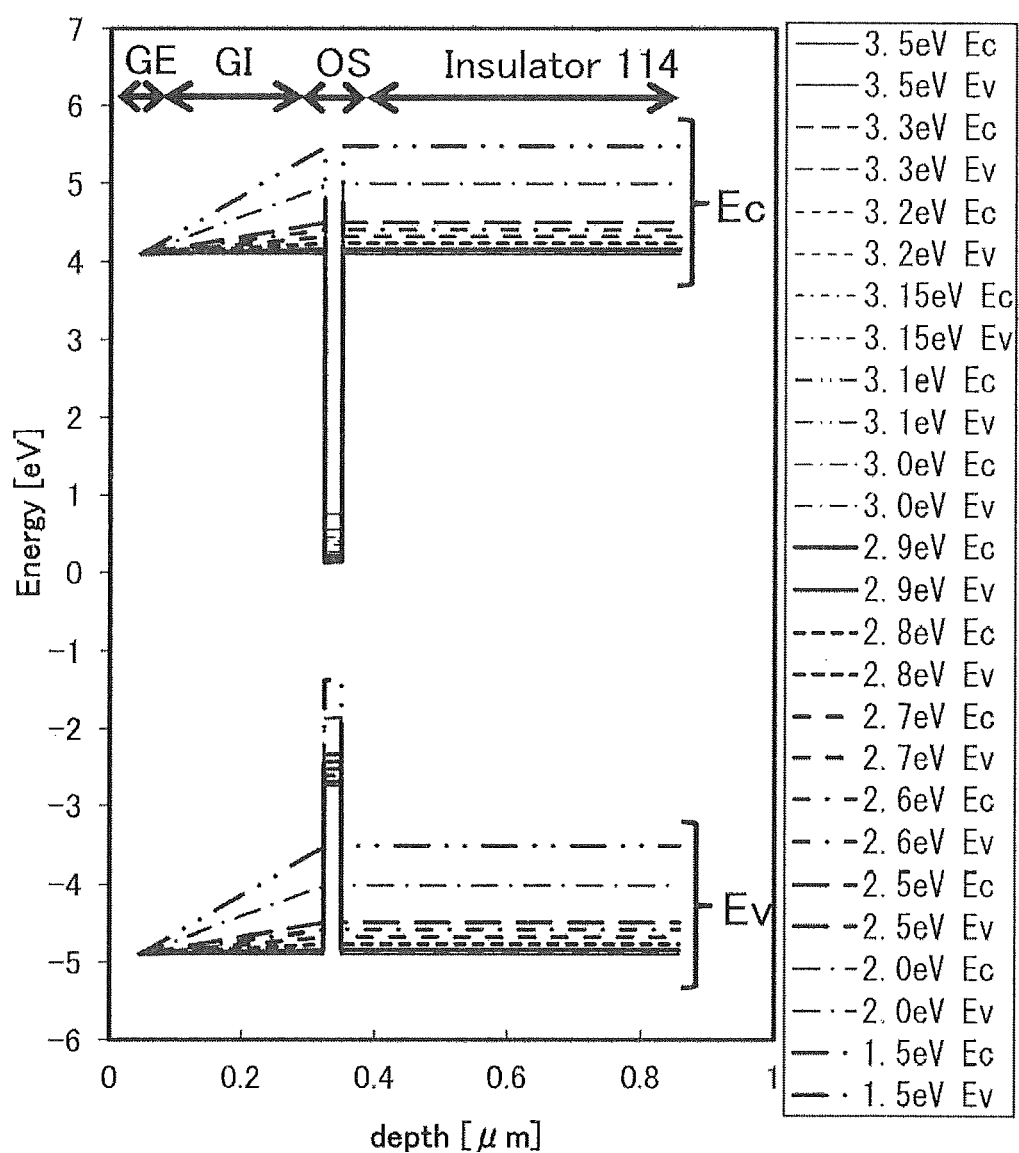
FIG. 11 shows a band structure of an oxide semiconductor and a gate insulator.

The energy gap was varied from 1.5 eV to 3.5 eV. Here, the values of the electron affinity and the donor density (carrier density) were adjusted so that the valence bands of single oxide semiconductors under conditions of different energy gaps are at the same position as physical properties before the connection. The donor density was set to $6.6 \times 10^{-9}$ [cm$^{-3}$] under the condition of a 3.2 eV energy gap. The results are shown in FIG. 11. In FIG. 11, the Fermi level is positioned at 0 eV.

Figure 12:
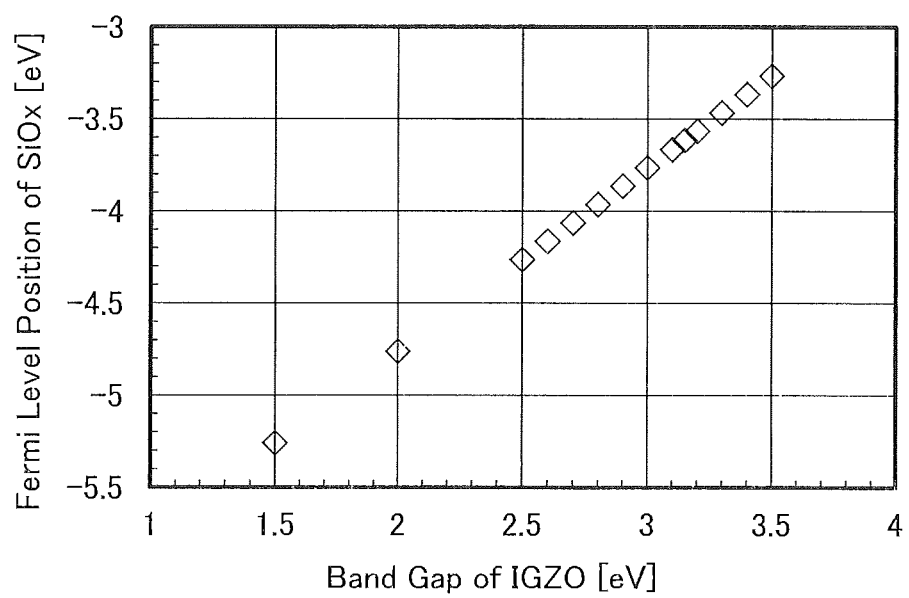
FIG. 12 shows a band structure.

Next, FIG. 12 shows the conduction band of the gate insulator at the interface with the oxide semiconductor at $V_{gs}$ of 30 V. In FIG. 12, the Fermi level is positioned at 0 eV.

Figure 13:
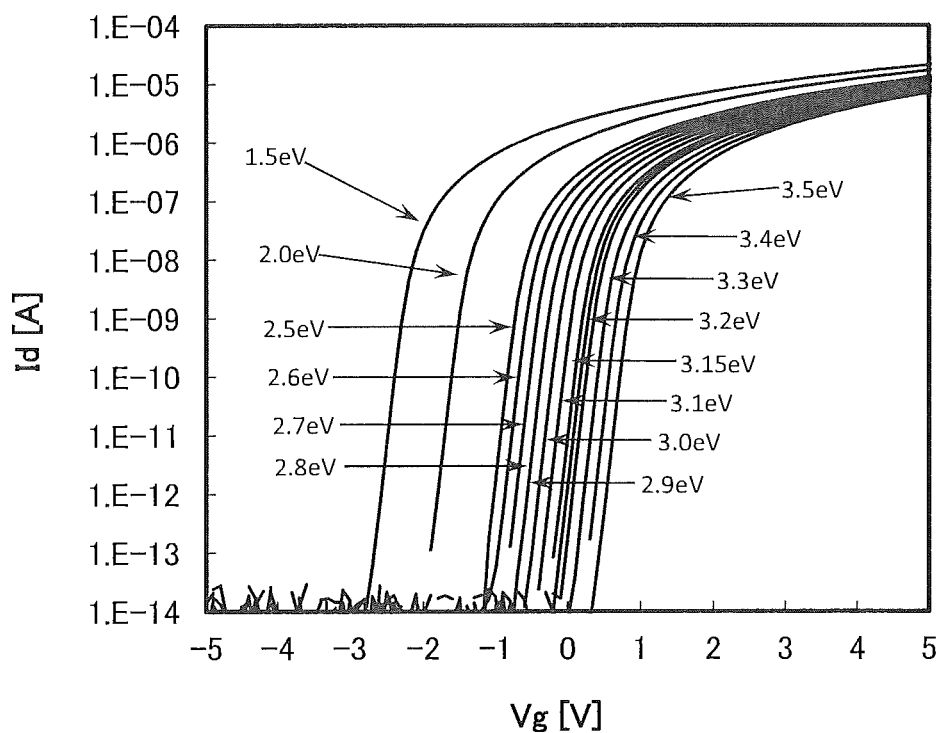
FIG. 13 shows $I_{ds}$–$V_{gs}$ characteristics of transistors.

Then, FIG. 13 shows $I_{ds}$-$V_{gs}$ characteristics of transistors in the case where the energy gaps of oxide semiconductors are changed. It is found that the $I_{ds}$-$V_{gs}$ characteristics and the threshold value shift in the negative direction as the energy gaps get smaller.

<Defect State>

As disclosed in Non-Patent Documents 1 and 2, E'-center, a hydrogen-complexed oxygen vacancy, NBOHC, and the like are known as defects in the gate insulator.

In this embodiment, the transition level of defect states in amorphous silicon oxide was obtained by first principles calculation. For the calculation, plane-wave basis first-principles calculation software Vienna ab-initio simulation package (VASP) was used. HSE06 was used for a hybrid functional, and GGA-PBE was used for the exchange-correlation term. The mixture ratio of an exact term was 0.4 and PAW was used for the pseudo potential. Cut-off energy of a plane wave was set to 800 eV. An amorphous silicon oxide model was calculated as follows: a molecular dynamics method was used as a calculation method; the structure was optimized by a melt quench method; and the number of atoms was set to 96, the pseudo potential of oxygen was set to O_h, and 1×1×1 k-point mesh was used as parameters used for the calculation.

Figure 8:
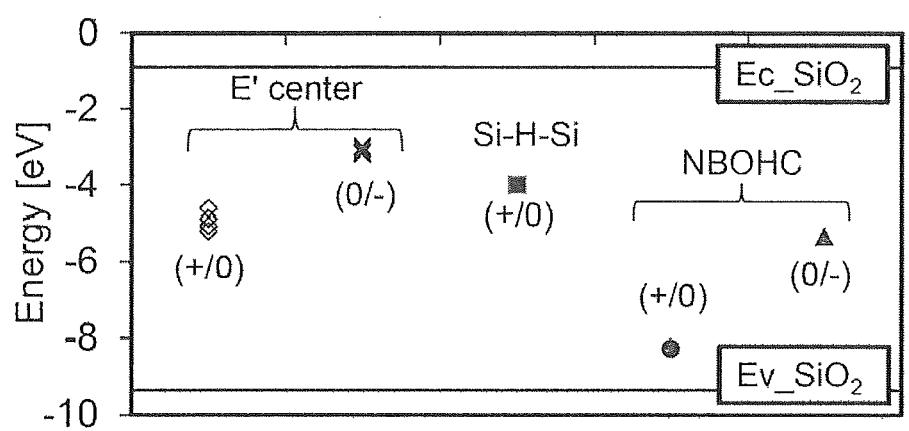
FIG. 8 shows a defect state in silicon oxide.

FIG. 8 shows transition levels of defect states in the silicon oxide which are obtained by calculation. Here, defect states corresponding to E'-center, a hydrogen-complexed oxygen vacancy (Si—H—Si), and NBOHC are referred to as F, $E_{Si-H-Si}$, and $E_{NBOHC}$, respectively. Here, in FIG. 8, a level indicated by (0/−) represents the Fermi energy in which a neutral electric charge state is changed to a negative electric charge state, and a level indicated by (+/0) represents the Fermi energy in which a positive electric charge state is changed to a neutral electric charge state. Here, for example, energy of a hydrogen-complexed oxygen vacancy, in which a positive electric charge state is changed to a neutral electric charge state, is represented by $E_{Si-H-Si(+/0)}$.

Figure 10:
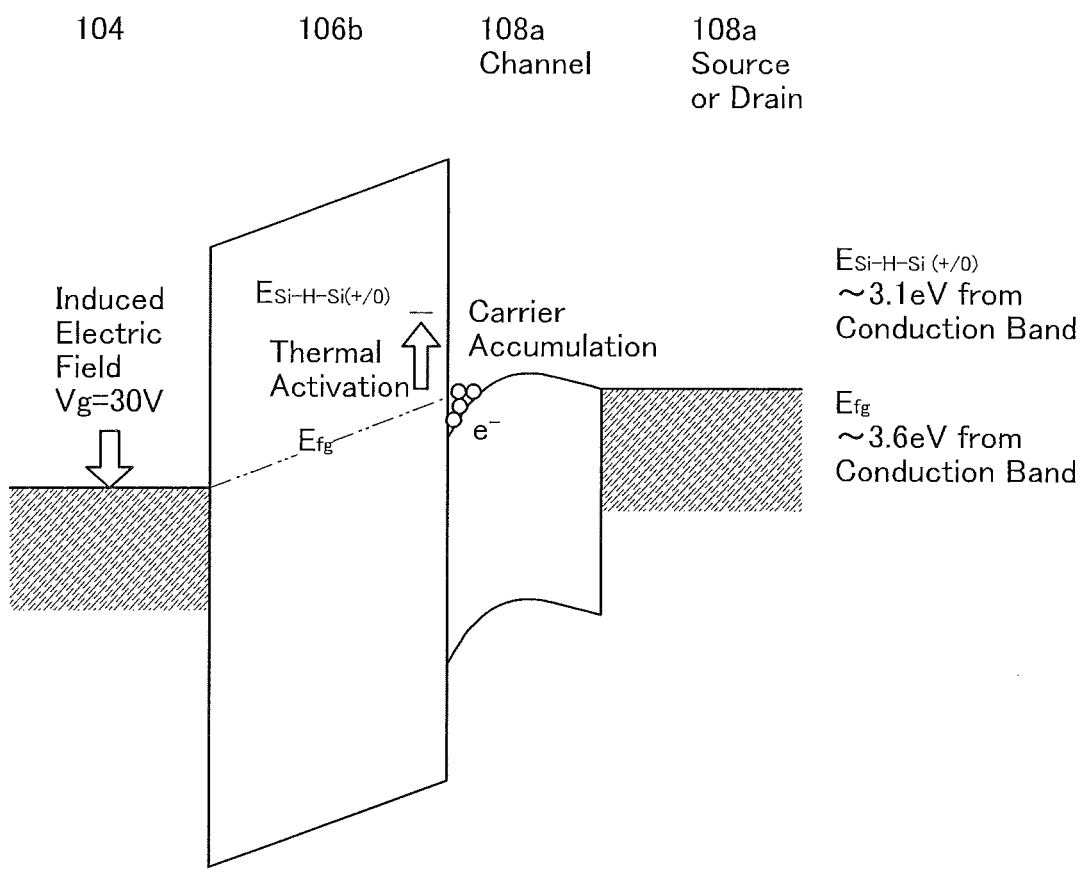
FIG. 10 shows transition of electrons.

As shown in FIG. 4, the activation energy $E_a$ was calculated as 0.45 eV at $V_1$ of 30 V. As shown in FIG. 7, the Fermi level of the gate insulator at $V_{gs}$ of 30 V is assumed to be $E_{fg}$. The energy between the conduction band and $E_{fg}$ was estimated to be 3.65 eV. In addition, according to FIG. 8, the energy between the conduction band of the gate insulator and the defect state $E_{Si-H-Si(+/0)}$ is about 3.1 eV. These relations are shown in the band diagram of FIG. 10.

Figure 9:
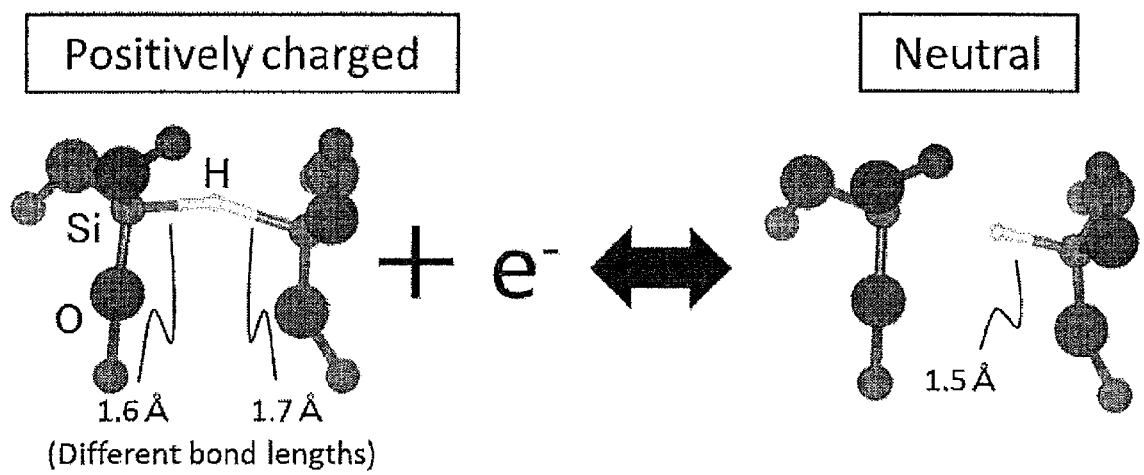
FIG. 9 shows a change in the electric charge states of defects.

The above results suggest that in the case where a positive electric charge state is changed to a neutral electric charge state, the energy between the defect state $E_{Si-H-Si}$ and the conduction band corresponds with the energy corresponding to a difference between $E_{fg}$ and $E_a$. Thus, this indicates that the reaction corresponding to the defect state $E_{Si-x-Si(+/0)}$ is one of the main causes of a change in threshold value. Here, the reaction in the case where a positive electric charge state is changed to a neutral electric charge state i.e., electrons are donated to the defect in a hydrogen-complexed oxygen vacancy is shown in the model diagram of FIG. 9.

Activation energy is preferably increased because the amount of electric charge trapped at the interface between the gate insulator and the oxide semiconductor and in the gate insulator can be reduced in some cases. To increase activation energy, the energy difference between the channel region of the transistor and the defect state can be increased. To increase activation energy, the energy at the conduction band minimum of the oxide semiconductor can be reduced and thus the electron affinity of the oxide semiconductor can be increased, for example.

As described above, $\Delta V_{th}$ is increased because electric charge is trapped in a trap of the gate insulator. Additionally, an element that is diffused easily like hydrogen is released from the gate insulator, so that fixed electric charge is generated in some cases in the gate insulator and at the interface between the gate insulator and the oxide semiconductor, leading to an increase of $\Delta V_{th}$. For example, reactions represented by General formulae (G1) and (G2) shown below and the like are possible.

[Chemical formula 1]

$$H_2O + e^- \rightleftharpoons OH.+H \quad (G1)$$

[Chemical Formula 2]

$$SiOH + e^- \rightleftharpoons SiO.+H \quad (G2)$$

Generation of fixed electric charge in the gate insulator can be explained as follows. First, a reaction represented by at least one of the above General formulae (G1) and (G2) occurs. By such a reaction, bonds in $H_2O$ and in SiOH are cut and thus fixed electric charge and hydrogen are generated. Here, hydrogen is an element that is diffused very easily. By diffusion of the generated hydrogen, the balance of the both sides of the reaction equation cannot be maintained. To recover the balance, another reaction occurs in a direction (right direction) in which the fixed electric charge is generated. Thus, fixed electric charge is increased and the amount of change in threshold value is increased over time.

Here, $\Delta V_{th}$ can be represented by Formula 2 shown below using α, β, and stress time t.

[Formula 2]

$$\Delta V_{th} = \alpha \times t^\beta \quad (2)$$

Here, Formula 2 expresses a reaction-diffusion (R-D) model disclosed in Non-Patent Document 4, and α is a parameter determined by the amounts of carrier traps and an initial defect due to the reaction, i.e., the amount of the initial reaction in the General formulae (G1) and (G2), and β is a parameter determined by diffusion.

Easiness for reaction is thought to be represented by α. For example, it is thought that α can be made small by making trap in the gate insulator less likely to be generated with higher activation energy. In addition, it is thought that α can be made small by suppressing the reaction represented by the General formulae (G1) and (G2) and the like.

It is thought that β is determined by diffusion and depends on easiness for diffusion of hydrogen, or the like, for example.

Here, the R-D model is described with reference to FIGS. 44A to 44C and General formula (G3) shown below.

[Chemical Formula 3]

$$AB + e^- \rightleftharpoons A.+B \quad (G3)$$

Figure 44A:
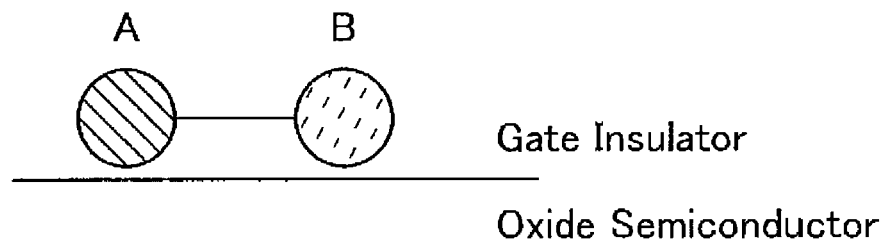
FIGS. 44A to 44C each illustrate a model.

FIG. 44A illustrates that a compound containing an element A and an element B exists at the interface between the gate insulator and the oxide semiconductor and in its vicinity. In the compound, the elements A and B are bonded.

Figure 44B:
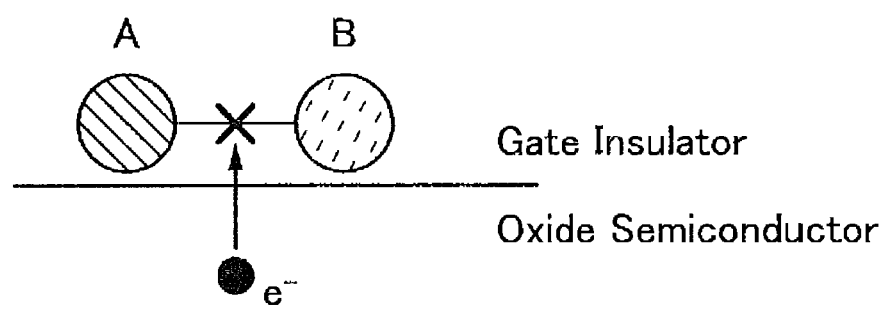

FIG. 44B illustrates an initial reaction process. As illustrated in FIG. 44B, the bond between the elements A and B is cut by accepting an electron (e$^-$) (General formula (G3)).

Donation and acceptance of electrons are likely to occur by applying an electric field to the gate insulator and the oxide semiconductor. Easiness for the initial reaction can be expressed by the parameter α.

Figure 44C:
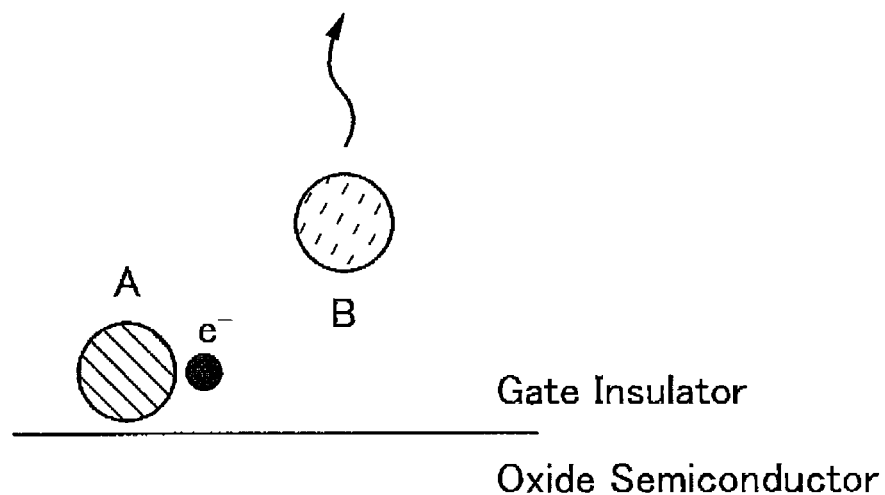

After that, the element B is diffused into the gate insulator as illustrated in FIG. 44C. Easiness for the diffusion can be expressed by the parameter β.

<Oxide Semiconductor>

The energy gap of the oxide semiconductor included in the channel region of the transistor of one embodiment of the present invention is preferably 2.6 eV or more and 3.3 eV or less, further preferably 2.7 eV or more and 3.1 eV or less, and still further preferably 2.9 eV or more and 3.1 eV or less.

The oxide semiconductor included in the channel region of the transistor of one embodiment of the present invention preferably contains indium and zinc. In addition, the oxide semiconductor preferably contains an element M. The atomic proportions of indium, the element M, and zinc are represented by x, y, z, respectively.

The energy gap can be made much smaller in some cases by increasing the atomic proportion of indium. The energy gap can be made much smaller in some cases by decreasing the atomic proportion of the element M. The electron affinity can be made much larger in some cases by decreasing the atomic proportion of the element M.

It is preferable that x/(x+y+z) be greater than or equal to 0.33 and less than 0.7. In addition, it is preferable that y/(x+y+z) be greater than or equal to 0.8 and less than 0.33. Here, the element M is preferably gallium.

For example, the electron affinity can be increased by increasing the carrier density of the oxide semiconductor of one embodiment of the present invention. The carrier density of the oxide semiconductor included in the channel region of the transistor of one embodiment of the present invention is preferably higher than or equal to $1\times10^{5}$ cm$^{-3}$ and lower than or equal to $5\times10^{17}$ cm$^{-3}$, further preferably higher than or equal to $1\times10^{7}$ cm$^{-3}$ and lower than $1\times10^{17}$ cm$^{-3}$, still further preferably higher than or equal to $1\times10^{9}$ cm$^{-3}$ and lower than or equal to $5\times10^{16}$ cm$^{-3}$, yet further preferably higher than or equal to $1\times10^{10}$ cm$^{-3}$ and lower than or equal to $1\times10^{16}$ cm$^{-3}$, and yet still preferably higher than or equal to $1\times10^{11}$ cm$^{-3}$ and lower than or equal to $1\times10^{15}$ cm$^{-3}$.

Here, when hydrogen is bonded to an oxygen vacancy (referred to as $V_O$) of the oxide semiconductor to form $V_OH$, the carrier density is increased in some cases.

When the carrier density is increased too much, the $I_{ds}$-$V_{gs}$ characteristics of the transistor are largely shifted in the negative direction. That is, the threshold value is largely shifted in the negative direction. The transistor tends to be normally on when a shift in the negative direction occurs excessively. Note that a normally-on transistor refers to a transistor in which current (e.g., current between a drain and a source ($I_{ds}$)) flows at a gate voltage $V_g$ of 0 V.

The hydrogen concentration in the oxide semiconductor included in the channel region of the transistor of one embodiment of the present invention is preferably lower than or equal to $2\times10^{20}$ atoms/cm$^3$, further preferably lower than or equal to $5\times10^{19}$ atoms/cm$^3$, still further preferably lower than or equal to $1\times10^{19}$ atoms/cm$^3$, and yet further preferably lower than or equal to $5\times10^{18}$ atoms/cm$^3$.

<Threshold Value of Transistor>

As described above, the threshold value is shifted excessively in the negative direction in the case where the energy gap becomes too small and the carrier density is increased too much.

Here, for example, in a transistor whose channel length is greater than or equal to 10 nm and less than or equal to 10000 nm, the threshold value when a potential difference of 0.1 V or more and 15 V or less is applied between a drain and a source of the transistor is preferably greater than or equal to −0.5 V and less than or equal to 2 V, further preferably greater than or equal to −0.3 V and less than or equal to 1 V.

<Projected Density of States>

In the In—Ga—Zn oxide, the total density of states and the projected density of states (PDOS) of indium, gallium, zinc, and oxygen were calculated. Calculation conditions are shown in Table 2.

TABLE 2

| Software | CASTEP |
|---|---|
| Calculation method | calculation method for electronic states |
| Model | c-InGaZnO$_4$ model with 28 atoms |
| Cutoff energy | 800 eV |
| Functional | GGA/PBEsol |
| K point | 3 × 4 × 4 |

Figure 47:
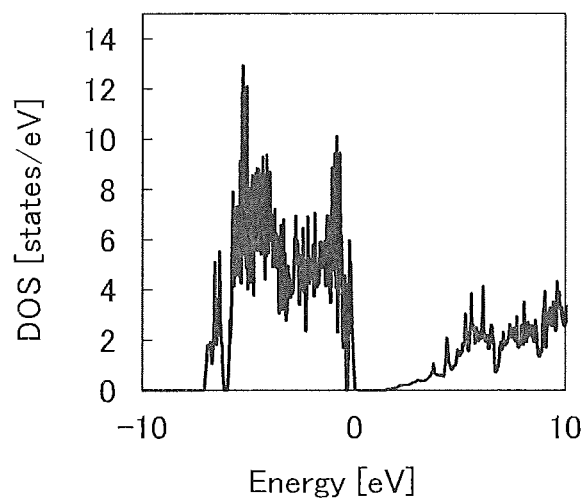
FIG. 47 shows the calculation result of the density of states of an In—Ga—Zn oxide.
Figure 48A:
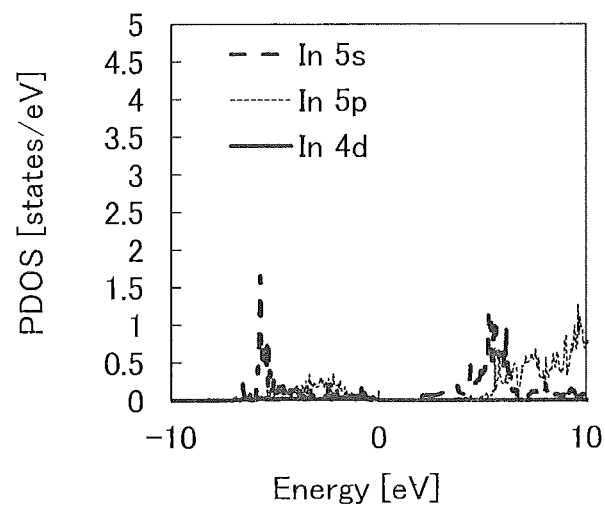
FIGS. 48A and 48B show the calculation results of the projected density of states of indium and gallium in an In—Ga—Zn oxide.
Figure 48B:
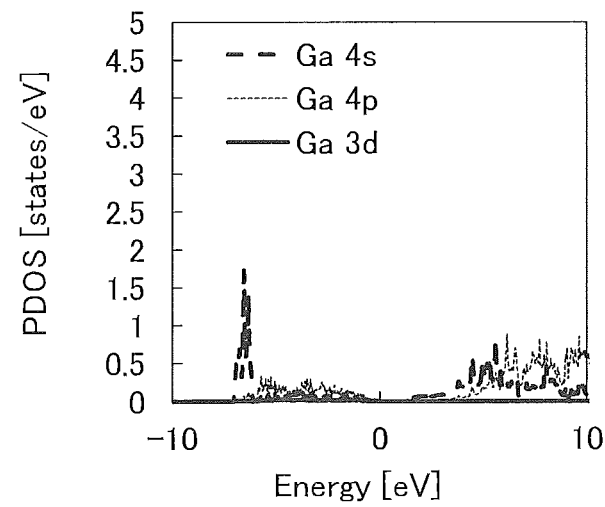
Figure 49A:
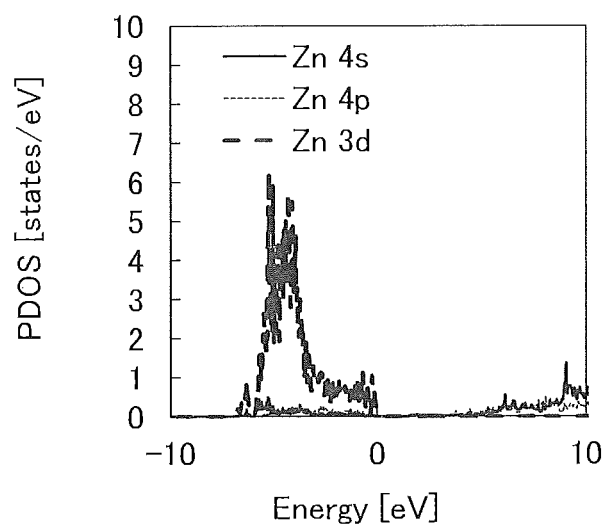
FIGS. 49A and 49B show the calculation results of the projected density of states of zinc and oxygen in the In—Ga—Zn oxide.
Figure 49B:
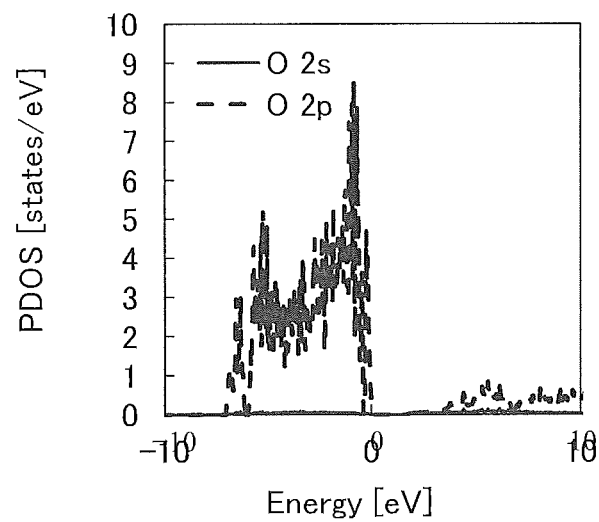

FIG. 47 shows the total density of states of the In—Ga—Zn oxide. The projected density of states of indium, gallium, zinc, and oxygen are shown in FIG. 48A, FIG. 48B, FIG. 49A, and FIG. 49B, respectively.

FIGS. 48A and 48B and FIGS. 49A and 49B indicate that the orbitals of the all four elements contribute to the conduction band minimum (CBM), whereas the 2p orbital of oxygen mainly contributes to the valence band maximum (VBM).

Embodiment 2

In this embodiment, transistors of one embodiment of the present invention will be described.

Structure Example 1 of Transistor

A structure example of the transistor of one embodiment of the present invention is shown below.

Figure 1B:
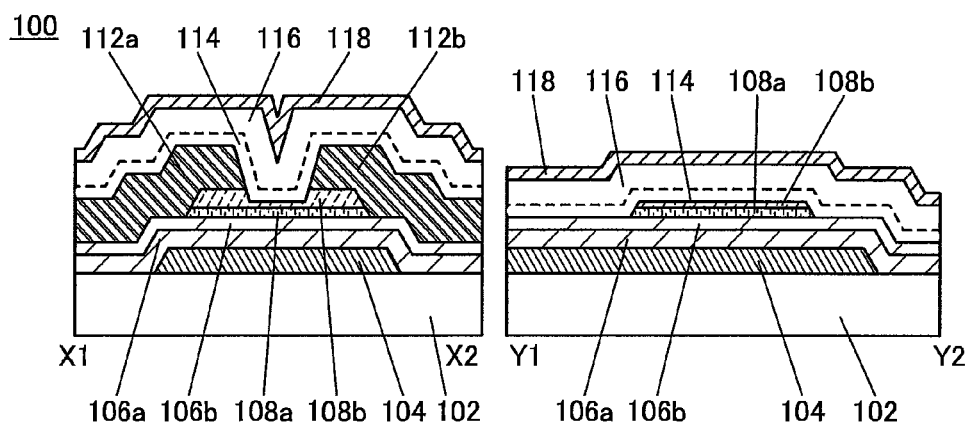
Figure 1C:
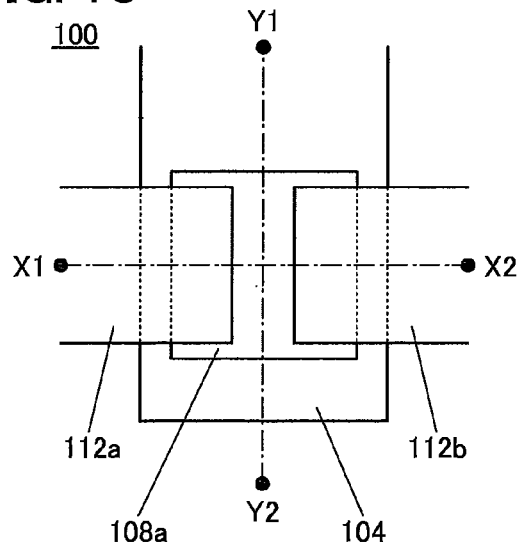

FIG. 1C is a top view of the transistor 100 that is a semiconductor device of one embodiment of the present invention. FIGS. 1A and 1B are cross-sectional views taken along the dashed-dotted line X1-X2 in FIG. 1C, and cross-sectional views taken along the dashed-dotted line Y1-Y2 in FIG. 1C.

Note that in FIG. 1C, some components of the transistor 100 (e.g., an insulating film functioning as a gate insulator) are not illustrated to avoid complexity. The direction of the dashed-dotted line X1-X2 may be called a channel length direction, and the direction of the dashed-dotted line Y1-Y2 may be called a channel width direction. As in FIG. 1C, some components are not illustrated in some cases in top views of transistors described below.

The transistor 100 includes the conductor 104 functioning as a gate electrode over a substrate 102, the insulator 106a over the substrate 102 and the conductor 104, the insulator 106b over the insulator 106a, the oxide semiconductor 108a over the insulator 106b, the conductor 112a functioning as a source electrode electrically connected to the oxide semiconductor 108a, and the conductor 112b functioning as a drain electrode electrically connected to the oxide semiconductor 108a. The insulators 106a and 106b function as a gate insulator of the transistor 100. Over the transistor 100, specifically, over the conductors 112a and 112b and the oxide semiconductor 108a, insulators 114, 116, and 118 are provided. The insulators 114, 116, and 118 function as a protective insulating film for the transistor 100. The insulator 114 and the insulator 116 are also referred to as a first protective insulating film and a second protective insulating film, respectively.

Here, as illustrated in FIG. 1B, the transistor 100 may have a stacked-layer structure in which two layers of the oxide semiconductor 108a on the conductor 104 side and an oxide semiconductor 108b over the oxide semiconductor 108a are stacked. Note that the conductor 104 functions as a gate electrode.

As the oxide semiconductor 108a, the oxide semiconductor 108a described in Embodiment 1 can be used.

For the oxide semiconductor 108a, an In-M (M is aluminum, gallium, yttrium, or tin) oxide or an In-M-Zn oxide can be used. It is particularly preferable to use an In-M-Zn oxide for the oxide semiconductor 108.

The oxide semiconductor 108a preferably has an atomic ratio of In:M:Zn=4:$\alpha$1 (1.5≤$\alpha$1≤2.5):$\alpha$2 (2.5≤$\alpha$2≤3.5). The oxide semiconductor 108b preferably has an atomic ratio of In:M:Zn=1:$\beta$1 (0.8≤$\beta$1≤1.2):$\beta$2 (0.8≤$\beta$2≤1.2).

When the oxide semiconductor 108a has the above atomic ratio, i.e., a composition in which the atomic proportion of In is higher than that of M, the conduction band of the oxide semiconductor can be made deeper than the vacuum level in some cases. The field-effect mobility (also simply referred to as mobility or μFE) of the transistor 100 can be improved. Specifically, the field-effect mobility of the transistor 100 can be higher than 10 cm$^2$/Vs, preferably higher than 30 cm$^2$/Vs.

For example, the use of the transistor with high field-effect mobility for a gate driver that generates a gate signal (specifically, a demultiplexer connected to an output terminal of a shift register included in a gate driver) allows a semiconductor device or a display device to have a narrow frame.

A change in the electrical characteristics of the transistor 100 due to light irradiation can be reduced by the oxide semiconductor 108b included in the transistor 100. The atomic proportion of In in the oxide semiconductor 108b is lower than that in the oxide semiconductor 108a, and thus the oxide semiconductor 108b has a larger $E_g$ than the oxide semiconductor 108a. For this reason, in light irradiation, the amount of light absorbed by the oxide semiconductor can be reduced. Therefore, the oxide semiconductor having a stacked-layer structure of the oxide semiconductor 108a and the oxide semiconductor 108b has higher resistance to a negative bias stress test with light irradiation.

It is preferable that the insulators 114 and 116 each include a region (oxygen-excess region) including oxygen in excess of that in the stoichiometric composition. In other words, the insulators 114 and 116 are insulating films capable of releasing oxygen. Note that the oxygen-excess region is formed in the insulators 114 and 116 in such a manner that oxygen is introduced into the insulators 114 and 116 after the deposition, for example. As a method for introducing oxygen, an ion implantation method, an ion doping method, a plasma immersion ion implantation method, plasma treatment, or the like may be employed. Oxygen released from the insulators 114 and 116 is diffused into the oxide semiconductor 108a, so that an oxygen vacancy in the oxide semiconductor 108a can be filled.

In order to fill an oxygen vacancy in the oxide semiconductor 108a, a channel region in the oxide semiconductor 108b and its vicinity preferably have a small thickness. For example, the thickness of the channel region in the oxide semiconductor 108b and its vicinity is preferably greater than or equal to 1 nm and less than or equal to 20 nm, and further preferably greater than or equal to 3 nm and less than or equal to 10 nm.

Furthermore, in order to fill an oxygen vacancy in the oxide semiconductor 108a, the oxide semiconductor 108b preferably has high oxygen permeability. When the oxide semiconductor 108b has high oxygen permeability, excess oxygen in the insulators 114 and 116 can be favorably transmitted through the oxide semiconductor 108a.

As described above, in the semiconductor device of one embodiment of the present invention, an oxide semiconductor has a stacked-layer structure and an insulator in contact with the oxide semiconductor contains excess oxygen; thus, the reliability of the semiconductor device can be high. Furthermore, in one embodiment of the present invention, the temperature in the manufacturing process of the semiconductor device can be low (typically, lower than 400° C. or lower than 375° C. (preferably, higher than or equal to 340° C. and lower than or equal to 360° C.)).

Other components of the semiconductor device of this embodiment will be described below in detail.

<Substrate>

There is no particular limitation on a material and the like of the substrate 102 as long as the material has heat resistance high enough to withstand at least heat treatment performed later. For example, a glass substrate, a ceramic substrate, a quartz substrate, a sapphire substrate, or the like may be used as the substrate 102. Alternatively, a single crystal semiconductor substrate or a polycrystalline semiconductor substrate made of silicon or silicon carbide, a compound semiconductor substrate made of silicon germanium or the like, an SOI substrate, or the like may be used as the substrate 102. Still alternatively, any of these substrates provided with a semiconductor element may be used as the substrate 102. In the case where a glass substrate is used as the substrate 102, a glass substrate having any of the following sizes can be used: the 6th generation, the 7th generation, the 8th generation, the 9th generation, and the 10th generation. Thus, a large-sized display device can be manufactured. Such a large-sized substrate is preferably used because manufacturing cost can be reduced.

Alternatively, a flexible substrate may be used as the substrate 102, and the transistor 100 may be provided directly on the flexible substrate. Alternatively, a separation layer may be provided between the substrate 102 and the transistor 100. The separation layer can be used when part or the whole of a semiconductor device formed over the separation layer is separated from the substrate 102 and transferred onto another substrate. In such a case, the transistor 100 can be transferred to a substrate having low heat resistance or a flexible substrate as well.

<Conductors Functioning as Gate Electrode and Source and Drain Electrodes>

The conductor 104 functioning as the gate electrode, the conductor 112a functioning as the source electrode, and the conductor 112b functioning as the drain electrode each can be formed using a metal element selected from chromium (Cr), copper (Cu), aluminum (Al), gold (Au), silver (Ag), zinc (Zn), molybdenum (Mo), tantalum (Ta), titanium (Ti), tungsten (W), manganese (Mn), nickel (Ni), iron (Fe), and cobalt (Co); an alloy including any of these metal element as a component; an alloy including a combination of any of these metal elements; or the like.

Furthermore, the conductors 104, 112a, and 112b may have a single-layer structure or a stacked-layer structure of two or more layers. For example, a single-layer structure of an aluminum film containing silicon, a two-layer structure in which a titanium film is stacked over an aluminum film, a two-layer structure in which a titanium film is stacked over a titanium nitride film, a two-layer structure in which a tungsten film is stacked over a titanium nitride film, a two-layer structure in which a tungsten film is stacked over a tantalum nitride film or a tungsten nitride film, a three-layer structure in which a titanium film, an aluminum film, and a titanium film are stacked in this order, and the like can be given. Alternatively, an alloy film or a nitride film which contains aluminum and one or more elements selected from titanium, tantalum, tungsten, molybdenum, chromium, neodymium, and scandium may be used.

The conductors 104, 112a, and 112b can be formed using a light-transmitting conductive material such as indium tin oxide, indium oxide containing tungsten oxide, indium zinc oxide containing tungsten oxide, indium oxide containing titanium oxide, indium tin oxide containing titanium oxide, indium zinc oxide, or indium tin oxide to which silicon oxide is added.

A Cu—X alloy film (X is Mn, Ni, Cr, Fe, Co, Mo, Ta, or Ti) may be used for the conductors 104, 112a, and 112b. The use of a Cu—X alloy film enables the manufacturing cost to be reduced because wet etching process can be used in the processing.

<Insulators Functioning as Gate Insulator>

As each of the insulators 106a and 106b functioning as the gate insulator of the transistor 100, an insulating layer including at least one of the following films formed by a plasma enhanced chemical vapor deposition (PECVD) method, a sputtering method, or the like can be used: a silicon oxide film, a silicon oxynitride film, a silicon nitride oxide film, a silicon nitride film, an aluminum oxide film, a hafnium oxide film, an yttrium oxide an, a zirconium oxide film, a gallium oxide film, a tantalum oxide film, a magnesium oxide film, a lanthanum oxide film, a cerium oxide film, and a neodymium oxide film. Note that instead of a stacked-layer structure of the insulators 106a and 106b, an insulating film of a single layer formed using a material selected from the above or an insulating film of three or more layers may be used.

The insulator 106a functions as a blocking film which inhibits penetration of oxygen. For example, in the case where excess oxygen is supplied to the insulator 106b, the insulator 114, the insulator 116, and/or the oxide semiconductor 108, the insulator 106a can inhibit penetration of oxygen.

Note that the insulator 106b that is in contact with the oxide semiconductor 108 functioning as a channel region of the transistor 100 is preferably an oxide insulating film and preferably includes a region including oxygen in excess of that in the stoichiometric composition (oxygen-excess region). In other words, the insulator 106b is an insulating film capable of releasing oxygen. In order to provide the oxygen-excess region in the insulator 106b, the insulator 106b is formed in an oxygen atmosphere, for example. Alternatively, the oxygen-excess region may be formed by introduction of oxygen into the insulator 106b after the deposition. As a method for introducing oxygen, an ion implantation method, an ion doping method, a plasma immersion ion implantation method, plasma treatment, or the like may be employed.

In the case where hafnium oxide is used for the insulator 106b, the following effect is attained. Hafnium oxide has a higher dielectric constant than silicon oxide and silicon oxynitride. Therefore, the insulator 106b using hafnium oxide can have a larger thickness than the insulator 106b using silicon oxide; thus, leakage current due to tunnel current can be low. That is, it is possible to provide a transistor with a low off-state current. Moreover, hafnium oxide with a crystalline structure has a higher dielectric constant than hafnium oxide with an amorphous structure. Therefore, it is preferable to use hafnium oxide with a crystalline structure in order to provide a transistor with a low off-state current. Examples of the crystalline structure include a monoclinic crystal structure and a cubic crystal structure. Note that one embodiment of the present invention is not limited to the above examples.

In this embodiment, a silicon nitride film is formed as the insulator 106a, and a silicon oxide film is formed as the insulator 106b. A silicon nitride film has a higher dielectric constant than a silicon oxide film and needs a larger thickness for capacitance equivalent to that of a silicon oxide film. Thus, when a silicon nitride film is used as the gate insulator of the transistor 100, the physical thickness of the gate insulator can be increased. This makes it possible to reduce a decrease in the withstand voltage of the transistor 100 and furthermore to increase the withstand voltage, thereby reducing electrostatic discharge damage to the transistor 100.

<Oxide Semiconductor>

The oxide semiconductors 108a and 108b can be formed using any of the materials containing indium, the element M, and zinc described above. In the case where the oxide semiconductor 108 includes an In-M-Zn oxide, it is preferable that the atomic ratio of metal elements of a sputtering target used for forming the In-M-Zn oxide satisfy In M and Zn M. As the atomic ratio of metal elements of such a sputtering target, In:M:Zn=1:1:1, In:M:Zn=1:1:1.2, In:M:Zn=2:1:3, In:M:Zn=3:1:2, and In:M:Zn=4:2:4.1 are preferable. In the case where the oxide semiconductor 108 includes an In-M-Zn oxide, it is preferable to use a target including a polycrystalline In-M-Zn oxide as the sputtering target. With the use of the target including a polycrystalline In-M-Zn oxide, the oxide semiconductor 108 having crystallinity can be easily formed. Note that the atomic ratio of metal elements of the deposited oxide semiconductor 108 varies from the above atomic ratio of metal elements of the sputtering target within a range of ±40% as an error. For example, when a sputtering target with an atomic ratio of In:Ga:Zn=4:2:4.1 is used, the atomic ratio of In to Ga and Zn in the oxide semiconductor 108 may be approximately 4:2:3.

The oxide semiconductor 108a can be formed using the sputtering target with an atomic ratio of In:M:Zn=2:1:3, In:M:Zn=3:1:2, In:M:Zn=4:2:4.1, or the like. It is preferable that the oxide semiconductor 108a have an atomic ratio of In:M:Zn=4:α1 (1.5≤α1≤2.5):α2 (2.5≤α2≤3.5).

The oxide semiconductor 108b can be formed using the sputtering target with an atomic ratio of In:M:Zn=1:1:1, In:M:Zn=1:1:1.2, or the like. It is preferable that the oxide semiconductor 108b have an atomic ratio of In:M:Zn=1:β1 (0.8≤β1≤1.2):β2 (0.8≤β2≤1.2). Note that the atomic ratio of metal elements in the sputtering target used for forming the oxide semiconductor 108b does not necessarily satisfy In M and Zn≥M, and may satisfy In≥M and Zn<M. For example, the sputtering target can have an atomic ratio of In:M:Zn=1:3:2, In:M:Zn=1:3:4, or In:M:Zn=1:3:6.

With the use of an oxide semiconductor having a wide energy gap as the oxide semiconductors 108a and 108b, the off-state current of the transistor 100 can be reduced. Furthermore, the energy gap of the oxide semiconductor 108b is preferably larger than that of the oxide semiconductor 108a. The energy gap of the oxide semiconductor 108b is preferably larger than that of the oxide semiconductor 108a by 0.15 eV or more or 0.5 eV or more and 2 eV or less or 1 eV or less. It is preferable to use the following oxide semiconductor film.

The thickness of each of the oxide semiconductor 108a and 108b is greater than or equal to 3 nm and less than or equal to 200 nm, preferably greater than or equal to 3 nm and less than or equal to 100 nm, and further preferably greater than or equal to 3 nm and less than or equal to 50 nm.

An oxide semiconductor film with a low carrier density is used as the oxide semiconductor 108b so that the carrier density of the oxide semiconductor 108b can be preferably lower than $1\times10^{15}/cm^3$, further preferably lower than $1\times10^{13}/cm^3$, still further preferably lower than $1\times10^{11}/cm^3$, and yet further preferably lower than $1\times10^{9}/cm^3$.

Note that it is preferable to use, as each of the oxide semiconductors 108a and 108b, an oxide semiconductor film in which the impurity concentration is low and the density of defect states is low, in which case the transistor can have more excellent electrical characteristics. Examples of impurities are hydrogen, nitrogen, alkali metal, alkaline earth metal, and the like.

Even when an element has an extremely low off-state current and a channel width W of $1\times10^6$ μm and a channel length L of 10 μm, an off-state current can be less than or equal to the measurement limit of a semiconductor parameter analyzer, i.e., less than or equal to $1\times10^{-13}$ A, at voltage (drain voltage) between a source electrode and a drain electrode of from 1 V to 10 V.

The oxide semiconductor 108a may include a region having a lower hydrogen concentration than the oxide semiconductor 108b. When the oxide semiconductor 108a includes the region having a lower hydrogen concentration than the oxide semiconductor 108b, a highly reliable semiconductor device can be achieved in some cases.

When silicon or carbon that is one of elements belonging to Group 14 is contained in the oxide semiconductor 108a, oxygen vacancies are increased in the oxide semiconductor 108a, and the oxide semiconductor 108a becomes an n-type film. Thus, the concentration of silicon or carbon (the concentration is measured by SIMS) in the oxide semiconductor 108a or the concentration of silicon or carbon (the concentration is measured by SIMS) in the vicinity of an interface with the oxide semiconductor 108a is set to be lower than or equal to $2\times10^{18}$ atoms/cm$^3$, preferably lower than or equal to $2\times10^{17}$ atoms/cm$^3$.

In addition, the concentration of alkali metal or alkaline earth metal in the oxide semiconductor 108a, which is measured by SIMS, is lower than or equal to $1\times10^{18}$ atoms/cm$^3$, preferably lower than or equal to $2\times10^{16}$ atoms/cm$^3$. Alkali metal and alkaline earth metal might generate carriers when bonded to an oxide semiconductor, in which case the off-state current of the transistor might be increased. Therefore, it is preferable to reduce the concentration of alkali metal or alkaline earth metal in the oxide semiconductor 108a.

Furthermore, when including nitrogen, the oxide semiconductor 108a easily becomes n-type by generation of electrons serving as carriers and an increase of carrier density. Thus, when a transistor including an oxide semiconductor film contains nitrogen too much, a shift in the negative direction occurs excessively in some cases. Nitrogen in the oxide semiconductor film is preferably reduced as much as possible; the concentration of nitrogen which is measured by SIMS is preferably, for example, lower than or equal to $5\times10^{18}$ atoms/cm$^3$.

Each of the oxide semiconductors 108a and 108b may have a non-single-crystal structure, for example. The non-single-crystal structure includes a c-axis aligned crystalline oxide semiconductor (CAAC-OS) which is described later, a polycrystalline structure, a microcrystalline structure, or an amorphous structure, for example. Among the non-single-crystal structures, the amorphous structure has the highest density of defect states, whereas the CAAC-OS has the lowest density of defect states.

<Band Structure 2>

Figure 14A:
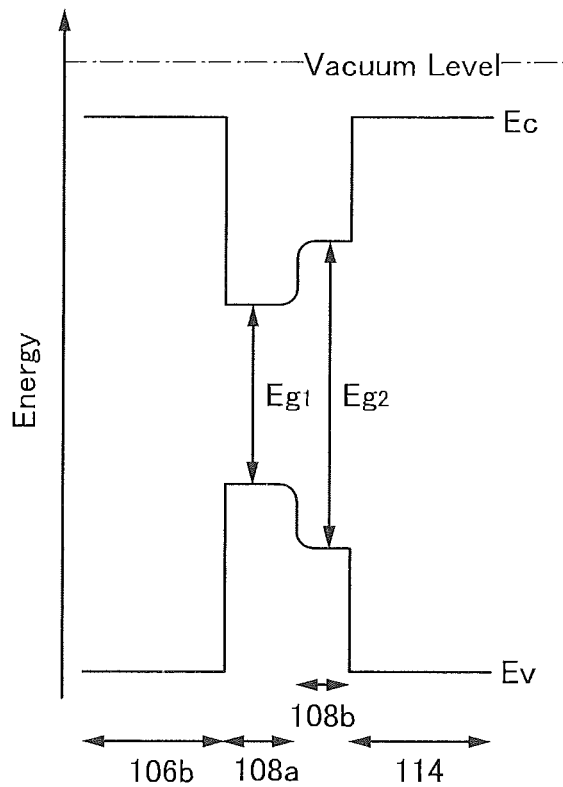
FIGS. 14A and 14B each show a band structure.

FIG. 14A shows a band structure including the oxide semiconductors 108a and 108b as the oxide semiconductor having a stacked-layer structure. Note that the conductor 104 is not illustrated in FIG. 14A.

FIG. 14A shows an example of a band structure in the thickness direction of a stack of the insulator 106b, the oxide semiconductor 108a, the oxide semiconductor 108b, and the insulator 114. For easy understanding, energy level of the conduction band minimum ($E_c$) of each of the insulator 106b, the oxide semiconductor 108a, the oxide semiconductor 108b, and the insulator 114 is shown in the band structure.

In the band structure of FIG. 14A, a silicon oxide film is used as each of the insulators 106b and 114, an oxide semiconductor film formed using a metal oxide target with an atomic ratio of metal elements of In:Ga:Zn=4:2:4.1 is used as the oxide semiconductor 108a, and a metal oxide film formed using a metal oxide target with an atomic ratio of metal elements of In:Ga:Zn=1:1:1.2 is used as the oxide semiconductor 108b.

As illustrated in FIG. 14A, the energy level of the conduction band minimum gradually varies between the oxide semiconductors 108a and 108b. In other words, the energy level of the conduction band minimum is continuously varied or continuously connected. To obtain such a band structure, there exists no impurity, which forms a defect state such as a trap center or a recombination center, at the interface between the oxide semiconductors 108a and 108b.

To form a continuous junction between the oxide semiconductor 108a and the oxide semiconductor 108b, the films are formed successively without exposure to the air by using a multi-chamber deposition apparatus (sputtering apparatus) provided with a load lock chamber. Each chamber of the sputtering apparatus is preferably evacuated to be a high vacuum (to a degree of approximately $5\times10^{-7}$ Pa to $1\times10^{-4}$ Pa) with an adsorption vacuum pump such as a cryopump in order to remove water or the like, which serves as an impurity against the oxide semiconductor, as much as possible. Alternatively, a turbo molecular pump and a cold trap are preferably combined to prevent a backflow of a gas, especially a gas containing carbon or hydrogen, from an exhaust system into the chamber.

With the band structure of FIG. 14A, the oxide semiconductor 108a serves as a well, and a channel region is formed in the oxide semiconductor 108a in the transistor with the stacked-layer structure.

In the case where the oxide semiconductor 108b is not provided, defect states might be formed in the oxide semiconductor 108a. However, in the above stacked-layer structure, the defect states can be formed in the oxide semiconductor 108b. Thus, the defect states can be distanced away from the oxide semiconductor 108a.

In addition, the defect states might be more distant from the vacuum level than the energy level of the conduction band minimum ($E_c$) of the oxide semiconductor 108a functioning as a channel region, so that electrons are likely to be accumulated in the defect states. When the electrons are accumulated in the defect states, the electrons become negative fixed electric charge, so that the threshold voltage of the transistor is shifted in the positive direction. Therefore, it is preferable that the energy level of the defect states be closer to the vacuum level than the energy level of the conduction band minimum ($E_c$) of the oxide semiconductor 108a. Such a structure inhibits accumulation of electrons in the defect states. As a result, the on-state current and the field-effect mobility of the transistor can be increased.

In FIG. 14A, the energy level of the conduction band minimum of the oxide semiconductor 108b is closer to the vacuum level than that of the oxide semiconductor 108a. Typically, a difference in energy level between the conduction band minimum of the oxide semiconductor 108a and the conduction band minimum of the oxide semiconductor 108b is 0.15 eV or more or 0.5 eV or more and 2 eV or less or 1 eV or less. That is, the difference between the electron affinity of the oxide semiconductor 108b and the electron affinity of the oxide semiconductor 108a is 0.15 eV or more or 0.5 eV or more and 2 eV or less or 1 eV or less.

In such a structure, the oxide semiconductor 108a serves as a main path of current and functions as a channel region. In addition, since the oxide semiconductor 108b includes one or more metal elements included in the oxide semiconductor 108a in which a channel region is formed, interface scattering is less likely to occur at the interface between the oxide semiconductor 108a and the oxide semiconductor 108b. Thus, the transistor can have high field-effect mobility because the movement of carriers is not hindered at the interface.

To prevent the oxide semiconductor 108b from functioning as part of a channel region, a material having sufficiently low conductivity is used for the oxide semiconductor 108b. Alternatively, a material which has a smaller electron affinity (a difference in energy level between the vacuum level and the conduction band minimum) than the oxide semiconductor 108a and has a difference in energy level in the conduction band minimum from the oxide semiconductor 108a (band offset) is used for the oxide semiconductor 108b. Furthermore, to inhibit generation of a difference between threshold voltages due to the value of the drain voltage, it is preferable to form the oxide semiconductor 108b using a material whose energy level of the conduction band minimum is closer to the vacuum level than that of the oxide semiconductor 108a. For example, a difference in energy level between the conduction band minimum of the oxide semiconductor 108b and the conduction band minimum of the oxide semiconductors 108a and 108c is 0.2 eV or more, preferably 0.5 eV or more.

Figure 14B:
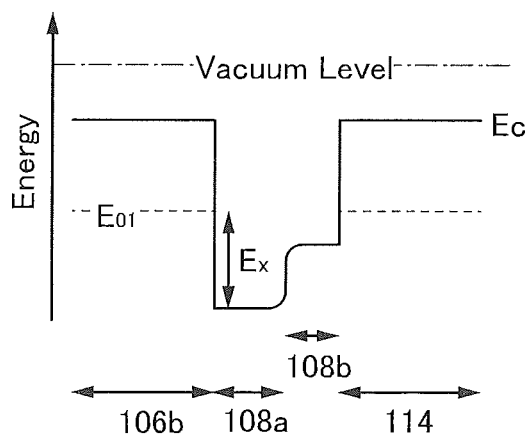

FIG. 14B shows a band structure when defect states exist at the position of energy $E_{O1}$ in the insulator 106b. A difference between the energy $E_{O1}$ and the conduction band minimum of the oxide semiconductor 108a is represented by energy E. Here, the energy $E_x$ is a positive value when $E_{O1}$ is closer to the vacuum level, i.e., higher than the conduction band minimum of the oxide semiconductor 108a. The energy $E_x$ is preferably 0.01 eV or more and 1.2 eV or less, further preferably 0.2 eV or more and 1.0 eV or less, still further preferably 0.3 eV or more and 0.8 eV or less, and yet further preferably 0.5 eV or more and 0.8 eV or less.

When a silicon oxide film or a silicon oxynitride film is used here as the insulator 106b, the defect state shown in FIG. 8 can be considered as $E_{O1}$. $E_{Si-H-Si(+/0)}$ is distanced away from the conduction band of the insulator 106b by approximately 3.1 eV and distanced away from the vacuum level by approximately 4.0 eV. Thus, the electron affinity of the oxide semiconductor 108a is preferably 4.01 eV or more and 5.2 eV or less, further preferably 4.2 eV or more and 5.0 eV or less, still further preferably 4.4 eV or more and 4.8 eV or less, and yet further preferably 4.5 eV or more and 4.8 eV or less.

It is preferable that the oxide semiconductor 108b not have a spinel crystal structure. This is because if the oxide semiconductor 108b has a spinel crystal structure, constituent elements of the conductors 112a and 112b might be diffused into the oxide semiconductor 108a at the interface between the spinel crystal structure and another region. Note that the oxide semiconductor 108b is preferably a CAAC-OS, which is described later, in which case a higher blocking property against constituent elements of the conductors 112a and 112b, for example, a copper element, is obtained.

The thickness of the oxide semiconductor 108b is large enough to inhibit diffusion of the constituent elements of the conductors 112a and 112b into the oxide semiconductor 108a and small enough not to inhibit supply of oxygen from the insulator 114 to the oxide semiconductor 108a. For example, when the thickness of the oxide semiconductor 108b is greater than or equal to 10 nm, diffusion of the constituent elements of the conductors 112a and 112b into the oxide semiconductor 108a can be inhibited. When the thickness of the oxide semiconductor 108b is less than or equal to 100 nm, oxygen can be effectively supplied from the insulators 114 and 116 to the oxide semiconductor 108a.

<Insulators Functioning as Protective Insulating Films for Transistor>

The insulators 114 and 116 each have a function of supplying oxygen to the oxide semiconductor 108. The insulator 118 functions as a protective insulating film for the transistor 100. The insulators 114 and 116 contain oxygen. Furthermore, the insulator 114 is an insulating film which is permeable to oxygen. Note that the insulator 114 also functions as a film which relieves damage to the oxide semiconductor 108 at the time of forming the insulator 116 in a later step.

A silicon oxide film, a silicon oxynitride film, or the like with a thickness greater than or equal to 5 nm and less than or equal to 150 nm, preferably greater than or equal to 5 nm and less than or equal to 50 nm, can be used as the insulator 114.

In addition, it is preferable that the number of defects in the insulator 114 be small and typically, the spin density corresponding to a signal that appears at g=2.001 due to a dangling bond of silicon be lower than or equal to $3 \times 10^{17}$ spins/cm$^3$ by ESR measurement. This is because if the density of defects in the insulator 114 is high, oxygen is bonded to the defects and the amount of oxygen that passes through the insulator 114 is decreased.

Note that all oxygen entering the insulator 114 from the outside does not move to the outside of the insulator 114 and some oxygen remains in the insulator 114. Furthermore, movement of oxygen occurs in the insulator 114 in some cases in such a manner that oxygen enters the insulator 114 and oxygen included in the insulator 114 is moved to the outside of the insulator 114. When an oxide insulating film which can transmit oxygen is formed as the insulator 114, oxygen released from the insulator 116 provided over the insulator 114 can be moved to the oxide semiconductor 108 through the insulator 114.

The insulator 114 can be formed using an oxide insulating film having a low density of states due to nitrogen oxide. Note that the density of states due to nitrogen oxide can be formed between the energy of the valence band maximum ($E_{v\_os}$) and the energy of the conduction band minimum ($E_{v\_os}$) of the oxide semiconductor film. A silicon oxynitride film that releases less nitrogen oxide, an aluminum oxynitride film that releases less nitrogen oxide, or the like can be used as the above oxide insulating film.

Note that a silicon oxynitride film that releases less nitrogen oxide is a film which releases more ammonia than the nitrogen oxide in thermal desorption spectroscopy analysis; the number of ammonia molecules released from the silicon oxynitride film is typically greater than or equal to $1\times10^{18}/cm^3$ and less than or equal to $5\times10^{19}/cm^3$. Note that the number of ammonia molecules released from the film is the number of ammonia molecules released by heat treatment with which the surface temperature of the film becomes higher than or equal to 50° C. and lower than or equal to 650° C., preferably higher than or equal to 50° C. and lower than or equal to 550° C.

Nitrogen oxide ($NO_x$; x is greater than 0 and less than or equal to 2, preferably greater than or equal to 1 and less than or equal to 2), typically $NO_2$ or NO, forms levels in the insulator 114, for example. The level is positioned in the energy gap of the oxide semiconductor 108. Therefore, when nitrogen oxide is diffused to the interface between the insulator 114 and the oxide semiconductor 108, an electron is in some cases trapped by the level on the insulator 114 side. As a result, the trapped electron remains in the vicinity of the interface between the insulator 114 and the oxide semiconductor 108; thus, the threshold voltage of the transistor is shifted in the positive direction.

Nitrogen oxide reacts with ammonia and oxygen in heat treatment. Since nitrogen oxide included in the insulator 114 reacts with ammonia included in the insulator 116 in heat treatment, nitrogen oxide included in the insulator 114 is reduced. Therefore, an electron is hardly trapped at the interface between the insulator 114 and the oxide semiconductor 108.

The insulator 114 can be formed using an oxide insulating film having a low density of states due to nitrogen oxide. Note that the density of states due to nitrogen oxide can be formed between the energy of the valence band maximum ($E_{v\_os}$) and the energy of the conduction band minimum ($E_{c\_os}$) of the oxide semiconductor. By using the oxide insulating film, a shift in the threshold voltage of the transistor can be reduced, which leads to reduced changes in the electrical characteristics of the transistor.

Note that in an ESR spectrum at 100 K or lower of the insulator 114, by heat treatment of a manufacturing process of the transistor, typically heat treatment at a temperature lower than 400° C. or lower than 375° C. (preferably, higher than or equal to 340° C. and lower than or equal to 360° C.), a first signal that appears at a g-factor greater than or equal to 2.037 and less than or equal to 2.039, a second signal that appears at a g-factor greater than or equal to 2.001 and less than or equal to 2.003, and a third signal that appears at a g-factor greater than or equal to 1.964 and less than or equal to 1.966 are observed. The split width of the first and second signals and the split width of the second and third signals that are obtained by ESR measurement using an X-band are each approximately 5 mT. The sum of the spin densities of the first signal that appears at a g-factor greater than or equal to 2.037 and less than or equal to 2.039, the second signal that appears at a g-factor greater than or equal to 2.001 and less than or equal to 2.003, and the third signal that appears at a g-factor greater than or equal to 1.964 and less than or equal to 1.966 is lower than $1\times10^{18}$ spins/cm$^3$, typically higher than or equal to $1\times10^{17}$ spins/cm$^3$ and lower than $1\times10^{18}$ spins/cm$^3$.

In the ESR spectrum at 100 K or lower, the first signal that appears at a g-factor greater than or equal to 2.037 and less than or equal to 2.039, the second signal that appears at a g-factor greater than or equal to 2.001 and less than or equal to 2.003, and the third signal that appears at a g-factor greater than or equal to 1.964 and less than or equal to 1.966 correspond to signals attributed to nitrogen oxide ($NO_x$; x is greater than 0 and less than or equal to 2, preferably greater than or equal to 1 and less than or equal to 2). Typical examples of nitrogen oxide include nitrogen monoxide and nitrogen dioxide. In other words, the lower the total spin density of the first signal that appears at a g-factor greater than or equal to 2.037 and less than or equal to 2.039, the second signal that appears at a g-factor greater than or equal to 2.001 and less than or equal to 2.003, and the third signal that appears at a g-factor greater than or equal to 1.964 and less than or equal to 1.966 is, the smaller amount of nitrogen oxide the oxide insulating film contains.

The nitrogen concentration in the oxide insulating film measured by SIMS is lower than or equal to $6\times10^{20}$ atoms/cm$^3$.

The oxide insulating film is formed by a PECVD method at a substrate temperature higher than or equal to 220° C. and lower than or equal to 350° C. using silane and dinitrogen monoxide, whereby a dense and hard film can be formed.

The insulator 116 is formed using an oxide insulating film that contains oxygen in excess of that in the stoichiometric composition. Part of oxygen is released by heating from the oxide insulating film containing oxygen in excess of that in the stoichiometric composition. The oxide insulating film containing oxygen in excess of that in the stoichiometric composition is an oxide insulating film of which the amount of released oxygen converted into oxygen atoms is greater than or equal to $1.0\times10^{19}$ atoms/cm$^3$, preferably greater than or equal to $3.0\times10^{20}$ atoms/cm$^3$, in TDS analysis. Note that the temperature of the film surface in the TDS analysis is preferably higher than or equal to 100° C. and lower than or equal to 700° C., or higher than or equal to 100° C. and lower than or equal to 500° C.

A silicon oxide film, a silicon oxynitride film, or the like with a thickness greater than or equal to 30 nm and less than or equal to 500 nm, preferably greater than or equal to 50 nm and less than or equal to 400 nm, can be used as the insulator 116.

It is preferable that the number of defects in the insulator 116 be small, and typically the spin density corresponding to a signal which appears at g=2.001 due to a dangling bond of silicon be lower than $1.5\times10^{18}$ spins/cm$^3$, preferably lower than or equal to $1\times10^{18}$ spins/cm$^3$, by ESR measurement. Note that the insulator 116 is provided more apart from the oxide semiconductor 108 than the insulator 114 is; thus, insulator 116 may have higher density of defects than the insulator 114.

Furthermore, the insulators 114 and 116 can be formed using insulating films formed of the same kinds of materials; thus, a boundary between the insulators 114 and 116 cannot be clearly observed in some cases. Thus, in this embodiment, the boundary between the insulators 114 and 116 is shown by a dashed line. Although a two-layer structure of the insulators 114 and 116 is described in this embodiment, the present invention is not limited to this structure. For example, a single-layer structure of either one of the insulators 114 and 116 may be employed.

The insulator 118 has a function of blocking oxygen, hydrogen, water, alkali metal, alkaline earth metal, and the like. It is possible to prevent outward diffusion of oxygen from the oxide semiconductor 108, outward diffusion of oxygen included in the insulators 114 and 116, and entry of hydrogen, water, or the like into the oxide semiconductor 108 from the outside by providing the insulator 118. A nitride insulating film, for example, can be used as the insulator 118. The nitride insulating film is formed using silicon nitride, silicon nitride oxide, aluminum nitride, aluminum nitride oxide, or the like. In particular, a silicon nitride oxide film or a silicon nitride film is preferably used as the insulator 118, in which case outward diffusion of oxygen can be prevented.

Note that instead of the nitride insulating film having a blocking effect against oxygen, hydrogen, water, alkali metal, alkaline earth metal, and the like, an oxide insulating film having a blocking effect against oxygen, hydrogen, water, and the like may be provided as the insulator 118. As the oxide insulating film having a blocking effect against oxygen, hydrogen, water, and the like, an aluminum oxide film, an aluminum oxynitride film, a gallium oxide film, a gallium oxynitride film, an yttrium oxide film, an yttrium oxynitride film, a hafnium oxide film, a hafnium oxynitride film, and the like can be given. As the oxide insulating film having a blocking effect against oxygen, hydrogen, water, and the like, an aluminum oxide film, a hafnium oxide film, or an yttrium oxide film is particularly preferable.

Although the variety of films of the conductors, the insulators, and the oxide semiconductors which are described above can be formed by a sputtering method or a PECVD method, such films may be formed by another method, e.g., a thermal chemical vapor deposition (CVD) method or an atomic layer deposition (ALD) method. As an example of a thermal CVD method, a metal organic chemical vapor deposition (MOCVD) method can be given.

A thermal CVD method has an advantage that no defect due to plasma damage is generated because it does not utilize plasma for forming a film.

Deposition over a substrate by a thermal CVD method may be performed in such a manner that a source gas and an oxidizer are supplied to a chamber at a time, the pressure inside the chamber is set to an atmospheric pressure or a reduced pressure, and the source gas and the oxidizer react with each other in the vicinity of the substrate or over the substrate.

Deposition by an ALD method may be performed in such a manner that the pressure inside a chamber is set to an atmospheric pressure or a reduced pressure, source gases for reaction are sequentially introduced into the chamber, and then the sequence of the gas introduction is repeated. For example, two or more kinds of source gases are sequentially supplied to the chamber by switching respective switching valves (also referred to as high-speed valves). For example, a first source gas is introduced, an inert gas (e.g., argon or nitrogen) or the like is introduced when or after the first gas is introduced so that the source gases are not mixed, and then a second source gas is introduced. Note that in the case where the first source gas and the inert gas are introduced at a time, the inert gas serves as a carrier gas, and the inert gas may also be introduced at the same time as the second source gas. Alternatively, the first source gas may be exhausted by vacuum evacuation instead of the introduction of the inert gas, and then the second source gas may be introduced. The first source gas is adsorbed on the surface of the substrate to form a first layer; then the second source gas is introduced to react with the first layer; as a result, a second layer is stacked over the first layer, so that a thin film is formed. The sequence of the gas introduction is repeated a plurality of times until a desired thickness is obtained, whereby a thin film with excellent step coverage can be formed. The thickness of the thin film can be adjusted by the number of repetition times of the sequence of the gas introduction; therefore, an ALD method makes it possible to accurately adjust a thickness and thus is suitable for manufacturing a minute FET.

The variety of films of the conductors, the insulators, the oxide semiconductor, and the metal oxide film in this embodiment can be formed by a thermal CVD method such as an MOCVD method. For example, in the case where an In—Ga—Zn—O film is formed, trimethylindium, trimethylgallium, and dimethylzinc are used. Note that the chemical formula of trimethylindium is $In(CH_3)_3$. The chemical formula of trimethylgallium is $Ga(CH_3)_3$. The chemical formula of dimethylzinc is $Zn(CH_3)_2$. Without limitation to the above combination, triethylgallium (chemical formula: $Ga(C_2H_5)_3$) can be used instead of trimethylgallium and diethylzinc (chemical formula: $Zn(C_2H_5)_2$) can be used instead of dimethylzinc.

For example, in the case where a hafnium oxide film is formed by a deposition apparatus using an ALD method, two kinds of gases, that is, ozone ($O_3$) as an oxidizer and a source gas which is obtained by vaporizing a liquid containing a solvent and a hafnium precursor compound (e.g., a hafnium alkoxide or a hafnium amide such as tetrakis(dimethylamide)hafnium (TDMAH)) are used. Note that the chemical formula of tetrakis(dimethylamide)hafnium is $Hf[N(CH_3)_2]_4$. Examples of another material liquid include tetrakis(ethylmethylamide)hafnium.

For example, in the case where an aluminum oxide film is formed by a deposition apparatus using an ALD method, two kinds of gases, e.g., $H_2O$ as an oxidizer and a source gas which is obtained by vaporizing a liquid containing a solvent and an aluminum precursor compound (e.g., trimethylaluminum (TMA)) are used. Note that the chemical formula of trimethylaluminum is $Al(CH_3)_3$. Examples of another material liquid include tris(dimethylamide)aluminum, triisobutylaluminum, and aluminum tris(2,2,6,6-tetramethyl-3,5-heptanedionate).

For example, in the case where a silicon oxide film is formed with a deposition apparatus using an ALD method, hexachlorodisilane is adsorbed on a surface where a film is to be formed, chlorine included in the adsorbate is removed, and radicals of an oxidizing gas (e.g., $O_2$ or dinitrogen monoxide) are supplied to react with the adsorbate.

For example, in the case where a tungsten film is formed with a deposition apparatus using an ALD method, a $WF_6$ gas and a $B_2H_6$ gas are used to form an initial tungsten film, and then a $WF_6$ gas and an $H_2$ gas are used to form a tungsten film. Note that an $SiH_4$ gas may be used instead of a $B_2H_6$ gas.

For example, in the case where an oxide semiconductor film, e.g., an In—Ga—Zn—O film is formed with a deposition apparatus using an ALD method, an $In(CH_3)_3$ gas and an $O_3$ gas are used to form an In—O layer, then a $Ga(CH_3)_3$ gas and an $O_3$ gas are used to form a Ga—O layer, and then a $Zn(CH_3)_2$ gas and an $O_3$ gas are used to form a Zn—O layer. Note that the order of these layers is not limited to this example. A mixed compound layer such as an In—Ga—O layer, an In—Zn—O layer, or a Ga—Zn—O layer may be formed using these gases. Note that although an $H_2O$ gas which is obtained by bubbling water with an inert gas such as Ar may be used instead of an $O_3$ gas, it is preferable to use an $O_3$ gas, which does not contain H. Furthermore, instead of an $In(CH_3)_3$ gas, an $In(C_2H_5)_3$ gas may be used. Instead of a $Ga(CH_3)_3$ gas, a $Ga(C_2H_5)_3$ gas may be used. Furthermore, a $Zn(CH_3)_2$ gas may be used.

Next, a structure example different from that of the transistor 100 in FIGS. 1A to 1C is described with reference to FIGS. 15A and 15B. Note that in the case where a portion has a function similar to that described above, the same hatch pattern is applied to the portion, and the portion is not especially denoted by a reference numeral in some cases.

Figure 15A:
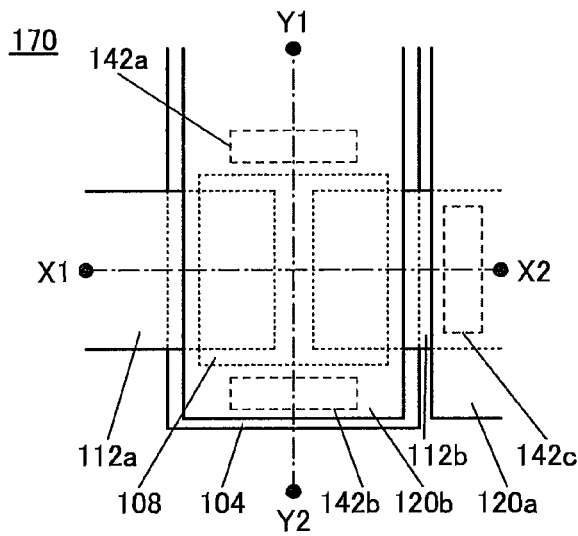
FIGS. 15A to 15C are a top view and cross-sectional views of a transistor.

FIG. 15A is a top view of a transistor 170 that is a semiconductor device of one embodiment of the present invention. FIG. 15B is a cross-sectional view taken along the dashed-dotted line X1-X2 in FIG. 15A, and a cross-sectional view taken along the dashed-dotted line Y1-Y2 in FIG. 15A.

The transistor 170 includes the conductor 104 functioning as a first gate electrode over the substrate 102, the insulator 106*a* over the substrate 102 and the conductor 104, the insulator 106*b* over the insulator 106*a*, the oxide semiconductor 108 over the insulator 106*b*, the insulator 114 over the oxide semiconductor 108, the insulator 116 over the insulator 114, the conductor 112*a* functioning as a source electrode electrically connected to the oxide semiconductor 108, the conductor 112*b* functioning as a drain electrode electrically connected to the oxide semiconductor 108, the insulator 118 over the insulator 116, a conductor 120*a* over the insulator 118, and a conductor 120*b* over the insulator 118. The insulators 114, 116, and 118 function as a second gate insulator of the transistor 170. The conductor 120*a* is electrically connected to the conductor 112*b* through an opening 142*c* provided in the insulators 114, 116, and 118. The conductor 120*a* in the transistor 170 functions as, for example, a pixel electrode used for a display device. The conductor 120*b* in the transistor 170 functions as a second gate electrode (also referred to as a back gate electrode).

Figure 15B:
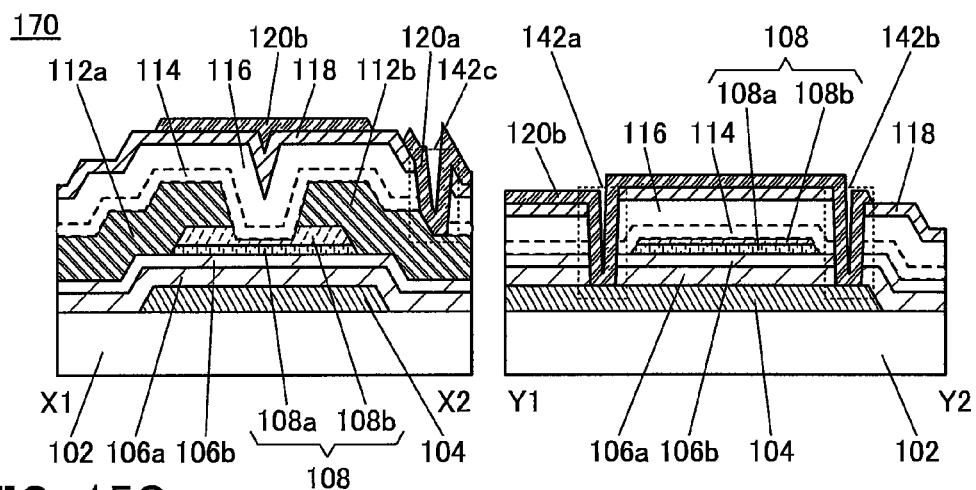

As illustrated in FIG. 15B, the conductor 120*b* is connected to the conductor 104 functioning as a first gate electrode through openings 142*a* and 142*b* provided in the insulators 106*a*, 106*b*, 114, 116, and 118. Accordingly, the conductor 120*b* and the conductor 104 are supplied with the same potential.

Note that although the structure in which the openings 142*a* and 142*b* are provided so that the conductor 120*b* and the conductor 104 are connected to each other is described in this embodiment, one embodiment of the present invention is not limited thereto. For example, a structure in which only one of the openings 142*a* and 142*b* is provided so that the conductor 120*b* and the conductor 104 are connected to each other, or a structure in which the openings 142*a* and 142*b* are not provided and the conductor 120*b* and the conductor 104 are not connected to each other may be employed. Note that in the case where the conductor 120*b* and the conductor 104 are not connected to each other, it is possible to apply different potentials to the conductor 120*b* and the conductor 104.

As illustrated in FIG. 15B, the oxide semiconductor 108 is positioned to face each of the conductor 104 functioning as a first gate electrode and the conductor 120*b* functioning as a second gate electrode, and is sandwiched between the two conductors functioning as gate electrodes. The lengths in the channel length direction and the channel width direction of the conductor 120*b* functioning as a second gate electrode are longer than those in the channel length direction and the channel width direction of the oxide semiconductor 108. The whole oxide semiconductor 108 is covered with the conductor 120*b* with the insulators 114, 116, and 118 positioned therebetween. Since the conductor 120*b* functioning as a second gate electrode is connected to the conductor 104 functioning as a first gate electrode through the openings 142*a* and 142*b* provided in the insulators 106*a*, 106*b*, 114, 116, and 118, a side surface of the oxide semiconductor 108 in the channel width direction faces the conductor 120*b* functioning as a second gate electrode with the insulators 114, 116, and 118 positioned therebetween.

In other words, in the channel width direction of the transistor 170, the conductor 104 functioning as a first gate electrode and the conductor 120*b* functioning as a second gate electrode are connected to each other through the openings provided in the insulators 106*a* and 106*b* functioning as a first gate insulator and the insulators 114, 116, and 118 functioning as a second gate insulator; and the conductor 104 and the conductor 120*b* surround the oxide semiconductor 108 with the insulators 106*a* and 106*b* functioning as a first gate insulator and the insulators 114, 116, and 118 functioning as a second gate insulator positioned therebetween.

With such a structure, the oxide semiconductor 108 included in the transistor 170 can be electrically surrounded by electric fields of the conductor 104 functioning as a first gate electrode and the conductor 120*b* functioning as a second gate electrode. A device structure of a transistor, like that of the transistor 170, in which electric fields of a first gate electrode and a second gate electrode electrically surround an oxide semiconductor film where a channel region is formed can be referred to as a surrounded channel (s-channel) structure.

Since the transistor 170 has the s-channel structure, an electric field for inducing a channel can be effectively applied to the oxide semiconductor 108 by the conductor 104 functioning as a first gate electrode; therefore, the current drive capability of the transistor 170 can be improved and high on-state current characteristics can be obtained. Since the on-state current can be increased, it is possible to reduce the size of the transistor 170. In addition, since the transistor 170 has a structure in which the oxide semiconductor 108 is surrounded by the conductor 104 functioning as a first gate electrode and the conductor 120*b* functioning as a second gate electrode, the mechanical strength of the transistor 170 can be increased.

Note that the other components of the transistor 170 are the same as those of the transistor 100 described above, and an effect similar to that of the transistor 100 can be obtained.

Figure 15C:
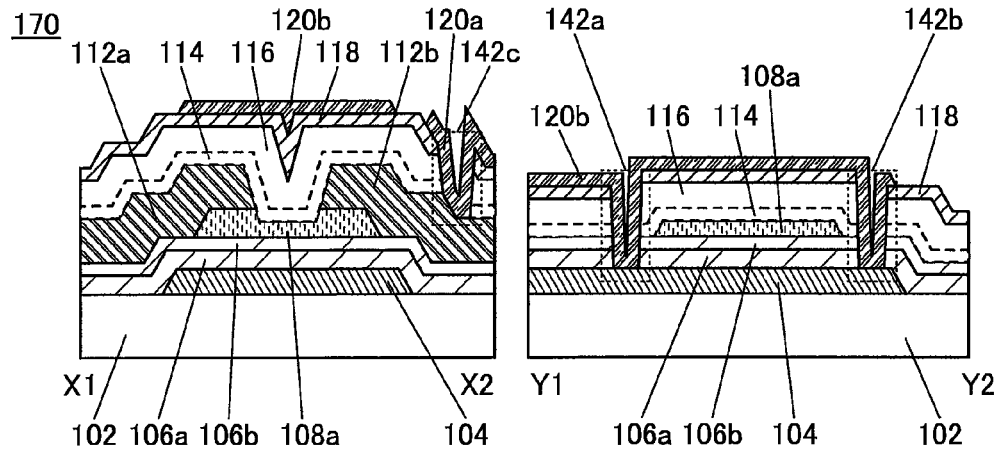

Here, as illustrated in FIG. 15C, the transistor 170 does not necessarily include the oxide semiconductor 108*b*.

The structures of the transistors of this embodiment can be freely combined with each other.

Structure Example 2 of Transistor

Figure 16A:
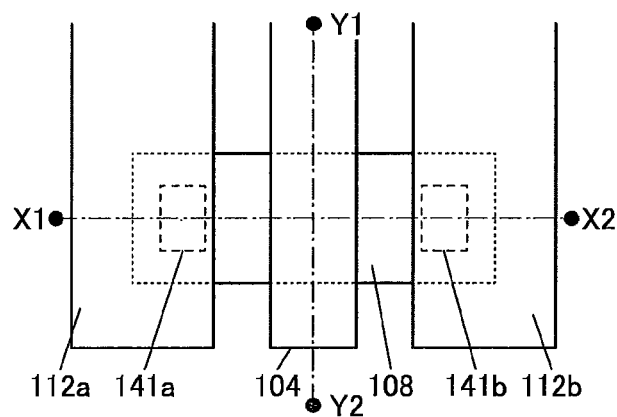
FIGS. 16A to 16C are a top view and cross-sectional views of a transistor.
Figure 16B:
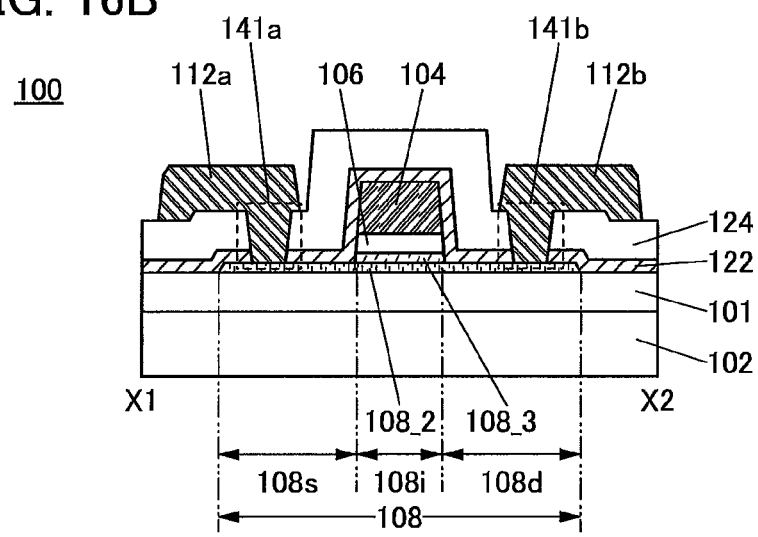
Figure 16C:
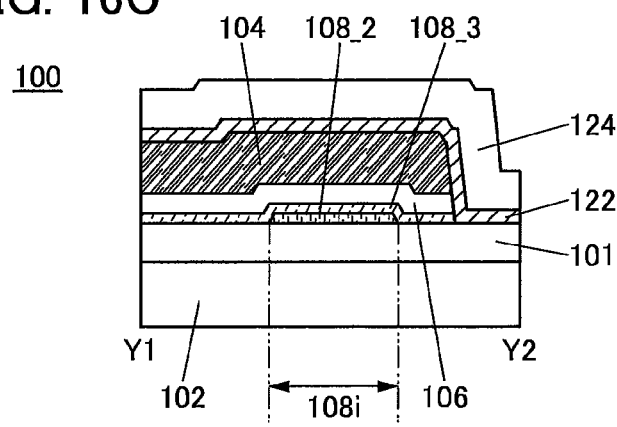

The transistor 100 illustrated in FIGS. 16A to 16C includes an insulator 101 formed over the substrate 102, the oxide semiconductor 108 over the insulator 101, the insulator 106*b* over the oxide semiconductor 108, the conductor 104 over the insulator 106*b*, and an insulator 122 over the insulator 101, the oxide semiconductor 108, and the conductor 104. The oxide semiconductor 108 includes a channel region 108*i* overlapping with the conductor 104, a source region 108*s* in contact with the insulator 122, and a drain region 108*d* in contact with the insulator 122. The channel region 108*i* includes a layer 108_2 and a layer 108_3 which is in contact with a top surface of the layer 108_2 and covers side surfaces of the layer 108_2 in the channel width direction. Here, the above-described oxide semiconductor 108*a* can be used as the layer 108_2 in the channel region 108*i*. The insulator 106*b* functions as a gate insulator. The transistor 100 may further include an insulator 124 over the insulator 122, the conductor 112*a* electrically connected to the source region 108*s* through an opening 141*a* provided in the insulator 122 and the insulator 124, and the conductor 112*b* electrically connected to the drain region 108*d* through an opening 141*b* provided in the insulator 122 and the insulator 124.

Here, an oxide semiconductor functioning as an electrode may be used as the conductor 104. The oxide semiconductor functioning as a gate electrode has a function of supplying oxygen to the insulator 106*b*. The oxide semiconductor having a function of supplying oxygen to the insulator 106*b* enables the insulator 106*b* to contain excess oxygen. When the insulator 110 includes an excess oxygen region, excess oxygen can be supplied to the oxide semiconductor 108, specifically, the channel region 108*i*. Thus, oxygen vacancies in the channel region 108*i* are filled with excess oxygen, so that a highly reliable semiconductor device can be obtained.

The insulator 101, which is formed under the oxide semiconductor 108, may contain excess oxygen to be supplied to the oxide semiconductor 108. However, excess oxygen contained in the insulator 101 is also possibly supplied to the source region 108*s* and the drain region 108*d* of the oxide semiconductor 108. If excess oxygen is supplied to the source region 108*s* and the drain region 108*d*, the resistance of the source region 108*s* and the drain region 108*d* might be increased.

In contrast, in the structure in which the insulator 110 formed over the oxide semiconductor 108 contains excess oxygen, excess oxygen can be selectively supplied to the channel region 108*i*. Alternatively, after excess oxygen is supplied to the channel region 108*i*, the source region 108*s*, and the drain region 108*d*, the carrier density in the source region 108*s* and the drain region 108*d* may be selectively increased.

The insulator 122 contains nitrogen and/or hydrogen. From the insulator 122 containing nitrogen and/or hydrogen, nitrogen and/or hydrogen can be supplied to the oxide semiconductor 108 and the oxide semiconductor functioning as a gate electrode.

The carrier density in the oxide semiconductor functioning as a gate electrode having supplied oxygen to the insulator 106*b* is increased by nitrogen and/or hydrogen supplied from the insulator 122. In other words, the oxide semiconductor functioning as a gate electrode also functions as an oxide conductor (OC). Thus, the oxide semiconductor functioning as a gate electrode has a higher carrier density than the oxide semiconductor 108 and can function as a gate electrode.

Furthermore, the oxide semiconductor functioning as a gate electrode and the source region 108*s* and the drain region 108*d* of the oxide semiconductor 108 each may contain an element that forms an oxygen vacancy. Typical examples of the element that forms an oxygen vacancy are hydrogen, boron, carbon, nitrogen, fluorine, phosphorus, sulfur, chorine, and a rare gas element. Typical examples of the rare gas element are helium, neon, argon, krypton, and xenon.

An impurity element added to the oxide semiconductor cuts a bond between a metal element and oxygen in the oxide semiconductor, so that an oxygen vacancy is formed. Alternatively, when an impurity element is added to the oxide semiconductor, oxygen bonded to a metal element in the oxide semiconductor is bonded to the impurity element and detached from the metal element, so that an oxygen vacancy is formed. As a result, the oxide semiconductor has a higher carrier density, and thus, the conductivity thereof becomes higher.

The transistor 100 preferably has a region in which a side end portion of the insulator 106*b* is aligned with a side end portion of the oxide semiconductor functioning as a gate electrode. In other words, in the transistor 100, an upper end portion of the insulator 106*b* is substantially aligned with a lower end portion of the oxide semiconductor functioning as a gate electrode. The above structure can be obtained by processing the insulator 106*b* with the use of the oxide semiconductor functioning as a gate electrode as a mask, for example.

As described above, in the semiconductor device of one embodiment of the present invention, the insulator which covers the side surfaces of the oxide semiconductor serving as a channel region and which is formed over the channel region contains excess oxygen supplied from the oxide semiconductor functioning as a gate electrode. A semiconductor device with such a structure can have high reliability.

A side surface of the channel region 108*i* in the channel width (W) direction or a region in the vicinity of the side surface is easily damaged by processing, resulting in a defect (e.g., an oxygen vacancy), or easily contaminated by an impurity attached thereto. Therefore, even when the channel region 108*i* is substantially intrinsic, stress such as an electric field applied thereto activates the side surface of the channel region 108*i* in the channel width (W) direction or the region in the vicinity of the side surface and turns it into a low-resistance (n-type) region easily. Moreover, if the side surface of the channel region 108*i* in the channel width (W) direction or the region in the vicinity of the side surface is an n-type region, a parasitic channel may be formed because the n-type region serves as a carrier path.

In the semiconductor device of one embodiment of the present invention, the channel region 108*i* has a stacked-layer structure and side surfaces of the channel region 108*i* in the channel width (W) direction are covered with one of the stacked layers. This structure can reduce defects on the side surfaces of the channel region 108*i* or in regions in the vicinity of the side surfaces or reduce impurities attached thereto.

For the layer 108_3 in the channel region 108*i*, refer to the description of the oxide semiconductor 108*b*, for example.

The insulator 122 contains nitrogen and/or hydrogen. From the insulator 122 containing nitrogen and/or hydrogen, nitrogen and/or hydrogen can be supplied to the oxide semiconductor 108.

Furthermore, the source region 108*s* and the drain region 108*d* of the oxide semiconductor 108 each may contain an element that forms an oxygen vacancy. Typical examples of the element that forms an oxygen vacancy are hydrogen, boron, carbon, nitrogen, fluorine, phosphorus, sulfur, chorine, and a rare gas element. Typical examples of the rare gas element are helium, neon, argon, krypton, and xenon.

An impurity element added to the oxide semiconductor cuts a bond between a metal element and oxygen in the oxide semiconductor, so that an oxygen vacancy is formed. Alternatively, when an impurity element is added to the oxide semiconductor, oxygen bonded to a metal element in the oxide semiconductor is bonded to the impurity element and detached from the metal element, so that an oxygen vacancy is formed. As a result, the oxide semiconductor has a higher carrier density, and thus, the conductivity thereof becomes higher.

Meanwhile, the source region 108*s* and the drain region 108*d* are in contact with the insulator 122. Hydrogen and/or nitrogen are/is added from the insulator 122 to the source region 108*s* and the drain region 108*d* in contact with the insulator 122, so that the carrier densities in the source region 108s and the drain region 108d are increased.

Note that in the oxide semiconductor 108, the crystallinity of the channel region 108i is different from the crystallinity of each of the source region 108s and the drain region 108d in some cases. Specifically, in the oxide semiconductor 108, the crystallinity of each of the source region 108s and the drain region 108d is lower than the crystallinity of the channel region 108i in some cases. This is because, when the impurity element is added to the source region 108s and the drain region 108d, the source region 108s and the drain region 108d are damaged and thus have lower crystallinity.

The insulator 101 can be formed by a sputtering method, a CVD method, an evaporation method, a pulsed laser deposition (PLD) method, a printing method, a coating method, or the like as appropriate. For example, the insulator 101 can be formed to have a single-layer structure or stacked-layer structure of an oxide insulator and/or a nitride insulator. To improve the properties of the interface with the oxide semiconductor 108, at least a region of the insulator 101 which is in contact with the oxide semiconductor 108 is preferably formed using an oxide insulator. When the insulator 101 is formed using an oxide insulator from which oxygen is released by heating, oxygen contained in the insulator 101 can be moved to the oxide semiconductor 108 by heat treatment. For example, the insulator 101 can be formed to have a single-layer structure or stacked-layer structure of silicon oxide, silicon oxynitride, silicon nitride oxide, silicon nitride, aluminum oxide, hafnium oxide, gallium oxide, a Ga—Zn oxide, or the like. In this embodiment, the insulator 101 has a stacked-layer structure of a silicon nitride film and a silicon oxynitride film. With the insulator 101 having such a stacked-layer structure including a silicon nitride film as a lower layer and a silicon oxynitride film as an upper layer, oxygen can be efficiently introduced into the oxide semiconductor 108.

The thickness of the insulator 101 can be greater than or equal to 50 nm, greater than or equal to 100 nm and less than or equal to 3000 nm, or greater than or equal to 200 nm and less than or equal to 1000 nm. By increasing the thickness of the insulator 101, the amount of oxygen released from the insulator 101 can be increased, and interface states at the interface between the insulator 101 and the oxide semiconductor 108 and oxygen vacancies included in the channel region 108i of the oxide semiconductor 108 can be reduced.

The insulator 124 can be formed to have a single-layer structure or stacked-layer structure of an oxide insulator and/or a nitride insulator. For example, the insulator 118 can be formed to have a single-layer structure or stacked-layer structure of silicon oxide, silicon oxynitride, silicon nitride oxide, silicon nitride, aluminum oxide, hafnium oxide, gallium oxide, a Ga—Zn oxide, or the like. Furthermore, the insulator 118 preferably functions as a barrier film against hydrogen, water, and the like from the outside.

Note that the stacked-layer structure of the channel region 108i is not limited to the two-layer structure of the layer 108_2 and the layer 108_3 in FIGS. 16B and 16C. For example, the stacked-layer structure illustrated in FIGS. 17A and 17B may be employed.

Figure 17A:
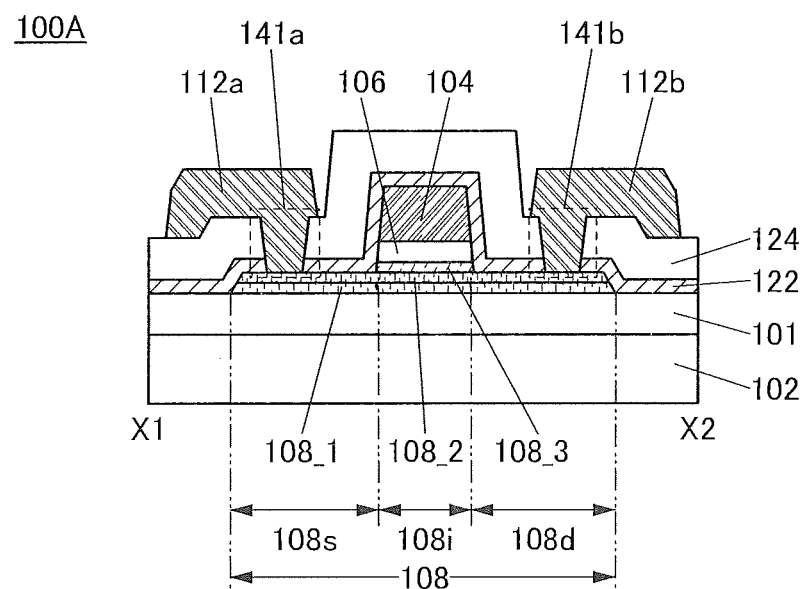
FIGS. 17A and 17B are cross-sectional views of a transistor.
Figure 17B:
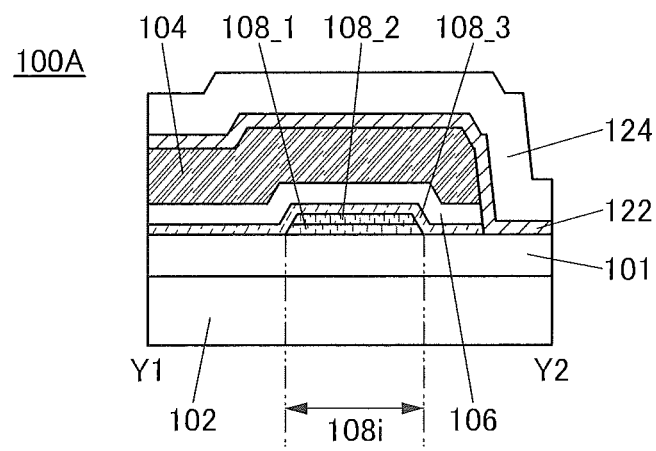

FIGS. 17A and 17B are cross-sectional views of a transistor 100A. A top view of the transistor 100A is similar to that of the transistor 100 in FIG. 16A and will be described with reference to FIG. 16A. The cross-sectional view in FIG. 17A is taken along the dashed-dotted line X1-X2 in FIG. 16A, and the cross-sectional view in FIG. 17B is taken along the dashed-dotted line Y1-Y2 in FIG. 16A.

The oxide semiconductor 108 of the transistor 100A includes the channel region 108i overlapping with the conductor 104, the source region 108s in contact with the insulator 122, and the drain region 108d in contact with the insulator 122. The channel region 108i includes the layer 108_2, the layer 108_3 which is in contact with a top surface of the layer 108_2 and covers side surfaces of the layer 108_2 in the channel width direction, and a layer 108_1 in contact with a bottom surface of the layer 108_2.

As described above, the transistor 100A is different from the transistor 100 described above in the structure of the oxide semiconductor 108. Except that, the transistor 100A has a structure and an effect similar to those of the transistor 100.

For the layer 108_1 in the channel region 108i, refer to the description of the oxide semiconductor 108b, for example.

<Band Structure 3>

The band structure of the oxide semiconductor and the insulators in contact with the oxide semiconductor in the transistor 100A in FIGS. 17A and 17B is described with reference to FIG. 18A.

Figure 18A:
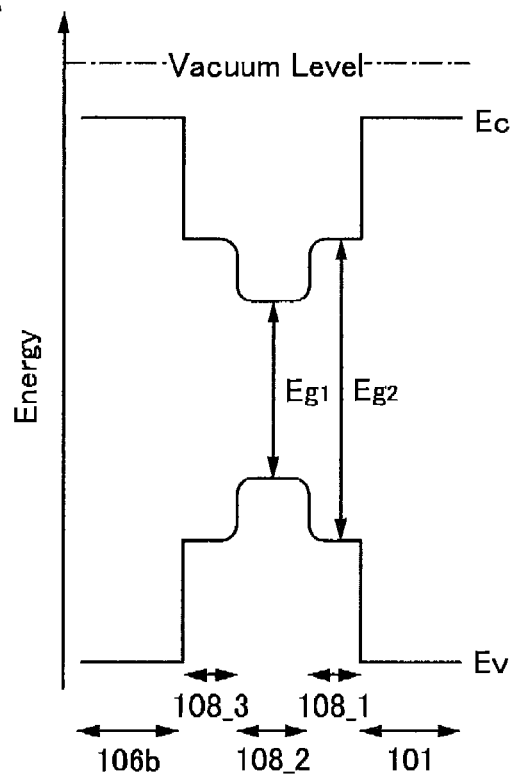
FIGS. 18A to 18C each show a band structure.

FIG. 18A illustrates the band structure in the thickness direction of a region including the insulator 101, the layer 108_1, the layer 108_2, the layer 108_3, and the insulator 106. For easy understanding, the band structure shows the energy levels of the conduction band minimum ($E_c$) of the insulator 101, the layer 108_1, the layer 108_2, the layer 108_3, and the insulator 106.

Here, a silicon oxide film is used as each of the insulators 101 and 106, an oxide semiconductor film formed using a metal oxide target with an atomic ratio of metal elements of In:Ga:Zn=1:1:1.2 is used as each of the layers 108_1 and 108_3, and an oxide semiconductor film formed using a metal oxide target with an atomic ratio of metal elements of In:Ga:Zn=4:2:4.1 is used as the layer 108_2.

As illustrated in FIG. 18A, there is no energy barrier between the layer 108_1 and the layer 108_2 and between the layer 108_2 and the layer 108_3, and the energy of the conduction band minimum gradually changes. Such an energy band structure is also referred to as a buried channel structure.

In the structure in FIG. 18A, the channel region of the transistor 100A including the layer 108_1, the layer 108_2, and the layer 108_3 are formed in the layer 1082 which serves as a well.

Here, the transistor 100 includes the layers 108_2 and 108_3 and does not include the layer 108_1. In this case, the energy of the conduction band minimum of the layer 108_2 is lower than that of the layer 108_3; therefore, the channel region is formed in the layer 108_2.

Figure 18B:
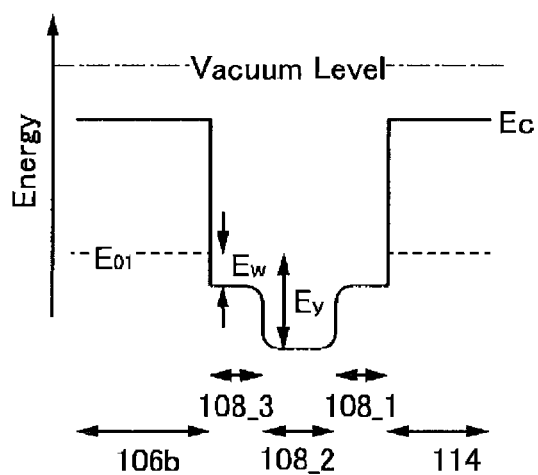
Figure 18C:
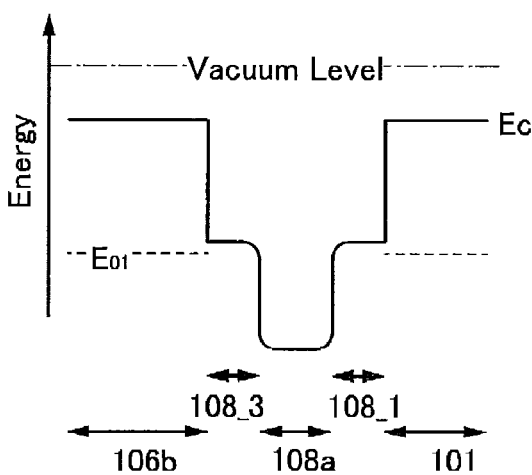

FIG. 18B shows a band structure when defect states exist at the position of energy $E_{O1}$ in the insulator 106. A difference between the energy $E_{O1}$ and the conduction band minimum of the layer 108_2 is represented by energy $E_y$. Here, the energy $E_y$ is a positive value when $E_{O1}$ is closer to the vacuum level, i.e., higher than the conduction band minimum of the layer 108_2. The energy $E_y$ is preferably 0.01 eV or more and 1.2 eV or less, further preferably 0.2 eV or more and 1.0 eV or less, and still further preferably 0.4 eV or more and 0.8 eV or less. A difference between the energy $E_{O1}$ and the conduction band minimum of the layer 108_3 is represented by energy $E_W$. Here, FIG. 18C shows an example in which the energy $E_W$ is a negative value.

The energy $E_w$ is preferably −0.2 eV or more and less than 0.8 eV, further preferably 0 eV or more and less than 0.7 eV, and still further preferably 0.1 eV or more and less than 0.5 eV.

When a silicon oxide film and a silicon oxynitride film are used here as the insulator 106, the defect state shown in FIG. 8 can be considered as $E_{O1}$. $E_{Si-H-Si(+/O)}$ is distanced away from the conduction band of the insulator 106b by approximately 3.1 eV and distanced away from the vacuum level by approximately 4.0 eV. Thus, the electron affinity of the oxide semiconductor 108a is preferably 4.01 eV or more and 5.2 eV or less, further preferably 4.2 eV or more and 5.0 eV or less, still further preferably 4.4 eV or more and 4.8 eV or less, and yet further preferably 4.5 eV or more and 4.8 eV or less. The electron affinity of the oxide semiconductor 108b is preferably 3.8 eV or more and less than 4.8 eV, further preferably 4 eV or more and less than 4.7 eV, and still further preferably 4.1 eV or more and less than 4.5 eV.

Even when a defect state due to an impurity or a defect is formed at the interface between the layer 108_3 and the insulator 106 in the transistor 100 or in the vicinity of the interface, the layer 108_3 enables the layer 108_2 to be distanced away from the region in which the defect state is formed. Even when defect states due to impurities or defects are formed at the interface between the layer 108_1 and the insulator 101 or in the vicinity of the interface and at the interface between the layer 108_3 and the insulator 106 or in the vicinity of the interface in the transistor 100A, the layers 108_1 and 108_3 enable the layer 108_2 to be distanced away from the regions in which the defect states are formed. Thus, owing to the layer 108_3 of each of the transistors 100 and 100A, carriers are less likely to be trapped in the defect states of the insulator 106 functioning as a gate insulator.

Figure 41A:
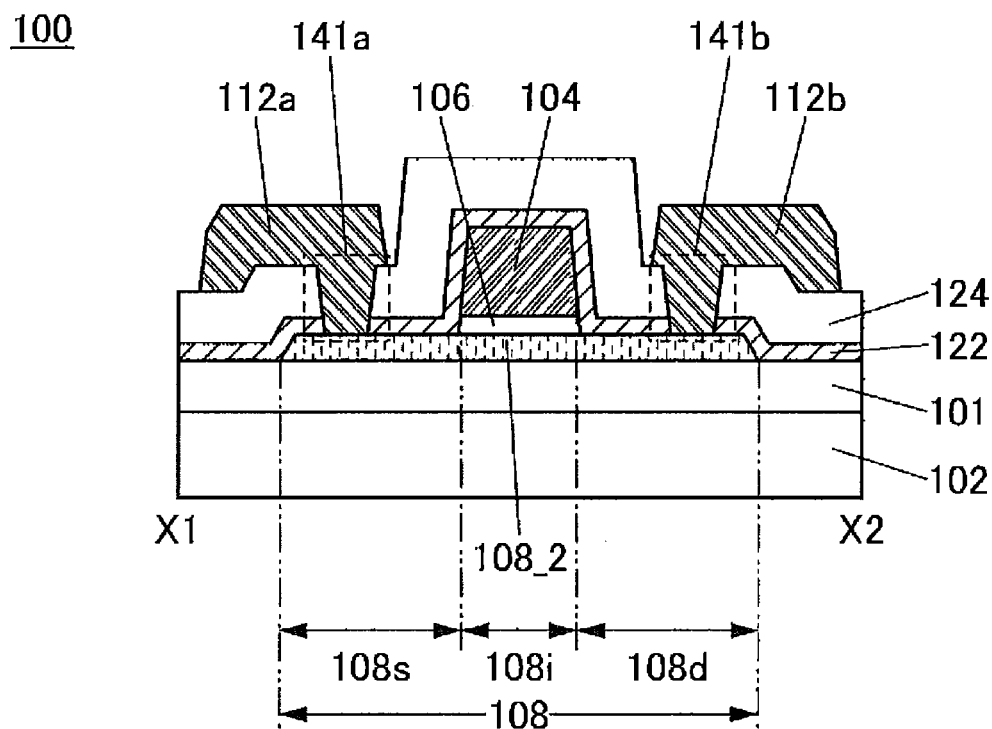
FIGS. 41A and 41B are a top view and a cross-sectional view of a transistor.
Figure 41B:
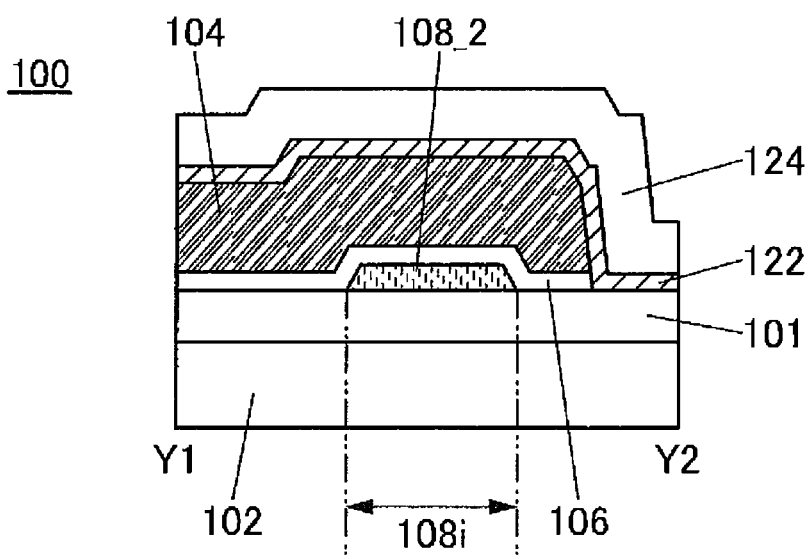

As illustrated in FIGS. 41A and 41B, the transistor 100 does not necessarily include the layers 108_1 and 108_3.

Figure 42A:
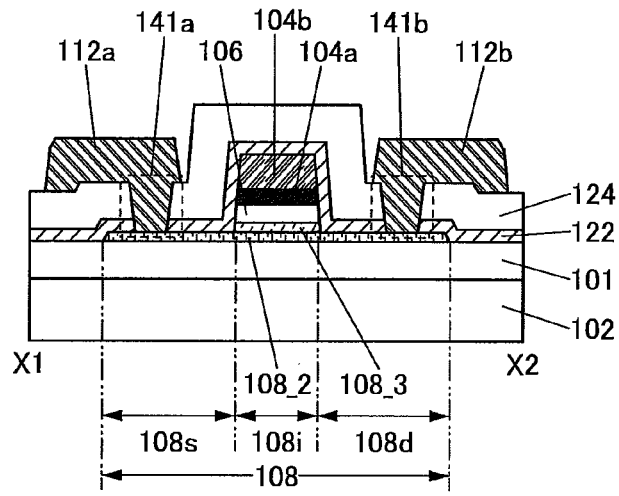
FIGS. 42A to 42C are each a cross-sectional view of a transistor.

The conductor 104 may have a stacked-layer structure of two or more layers. For example, two conductors 104a and 104b may be stacked as illustrated in FIG. 42A.

Here, an oxide semiconductor may be used as the conductor 104a. In that case, for example, a metal element, an alloy including two or more metal elements as a component, a nitride of a metal element such as tantalum nitride and titanium nitride, or the like may be used as the conductor 104b. Alternatively, for example, a stack of two or more of a metal element, an alloy, and a nitride of a metal element may be used as the conductor 104b.

Figure 42B:
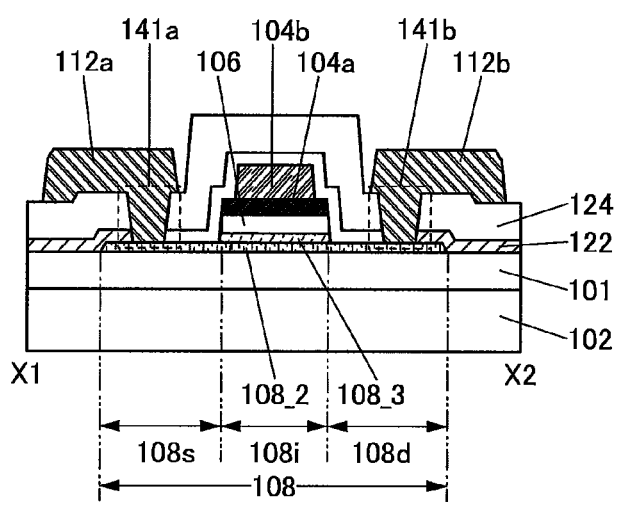
Figure 42C:
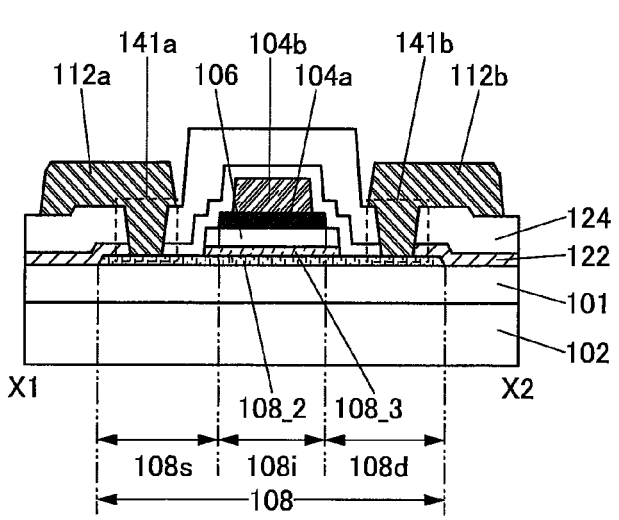

As illustrated in FIG. 42B, the end portion of the conductor 104a may be positioned on the outer side than the end portion of the conductor 104b. As illustrated in FIG. 42C, the end portion of the insulator 106 may be positioned on the outer side than the end portion of the conductor 104a.

Figure 43A:
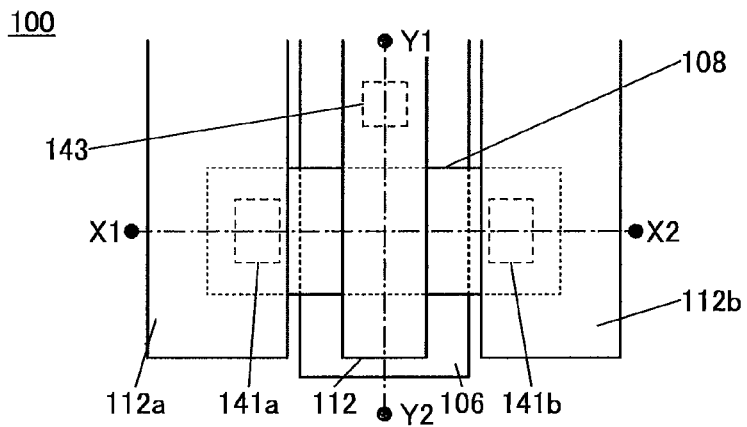
FIGS. 43A to 43C are a top view and cross-sectional views of a transistor.
Figure 43B:
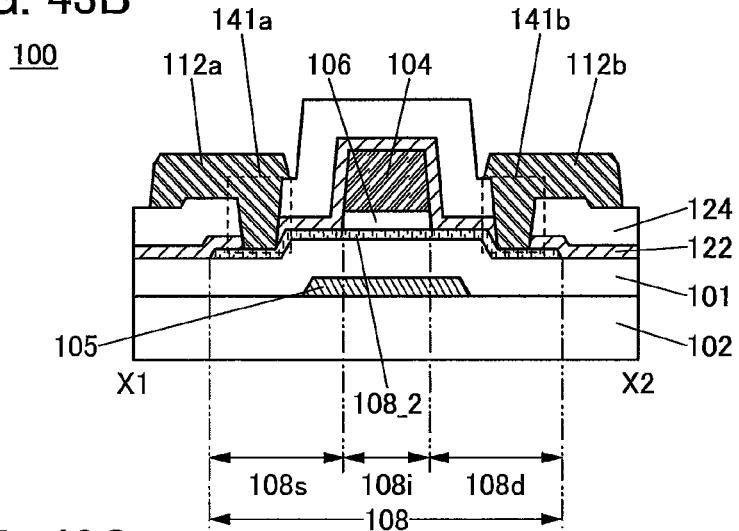
Figure 43C:
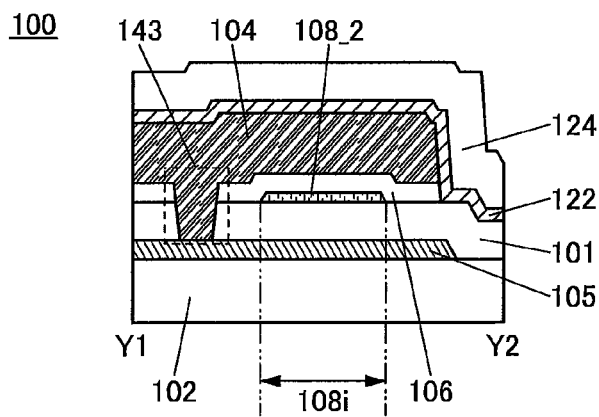

FIGS. 43A to 43C illustrate an example of the transistor 100. FIG. 43A is a top view of the transistor 100, FIG. 43B is a cross-sectional view taken along the dashed-dotted line X1-X2 in FIG. 43A, and FIG. 43C is a cross-sectional view taken along the dashed-dotted line Y1-Y2 in FIG. 43A. The cross section in FIG. 43B is different from that in FIG. 41A in that a conductor 105 functioning as a second gate electrode is included. The cross section in FIG. 43C is different from that in FIG. 41B in that the conductor 105 is included and that part of the conductor 104 is embedded in an opening 143 provided in the insulator 106 and the insulator 101 to be in contact with the conductor 105. The conductor 105 faces the layer 108_2 with the insulator 101 positioned therebetween.

<Method for Manufacturing Transistor>

Next, an example of a method for manufacturing the transistor 100 in FIGS. 16A to 16C will be described with reference to FIGS. 19A to 19D, FIGS. 20A to 20D, and FIGS. 21A to 21C. Note that FIGS. 19A to 19D, FIGS. 20A to 20D, and FIGS. 21A to 21C are cross-sectional views in the channel length (L) direction and the channel width (W) direction and illustrate a method for manufacturing the transistor 100.

First, the insulator 101 is formed over the substrate 102, and an oxide semiconductor film is formed over the insulator 101. Then, the oxide semiconductor film is processed into an island shape, whereby the layer 108_2 is formed (see FIG. 19A).

The insulator 101 can be formed by a sputtering method, a CVD method, an evaporation method, a pulsed laser deposition (PLD) method, a printing method, a coating method, or the like as appropriate. In this embodiment, as the insulator 101, a 400-nm-thick silicon nitride film and a 50-nm-thick silicon oxynitride film are formed with a PECVD apparatus.

After the insulator 101 is formed, oxygen may be added to the insulator 101. As oxygen added to the insulator 101, an oxygen radical, an oxygen atom, an oxygen atomic ion, an oxygen molecular ion, or the like may be used. Oxygen can be added by an ion doping method, an ion implantation method, a plasma treatment method, or the like. Alternatively, a film that suppresses oxygen release may be formed over the insulator 101, and then, oxygen may be added to the insulator 101 through the film.

The above film that suppresses oxygen release can be formed using the following conductive material: a metal element selected from indium, zinc, gallium, tin, aluminum, chromium, tantalum, titanium, molybdenum, nickel, iron, cobalt, and tungsten; an alloy containing the metal element as a component; an alloy containing any of the metal elements in combination; a metal nitride containing the metal element; a metal oxide containing the metal element; a metal nitride oxide containing the metal element; or the like.

In the case where oxygen is added by plasma treatment in which oxygen is excited by a microwave to generate high-density oxygen plasma, the amount of oxygen added to the insulator 101 can be increased.

The layer 108_2 can be formed by a sputtering method, a coating method, a pulsed laser deposition method, a laser ablation method, a thermal CVD method, or the like. Note that the oxide semiconductor film can be processed into the layer 108_2 in such a manner that a mask is formed over the oxide semiconductor film by a lithography process, and then, the oxide semiconductor film is partly etched using the mask. Alternatively, the island-shaped layer 108_2 may be directly formed over the insulator 101 by a printing method.

As a power supply device for generating plasma when the oxide semiconductor film is formed by a sputtering method, an RF power supply device, an AC power supply device, a DC power supply device, or the like can be used as appropriate. As a sputtering gas for forming the oxide semiconductor film, a rare gas (typically argon), oxygen, or a mixed gas of a rare gas and oxygen is used as appropriate. In the mixed gas of a rare gas and oxygen, the proportion of oxygen to the rare gas is preferably increased.

To increase the crystallinity of the oxide semiconductor film formed by a sputtering method, for example, the oxide semiconductor film is preferably deposited at a substrate temperature higher than or equal to 150° C. and lower than or equal to 750° C., higher than or equal to 150° C. and lower than or equal to 450° C., or higher than or equal to 200° C. and lower than or equal to 350° C.

In this embodiment, as the layer 108_2, a 30-nm-thick oxide semiconductor film is deposited with a sputtering apparatus using an In—Ga—Zn metal oxide with an atomic ratio of In:Ga:Zn=4:2:4.1 as a sputtering target.

After the layer 108_2 is formed, the layer 108_2 may be dehydrated or dehydrogenated by heat treatment. The temperature of the heat treatment is typically higher than or equal to 150° C. and lower than the strain point of the substrate, higher than or equal to 250° C. and lower than or equal to 450° C., or higher than or equal to 300° C. and lower than or equal to 450° C.

The heat treatment can be performed in an inert gas atmosphere containing nitrogen or a rare gas such as helium, neon, argon, xenon, or krypton. Alternatively, the heat treatment may be performed in an inert gas atmosphere first, and then, in an oxygen atmosphere. It is preferable that the above inert gas atmosphere and the above oxygen atmosphere do not contain hydrogen, water, and the like. The treatment time may be longer than or equal to 3 minutes and shorter than or equal to 24 hours.

An electric furnace, an RTA apparatus, or the like can be used for the heat treatment. With the use of an RTA apparatus, the heat treatment can be performed at a temperature higher than or equal to the strain point of the substrate if the heating time is short. Therefore, the heat treatment time can be shortened.

By depositing the oxide semiconductor film while it is heated or by performing heat treatment after the formation of the oxide semiconductor film, the hydrogen concentration in the oxide semiconductor film, which is measured by secondary ion mass spectrometry, can be lower than or equal to $5\times10^{19}$ atoms/cm$^3$, lower than or equal to $1\times10^{19}$ atoms/cm$^3$, lower than or equal to $5\times10^{18}$ atoms/cm$^3$, lower than or equal to $1\times10^{18}$ atoms/cm$^3$, lower than or equal to $5\times10^{17}$ atoms/cm$^3$, or lower than or equal to $1\times10^{16}$ atoms/cm$^3$.

Note that the transistor 100A described above can be formed in such a manner that an oxide semiconductor film having a stacked-layer structure is formed in the step of forming the layer 108_2 and is processed into an island shape to form the layer 108_1 and the layer 108_2.

Figure 19A:
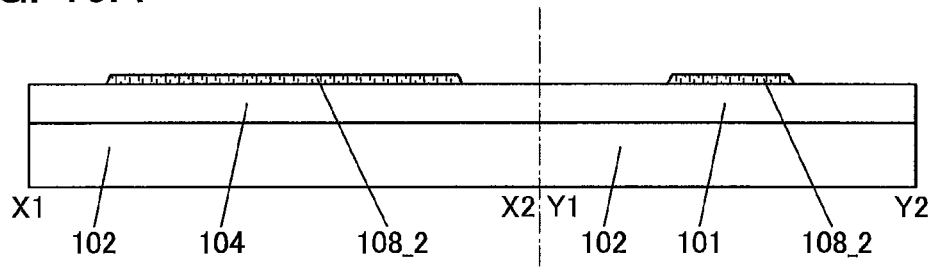
FIGS. 19A to 19D illustrate a method for manufacturing a transistor.
Figure 19B:
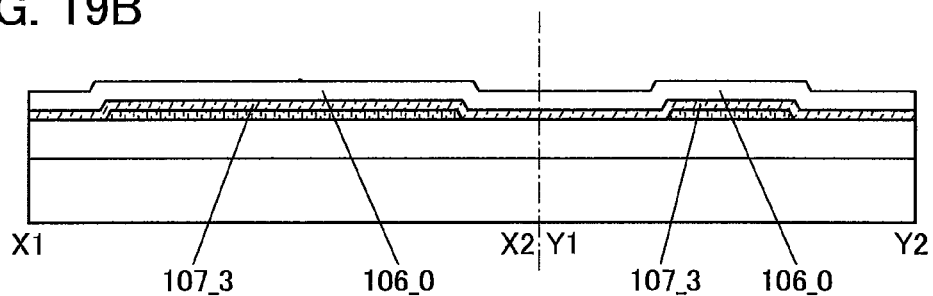

Next, an oxide semiconductor 107_3 to be the layer 108_3 and an insulator 106_0 are formed over the insulator 101 and the layer 108_2 (see FIG. 19B).

The oxide semiconductor 107_3 is formed to cover side surfaces of the layer 108_2. Note that the oxide semiconductor 107_3 can be formed using a material and a method similar to those of the layer 108_2 described above.

In this embodiment, as the oxide semiconductor 1073, a 5-nm-thick oxide semiconductor film is deposited with a sputtering apparatus using an In—Ga—Zn metal oxide with an atomic ratio of In:Ga:Zn=1:1:1.2 as a sputtering target.

As the insulator 106, a silicon oxide film or a silicon oxynitride film can be formed by a PECVD method. In this case, a deposition gas containing silicon and an oxidizing gas are preferably used as a source gas. Typical examples of the deposition gas containing silicon include silane, disilane, trisilane, silane fluoride, and the like. As examples of the oxidizing gas, oxygen, ozone, dinitrogen monoxide, nitrogen dioxide, and the like can be given.

A silicon oxynitride film having few defects can be formed as the insulator 106 by a PECVD method under the conditions where the gas flow rate of the oxidizing gas is more than 20 times and less than 100 times, or more than or equal to 40 times and less than or equal to 80 times, the gas flow rate of the deposition gas and that the pressure in a treatment chamber is lower than 100 Pa or lower than or equal to 50 Pa.

As the insulator 106, a dense silicon oxide film or a dense silicon oxynitride film can be formed under the conditions where the substrate placed in a vacuum-evacuated treatment chamber of a PECVD apparatus is held at a temperature higher than or equal to 280° C. and lower than or equal to 400° C., the pressure in the treatment chamber into which a source gas is introduced is set to be higher than or equal to 20 Pa and lower than or equal to 250 Pa, preferably higher than or equal to 100 Pa and lower than or equal to 250 Pa, and a high-frequency power is supplied to an electrode provided in the treatment chamber.

The insulator 106 may be formed by a PECVD method using a microwave. A microwave refers to a wave in the frequency range of 300 MHz to 300 GHz. In a microwave, electron temperature and electron energy are low. Furthermore, in the power supplied in a PECVD apparatus using a microwave, the proportion of power used for plasma generation, i.e., power used for ionization of molecules is high, whereas the proportion of power used for electron acceleration is low. Thus, plasma with high density (high-density plasma) can be generated. This method causes little plasma damage to the deposition surface or a deposit, so that the insulator 106 having few defects can be formed.

Alternatively, the insulator 106 can also be formed by a CVD method using an organosilane gas. As the organosilane gas, the following silicon-containing compound can be used: tetraethyl orthosilicate (TEOS) (chemical formula: Si(OC$_2$H$_5$)$_4$), tetramethylsilane (TMS) (chemical formula: Si(CH$_3$)$_4$), tetramethylcyclotetrasiloxane (TMCTS), octamethylcyclotetrasiloxane (OMCTS), hexamethyldisilazane (HMDS), triethoxysilane (SiH(OC$_2$H$_5$)$_3$), trisdimethylaminosilane (SiH(N(CH$_3$)$_2$)$_3$), or the like. By a CVD method using an organosilane gas, the insulator 106 having high coverage can be formed.

In this embodiment, as the insulator 106, a 100-nm-thick silicon oxynitride film is formed with a PECVD apparatus.

Next, a conductor 104_0 is formed over the insulator 106. In the case where an oxide semiconductor film is used as the conductor 104_0, oxygen is added from the conductor 104_0 to the insulator 106 in the formation of the conductor 104_0 (see FIG. 19C).

The conductor 104_0 can be formed by a sputtering method or the like.

Figure 19C:
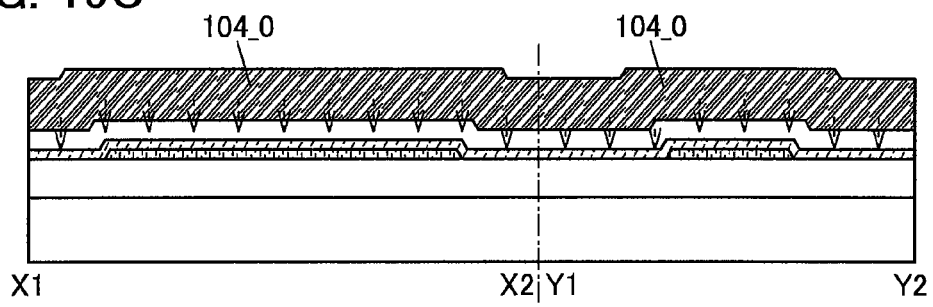

In the case where an oxide semiconductor film is used as the conductor 1040, the oxide semiconductor film is preferably formed in an atmosphere containing an oxygen gas. Since the atmosphere in which the conductor 104_0 is formed contains an oxygen gas, oxygen can be favorably added to the insulator 106. In FIG. 19C, oxygen added to the insulator 106 is schematically shown by arrows. For the conductor 104_0, a material similar to that of the layer 108_2 described above can be used.

Figure 19D:
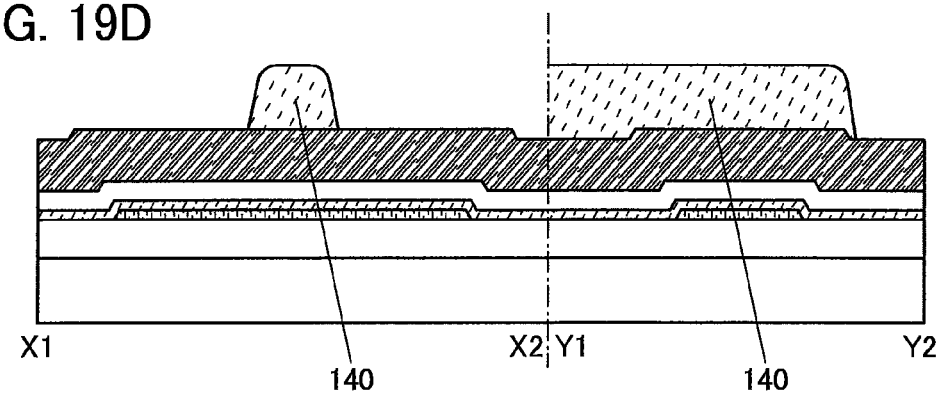

Subsequently, a mask 140 is formed by a lithography process in a desired position over the conductor 104_0 (see FIG. 19D).

Figure 20A:
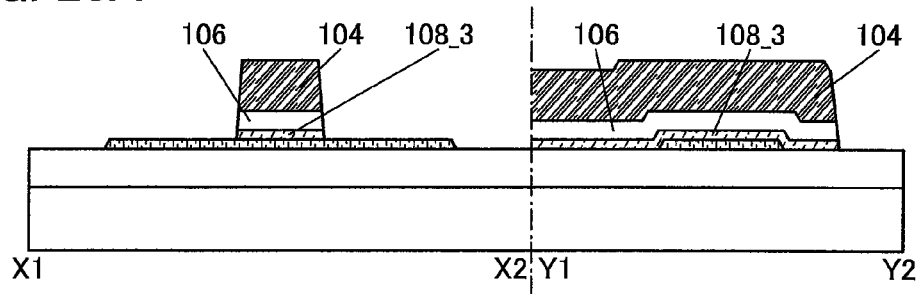
FIGS. 20A to 20D illustrate a method for manufacturing a transistor.

Next, the conductor 104_0, the insulator 106, and the oxide semiconductor 107_3 are processed by etching from above the mask 140, and then, the mask 140 is removed, so that the island-shaped conductor 104, the island-shaped insulator 106, and the island-shaped layer 108_3 are formed (see FIG. 20A).

Note that a surface of the layer 108_2 is partly exposed when the layer 108_3 is formed. The exposed regions of the layer 108_2 serve as the source region 108s and the drain region 108d later.

In this embodiment, the conductor 104_0, the insulator 106, and the layer 108_3 are processed by a dry etching method.

In the processing into the conductor 104, the insulator 106, and the layer 108_3, the thickness of the layer 108_2 in a region not overlapping with the conductor 104 is decreased in some cases. In other cases, in the processing into the conductor 104, the insulator 106, and the layer 108_3, the thickness of the insulator 101 in a region not overlapping with the layer 108_2 is decreased.

Figure 20B:
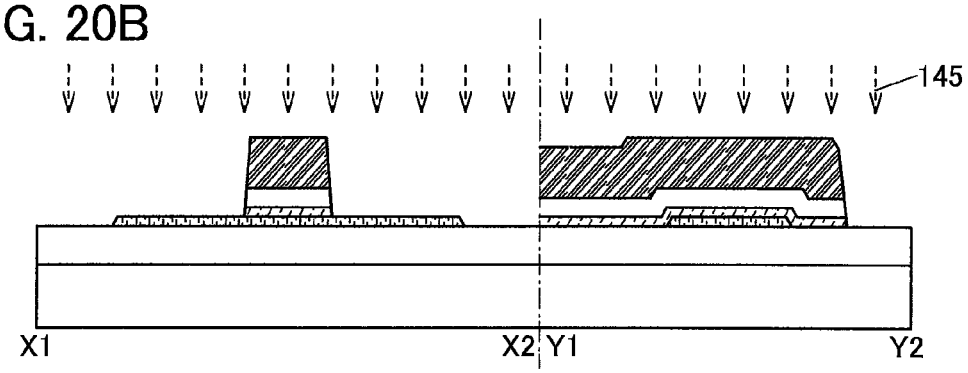
Figure 20C:
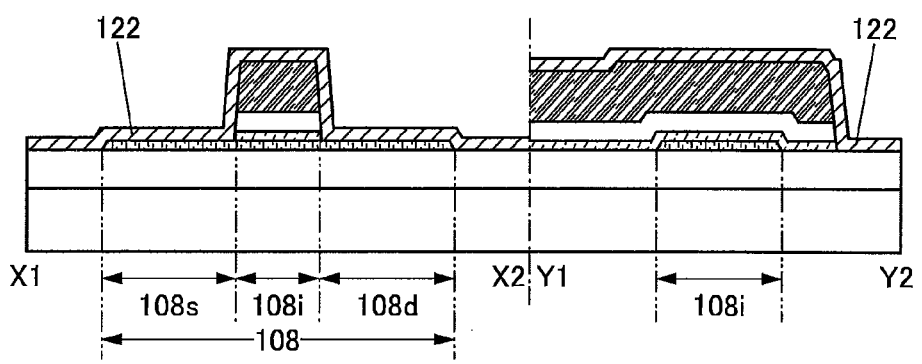

Next, an impurity element 145 is added from above the insulator 101, the layer 108_2, and the conductor 104 (see FIG. 20B).

The impurity element 145 can be added by an ion doping method, an ion implantation method, a plasma treatment method, or the like. In a plasma treatment method, an impurity element can be added using plasma generated in a gas atmosphere containing the impurity element. A dry etching apparatus, an ashing apparatus, a PECVD apparatus, a high-density PECVD apparatus, or the like can be used to generate plasma.

As a source gas of the impurity element 145, at least one of $B_2H_6$, $PH_3$, $CH_4$, $N_2$, $NH_3$, $AlH_3$, $AlCl_3$, $SiH_4$, $Si_2H_6$, $F_2$, HF, $H_2$, and a rare gas (e.g., argon) can be used. Alternatively, at least one of $B_2H_6$, $PH_3$, $N_2$, $NH_3$, $AlH_3$, $AlCl_3$, $F_2$, HF, and $H_2$ which are diluted with a rare gas can be used. At least one of $B_2H_6$, $PH_3$, $N_2$, $NH_3$, $AlH_3$, $AlCl_3$, $F_2$, HF, and $H_2$ which are diluted with a rare gas is used to add the impurity element 145 to the layer 108_2 and the conductor 104, whereby at least one of a rare gas, hydrogen, boron, carbon, nitrogen, fluorine, phosphorus, sulfur, and chlorine can be added to the layer 108_2 and the conductor 104.

Alternatively, after being added to the layer 108_2 and the conductor 104 with the use of a rare gas as a source gas, the impurity element 145 may be added thereto with the use of at least one of $B_2H_6$, $PH_3$, $CH_4$, $N_2$, $NH_3$, $AlH_3$, $AlCl_3$, $SiH_4$, $Si_2H_6$, $F_2$, HF, and $H_2$ as a source gas.

Alternatively, after being added to the layer 108_2 and the conductor 104 with the use of at least one of $B_2H_6$, $PH_3$, $CH_4$, $N_2$, $NH_3$, $AlH_3$, $AlCl_3$, $SiH_4$, $Si_2H_6$, $F_2$, HF, and $H_2$ as a source gas, the impurity element 145 may be added thereto with the use of a rare gas as a source gas.

The addition of the impurity element 145 may be controlled by appropriately setting the implantation conditions such as the accelerating voltage and the dose. For example, in the case where argon is added by an ion implantation method, the accelerating voltage may be higher than or equal to 10 kV and lower than or equal to 100 kV and the dose may be greater than or equal to $1\times10^{13}$ ions/cm$^2$ and less than or equal to $1\times10^{16}$ ions/cm$^2$, for example, $1\times10^{14}$ ions/cm$^2$. In the case where phosphorus ions are added by an ion implantation method, the accelerating voltage may be 30 kV and the dose may be greater than or equal to $1\times10^{13}$ ions/cm$^2$ and less than or equal to $5\times10^{16}$ ions/cm$^2$, for example, $1\times10^{15}$ ions/cm$^2$.

One embodiment of the present invention is not limited to the example described in this embodiment, in which the impurity element 145 is added after the mask 140 is removed; for example, the impurity element 145 may be added with the mask 140 left.

In this embodiment, as the impurity element 145, argon is added to the layer 108_2 with the use of a doping apparatus. Note that one embodiment of the present invention is not limited thereto, and for example, the step of adding the impurity element 145 is not necessarily performed.

Next, the insulator 122 is formed over the insulator 101, the layer 108_2, and the conductor 104. As a result of the formation of the insulator 122, regions of the layer 108_2 which are in contact with the insulator 122 serve as the source region 108s and the drain region 108d. In addition, the layer 108_3 and regions of the layer 108_2 which are not in contact with the insulator 122 serve as the channel region 108i. In this manner, the oxide semiconductor 108 of one embodiment of the present invention is formed (see FIG. 20C).

Thus, the oxide semiconductor 108 includes the channel region 108i overlapping with the conductor 104, the source region 108s in contact with the insulator 122, and the drain region 108d in contact with the insulator 122. The channel region 108i includes the layer 108_2 and the layer 108_3 which is in contact with a top surface of the layer 108_2 and covers side surfaces of the layer 108_2 in the channel width direction.

Note that the insulator 122 can be formed using a material selected from the materials described above. In this embodiment, as the insulator 122, a 100-nm-thick silicon nitride film is formed with a PECVD apparatus.

With the silicon nitride film used as the insulator 122, hydrogen in the silicon nitride film enters the conductor 104, the source region 108s, and the drain region 108d in contact with the insulator 122; consequently, the carrier densities in the conductor 104, the source region 108s, and the drain region 108d can be increased.

Figure 20D:
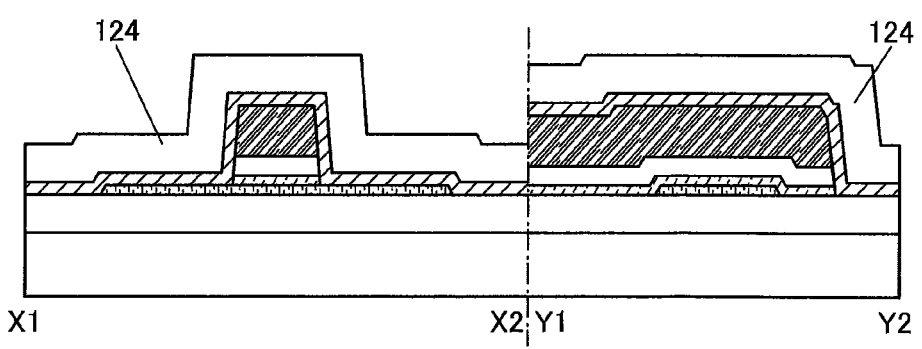

Next, the insulator 124 is formed over the insulator 122 (see FIG. 20D).

The insulator 124 can be formed using a material selected from the materials described above. In this embodiment, as the insulator 124, a 300-nm-thick silicon oxynitride film is formed with a PECVD apparatus.

Figure 21A:
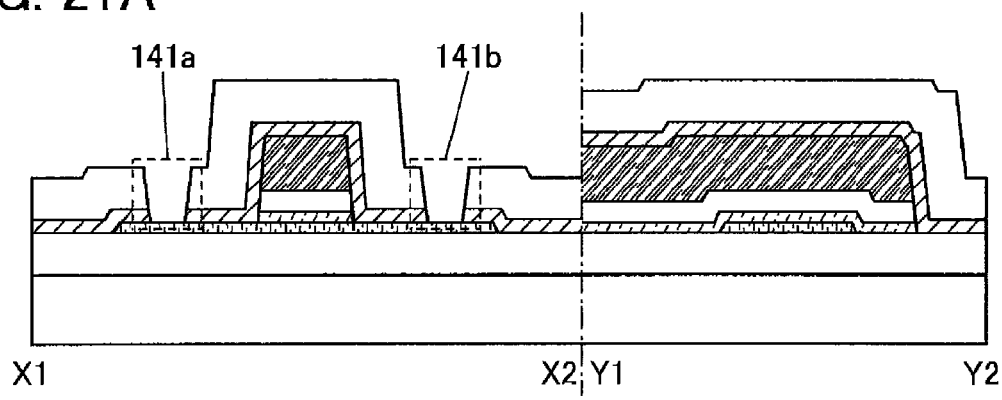
FIGS. 21A to 21C illustrate a method for manufacturing a transistor.

Subsequently, a mask is formed by a lithography process in a desired position over the insulator 124, and then, the insulator 124 and the insulator 122 are partly etched, so that the opening 141a reaching the source region 108s and the opening 141b reaching the drain region 108d are formed (see FIG. 21A).

As a method for etching the insulator 124 and the insulator 122, a wet etching method and/or a dry etching method can be used as appropriate. In this embodiment, the insulator 124 and the insulator 122 are processed by a dry etching method.

Figure 21B:
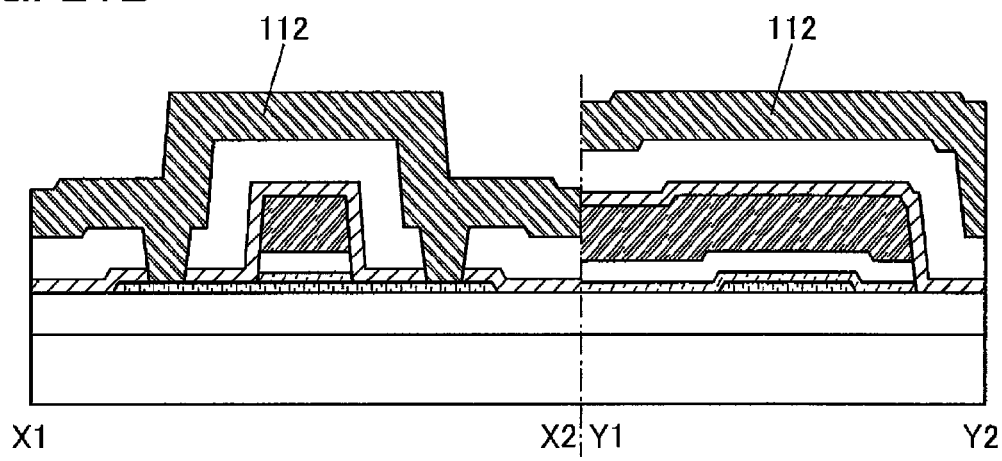

Next, a conductor 112 is formed over the insulator 124 to cover the openings 141a and 141b (see FIG. 21B).

The conductor 112 can be formed using a material that can be used for the conductors 112a and 112b. In this embodiment, as the conductor 112, a stack of a 50-nm-thick titanium film, a 400-nm-thick aluminum film, and a 100-nm-thick titanium film is formed with a sputtering apparatus.

Figure 21C:
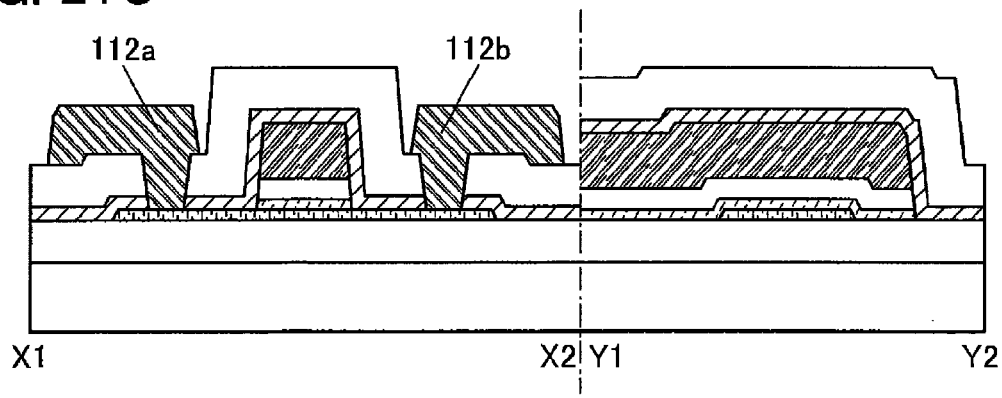

Subsequently, a mask is formed by a lithography process in a desired position over the conductor 112, and then, the conductor 112 is partly etched, so that the conductors 112a and 112b are formed (see FIG. 21C).

As a method for processing the conductor 112, a wet etching method and/or a dry etching method can be used as appropriate. In this embodiment, the conductor 112 is processed into the conductors 112a and 112b by a dry etching method.

Through the above steps, the transistor 100 in FIGS. 16A to 16C can be manufactured.

Note that a film or a layer included in the transistor 100 (e.g., an insulator, an oxide semiconductor, or a conductor) can be formed by a sputtering method, a chemical vapor deposition (CVD) method, a vacuum evaporation method, a pulsed laser deposition (PLD) method, or an atomic layer deposition (ALD) method. Alternatively, a coating method or a printing method can be used. Although a sputtering method and a plasma-enhanced chemical vapor deposition (PECVD) method are typical deposition methods, a thermal CVD method may also be used. As an example of a thermal CVD method, a metal organic chemical vapor deposition (MOCVD) method can be given.

Deposition by a thermal CVD method is performed in such a manner that a source gas and an oxidizer are supplied at a time to a chamber in which the pressure is set to an atmospheric pressure or a reduced pressure, and the source gas and the oxidizer react with each other in the vicinity of the substrate or over the substrate. As seen above, a thermal CVD method has an advantage that no defect due to plasma damage is generated because it does not utilize plasma for forming a film.

Deposition by an ALD method may be performed in such a manner that the pressure inside a chamber is set to an atmospheric pressure or a reduced pressure, source gases for reaction are sequentially introduced into the chamber, and then the sequence of the gas introduction is repeated. An inert gas (e.g., argon or nitrogen) may be introduced as a carrier gas together with the source gas. For example, two or more kinds of source gases may be sequentially supplied to the chamber. In this case, an inert gas is introduced between reaction of a first source gas and introduction of a second source gas to prevent the source gases from being mixed. Alternatively, the first source gas may be exhausted by vacuum evacuation instead of the introduction of the inert gas, and then the second source gas may be introduced. The first source gas is adsorbed on the surface of the substrate and reaction is caused to form a first layer; then the second source gas is introduced and adsorption and reaction are caused to form a second layer over the first layer; as a result, a thin film is formed. The sequence of the gas introduction is controlled and repeated plural times until a desired thickness is obtained, whereby a thin film with excellent step coverage can be formed. The thickness of the thin film can be precisely adjusted by the number of repetition times of the sequence of the gas introduction; therefore, an ALD method is suitable for manufacturing a minute FET.

Films of the conductor, the insulator, and the oxide semiconductor can be formed by a thermal CVD method such as an MOCVD method. For example, in the case where an In—Ga—Zn—O film is formed, trimethylindium (In($CH_3$)$_3$), trimethylgallium (Ga($CH_3$)$_3$), and dimethylzinc (Zn($CH_3$)$_2$) are used. Without limitation to the above combination, triethylgallium (chemical formula: Ga($C_2H_5$)$_3$) can be used instead of trimethylgallium and diethylzinc (chemical formula: Zn($C_2H_5$)$_2$) can be used instead of dimethylzinc.

For example, in the case where a hafnium oxide film is formed by a deposition apparatus using an ALD method, two kinds of gases, that is, ozone ($O_3$) as an oxidizer and a source gas which is obtained by vaporizing liquid containing a solvent and a hafnium precursor compound (e.g., a hafnium alkoxide or a hafnium amide such as tetrakis(dimethylamide)hafnium (TDMAH, Hf[N($CH_3$)$_2$]$_4$) or tetrakis(ethylmethylamide)hafnium).

For example, in the case where an aluminum oxide film is formed by a deposition apparatus using an ALD method, two kinds of gases, e.g., $H_2O$ as an oxidizer and a source gas which is obtained by vaporizing a liquid containing a solvent and an aluminum precursor compound (e.g., trimethylaluminum (TMA, Al($CH_3$)$_3$)) are used. Examples of another material liquid include tris(dimethylamide)aluminum, triisobutylaluminum, and aluminum tris(2,2,6,6-tetramethyl-3,5-heptanedionate).

For example, in the case where a silicon oxide film is formed with a deposition apparatus using an ALD method, hexachlorodisilane is adsorbed on a surface where a film is to be formed, and radicals of an oxidizing gas (e.g., $O_2$ or dinitrogen monoxide) are supplied to react with the adsorbate.

For example, in the case where a tungsten film is formed with a deposition apparatus using an ALD method, a $WF_6$ gas and a $B_2H_6$ gas are used to form an initial tungsten film, and then a $WF_6$ gas and an $H_2$ gas are used to form a tungsten film. Note that an $SiH_4$ gas may be used instead of a $B_2H_6$ gas.

For example, in the case where an oxide semiconductor film, e.g., an In—Ga—Zn—O film is formed with a deposition apparatus using an ALD method, an In($CH_3$)$_3$ gas and an $O_3$ gas are used to form an In—O layer, then a Ga($CH_3$)$_3$ gas and an $O_3$ gas are used to form a Ga—O layer, and then a Zn($CH_3$)$_2$ gas and an $O_3$ gas are used to form a Zn—O layer. Note that the order of these layers is not limited to this example. A mixed compound layer such as an In—Ga—O layer, an In—Zn—O layer, or a Ga—Zn—O layer may be formed using these gases. Note that although an $H_2O$ gas which is obtained by bubbling water with an inert gas such as Ar may be used instead of an $O_3$ gas, it is preferable to use an $O_3$ gas, which does not contain H.

Embodiment 3

In this embodiment, an oxide semiconductor of one embodiment of the present invention will be described.

<Structure of Oxide Semiconductor>

A structure of an oxide semiconductor is described below.

An oxide semiconductor is classified into a single crystal oxide semiconductor and a non-single-crystal oxide semiconductor. Examples of a non-single-crystal oxide semiconductor include a c-axis-aligned crystalline oxide semiconductor (CAAC-OS), a polycrystalline oxide semiconductor, a nanocrystalline oxide semiconductor (nc-OS), an amorphous-like oxide semiconductor (a-like OS), and an amorphous oxide semiconductor.

From another perspective, an oxide semiconductor is classified into an amorphous oxide semiconductor and a crystalline oxide semiconductor. Examples of a crystalline oxide semiconductor include a single crystal oxide semiconductor, a CAAC-OS, a polycrystalline oxide semiconductor, and an nc-OS.

An amorphous structure is generally thought to be isotropic and have no non-uniform structure, to be metastable and not have fixed positions of atoms, to have a flexible bond angle, and to have a short-range order but have no long-range order, for example.

This means that a stable oxide semiconductor cannot be regarded as a completely amorphous oxide semiconductor. Moreover, an oxide semiconductor that is not isotropic (e.g., an oxide semiconductor that has a periodic structure in a microscopic region) cannot be regarded as a completely amorphous oxide semiconductor. In contrast, an a-like OS, which is not isotropic, has an unstable structure that contains a void. Because of its instability, an a-like OS is close to an amorphous oxide semiconductor in terms of physical properties.

<CAAC-OS>

First, a CAAC-OS is described.

A CAAC-OS is one of oxide semiconductors having a plurality of c-axis aligned crystal parts (also referred to as pellets).

Figure 22A:
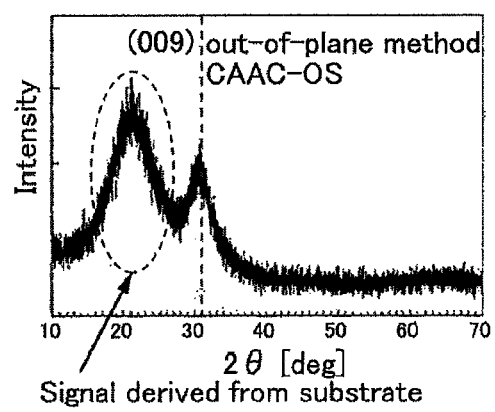
FIGS. 22A to 22E show structural analysis of a CAAC-OS and a single crystal oxide semiconductor by XRD and selected-area electron diffraction patterns of a CAAC-OS.

Analysis of a CAAC-OS by X-ray diffraction (XRD) is described. For example, when the structure of a CAAC-OS including an $InGaZnO_4$ crystal that is classified into the space group R-3m is analyzed by an out-of-plane method, a peak appears at a diffraction angle (2θ) of around 31° as shown in FIG. 22A. This peak is derived from the (009) plane of the InGaZnO$_4$ crystal, which indicates that crystals in the CAAC-OS have c-axis alignment, and that the c-axes are aligned in a direction substantially perpendicular to a surface over which the CAAC-OS film is formed (also referred to as a formation surface) or the top surface of the CAAC-OS film. Note that a peak sometimes appears at a 2θ of around 36° in addition to the peak at a 2θ of around 31°. The peak at a 2θ of around 36° is derived from a crystal structure that is classified into the space group Fd-3m; thus, this peak is preferably not exhibited in a CAAC-OS.

Figure 22B:
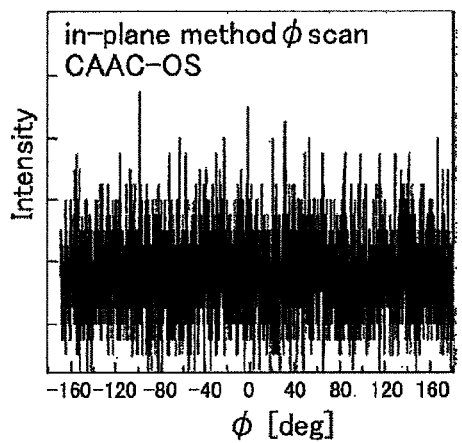
Figure 22C:
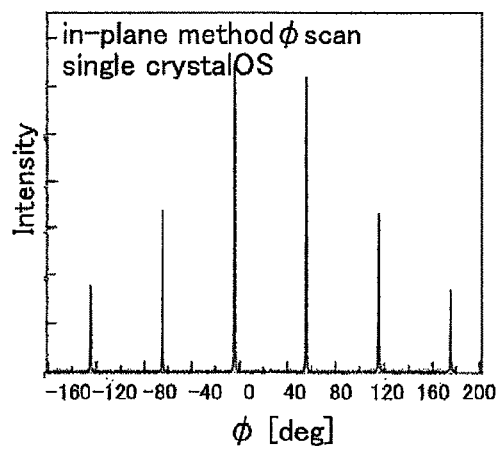

On the other hand, in structural analysis of the CAAC-OS by an in-plane method in which an X-ray is incident on the CAAC-OS in a direction parallel to the formation surface, a peak appears at a 2θ of around 56°. This peak is attributed to the (110) plane of the InGaZnO$_4$ crystal. When analysis (φ scan) is performed with a 2θ fixed at around 56° and with the sample rotated using a normal vector to the sample surface as an axis (φ axis), as shown in FIG. 22B, a peak is not clearly observed. In contrast, in the case where single crystal InGaZnO$_4$ is subjected to scan with a 2θ fixed at around 56°, as shown in FIG. 22C, six peaks that are derived from crystal planes equivalent to the (110) plane are observed. Accordingly, the structural analysis using XRD shows that the directions of a-axes and b-axes are irregularly oriented in the CAAC-OS.

Figure 22D:
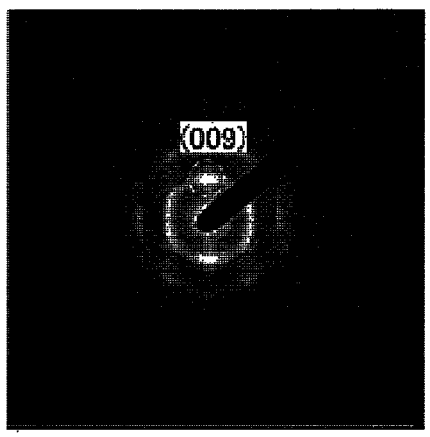
Figure 22E:
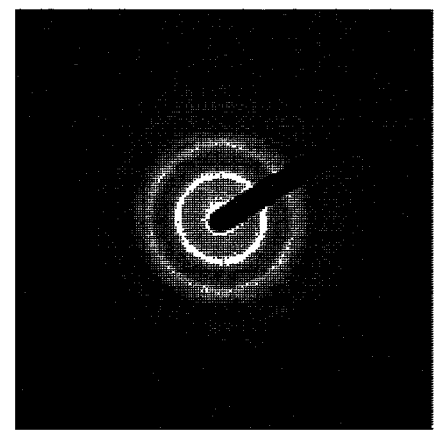

Next, a CAAC-OS analyzed by electron diffraction is described. For example, when an electron beam with a probe diameter of 300 nm is incident on a CAAC-OS including an InGaZnO$_4$ crystal in a direction parallel to the formation surface of the CAAC-OS, a diffraction pattern (also referred to as a selected-area electron diffraction pattern) shown in FIG. 22D can be obtained. In this diffraction pattern, spots derived from the (009) plane of an InGaZnO$_4$ crystal are included. Thus, the electron diffraction also indicates that pellets included in the CAAC-OS have c-axis alignment and that the c-axes are aligned in a direction substantially perpendicular to the formation surface or the top surface of the CAAC-OS. Meanwhile, FIG. 22E shows a diffraction pattern obtained in such a manner that an electron beam with a probe diameter of 300 nm is incident on the same sample in a direction perpendicular to the sample surface. As shown in FIG. 22E, a ring-like diffraction pattern is observed. Thus, the electron diffraction using an electron beam with a probe diameter of 300 nm also indicates that the a-axes and b-axes of the pellets included in the CAAC-OS do not have regular orientation. The first ring in FIG. 22E is considered to be derived from the (010) plane, the (100) plane, and the like of the InGaZnO$_4$ crystal. The second ring in FIG. 22E is considered to be derived from the (110) plane and the like.

In a combined analysis image (also referred to as a high-resolution TEM image) of a bright-field image and a diffraction pattern of a CAAC-OS, which is obtained using a transmission electron microscope (TEM), a plurality of pellets can be observed. However, even in the high-resolution TEM image, a boundary between pellets, that is, a grain boundary is not clearly observed in some cases. Thus, in the CAAC-OS, a reduction in electron mobility due to the grain boundary is less likely to occur.

Figure 23A:
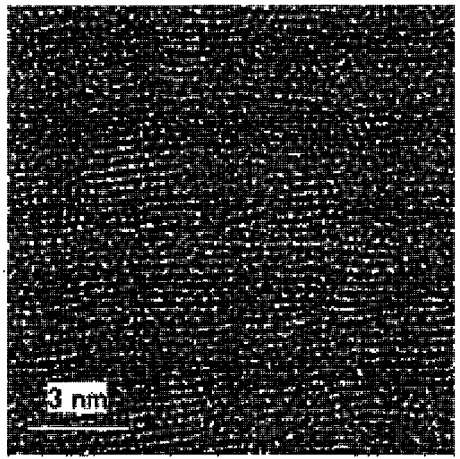
FIGS. 23A to 23E show a cross-sectional TEM image and plan-view TEM images of a CAAC-OS and images obtained through analysis thereof.

FIG. 23A shows a high-resolution TEM image of a cross section of the CAAC-OS that is observed from a direction substantially parallel to the sample surface. The high-resolution TEM image is obtained with a spherical aberration corrector function. The high-resolution TEM image obtained with a spherical aberration corrector function is particularly referred to as a Cs-corrected high-resolution TEM image. The Cs-corrected high-resolution TEM image can be observed with, for example, an atomic resolution analytical electron microscope JEM-ARM200F manufactured by JEOL Ltd.

FIG. 23A shows pellets in which metal atoms are arranged in a layered manner. FIG. 23A proves that the size of a pellet is greater than or equal to 1 nm or greater than or equal to 3 nm. Therefore, the pellet can also be referred to as a nanocrystal (nc). Furthermore, the CAAC-OS can also be referred to as an oxide semiconductor including c-axis aligned nanocrystals (CANC). A pellet reflects unevenness of a formation surface or a top surface of the CAAC-OS, and is parallel to the formation surface or the top surface of the CAAC-OS.

Figure 23B:
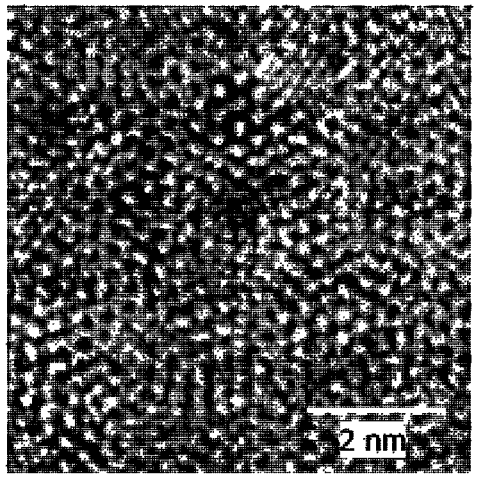
Figure 23C:
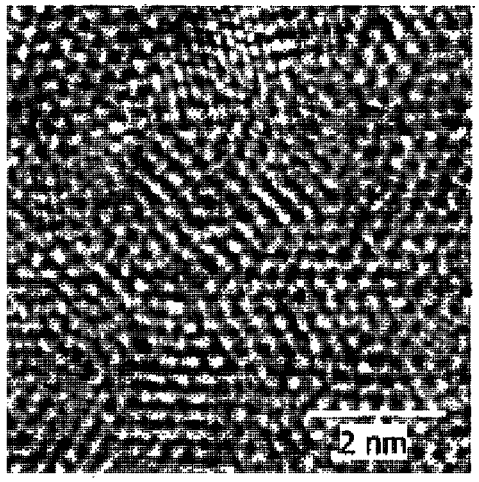
Figure 23D:
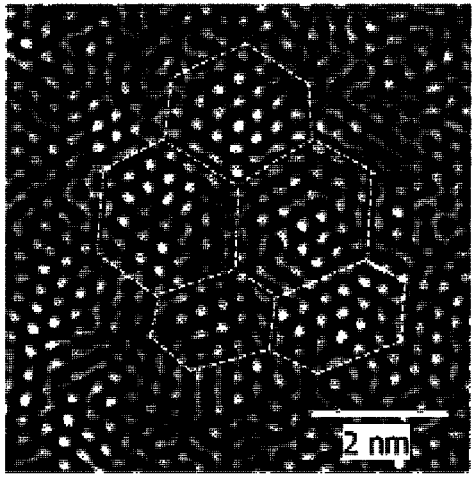
Figure 23E:
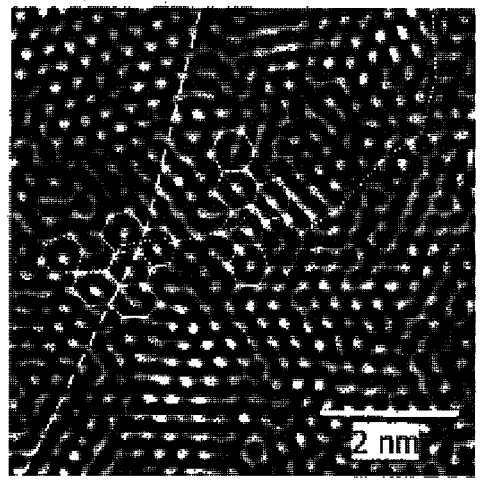

FIGS. 23B and 23C show Cs-corrected high-resolution TEM images of a plane of the CAAC-OS observed from a direction substantially perpendicular to the sample surface. FIGS. 23D and 23E are images obtained through image processing of FIGS. 23B and 23C. The method of image processing is as follows. The image in FIG. 23B is subjected to fast Fourier transform (FFT), so that FFT images are obtained. Then, mask processing is performed such that a range of from 2.8 nm$^{-1}$ to 5.0 nm$^{-1}$ from the origin point in the obtained FFT images remains. After the mask processing, the FFT images are processed by inverse fast Fourier transform (IFFT) to obtain processed images. The images obtained in this manner are called FFT filtering images. An FFT filtering image is a Cs-corrected high-resolution TEM image from which a periodic component is extracted, and shows a lattice arrangement.

In FIG. 23D, a portion where a lattice arrangement is broken is denoted with a dashed line. A region surrounded by a dashed line is one pellet. The portion shown by the dashed line is a junction of pellets. The dashed line draws a hexagon, which means that the pellet has a hexagonal shape. Note that the shape of the pellet is not always a regular hexagon but is a non-regular hexagon in many cases.

In FIG. 23E, a dotted line denotes a portion where the direction of a lattice arrangement is changed between a region with a regular lattice arrangement and another region with a regular lattice arrangement, and a dashed line denotes the change in the direction of the lattice arrangement. A clear grain boundary cannot be observed even in the vicinity of the dotted line. When a lattice point in the vicinity of the dotted line is regarded as a center and surrounding lattice points are joined, a distorted hexagon, pentagon, and/or heptagon can be formed. That is, a lattice arrangement is distorted so that formation of a grain boundary is inhibited. This is probably because the CAAC-OS can tolerate distortion owing to a low density of the atomic arrangement in an a-b plane direction, the interatomic bond distance changed by substitution of a metal element, and the like.

As described above, the CAAC-OS has c-axis alignment, its pellets (nanocrystals) are connected in an a-b plane direction, and the crystal structure has distortion. For this reason, the CAAC-OS can also be referred to as an oxide semiconductor including a c-axis-aligned a-b-plane-anchored (CAA) crystal.

The CAAC-OS is an oxide semiconductor with high crystallinity. Entry of impurities, formation of defects, or the like might decrease the crystallinity of an oxide semiconductor. This means that the CAAC-OS has small amounts of impurities and defects (e.g., oxygen vacancies).

Note that the impurity means an element other than the main components of the oxide semiconductor, such as hydrogen, carbon, silicon, or a transition metal element.

For example, an element (specifically, silicon or the like) having higher strength of bonding to oxygen than a metal element included in an oxide semiconductor extracts oxygen from the oxide semiconductor, which results in disorder of the atomic arrangement and reduced crystallinity of the oxide semiconductor. A heavy metal such as iron or nickel, argon, carbon dioxide, or the like has a large atomic radius (or molecular radius), and thus disturbs the atomic arrangement of the oxide semiconductor and decreases crystallinity.

The characteristics of an oxide semiconductor having impurities or defects might be changed by light, heat, or the like. Impurities included in the oxide semiconductor might serve as carrier traps or carrier generation sources, for example. For example, oxygen vacancies in the oxide semiconductor might serve as carrier traps or serve as carrier generation sources when hydrogen is captured therein.

The CAAC-OS having small amounts of impurities and oxygen vacancies is an oxide semiconductor with a low carrier density. A CAAC-OS has a low impurity concentration and a low density of defect states. Thus, the CAAC-OS can be referred to as an oxide semiconductor having stable characteristics.

<nc-OS>

Next, an nc-OS is described.

Analysis of an nc-OS by XRD is described. When the structure of an nc-OS is analyzed by an out-of-plane method, a peak indicating orientation does not appear. That is, a crystal of an nc-OS does not have orientation.

Figure 24A:
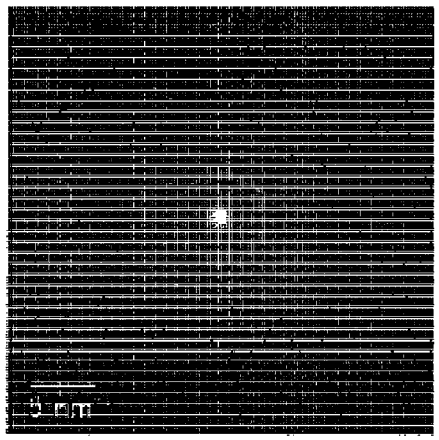
FIGS. 24A to 24D show electron diffraction patterns and a cross-sectional TEM image of an nc-OS.
Figure 24B:
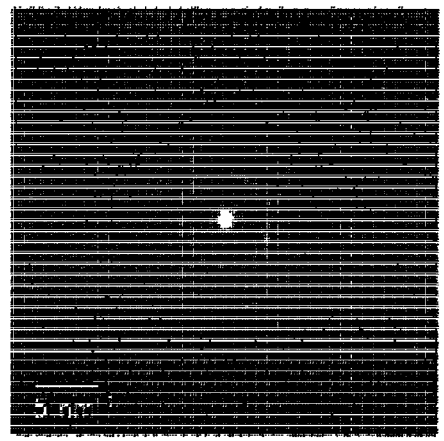

For example, when an electron beam with a probe diameter of 50 nm is incident on a 34-nm-thick region of thinned nc-OS including an InGaZnO$_4$ crystal in a direction parallel to the formation surface, a ring-shaped diffraction pattern (a nanobeam electron diffraction pattern) shown in FIG. 24A is observed. FIG. 24B shows a diffraction pattern (a nanobeam electron diffraction pattern) obtained when an electron beam with a probe diameter of 1 nm is incident on the same sample. As shown in FIG. 24B, a plurality of spots are observed in a ring-like region. In other words, ordering in an nc-OS is not observed with an electron beam with a probe diameter of 50 nm but is observed with an electron beam with a probe diameter of 1 nm.

Figure 24C:
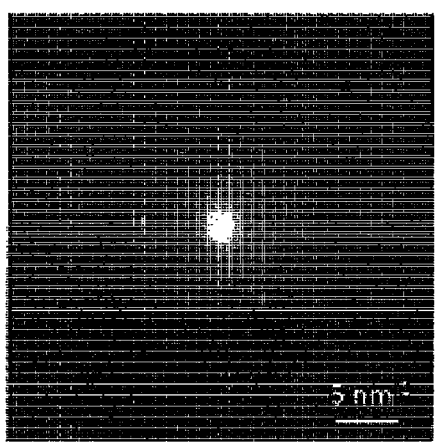

Furthermore, an electron diffraction pattern in which spots are arranged in an approximately regular hexagonal shape is observed in some cases as shown in FIG. 24C when an electron beam having a probe diameter of 1 nm is incident on a region with a thickness of less than 10 nm. This means that an nc-OS has a well-ordered region, i.e., a crystal, in the range of less than 10 nm in thickness. Note that an electron diffraction pattern having regularity is not observed in some regions because crystals are aligned in various directions.

Figure 24D:
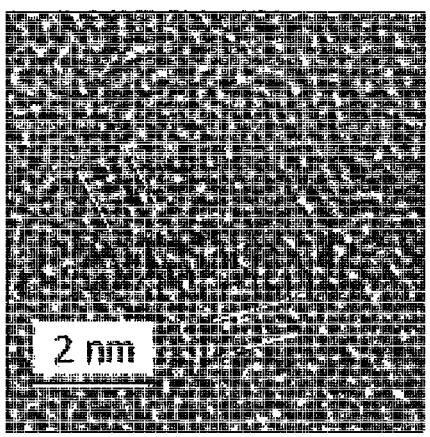

FIG. 24D shows a Cs-corrected high-resolution TEM image of a cross section of an nc-OS observed from the direction substantially parallel to the formation surface. In a high-resolution TEM image, an nc-OS has a region in which a crystal part is observed, such as the part indicated by additional lines in FIG. 24D, and a region in which a crystal part is not clearly observed. In most cases, the size of a crystal part included in the nc-OS is greater than or equal to 1 nm and less than or equal to 10 nm, or specifically, greater than or equal to 1 nm and less than or equal to 3 mm. Note that an oxide semiconductor including a crystal part whose size is greater than 10 nm and less than or equal to 100 nm is sometimes referred to as a microcrystalline oxide semiconductor. In a high-resolution TEM image of the nc-OS, for example, a grain boundary is not clearly observed in some cases. Note that there is a possibility that the origin of the nanocrystal is the same as that of a pellet in a CAAC-OS. Therefore, a crystal part of the nc-OS may be referred to as a pellet in the following description.

As described above, in the nc-OS, a microscopic region (e.g., a region with a size greater than or equal to 1 nm and less than or equal to 10 nm, in particular, a region with a size greater than or equal to 1 nm and less than or equal to 3 nm) has a periodic atomic arrangement. There is no regularity of crystal orientation between different pellets in the nc-OS. Thus, the orientation of the whole film is not ordered. Accordingly, the nc-OS cannot be distinguished from an a-like OS or an amorphous oxide semiconductor, depending on an analysis method.

Since there is no regularity of crystal orientation between the pellets (nanocrystals), the nc-OS can also be referred to as an oxide semiconductor including random aligned nanocrystals (RANC) or an oxide semiconductor including non-aligned nanocrystals (NANC).

The nc-OS is an oxide semiconductor that has high regularity as compared with an amorphous oxide semiconductor. Therefore, the nc-OS is likely to have a lower density of defect states than an a-like OS and an amorphous oxide semiconductor. Note that there is no regularity of crystal orientation between different pellets in the nc-OS. Therefore, the nc-OS has a higher density of defect states than the CAAC-OS in some cases.

<a-Like OS>

An a-like OS has a structure between those of the nc-OS and the amorphous oxide semiconductor.

FIGS. 25A and 25B are high-resolution cross-sectional TEM images of an a-like OS. FIG. 25A is the high-resolution cross-sectional TEM image of the a-like OS at the start of the electron irradiation. FIG. 25B is the high-resolution cross-sectional TEM image of the a-like OS after the electron (e) irradiation at $4.3 \times 10^8$ e$^-$/nm$^2$. FIGS. 25A and 25B show that stripe-like bright regions extending vertically are observed in the a-like OS from the start of the electron irradiation. It can be also found that the shape of the bright region changes after the electron irradiation. Note that the bright region is presumably a void or a low-density region.

The a-like OS has an unstable structure because it contains a void. To verify that an a-like OS has an unstable structure as compared with a CAAC-OS and an nc-OS, a change in structure caused by electron irradiation is described below.

An a-like OS, an nc-OS, and a CAAC-OS are prepared as samples. Each of the samples is an In—Ga—Zn oxide.

First, a high-resolution cross-sectional TEM image of each sample is obtained. The high-resolution cross-sectional TEM images show that all the samples have crystal parts.

It is known that a unit cell of an InGaZnO$_4$ crystal has a structure in which nine layers including three In—O layers and six Ga—Zn—O layers are stacked in the c-axis direction. The distance between the adjacent layers is equivalent to the lattice spacing on the (009) plane (also referred to as d value). The value is calculated to be 0.29 nm from crystal structural analysis. Accordingly, a portion where the spacing between lattice fringes is greater than or equal to 0.28 nm and less than or equal to 0.30 nm is regarded as a crystal part of InGaZnO$_4$ in the following description. Each of lattice fringes corresponds to the a-b plane of the InGaZnO$_4$ crystal.

Figure 26:
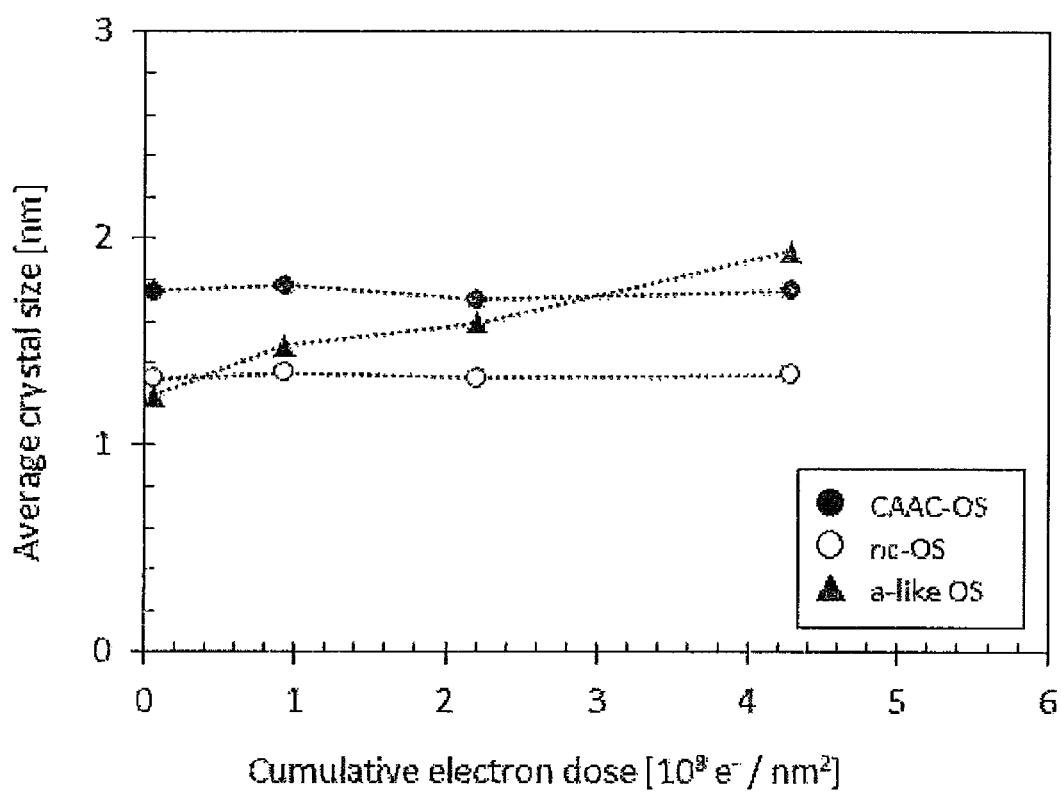
FIG. 26 shows a change of crystal parts of an In—Ga—Zn oxide owing to electron irradiation.

FIG. 26 shows a change in the average size of crystal parts (at 22 points to 30 points) in each sample. Note that the crystal part size corresponds to the length of a lattice fringe. FIG. 26 indicates that the crystal part size in the a-like OS increases with an increase in the cumulative electron dose in obtaining TEM images, for example. As shown in FIG. 26, a crystal part of approximately 1.2 nm (also referred to as an initial nucleus) at the start of TEM observation grows to a size of approximately 1.9 nm at a cumulative electron (e) dose of $4.2 \times 10^8$ e$^-$/nm$^2$. In contrast, the crystal part size in the nc-OS and the CAAC-OS shows little change from the start of electron irradiation to a cumulative electron dose of $4.2 \times 10^8$ e$^-$/nm$^2$. As shown in FIG. 26, the crystal part sizes in an nc-OS and a CAAC-OS are approximately 1.3 inn and approximately 1.8 nm, respectively, regardless of the cumulative electron dose. For the electron beam irradiation and TEM observation, a Hitachi H-9000NAR transmission electron microscope was used. The conditions of electron beam irradiation were as follows: the accelerating voltage was 300 kV, the current density was $6.7 \times 10^5$ e$^-$/(nm$^2 \cdot$s), and the diameter of irradiation region was 230 nm.

In this manner, growth of the crystal part in the a-like OS is sometimes induced by electron irradiation. In contrast, in the nc-OS and the CAAC-OS, growth of the crystal part is hardly induced by electron irradiation. Therefore, the a-like OS has an unstable structure as compared with the nc-OS and the CAAC-OS.

The a-like OS has a lower density than the nc-OS and the CAAC-OS because it contains a void. Specifically, the density of the a-like OS is higher than or equal to 78.6% and lower than 92.3% of the density of the single crystal oxide semiconductor having the same composition. The density of each of the nc-OS and the CAAC-OS is higher than or equal to 92.3% and lower than 100% of the density of the single crystal oxide semiconductor having the same composition. Note that it is difficult to deposit an oxide semiconductor having a density of lower than 78% of the density of the single crystal oxide semiconductor.

For example, in the case of an oxide semiconductor with an atomic ratio of In:Ga:Zn=1:1:1, the density of single crystal InGaZnO$_4$ with a rhombohedral crystal structure is 6.357 g/cm$^3$. Accordingly, in the case of the oxide semiconductor with an atomic ratio of In:Ga:Zn=1:1:1, the density of the a-like OS is higher than or equal to 5.0 g/cm$^3$ and lower than 5.9 g/cm$^3$. For example, in the case of the oxide semiconductor with an atomic ratio of In:Ga:Zn=1:1:1, the density of each of the nc-OS and the CAAC-OS is higher than or equal to 5.9 g/cm$^3$ and lower than 6.3 g/cm$^3$.

Note that in the case where an oxide semiconductor having a certain composition does not exist in a single crystal structure, single crystal oxide semiconductors with different compositions are combined at an adequate ratio, which makes it possible to calculate density equivalent to that of a single crystal oxide semiconductor with the desired composition. The density of a single crystal oxide semiconductor having the desired composition can be calculated using a weighted average according to the combination ratio of the single crystal oxide semiconductors with different compositions. Note that it is preferable to use as few kinds of single crystal oxide semiconductors as possible to calculate the density.

As described above, oxide semiconductors have various structures and various properties. Note that an oxide semiconductor may be a stack of two or more films of an amorphous oxide semiconductor, an a-like OS, an nc-OS, and a CAAC-OS, for example.

The atomic ratio of indium to an element M and zinc of an oxide is described below.

First, ranges of the atomic ratio of indium to the element M and zinc are described with reference to FIGS. 27A to 27C. Note that the proportion of oxygen atoms is not shown in FIGS. 27A to 27C.

Figure 27A:
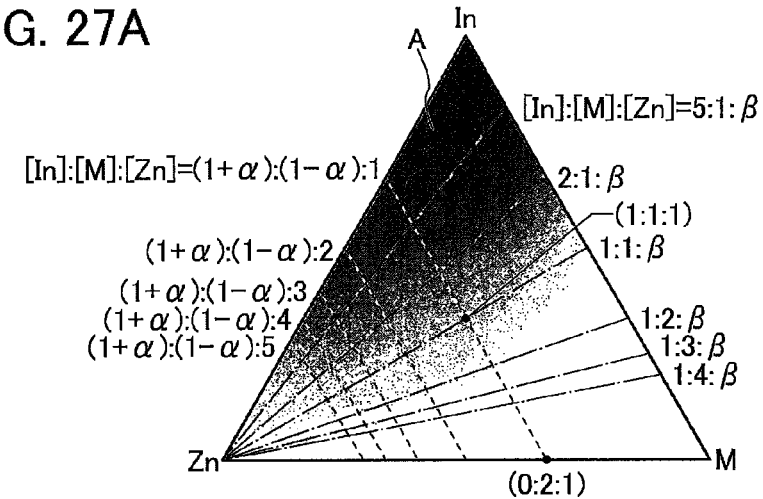
FIGS. 27A to 27C each illustrate an atomic ratio range of an oxide of the present invention.
Figure 27B:
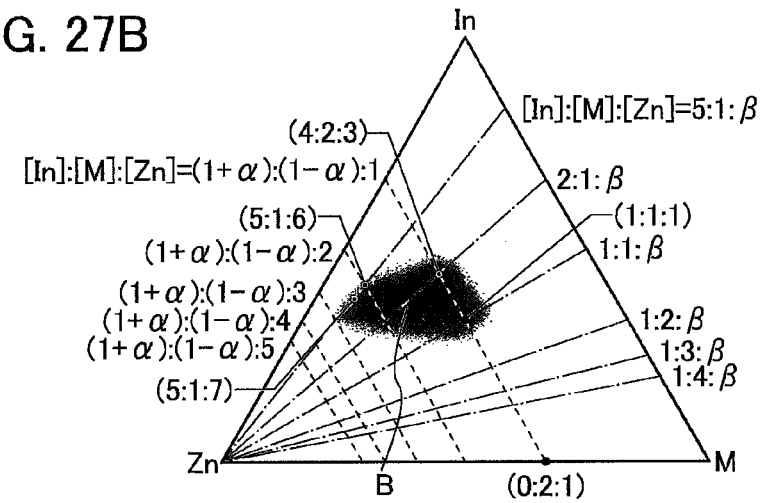
Figure 27C:
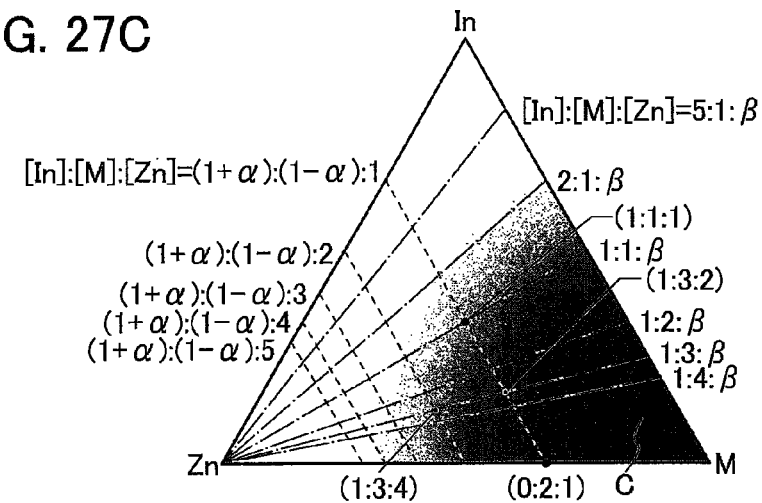

In FIGS. 27A to 27C, broken lines indicate a line where the atomic ratio of In:M:Zn is $(1+\alpha):(1-\alpha):1$, where $-1 \leq \alpha \leq 1$, a line where the atomic ratio of In:M:Zn is $(1+\alpha):(1-\alpha):2$, a line where the atomic ratio of In:M:Zn is $(1+\alpha):(1-\alpha):3$, a line where the atomic ratio of In:M:Zn is $(1+\alpha):(1-\alpha):4$, and a line where the atomic ratio of In:M:Zn is $(1+\alpha):(1-\alpha):5$.

Dashed-dotted lines indicate a line where the atomic ratio of In:M:Zn is 1:1:A where $\beta \geq 0$, a line where the atomic ratio of In:M:Zn is 1:2:$\beta$, a line where the atomic ratio of In:M:Zn is 1:3:$\beta$ a line where the atomic ratio of In:M:Zn is 1:4:$\beta$ a line where the atomic ratio of In:M:Zn is 2:1:$\beta$ and a line where the atomic ratio of In:M:Zn is 5:1:$\beta$.

FIGS. 27A and 27B illustrate examples of the ranges of the atomic ratio of indium to the element M and zinc contained in an oxide of one embodiment of the present invention.

Figure 28:
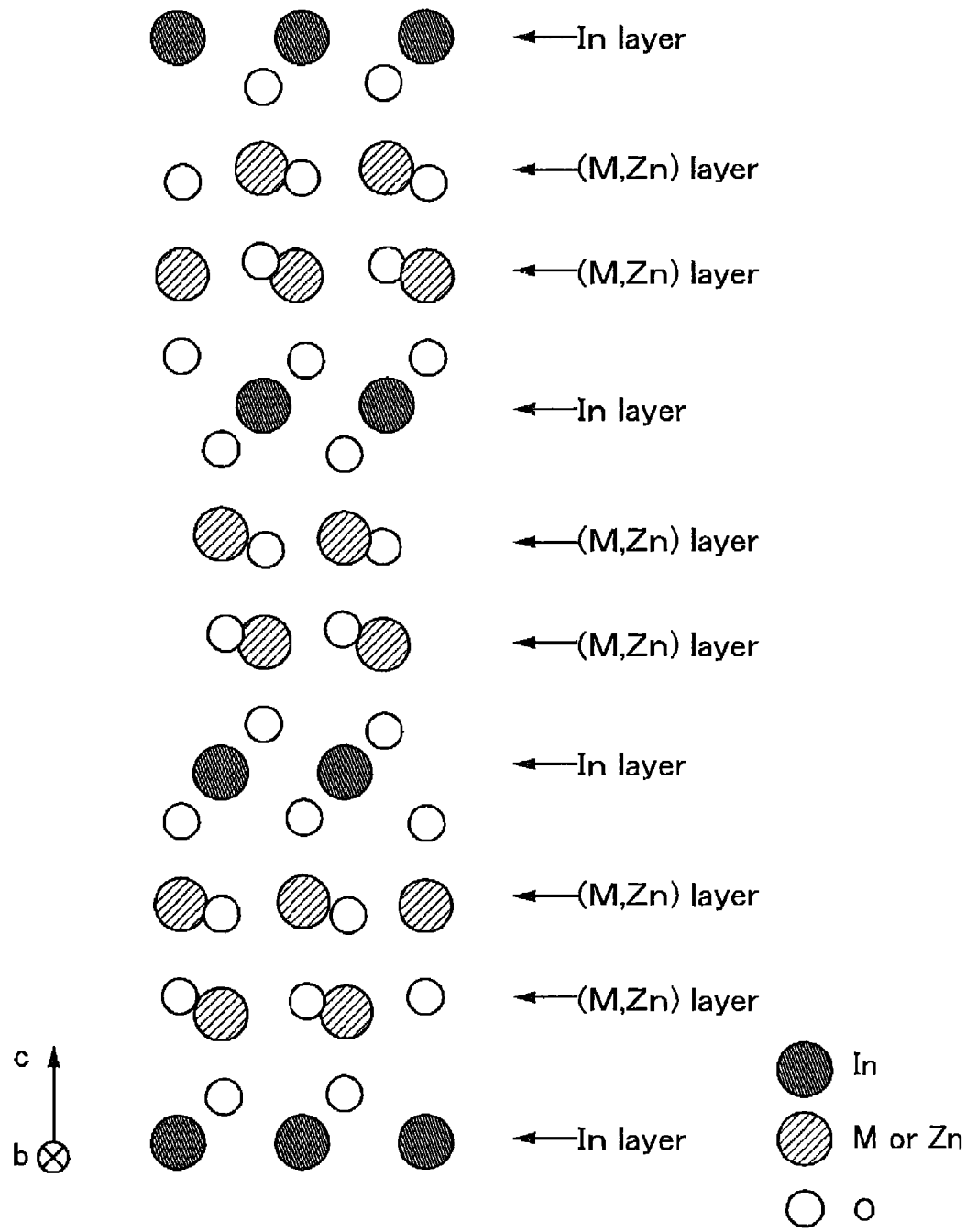
FIG. 28 illustrates a crystal of InMZnO$_4$.

FIG. 28 illustrates an example of the crystal structure of InMZnO$_4$ with an atomic ratio of In:M:Zn=1:1:1. The crystal structure illustrated in FIG. 28 is InMZnO$_4$ observed from a direction parallel to a b-axis. Note that a metal element in a layer that contains M, Zn, and oxygen (hereinafter, this layer is referred to as an "(M,Zn) layer") in FIG. 28 represents the element M or zinc. In that case, the proportion of the element M is the same as the proportion of zinc. The element M and zinc can be replaced with each other, and their arrangement is random.

Note that InMZnO$_4$ has a layered crystal structure (also referred to as a layered structure) and includes one layer that contains indium and oxygen (hereinafter referred to as an In layer) for every two (M,Zn) layers, as illustrated in FIG. 28.

Indium and the element M can be replaced with each other. Therefore, when the element M in the (M,Zn) layer is replaced by indium, the layer can also be referred to as an (In,M,Zn) layer. In that case, a layered structure that includes one In layer for every two (In,M,Zn) layers is obtained.

An oxide with an atomic ratio of In:M:Zn=1:1:2 has a layered structure that includes one In layer for every three (M,Zn) layers. In other words, if [Zn] is larger than [In] and [M], the proportion of the (M,Zn) layer to the In layer becomes higher when the oxide is crystallized.

Note that in the case where the number of (M,Zn) layers with respect to one In layer is not an integer in the oxide, the oxide might have plural kinds of layered structures where the number of (M,Zn) layers with respect to one In layer is an integer. For example, in the case of In:M:Zn=1:1:1.5, the oxide might have the following layered structures: a layered structure that includes one In layer for every two (M,Zn) layers and a layered structure that includes one In layer for every three (M,Zn) layers.

For example, in the case where the oxide is deposited with a sputtering apparatus, a film with an atomic ratio deviated from the atomic ratio of a target is formed. In particular, [Zn] in the film might be smaller than [Zn] in the target depending on the substrate temperature in deposition.

A plurality of phases (e.g., two phases or three phases) exist in the oxide in some cases. For example, with an atomic ratio of In:M:Zn that is close to 0:2:1, two phases of a spinel crystal structure and a layered crystal structure are likely to exist. In addition, with an atomic ratio of In:M:Zn that is close to 1:0:0, two phases of a bixbyite crystal structure and a layered crystal structure are likely to exist. In the case where a plurality of phases exist in the oxide, a grain boundary might be formed between different crystal structures.

In addition, the oxide containing indium in a higher proportion can have high carrier mobility (electron mobility). This is because in an oxide containing indium, the element M, and zinc, the s orbital of heavy metal mainly contributes to carrier transfer, and when the indium content in the oxide is increased, overlaps of the s orbitals of indium atoms are increased; therefore, an oxide having a high content of indium has higher carrier mobility than an oxide having a low content of indium.

In contrast, when the indium content and the zinc content in an oxide become lower, carrier mobility becomes lower. Thus, with an atomic ratio of In:M:Zn=0:1:0 and the vicinity thereof (e.g., a region C in FIG. 27C), insulation performance becomes better.

The oxide of one embodiment of the present invention used for a channel region of a transistor has an atomic ratio represented by a region A in FIG. 27A, with which a layered structure with high carrier mobility and a few grain boundaries is easily obtained, for example.

A region B in FIG. 27B represents an atomic ratio of In:M:Zn=4:2:3 to 4:2:4.1 and the vicinity thereof. The vicinity includes an atomic ratio of In:M:Zn=5:3:4, for example. An oxide with an atomic ratio represented by the region B is an excellent oxide that has particularly high crystallinity and high carrier mobility.

Note that the condition where an oxide forms a layered structure is not uniquely determined by an atomic ratio. There is a difference in the degree of difficulty in forming a layered structure among atomic ratios. Even with the same atomic ratio, whether a layered structure is formed or not depends on a formation condition. Thus, the illustrated regions each represent an atomic ratio with which an oxide has a layered structure, and boundaries of the regions A to C are not clear.

Next, the case where the oxide has a two-layer structure or a three-layer structure is described. For example, the case where three oxides Si, S2, and S3 are stacked in this order is considered. The oxide S2 is preferably formed using an oxide with the atomic ratio represented by the region A in FIG. 27A, further preferably an oxide with the atomic ratio represented by the region B in FIG. 27B. For example, an oxide with high insulation performance and the atomic ratio represented by the region C in FIG. 27C can be used as the oxide Si and S3. Note that the region C in FIG. 27C represents the atomic ratio of In:M:Zn=0:1:0 or the vicinity thereof. Here, the oxide S2 can be used as the oxide semiconductor 108a and the layer 108_2 included in the channel region 108i described in the above embodiment. In addition, the oxide semiconductor 108b and the layers 108_1 and 108_3 included in the channel region 108i, which are described in the above embodiment, preferably have the atomic ratio represented by the region C, for example.

Embodiment 4

In this embodiment, an example of a display device that includes any of the transistors described in the above embodiment will be described below with reference to FIG. 29, FIG. 30, and FIG. 31.

Figure 29:
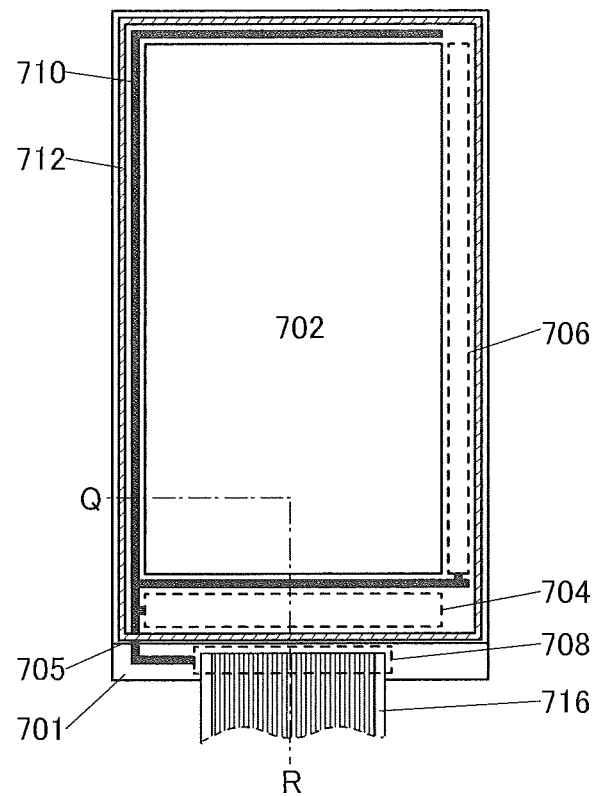
FIG. 29 is a top view illustrating one embodiment of a display device.

FIG. 29 is a top view of an example of a display device. A display device 700 illustrated in FIG. 29 includes a pixel portion 702 provided over a first substrate 701; a source driver circuit portion 704 and a gate driver circuit portion 706 provided over the first substrate 701; a sealant 712 provided to surround the pixel portion 702, the source driver circuit portion 704, and the gate driver circuit portion 706; and a second substrate 705 provided to face the first substrate 701. The first substrate 701 and the second substrate 705 are sealed with the sealant 712. That is, the pixel portion 702, the source driver circuit portion 704, and the gate driver circuit portion 706 are sealed with the first substrate 701, the sealant 712, and the second substrate 705. Although not illustrated in FIG. 29, a display element is provided between the first substrate 701 and the second substrate 705.

In the display device 700, a flexible printed circuit (FPC) terminal portion 708 electrically connected to the pixel portion 702, the source driver circuit portion 704, and the gate driver circuit portion 706 is provided in a region different from the region which is surrounded by the sealant 712 and positioned over the first substrate 701. Furthermore, an FPC 716 is connected to the FPC terminal portion 708, and a variety of signals and the like are supplied to the pixel portion 702, the source driver circuit portion 704, and the gate driver circuit portion 706 through the FPC 716. Furthermore, a signal line 710 is connected to the pixel portion 702, the source driver circuit portion 704, the gate driver circuit portion 706, and the FPC terminal portion 708. Various signals and the like are applied to the pixel portion 702, the source driver circuit portion 704, the gate driver circuit portion 706, and the FPC terminal portion 708 via the signal line 710 from the FPC 716.

A plurality of gate driver circuit portions 706 may be provided in the display device 700. An example of the display device 700 in which the source driver circuit portion 704 and the gate driver circuit portion 706 are formed over the first substrate 701 where the pixel portion 702 is also formed is described; however, the structure is not limited thereto. For example, only the gate driver circuit portion 706 may be formed over the first substrate 701 or only the source driver circuit portion 704 may be formed over the first substrate 701. In this case, a substrate where a source driver circuit, a gate driver circuit, or the like is formed (e.g., a driver circuit substrate formed using a single crystal semiconductor film or a polycrystalline semiconductor film) may be mounted on the first substrate 701. There is no particular limitation on the connection method of a separately formed driver circuit substrate; a chip on glass (COG) method, a wire bonding method, or the like can be used.

The pixel portion 702, the source driver circuit portion 704, and the gate driver circuit portion 706 included in the display device 700 include a plurality of transistors. As the plurality of transistors, any of the transistors that are the semiconductor devices of embodiments of the present invention can be used. Here, for example, a voltage higher than or equal to −40 V and lower than or equal to 40 V, preferably higher than or equal to −5 V and lower than or equal to 30 V and further preferably higher than or equal to −1 V and lower than or equal to 20 V, is applied between a source and a gate of the transistor in the gate driver circuit portion.

The display device 700 can include any of a variety of elements. The element includes, for example, at least one of a liquid crystal element, an electroluminescence (EL) element (e.g., an EL element including organic and inorganic materials, an organic EL element, or an inorganic EL element), an LED (e.g., a white LED, a red LED, a green LED, or a blue LED), a transistor (a transistor that emits light depending on current), an electron emitter, electronic ink, an electrophoretic element, a grating light valve (GLV), a plasma display panel (PDP), a display element using micro electro mechanical systems (MEMS), a digital micromirror device (DMD), a digital micro shutter (DMS), MIRASOL (registered trademark), an interferometric modulator display (IMOD) element, a MEMS shutter display element, an optical-interference-type MEMS display element, an electrowetting element, a piezoelectric ceramic display, and a display element including a carbon nanotube. In addition, a display medium whose contrast, luminance, reflectance, transmittance, or the like is changed by electric action or magnetic action may be included. Note that examples of display devices including EL elements include an EL display. Examples of display devices including electron emitters are a field emission display (FED) and an SED-type flat panel display (SED: surface-conduction electron-emitter display). Examples of display devices including liquid crystal elements include a liquid crystal display (e.g., a transmissive liquid crystal display, a transflective liquid crystal display, a reflective liquid crystal display, a direct-view liquid crystal display, or a projection liquid crystal display). An example of a display device including electronic ink or electrophoretic elements is electronic paper. In the case of a transflective liquid crystal display or a reflective liquid crystal display, some or all of pixel electrodes function as reflective electrodes. For example, some or all of pixel electrodes are formed to contain aluminum, silver, or the like. In such a case, a memory circuit such as an SRAM can be provided under the reflective electrodes, leading to lower power consumption.

As a display method in the display device 700, a progressive method, an interlace method, or the like can be employed. Furthermore, color elements controlled in a pixel at the time of color display are not limited to three colors: R, G, and B (R, G, and B correspond to red, green, and blue, respectively). For example, four pixels of the R pixel, the G pixel, the B pixel, and a W (white) pixel may be included. Alternatively, a color element may be composed of two colors among R, G, and B as in PenTile layout. The two colors may differ among color elements. Alternatively, one or more colors of yellow, cyan, magenta, and the like may be added to RGB. Note that the sizes of display regions may be different between respective dots of color elements. Embodiments of the disclosed invention are not limited to a display device for color display; the disclosed invention can also be applied to a display device for monochrome display.

A coloring layer (also referred to as a color filter) may be used in order to obtain a full-color display device in which white light (W) for a backlight (e.g., an organic EL element, an inorganic EL element, an LED, or a fluorescent lamp) is used. As the coloring layer, red (R), green (G), blue (B), yellow (Y), or the like may be combined as appropriate, for example. With the use of the coloring layer, higher color reproducibility can be obtained than in the case without the coloring layer. In this case, by providing a region with the coloring layer and a region without the coloring layer, white light in the region without the coloring layer may be directly utilized for display. By partly providing the region without the coloring layer, a decrease in luminance due to the coloring layer can be suppressed, and 20% to 30% of power consumption can be reduced in some cases when an image is displayed brightly. Note that in the case where full-color display is performed using a self-luminous element such as an organic EL element or an inorganic EL element, elements may emit light of their respective colors R, G, B, Y, and W. By using a self-luminous element, power consumption can be further reduced as compared to the case of using the coloring layer in some cases.

In this embodiment, structures including a liquid crystal element and an EL element as display elements are described with reference to FIG. 30 and FIG. 31. Note that FIG. 30 is a cross-sectional view taken along the dashed-dotted line Q-R shown in FIG. 29 and shows a structure including a liquid crystal element as a display element, whereas FIG. 31 is a cross-sectional view taken along the dashed-dotted line Q-R shown in FIG. 29 and shows a structure including an EL element as a display element.

Figure 30:
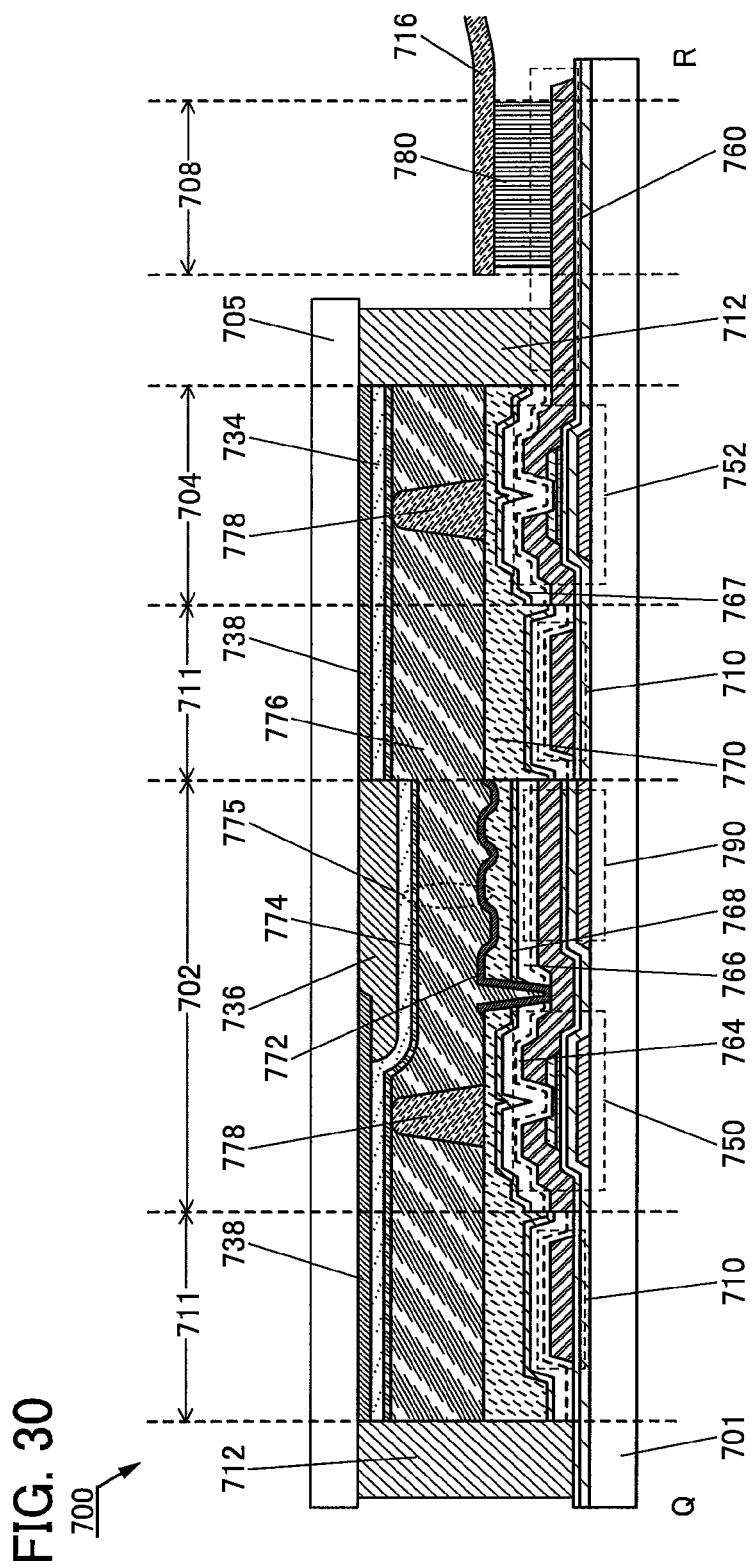
FIG. 30 is a cross-sectional view of one embodiment of a display device.
Figure 31:
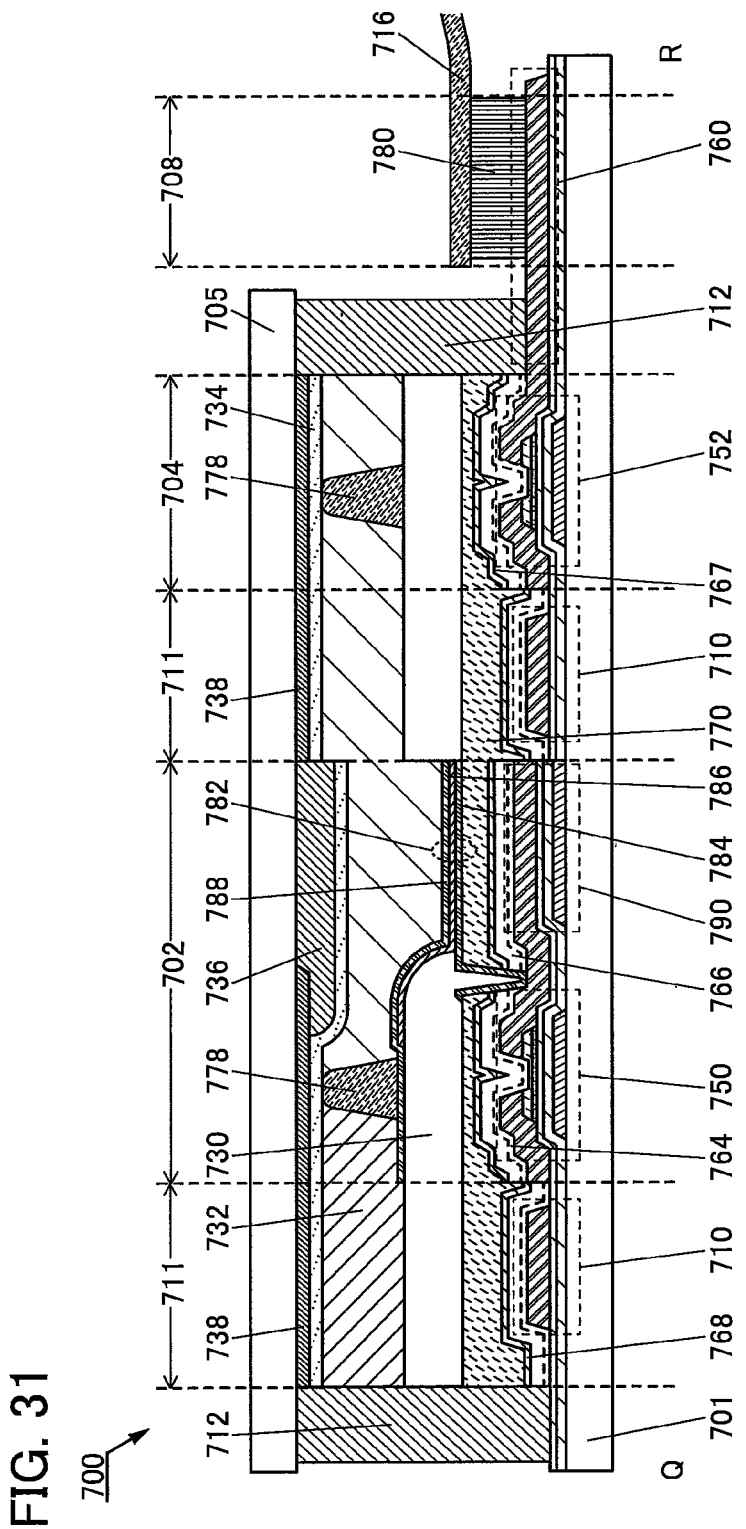
FIG. 31 is a cross-sectional view illustrating one embodiment of a display device.

Common portions between FIG. 30 and FIG. 31 are described first, and then different portions are described.
<Common Portions in Display Devices>

The display device 700 illustrated in each of FIG. 30 and FIG. 31 includes a lead wiring portion 711, the pixel portion 702, the source driver circuit portion 704, and the FPC terminal portion 708. Note that the lead wiring portion 711 includes the signal line 710. The pixel portion 702 includes a transistor 750 and a capacitor 790. The source driver circuit portion 704 includes a transistor 752.

Any of the transistors described above can be used as the transistors 750 and 752.

The transistors used in this embodiment each include an oxide semiconductor film which is highly purified and in which formation of an oxygen vacancy is suppressed. In the transistors, the current in an off state (off-state current) can be made small. Accordingly, an electrical signal such as an image signal can be held for a longer period, and a writing interval can be set longer in an on state. Accordingly, the frequency of refresh operation can be reduced, which leads to an effect of reducing power consumption.

In addition, the transistors used in this embodiment can have relatively high field-effect mobility and thus are capable of high-speed operation. For example, with such a transistor that can operate at high speed used for a liquid crystal display device, a switching transistor in a pixel portion and a driver transistor in a driver circuit portion can be formed over one substrate. That is, a semiconductor device formed using a silicon wafer or the like is not additionally needed as a driver circuit, by which the number of components of the semiconductor device can be reduced. In addition, the transistor that can operate at high speed can be used also in the pixel portion, whereby a high-quality image can be provided.

The capacitor 790 has a structure in which a dielectric is provided between a pair of electrodes. Specifically, a conductive film which is formed through the same process as a conductive film functioning as the gate electrode of the transistor 750 is used as one electrode of the capacitor 790, and the conductive film functioning as a source electrode or a drain electrode of the transistor 750 is used as the other electrode of the capacitor 790. Furthermore, an insulating film functioning as a gate insulating film of the transistor 750 is used as the dielectric between the pair of electrodes.

In FIG. 30 and FIG. 31, insulating films 764, 766, and 768, an oxide semiconductor film 767, and a planarization insulating film 770 are formed over the transistor 750, the transistor 752, and the capacitor 790.

The insulating films 764, 766, and 768 can be formed using materials and methods similar to those of the insulators 114, 116, and 118 described in the above embodiment, respectively. The oxide semiconductor film 767 can be formed using a material and a method similar to those of the oxide semiconductor 108 described in the above embodiment. The planarization insulating film 770 can be formed using a heat-resistant organic material, such as a polyimide resin, an acrylic resin, a polyimide amide resin, a benzocyclobutene resin, a polyamide resin, or an epoxy resin. Note that the planarization insulating film 770 may be formed by stacking a plurality of insulating films formed using these materials. Alternatively, a structure without the planarization insulating film 770 may be employed.

The signal line 710 is formed through the same process as conductive films functioning as the source electrode and the drain electrode of the transistor 750 or 752. Note that the signal line 710 may be formed using a conductive film which is formed through a different process from the source electrode and the drain electrode of the transistor 750 or 752, for example, a conductive film functioning as a gate electrode. In the case where the signal line 710 is formed using a material containing a copper element, signal delay or the like due to wiring resistance is reduced, which enables display on a large screen.

The FPC terminal portion 708 includes a connection electrode 760, an anisotropic conductive film 780, and the FPC 716. Note that the connection electrode 760 is formed through the same process as the conductive films functioning as the source electrode and the drain electrode of the transistor 750 or 752. The connection electrode 760 is electrically connected to a terminal included in the FPC 716 through the anisotropic conductive film 780.

For example, a glass substrate can be used as the first substrate 701 and the second substrate 705. As the first substrate 701 and the second substrate 705, a flexible substrate may be used. Examples of the flexible substrate include a plastic substrate.

A structure 778 is provided between the first substrate 701 and the second substrate 705. The structure 778 is a columnar spacer obtained by selective etching of an insulating film and is provided to control the thickness (cell gap) between the first substrate 701 and the second substrate 705. Note that a spherical spacer may be used as the structure 778. Although the example in which the structure 778 is provided on the first substrate 701 side is described in this embodiment, one embodiment of the present invention is not limited thereto. For example, the structure 778 may be provided on the second substrate 705 side, or both the first substrate 701 and the second substrate 705 may be provided with the structure 778.

Furthermore, a light-blocking film 738 functioning as a black matrix, a coloring film 736 functioning as a color filter, and an insulating film 734 in contact with the light-blocking film 738 and the coloring film 736 are provided on the second substrate 705 side.

<Structure Example of Display Device Using Liquid Crystal Element as Display Element>

The display device 700 illustrated in FIG. 30 includes a liquid crystal element 775. The liquid crystal element 775 includes a conductive film 772, a conductive film 774, and a liquid crystal layer 776. The conductive film 774 is provided on the second substrate 705 side and functions as a counter electrode. The display device 700 in FIG. 30 is capable of displaying an image in such a manner that light transmission or non-transmission is controlled by change in the alignment state of the liquid crystal layer 776 depending on a voltage applied between the conductive film 772 and the conductive film 774.

The conductive film 772 is connected to the conductive film functioning as the source electrode or the drain electrode included in the transistor 750. The conductive film 772 is formed over the planarization insulating film 770 to function as a pixel electrode, i.e., one electrode of the display element. The conductive film 772 functions as a reflective electrode. The display device 700 in FIG. 30 is what is called a reflective color liquid crystal display device in which external light is reflected by the conductive film 772 to display an image through the coloring film 736.

A conductive film that transmits visible light or a conductive film that reflects visible light can be used as the conductive film 772. For example, a material including one kind selected from indium (In), zinc (Zn), and tin (Sn) is preferably used for the conductive film that transmits visible light. For example, a material including aluminum or silver may be used for the conductive film that reflects visible light. In this embodiment, a conductive film that reflects visible light is used as the conductive film 772.

In the case where a conductive film which reflects visible light is used as the conductive film 772, the conductive film may have a stacked-layer structure. For example, a 100-nm-thick aluminum film is formed as the lower layer, and a 30-nm-thick silver alloy film (e.g., an alloy film including silver, palladium, and copper) is formed as the upper layer. Such a structure makes it possible to obtain the following effects.

(1) Adhesion between the base film and the conductive film 772 can be improved. (2) The aluminum film and the silver alloy film can be collectively etched using a chemical solution. (3) The conductive film 772 can have a favorable cross-sectional shape (e.g., a tapered shape). The reason for (3) is as follows: the etching rate of the aluminum film with the chemical solution is lower than that of the silver alloy film, or etching of the aluminum film that is the lower layer is developed faster than that of the silver alloy film because when the aluminum film that is the lower layer is exposed after the etching of the silver alloy film that is the upper layer, electrons are extracted from metal that is less noble than the silver alloy film, i.e., aluminum that is metal having a high ionization tendency, and thus etching of the silver alloy film is suppressed.

Note that projections and depressions are provided in part of the planarization insulating film 770 of the pixel portion 702 in the display device 700 in FIG. 30. The projections and depressions can be formed in such a manner that the planarization insulating film 770 is formed using an organic resin film or the like, and projections and depressions are formed on the surface of the organic resin film. The conductive film 772 functioning as a reflective electrode is formed along the projections and depressions. Therefore, when external light is incident on the conductive film 772, the light is reflected diffusely at the surface of the conductive film 772, whereby visibility can be improved.

Note that the display device 700 illustrated in FIG. 30 is a reflective color liquid crystal display device given as an example, but a display type is not limited thereto. For example, a transmissive color liquid crystal display device in which the conductive film 772 is a conductive film that transmits visible light may be used. In the case of a transmissive color liquid crystal display device, projections and depressions are not necessarily provided on the planarization insulating film 770.

Although not illustrated in FIG. 30, an alignment film may be provided on each of the conductive film 772 and the conductive film 774 on the side in contact with the liquid crystal layer 776. Although not illustrated in FIG. 30, an optical member (an optical substrate) such as a polarizing member, a retardation member, or an anti-reflection member, and the like may be provided as appropriate. For example, circular polarization may be employed by using a polarizing substrate and a retardation substrate. In addition, a backlight, a side light, or the like may be used as a light source.

In the case where a liquid crystal element is used as the display element, thermotropic liquid crystal, low-molecular liquid crystal, high-molecular liquid crystal, polymer-dispersed liquid crystal, ferroelectric liquid crystal, anti-ferroelectric liquid crystal, or the like can be used. Such a liquid crystal material exhibits a cholesteric phase, a smectic phase, a cubic phase, a chiral nematic phase, an isotropic phase, or the like depending on conditions.

In the case of employing a horizontal electric field mode, liquid crystal exhibiting a blue phase for which an alignment film is unnecessary may be used. A blue phase is one of liquid crystal phases, which is generated just before a cholesteric phase changes into an isotropic phase while temperature of cholesteric liquid crystal is increased. Since the blue phase appears only in a narrow temperature range, a liquid crystal composition in which several weight percent or more of a chiral material is mixed is used for the liquid crystal layer in order to improve the temperature range. The liquid crystal composition which includes liquid crystal exhibiting a blue phase and a chiral material has a short response time and has optical isotropy. In addition, the liquid crystal composition which includes liquid crystal exhibiting a blue phase and a chiral material does not need alignment treatment and has a small viewing angle dependence. An alignment film does not need to be provided and rubbing treatment is thus not necessary; accordingly, electrostatic discharge damage caused by the rubbing treatment can be prevented and defects and damage of the liquid crystal display device in the manufacturing process can be reduced.

In the case where a liquid crystal element is used as the display element, a twisted nematic (TN) mode, an in-plane-switching (IPS) mode, a fringe field switching (FFS) mode, an axially symmetric aligned micro-cell (ASM) mode, an optical compensated birefringence (OCB) mode, a ferroelectric liquid crystal (FLC) mode, an antiferroelectric liquid crystal (AFLC) mode, or the like can be used.

Further, a normally black liquid crystal display device such as a transmissive liquid crystal display device utilizing a vertical alignment (VA) mode may also be used. There are some examples of a vertical alignment mode; for example, a multi-domain vertical alignment (MVA) mode, a patterned vertical alignment (PVA) mode, an ASV mode, or the like can be employed.

<Display Device Using Light-Emitting Element as Display Element>

The display device 700 illustrated in FIG. 31 includes a light-emitting element 782. The light-emitting element 782 includes a conductive film 784, an EL layer 786, and a conductive film 788. The display device 700 illustrated in FIG. 31 is capable of displaying an image by light emission from the EL layer 786 included in the light-emitting element 782.

The conductive film 784 is connected to the conductive film functioning as the source electrode or the drain electrode included in the transistor 750. The conductive film 784 is formed over the planarization insulating film 770 to function as a pixel electrode, i.e., one electrode of the display element. A conductive film which transmits visible light or a conductive film which reflects visible light can be used for the conductive film 784. For example, a material including one kind selected from indium (In), zinc (Zn), and tin (Sn) is preferably used for the conductive film that transmits visible light. For example, a material including aluminum or silver is preferably used for the conductive film that reflects visible light.

In the display device 700 illustrated in FIG. 31, an insulating film 730 is provided over the planarization insulating film 770 and the conductive film 784. The insulating film 730 covers part of the conductive film 784. Note that the light-emitting element 782 has a top-emission structure. Therefore, the conductive film 788 has a light-transmitting property and transmits light emitted from the EL layer 786. Although the top-emission structure is described as an example in this embodiment, one embodiment of the present invention is not limited thereto. A bottom-emission structure in which light is emitted to the conductive film 784 side, or a dual-emission structure in which light is emitted to both the conductive film 784 side and the conductive film 788 side may be employed.

The coloring film 736 is provided to overlap with the light-emitting element 782, and the light-blocking film 738 is provided to overlap with the insulating film 730 and to be included in the lead wiring portion 711 and in the source driver circuit portion 704. The coloring film 736 and the light-blocking film 738 are covered with the insulating film 734. A space between the light-emitting element 782 and the insulating film 734 is filled with a sealing film 732. Although the coloring film 736 is provided in the example of the display device 700 illustrated in FIG. 31, one embodiment of the present invention is not limited thereto. In the case where the EL layer 786 is formed by a separate coloring method, the coloring film 736 is not necessarily provided.

The structures described in this embodiment can be used in appropriate combination with any of the structures described in the other embodiments.

Embodiment 5

In this embodiment, a display device that includes a semiconductor device of one embodiment of the present invention will be described with reference to FIGS. 32A to 32C.

The display device illustrated in FIG. 32A includes a region including pixels of display elements (hereinafter the region is referred to as a pixel portion 502), a circuit portion being provided outside the pixel portion 502 and including a circuit for driving the pixels (hereinafter the portion is referred to as a driver circuit portion 504), circuits each having a function of protecting an element (hereinafter the circuits are referred to as protection circuits 506), and a terminal portion 507. Note that the protection circuits 506 are not necessarily provided.

Part or the whole of the driver circuit portion 504 is preferably formed over a substrate over which the pixel portion 502 is formed, in which case the number of components and the number of terminals can be reduced. When part or the whole of the driver circuit portion 504 is not formed over the substrate over which the pixel portion 502 is formed, the part or the whole of the driver circuit portion 504 can be mounted by COG or tape automated bonding (TAB).

The pixel portion 502 includes a plurality of circuits for driving display elements arranged in X rows (X is a natural number of 2 or more) and Y columns (Y is a natural number of 2 or more) (hereinafter, such circuits are referred to as pixel circuits 501). The driver circuit portion 504 includes driver circuits such as a circuit for supplying a signal (scan signal) to select a pixel (hereinafter, the circuit is referred to as a gate driver 504a) and a circuit for supplying a signal (data signal) to drive a display element in a pixel (hereinafter, the circuit is referred to as a source driver 504b).

The gate driver 504a includes a shift register or the like. The gate driver 504a receives a signal for driving the shift register through the terminal portion 507 and outputs a signal. For example, the gate driver 504a receives a start pulse signal, a clock signal, or the like and outputs a pulse signal. The gate driver 504a has a function of controlling the potentials of wirings supplied with scan signals (hereinafter, such wirings are referred to as scan lines GL_1 to GL_X). Note that a plurality of gate drivers 504a may be provided to control the scan lines GL_1 to GL_X separately. Alternatively, the gate driver 504a has a function of supplying an initialization signal. Without being limited thereto, the gate driver 504*a* can supply another signal.

The source driver 504*b* includes a shift register or the like. The source driver 504*b* receives a signal (image signal) from which a data signal is derived, as well as a signal for driving the shift register, through the terminal portion 507. The source driver 504*b* has a function of generating a data signal to be written to the pixel circuit 501 which is based on the image signal. In addition, the source driver 504*b* has a function of controlling output of a data signal in response to a pulse signal produced by input of a start pulse signal, a clock signal, or the like. Furthermore, the source driver 504*b* has a function of controlling the potentials of wirings supplied with data signals (hereinafter such wirings are referred to as data lines DL_1 to DL_Y). Alternatively, the source driver 504*b* has a function of supplying an initialization signal. Without being limited thereto, the source driver 504*b* can supply another signal.

The source driver 504*b* includes a plurality of analog switches or the like, for example. The source driver 504*b* can output, as the data signals, signals obtained by time-dividing the image signal by sequentially turning on the plurality of analog switches. The source driver 504*b* may include a shift register or the like.

A pulse signal and a data signal are input to each of the plurality of pixel circuits 501 through one of the plurality of scan lines GL supplied with scan signals and one of the plurality of data lines DL supplied with data signals, respectively. Writing and holding of the data signal to and in each of the plurality of pixel circuits 501 are controlled by the gate driver 504*a*. For example, to the pixel circuit 501 in the m-th row and the n-th column an is a natural number of less than or equal to X, and n is a natural number of less than or equal to Y), a pulse signal is input from the gate driver 504*a* through the scan line GL_m, and a data signal is input from the source driver 504*b* through the data line DL_n in accordance with the potential of the scan line GL_m.

Figure 32A:
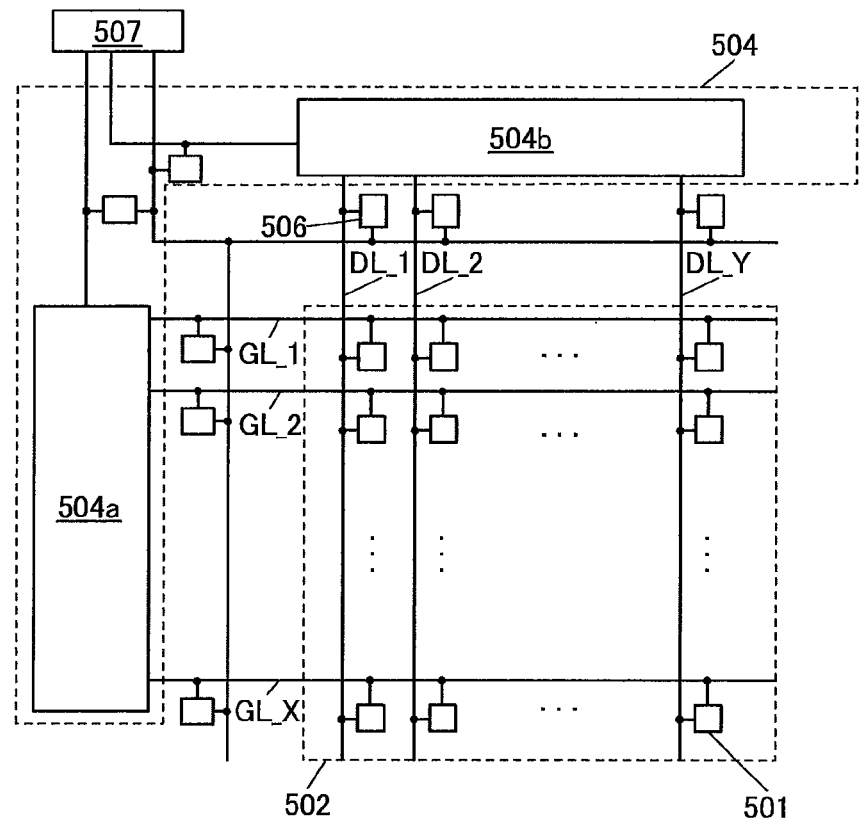
FIGS. 32A to 32C are a block diagram and circuit diagrams illustrating a display device.

The protection circuit 506 illustrated in FIG. 32A is connected to, for example, the scan line GL between the gate driver 504*a* and the pixel circuit 501. Alternatively, the protection circuit 506 is connected to the data line DL between the source driver 504*b* and the pixel circuit 501. Alternatively, the protection circuit 506 can be connected to a wiring between the gate driver 504*a* and the terminal portion 507. Alternatively, the protection circuit 506 can be connected to a wiring between the source driver 504*b* and the terminal portion 507. Note that the terminal portion 507 means a portion having terminals for inputting power, control signals, and image signals to the display device from external circuits.

The protection circuit 506 is a circuit that electrically connects a wiring connected to the protection circuit to another wiring when a potential out of a certain range is applied to the wiring connected to the protection circuit.

As illustrated in FIG. 32A, the protection circuits 506 are provided for the pixel portion 502 and the driver circuit portion 504, so that the resistance of the display device to overcurrent generated by electrostatic discharge (ESD) or the like can be improved. Note that the configuration of the protection circuits 506 is not limited to that, and for example, the protection circuit 506 may be configured to be connected to the gate driver 504*a* or the protection circuit 506 may be configured to be connected to the source driver 504*b*. Alternatively, the protection circuit 506 may be configured to be connected to the terminal portion 507.

In FIG. 32A, an example in which the driver circuit portion 504 includes the gate driver 504*a* and the source driver 504*b* is shown; however, the structure is not limited thereto. For example, only the gate driver 504*a* may be formed and a separately prepared substrate where a source driver circuit is formed (e.g., a driver circuit substrate formed with a single crystal semiconductor film or a polycrystalline semiconductor film) may be mounted.

Figure 32B:
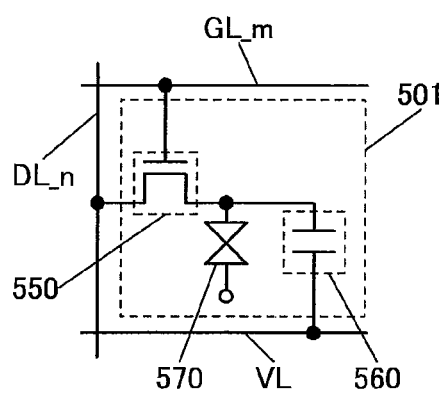

Each of the plurality of pixel circuits 501 in FIG. 32A can have the structure illustrated in FIG. 32B, for example.

The pixel circuit 501 illustrated in FIG. 32B includes a liquid crystal element 570, a transistor 550, and a capacitor 560. As the transistor 550, any of the transistors described in the above embodiment can be used.

The potential of one of a pair of electrodes of the liquid crystal element 570 is set as appropriate in accordance with the specifications of the pixel circuit 501. The alignment state of the liquid crystal element 570 depends on written data. A common potential may be supplied to one of the pair of electrodes of the liquid crystal element 570 included in each of the plurality of pixel circuits 501. Furthermore, the potential supplied to one of the pair of electrodes of the liquid crystal element 570 in the pixel circuit 501 in one row may be different from the potential supplied to one of the pair of electrodes of the liquid crystal element 570 in the pixel circuit 501 in another row.

As examples of a driving method of the display device including the liquid crystal element 570, any of the following modes can be given: a TN mode, an STN mode, a VA mode, an axially symmetric aligned micro-cell (ASM) mode, an optically compensated birefringence (OCB) mode, a ferroelectric liquid crystal (FLC) mode, an antiferroelectric liquid crystal (AFLC) mode, an MVA mode, a patterned vertical alignment (PVA) mode, an IPS mode, an FFS mode, a transverse bend alignment (TBA) mode, and the like. Other examples of the driving method of the display device include an electrically controlled birefringence (ECB) mode, a polymer-dispersed liquid crystal (PDLC) mode, a polymer network liquid crystal (PNLC) mode, and a guest-host mode. Note that the present invention is not limited to these examples, and various liquid crystal elements and driving methods can be applied to the liquid crystal element and the driving method thereof In the pixel circuit 501 in the m-th row and the n-th column, one of a source electrode and a drain electrode of the transistor 550 is electrically connected to the data line DL_n, and the other is electrically connected to the other of the pair of electrodes of the liquid crystal element 570. A gate electrode of the transistor 550 is electrically connected to the scan line GL_m. The transistor 550 has a function of controlling whether to write a data signal by being turned on or off.

One of a pair of electrodes of the capacitor 560 is electrically connected to a wiring to which a potential is supplied (hereinafter referred to as a potential supply line VL), and the other is electrically connected to the other of the pair of electrodes of the liquid crystal element 570. The potential of the potential supply line VL is set as appropriate in accordance with the specifications of the pixel circuit 501. The capacitor 560 functions as a storage capacitor for storing written data.

For example, in the display device including the pixel circuit 501 in FIG. 32B, the pixel circuits 501 are sequentially selected row by row by the gate driver 504*a* illustrated in FIG. 32A, whereby the transistors 550 are turned on and a data signal is written.

When the transistors 550 are turned off, the pixel circuits 501 in which the data has been written are brought into a holding state. This operation is sequentially performed row by row; thus, an image can be displayed.

Figure 32C:
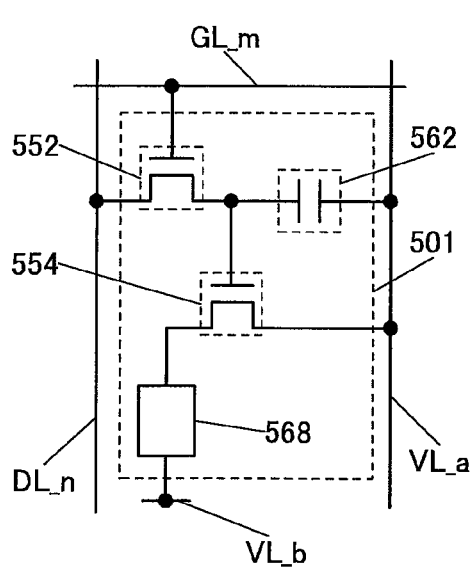

Alternatively, each of the plurality of pixel circuits 501 in FIG. 32A can have the structure illustrated in FIG. 32C, for example.

The pixel circuit 501 illustrated in FIG. 32C includes transistors 552 and 554, a capacitor 562, and a light-emitting element 568. Any of the transistors described in the above embodiment can be used as one or both of the transistors 552 and 554.

One of a source electrode and a drain electrode of the transistor 552 is electrically connected to a wiring to which a data signal is supplied (hereinafter referred to as a signal line DL_n). A gate electrode of the transistor 552 is electrically connected to a wiring to which a gate signal is supplied (hereinafter referred to as a scan line GL_m).

The transistor 552 has a function of controlling whether to write a data signal.

One of a pair of electrodes of the capacitor 562 is electrically connected to a wiring to which a potential is supplied (hereinafter referred to as a potential supply line VL_a), and the other is electrically connected to the other of the source electrode and the drain electrode of the transistor 552.

The capacitor 562 functions as a storage capacitor for storing written data.

One of a source electrode and a drain electrode of the transistor 554 is electrically connected to the potential supply line VL_a. Furthermore, a gate electrode of the transistor 554 is electrically connected to the other of the source electrode and the drain electrode of the transistor 552.

One of an anode and a cathode of the light-emitting element 568 is electrically connected to a potential supply line VL_b, and the other is electrically connected to the other of the source electrode and the drain electrode of the transistor 554.

As the light-emitting element 568, an organic electroluminescent element (also referred to as an organic EL element) or the like can be used, for example. Note that the light-emitting element 568 is not limited to an organic EL element; an inorganic EL element including an inorganic material may be used.

A high power supply potential VDD is supplied to one of the potential supply line VL_a and the potential supply line VL_b, and a low power supply potential VSS is supplied to the other.

For example, in the display device including the pixel circuit 501 in FIG. 32C, the pixel circuits 501 are sequentially selected row by row by the gate driver 504a illustrated in FIG. 32A, whereby the transistors 552 are turned on and a data signal is written.

When the transistors 552 are turned off, the pixel circuits 501 in which the data has been written are brought into a holding state. Furthermore, the amount of current flowing between the source electrode and the drain electrode of the transistor 554 is controlled in accordance with the potential of the written data signal. The light-emitting element 568 emits light with a luminance corresponding to the amount of flowing current. This operation is sequentially performed row by row; thus, an image can be displayed.

The structures described in this embodiment can be used in appropriate combination with any of the structures described in the other embodiments.

Embodiment 6

In this embodiment, a display module and electronic devices that include a semiconductor device of one embodiment of the present invention will be described with reference to FIG. 33 and FIGS. 34A to 34G.

Figure 33:
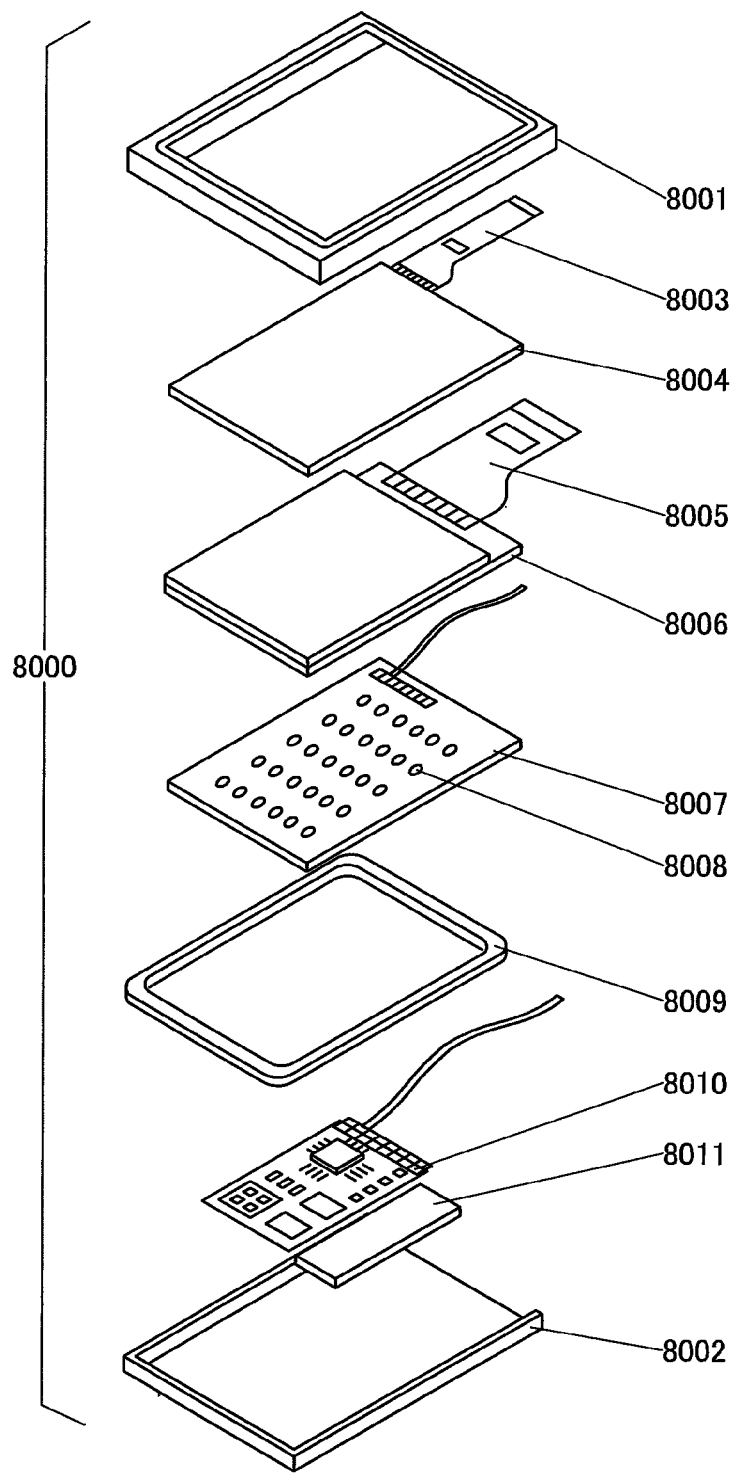
FIG. 33 illustrates a display module.

In a display module 8000 illustrated in FIG. 33, a touch panel 8004 connected to an FPC 8003 is provided as a touch sensor between an upper cover 8001 and a lower cover 8002. In addition, the display module 8000 further includes a display panel 8006 connected to an FPC 8005, a backlight 8007, a frame 8009, a printed board 8010, and a battery 8011.

The semiconductor device of one embodiment of the present invention can be used for, for example, the display panel 8006.

The shapes and sizes of the upper cover 8001 and the lower cover 8002 can be changed as appropriate in accordance with the sizes of the touch panel 8004 and the display panel 8006.

The touch panel 8004 can be a resistive touch panel or a capacitive touch panel and can be formed so as to overlap with the display panel 8006. A counter substrate (sealing substrate) of the display panel 8006 can have a touch panel function. A photosensor may be provided in each pixel of the display panel 8006 so that an optical touch panel is obtained.

The backlight 8007 includes light sources 8008. Note that although a structure in which the light sources 8008 are provided over the backlight 8007 is illustrated in FIG. 33, one embodiment of the present invention is not limited to this structure. For example, a structure in which the light sources 8008 are provided at an end portion of the backlight 8007 and a light diffusion plate is further provided may be employed. Note that the backlight 8007 need not be provided in the case where a self-luminous light-emitting element such as an organic EL element is used or in the case where a reflective panel or the like is employed.

The frame 8009 protects the display panel 8006 and also functions as an electromagnetic shield for blocking electromagnetic waves generated by the operation of the printed board 8010. The frame 8009 may function as a radiator plate.

The printed board 8010 is provided with a power supply circuit and a signal processing circuit for outputting a video signal and a clock signal. As a power source for supplying power to the power supply circuit, an external commercial power source or a power source using the battery 8011 provided separately may be used. The battery 8011 can be omitted in the case of using a commercial power source.

The display module 8000 may be additionally provided with a member such as a polarizing plate, a retardation plate, or a prism sheet.

FIGS. 34A to 34G illustrate electronic devices. These electronic devices can include a housing 9000, a display portion 9001, a speaker 9003, an operation key 9005 (including a power switch or an operation switch), a connection terminal 9006, a sensor 9007 (a sensor having a function of measuring force, displacement, position, speed, acceleration, angular velocity, rotational frequency, distance, light, liquid, magnetism, temperature, chemical substance, sound, time, hardness, electric field, current, voltage, power, radiation, flow rate, humidity, gradient, oscillation, odor, or infrared rays), a microphone 9008, and the like.

The electronic devices illustrated in FIGS. 34A to 34G can have a variety of functions, for example, a function of displaying a variety of information (a still image, a moving image, a text image, and the like) on the display portion, a touch panel function, a function of displaying a calendar, the date, the time, and the like, a function of controlling processing with a variety of software (programs), a wireless communication function, a function of being connected to a variety of computer networks with a wireless communication function, a function of transmitting and receiving a variety of data with a wireless communication function, a function of reading a program or data stored in a storage medium and displaying the program or data on the display portion, and the like. Note that functions of the electronic devices illustrated in FIGS. 34A to 34G are not limited thereto, and the electronic devices can have a variety of functions. Although not illustrated in FIGS. 34A to 34G, the electronic devices may each have a plurality of display portions. The electronic devices each preferably include an imaging device. The electronic devices may each have a camera or the like and a function of taking a still image, a function of taking a moving image, a function of storing the taken image in a storage medium (an external storage medium or a storage medium incorporated in the camera), a function of displaying the taken image on the display portion, and the like.

The imaging device may include a circuit which includes a transistor including an oxide semiconductor in a channel region, for example. With the use of the transistor for the circuit in the imaging device, an excellent image with little distortion can be obtained in high-speed imaging, for example.

The electronic devices illustrated in FIGS. 34A to 34G will be described in detail below.

Figure 34A:
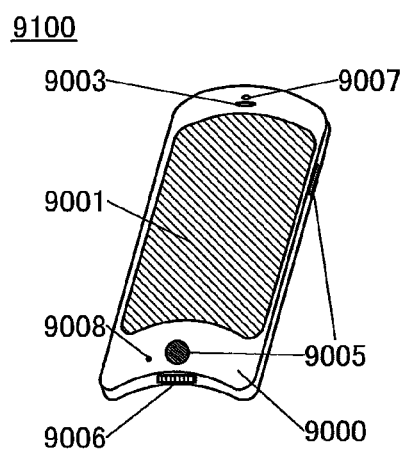
FIGS. 34A to 34G illustrate electronic devices.

FIG. 34A is a perspective view of a portable information terminal 9100. The display portion 9001 of the portable information terminal 9100 is flexible and thus can be incorporated along the curved surface of the housing 9000. Furthermore, the display portion 9001 includes a touch sensor, and operation can be performed by touching a screen with a finger, a stylus, or the like. For example, by touching an icon displayed on the display portion 9001, application can be started.

Figure 34D:
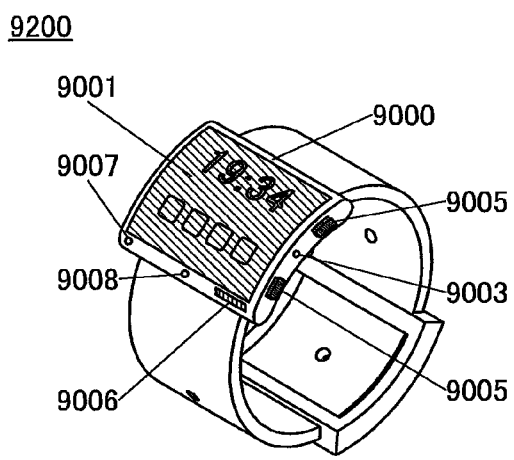
Figure 34B:
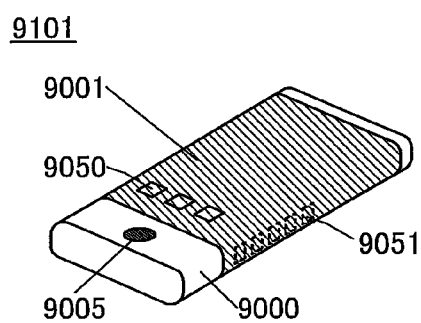

FIG. 34B is a perspective view of a portable information terminal 9101. The portable information terminal 9101 functions as, for example, one or more of a telephone set, a notebook, an information browsing system, and the like. Specifically, the portable information terminal 9101 can be used as a smartphone. Note that the speaker 9003, the connection terminal 9006, the sensor 9007, and the like, which are not illustrated in FIG. 34B, can be positioned in the portable information terminal 9101 as in the portable information terminal 9100 illustrated in FIG. 34A. The portable information terminal 9101 can display characters and image information on its plurality of surfaces. For example, three operation buttons 9050 (also referred to as operation icons, or simply, icons) can be displayed on one surface of the display portion 9001. Furthermore, information 9051 indicated by dashed rectangles can be displayed on another surface of the display portion 9001. Examples of the information 9051 include notification from a social networking service (SNS), display indicating reception of an e-mail or an incoming call, the title of the e-mail, the SNS, or the like, the sender of the e-mail, the SNS, or the like, the date, the time, remaining battery, and the reception strength of an antenna. Instead of the information 9051, the operation buttons 9050 or the like may be displayed in the position where the information 9051 is displayed.

Figure 34E:
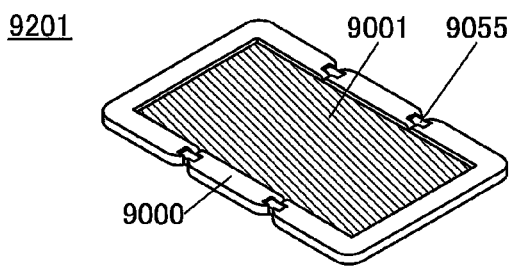
Figure 34C:
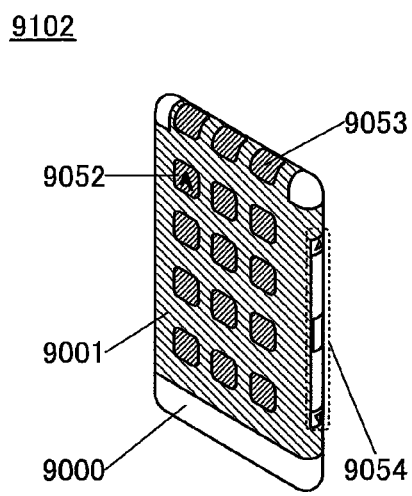

FIG. 34C is a perspective view of a portable information terminal 9102. The portable information terminal 9102 has a function of displaying information on three or more surfaces of the display portion 9001. Here, information 9052, information 9053, and information 9054 are displayed on different surfaces. For example, a user of the portable information terminal 9102 can see the display (here, the information 9053) with the portable information terminal 9102 put in a breast pocket of his/her clothes. Specifically, a caller's phone number, name, or the like of an incoming call is displayed in the position that can be seen from above the portable information terminal 9102. Thus, the user can see the display without taking out the portable information terminal 9102 from the pocket and decide whether to answer the call.

FIG. 34D is a perspective view of a watch-type portable information terminal 9200. The portable information terminal 9200 is capable of executing a variety of applications such as mobile phone calls, e-mailing, viewing and editing texts, music reproduction, Internet communication, and computer games. The display surface of the display portion 9001 is curved, and images can be displayed on the curved display surface. The portable information terminal 9200 can employ near field communication conformable to a communication standard. For example, hands-free calling can be achieved with mutual communication between the portable information terminal 9200 and a headset capable of wireless communication. Moreover, the portable information terminal 9200 includes the connection terminal 9006, and data can be directly transmitted to and received from another information terminal via a connector. Charging through the connection terminal 9006 is also possible. Note that the charging operation may be performed by wireless power feeding without using the connection terminal 9006.

Figure 34F:
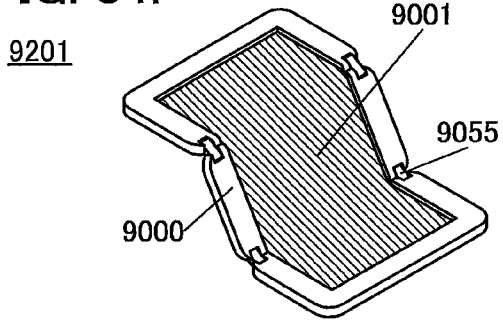
Figure 34G:
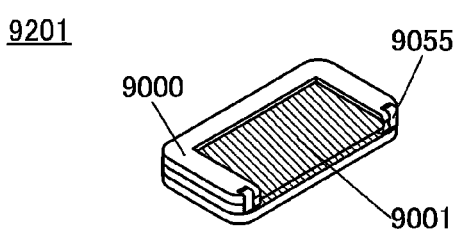

FIGS. 34E, 34F, and 34G are perspective views of a foldable portable information terminal 9201 that is opened, that is shifted from the opened state to the folded state or from the folded state to the opened state, and that is folded, respectively. The portable information terminal 9201 is highly portable when folded. When the portable information terminal 9201 is opened, a seamless large display region provides high browsability. The display portion 9001 of the portable information terminal 9201 is supported by three housings 9000 joined together by hinges 9055. By folding the portable information terminal 9201 at a connection portion between two housings 9000 with the hinges 9055, the portable information terminal 9201 can be reversibly changed in shape from the opened state to the folded state. For example, the portable information terminal 9201 can be bent with a radius of curvature of greater than or equal to 1 mm and less than or equal to 150 mm.

The electronic devices described in this embodiment each include the display portion for displaying some sort of data. However, a semiconductor device of one embodiment of the present invention can also be used for an electronic device that does not include a display portion. Furthermore, the structure in which the display portion of the electronic device described in this embodiment is flexible and display can be performed on the curved display surface or the structure in which the display portion of the electronic device is foldable is described as an example; however, the structure is not limited thereto and a structure in which the display portion of the electronic device is not flexible and display is performed on a plane portion may be employed.

The structures described in this embodiment can be used in appropriate combination with any of the structures described in the other embodiments.

Embodiment 7

In this embodiment, a semiconductor device of one embodiment of the present invention will be described.

[Semiconductor Device]

Figure 35A:
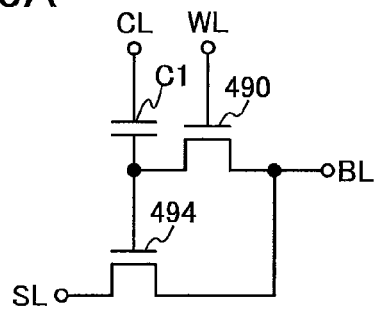
FIGS. 35A and 35B are a circuit diagram and a cross-sectional view of a semiconductor device.
Figure 35B:
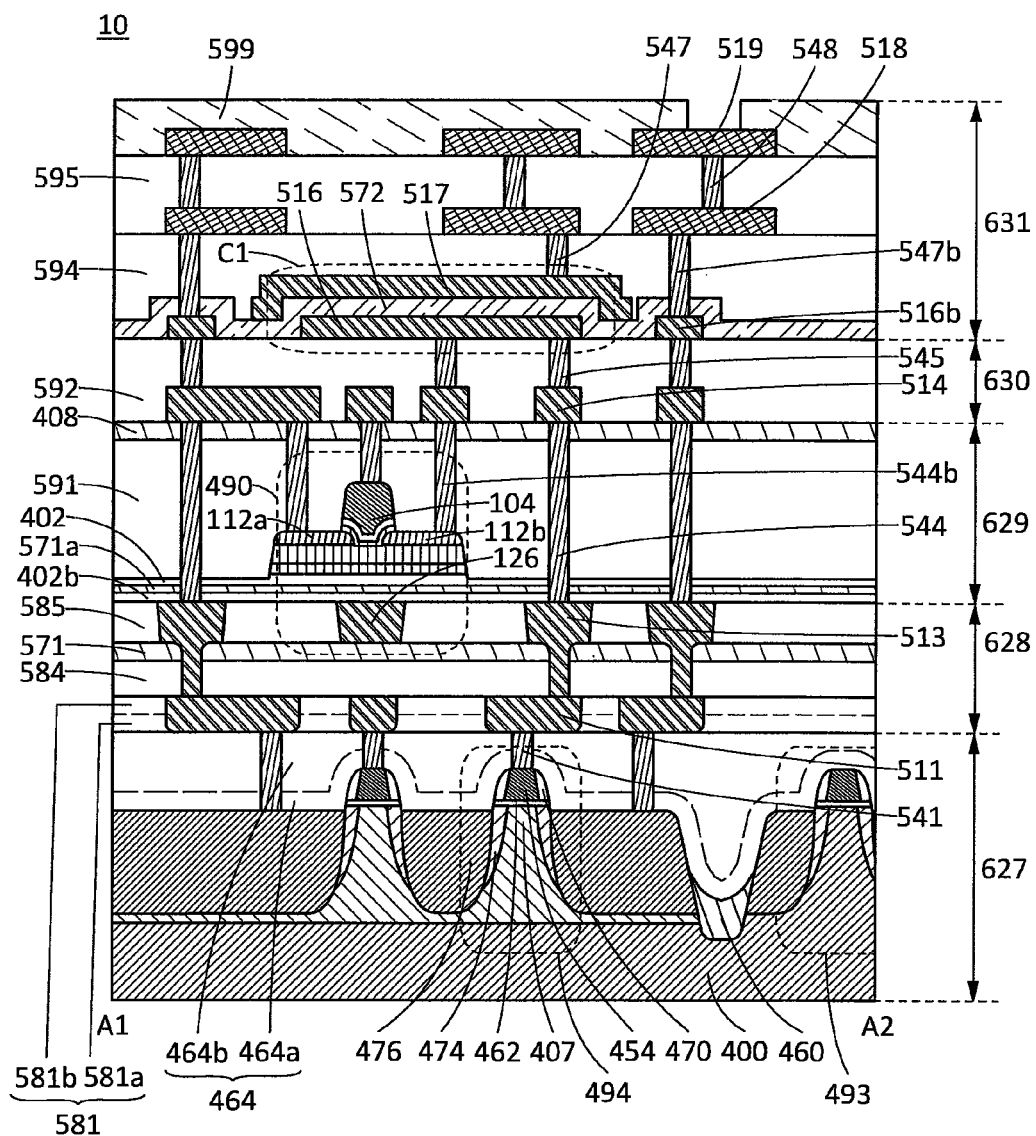

FIG. 35A is an example of a circuit included in a semiconductor device 10. FIG. 35B is an example of a cross-sectional view of the semiconductor device 10 including the circuit illustrated in FIG. 35A.

The semiconductor device 10 illustrated in FIG. 35B includes five layers, i.e., layers 627 to 631. The layer 627 includes a transistor 493, a transistor 494, and the like. The layer 629 includes the transistor 490 and the like. The layer 631 includes a capacitor C1 and the like.

<Layer 627>

The layer 627 includes a substrate 400, the transistor 493, the transistor 494, and the like over the substrate 400, an insulator 464 over the transistor 493 and the like, and plugs such as a plug 541. The plug 541 or the like is connected to, for example, a gate electrode, a source electrode, or a drain electrode of the transistor 493 or the like. The details of the transistors 493 and 494 will be described later.

The insulator 464 can be formed using, for example, silicon oxide, silicon oxynitride, silicon nitride oxide, silicon nitride, aluminum oxide, aluminum oxynitride, aluminum nitride oxide, aluminum nitride, or the like.

Alternatively, the insulator 464 can be formed using silicon carbonitride, silicon oxycarbide, or the like. Further alternatively, undoped silicate glass (USG), boron phosphorus silicate glass (BPSG), borosilicate glass (BSG), or the like can be used. USG, BPSG, and the like may be formed by an atmospheric pressure CVD method. Alternatively, hydrogen silsesquioxane (HSQ) or the like may be applied by a coating method. Here, the insulator 464 preferably contains hydrogen in some cases. When the insulator 464 contains hydrogen, defects or the like in the substrate 400 are reduced and characteristics of the transistor 493 and the like are improved in some cases.

The insulator 464 may have a single-layer structure or a stacked-layer structure of a plurality of materials. For example, the insulator 464 may have a two-layer structure of an insulator 464a and an insulator 464b as illustrated in FIG. 35B. Here, for example, silicon nitride and USG are used as the insulator 464a and the insulator 464b, respectively.

Transistors for forming peripheral circuits of the semiconductor device 10 of one embodiment of the present invention, for example, circuits such as a sense amplifier circuit, a driver circuit, a main amplifier, and an input/output circuit are preferably provided in the layer 627. A transistor including an oxide semiconductor is provided in the layer 629. The memory cell of one embodiment of the present invention is preferably provided in the layer 629. The peripheral circuits of the semiconductor device 10 are provided in the layer 627, the layer 629 is stacked thereover, and the transistor 490 is provided in the layer 629, whereby the area of the semiconductor device 10 can be reduced.

<Layer 628>

The layer 628 includes an insulator 581, an insulator 584 over the insulator 581, an insulator 571 over the insulator 584, an insulator 585 over the insulator 571, a conductor 511 and the like over the insulator 464, and a conductor 513 connected to the conductor 511 and the like and formed to fill an opening formed in the insulators 584, 571, and 585. The conductor 511 is preferably formed to be embedded in the insulator 581.

A conductor 126 is preferably provided in the layer 628. The conductor 126 is preferably formed to be embedded in the insulator 585. The conductor 126 preferably functions as a second gate electrode of the transistor 490.

For the insulator 581, refer to the description of the insulator 464. The insulator 581 may have a stacked-layer structure of a plurality of layers. For example, the insulator 581 has a two-layer structure of an insulator 581a and an insulator 581b over the insulator 581a as illustrated in FIG. 35B. For the insulators 581a and 581b, refer to the description of the insulators 464a and 464b.

For the insulators 584 and 585, the material that is described as that of the insulator 464 can be used. The insulators 584 and 585 may have a single-layer structure or a stacked-layer structure of a plurality of materials.

A conductive material such as a metal material, an alloy material, or a metal oxide material can be used as a material of the conductor 511, the conductor 513, the conductor 126, and the like. For example, a single-layer structure or a stacked-layer structure using any of metals such as aluminum, titanium, chromium, nickel, copper, yttrium, zirconium, niobium, molybdenum, silver, tantalum, and tungsten, or an alloy containing any of these metals as a main component can be used. Alternatively, a metal nitride such as tungsten nitride, molybdenum nitride, or titanium nitride can be used.

In the semiconductor device of one embodiment of the present invention, the conductor 511, the conductor 513, the conductor 126, and the like in the layer 628 may have a stacked-layer structure of two or more layers.

For example, copper can be used in a layer above the conductor. Copper has a low resistance and is preferably used as a conductor such as a plug or a wiring. On the other hand, copper is easily diffused, and the diffusion of copper into a semiconductor element degrades the characteristics of the semiconductor element in some cases. Thus, a layer under the conductor or the plug is preferably formed using a material through which copper is hardly allowed to pass. It is preferable that hydrogen or oxygen is hardly allowed to pass through the layer under the conductor or the plug. The layer under the conductor or the plug can be formed using tantalum, tantalum nitride, or titanium nitride, for example. Alternatively, the layer above the conductor or the plug may be formed using tungsten.

As an example of the insulator 581a, silicon nitride formed by a CVD method can be used. A film that releases a small amount of hydrogen is preferably used as the insulator 581a. The released amount of hydrogen can be measured by thermal desorption spectroscopy (TDS), for example. In TDS analysis, the amount of hydrogen released from the insulator 581a which is converted into hydrogen atoms is, for example, less than or equal to $5\times10^{20}$ atoms/cm$^3$, preferably less than or equal to $1\times10^{20}$ atoms/cm$^3$, in the range of 50° C. to 500° C. The amount of hydrogen released from the insulator 581a per area of the insulating film, which is converted into hydrogen atoms, is less than or equal to $5\times10^{15}$ atoms/cm$^2$, preferably less than or equal to $1\times10^{15}$ atoms/cm$^2$, for example. The dielectric constant of the insulator 581b is preferably lower than that of the insulator 581a.

The insulator 571 is preferably formed using an insulating material through which an impurity is hardly allowed to pass. Preferably, the insulator 571 has low oxygen permeability, for example. Preferably, the insulator 571 has low hydrogen permeability, for example. Preferably, the insulator 571 has low water permeability, for example.

The insulator 571 can be formed to have a single-layer structure or a stacked-layer structure using, for example, an insulating film containing aluminum oxide, hafnium oxide, tantalum oxide, zirconium oxide, lead zirconate titanate (PZT), strontium titanate ($SrTiO_3$), $(Ba,Sr)TiO_3$ (BST), or silicon nitride. Alternatively, bismuth oxide, germanium oxide, niobium oxide, silicon oxide, titanium oxide, tungsten oxide, yttrium oxide, or gallium oxide may be added to the insulating film, for example. Alternatively, the insulating film may be subjected to nitriding treatment to be an oxynitride film. A layer of silicon oxide, silicon oxynitride, or silicon nitride may be stacked over the insulating film. Aluminum oxide is particularly preferable because of its excellent barrier property against water or hydrogen. The insulator 571 is formed using, for example, silicon carbide, silicon carbonitride, or silicon oxycarbide.

The insulator 571 may be a stack of a layer of a material through which water or hydrogen is hardly allowed to pass and a layer containing an insulating material. The insulator 571 may be, for example, a stack of a layer containing silicon oxide or silicon oxynitride, a layer containing a metal oxide, and the like.

The insulator 571 included in the semiconductor device 10 can suppress the diffusion of an element included in the conductor 513, the conductor 126, and the like into the insulator 571 and layers under the insulator 571 (e.g., the insulator 584, the insulator 581, and the layer 627), for example.

<Layer 629>

The layer 629 includes a transistor such as the transistor 490 and plugs such as a plug 544 and a plug 544b. The plugs such as the plugs 544 and 544b are connected to the conductor 513, and a gate electrode, a source electrode, and a drain electrode of the transistor 490 and the like.

The transistor 490 includes the oxide semiconductor 108. In the transistor 490, the oxide semiconductor 108 includes three oxide semiconductors 108h, 108j, and 108k. The transistor 490 includes the oxide semiconductor 108h, the oxide semiconductor 108j over the oxide semiconductor 108h, conductors 112a and 112b over the oxide semiconductor 108j, the oxide semiconductor 108k in contact with a top surface and a side surface of the oxide semiconductor 108j, a top surface of the conductor 112a, and a top surface of the conductor 112b, the insulator 106 over the oxide semiconductor 108k, and the conductor 104 over the insulator 106. The conductor 104 is preferably formed over a region between the conductors 112a and 112b (a dividing region) with the insulator 106 positioned therebetween. The semiconductor device 10 in FIG. 35B includes an insulator 591 over the conductor 104 and an insulator 408 over the insulator 591.

As the oxide semiconductor 108j, the oxide semiconductor 108a described in Embodiment 1 can be used, for example.

The layers 108_1 and 108_3 described in Embodiment 1 can be used as the oxide semiconductors 108h and 108k, respectively.

The conductors 112a and 112b preferably function as the source electrode and the drain electrode of the transistor 490. The conductor 104 preferably functions as a gate electrode of the transistor 490. In the transistor 490, the conductor 104 and the conductor 126 preferably function as a first gate electrode and a second gate electrode, respectively.

The transistor 490 of one embodiment of the present invention preferably includes a charge trap layer between the oxide semiconductor 108 and the conductor 126. In the transistor 490 in FIG. 35B, an insulator 402b, an insulator 571a over the insulator 402b, and the insulator 402 over the insulator 571a are provided between the oxide semiconductor 108 and the conductor 126.

For the insulators 402 and 402b, the description of the insulator 584 can be referred to, for example. Furthermore, the semiconductor device 10 does not necessarily include the insulator 402b. The insulator 402 may be formed using silicon oxide or silicon nitride oxide (here, the silicon nitride oxide preferably contains more nitrogen than oxide), for example. In addition, the insulator 402b may be formed using silicon oxide, for example.

For the insulator 571a, refer to the description of the insulator 571.

The insulator 571a preferably functions as the charge trap layer. The threshold values of the transistor 490 can be controlled by trapping electric charge in the insulator 571a. In this specification, the threshold value refers to, for example, gate voltage at which a channel is formed. For example, the threshold value can be calculated from a curve obtained in a graph where the horizontal axis indicates the gate voltage $V_g$ and the vertical axis indicates the square root of drain current $I_d$ ($V_g$–$\sqrt{I_d}$ characteristics); the threshold value corresponds to the gate voltage $V_g$ at the intersection of an extrapolated tangent line having the highest inclination with the square root of drain current $I_d$ of 0 (i.e., $I_d$ of 0 A).

Here, the transistor 490 includes the conductor 104 overlapping with the oxide semiconductor 108 with the insulator 106 positioned therebetween and the conductor 126 overlapping with the oxide semiconductor 108 with the insulators 571a, 402, and 402b positioned therebetween.

As shown in the above embodiment, electric charge is trapped in at least one of the insulators 571a, 402, and 402b by providing a potential difference between the conductor 126 and the source of the transistor 490; accordingly, data is stored. Alternatively, electric charge may be trapped at the interface between two insulators among the insulators 571a, 402, and 402b, which are in contact with each other.

The charge trap layer can be formed using an insulator, a semiconductor, and a conductor. The insulator can be formed using silicon oxide, silicon oxynitride, silicon nitride oxide, silicon nitride, hafnium oxide, aluminum oxide, tantalum oxide, aluminum silicate, or the like. The semiconductor can be formed using polycrystalline silicon, microcrystalline silicon, amorphous silicon, an oxide semiconductor, or the like. The conductor can be formed using tantalum, tungsten, titanium, molybdenum, aluminum, copper, a molybdenum-tungsten alloy, or the like. Alternatively, the conductor can be a multilayer film selected as appropriate from tantalum nitride, tungsten nitride, titanium nitride, and the like through which oxygen is hardly allowed to pass.

The charge trap layer preferably contains oxygen and metal, for example. In the charge trap layer, the proportion of metal determined by energy dispersive X-ray spectrometry (EDX) is preferably greater than or equal to 20 atomic % and less than or equal to 50 atomic %, and the proportion of oxygen determined by EDX is preferably greater than or equal to 30 atomic % and less than or equal to 70 atomic %. Examples of the metal include hafnium, aluminum, tantalum, tungsten, and molybdenum.

Alternatively, the charge trap layer preferably contains silicon nitride. In the charge trap layer, the proportion of nitrogen is preferably greater than or equal to 45 atomic % and less than 60 atomic %, and the proportion of silicon is preferably greater than or equal to 40 atomic % and less than 55 atomic %.

The insulator 571a may have a stacked-layer structure of a layer that easily traps electric charge and a layer that hardly transmits an impurity. For example, as the layer that easily traps electric charge, hafnium oxide is formed, and, as the layer that hardly transmits an impurity, aluminum oxide is stacked thereover. Alternatively, hafnium oxide may be formed over aluminum oxide. Further alternatively, three layers of hafnium oxide, aluminum oxide, and silicon oxide may be stacked. Here, the stacking order of the three layers is not limited.

The insulators 571 and 571a in the semiconductor device 10 can suppress the diffusion of hydrogen, water, or the like in the layer 627 into the transistor 490 and the like. In addition, the insulator 408 of the semiconductor device 10 can suppress the diffusion of an impurity, such as hydrogen or water, from above the insulator 408. In the case where the transistor 490 and the like include an oxide semiconductor, for example, the deterioration in characteristics of the transistor can be suppressed in some cases by suppressing the diffusion of hydrogen into the oxide semiconductor.

The material described as the material of the conductor 511 or the like can be used as each of the conductors 112a and 112b, for example. In the case where a material that is easily bonded to oxygen, for example, tungsten or titanium is used as each of the conductors 112a and 112b, an oxide of the material is formed, so that oxygen vacancies in the oxide semiconductor 108 are increased in and near a region where the oxide semiconductor 108 is in contact with the conductors 112a and 112b. When hydrogen is bonded to an oxygen vacancy, the carrier density is increased and the resistivity is decreased in the region. Each of the conductors 112a and 112b may be formed of stacked films.

The material described as the material of the insulator 571 can be used as the insulator 408. Excess oxygen is preferably supplied to the interface between the insulator 408 and a film under the insulator 408 and the vicinity of the interface at the time of formation of the insulator 408.

When the insulators 571, 571a, and 408 are formed using a material with low oxygen permeability, the diffusion of oxygen from the transistor 490 and the like to the outside (e.g., the diffusion of oxygen to a layer under the insulator 571 and a layer over the insulator 408) can be suppressed. Accordingly, oxygen can be supplied to the transistor 490 and the like efficiently. In the case where the transistor 490 and the like include an oxide semiconductor, for example, easy supply of oxygen to the oxide semiconductor might improve transistor characteristics.

<Layer 630>

The layer 630 includes an insulator 592, conductors such as a conductor 514, and plugs such as a plug 545. The plug 545 and the like are connected to the conductors such as the conductor 514.

<Layer 631>

The layer 631 includes the capacitor C1. The capacitor C1 includes a conductor 516, a conductor 517, and an insulator 572. The insulator 572 includes a region sandwiched between the conductors 516 and 517. The layer 631 preferably includes an insulator 594 and a plug 547 over the conductor 517. The plug 547 is preferably formed to be embedded in the insulator 593. The layer 631 preferably includes a conductor 516b connected to a plug (not illustrated) in the layer 630 and a plug 547b over the conductor 516b. For the insulator 572, refer to the description of the insulator 571.

The layer 631 may include a wiring layer connected to the plugs 547 and 547b. In the example illustrated in FIG. 35B, the wiring layer includes a conductor 518 and the like connected to the plugs 547 and 547b, a plug 548 over the conductor 518, an insulator 595, a conductor 519 over the plug 548, and an insulator 599 over the conductor 519. The plug 548 is preferably formed to be embedded in the insulator 595. The insulator 599 includes an opening over the conductor 519.

The insulators, conductors, and semiconductors can be formed by a sputtering method, a CVD method (including a thermal CVD method, an MOCVD method, a PECVD method, and the like), an MBE method, an ALD method, a PLD method, or the like. In particular, the insulators are preferably formed by a CVD method and further preferably a plasma CVD method, because coverage can be further improved. It is preferable to use a thermal CVD method, an MOCVD method, or an ALD method in order to reduce plasma damage.

<Transistors 493 and 494>

The transistors 493 and 494 are described below.

The transistor 493 includes the following components: a channel formation region 407; an insulator 462 over the substrate 400; a conductor 454 over the insulator 462; an insulator 470 in contact with a side surface of the conductor 454; a region 476 positioned in the substrate 400 and overlapping with neither the conductor 454 nor the insulator 470; and a region 474 positioned in the substrate 400 and overlapping with the insulator 470. The region 476 is a low-resistance layer and preferably functions as a source or drain region of the transistor 493. The region 474 preferably functions as a lightly doped drain (LDD) region.

The transistor 493 may be either a p-channel transistor or an n-channel transistor, and an appropriate transistor is used depending on the circuit configuration or the driving method. Here, for example, the polarity of the transistor 494 is opposite to that of the transistor 493.

The substrate 400 preferably contains, for example, a semiconductor such as a silicon-based semiconductor, and further preferably single crystal silicon. Alternatively, a material including germanium (Ge), silicon germanium (SiGe), gallium arsenide (GaAs), gallium aluminum arsenide (GaAlAs), or the like may be contained. Alternatively, silicon having crystal lattice distortion may be contained. Alternatively, the transistor 493 may be a high-electron-mobility transistor (HEMT) with GaAs, GaAlAs, or the like.

The region 476 preferably contains an element that imparts n-type conductivity, such as phosphorus, or an element that imparts p-type conductivity, such as boron.

The conductor 454 can be formed using a semiconductor material such as silicon containing the element that imparts n-type conductivity, such as phosphorus, or the element that imparts p-type conductivity, such as boron, or a conductive material such as a metal material, an alloy material, or a metal oxide material. It is preferable to use a high-melting-point material that has both heat resistance and conductivity, such as tungsten or molybdenum, and it is particularly preferable to use tungsten.

The transistors 493 and 494 illustrated in FIG. 35B are examples in which element isolation is performed by a shallow trench isolation (STI) method or the like. Specifically, the transistors are electrically isolated by element isolation using an element isolation region 460 that is formed in such a manner that an insulator containing silicon oxide or the like is buried in a trench formed in the substrate 400 by etching or the like and then is partly removed by etching or the like.

In a projection of the substrate 400 which is positioned in a region other than the trench, the regions 476 and 474 and the channel formation region 407 are provided. Over the channel formation region 407, the insulator 462 that covers the channel formation region 407 and the conductor 454 that overlaps with the channel formation region 407 with the insulator 462 positioned therebetween are provided.

In the transistors 493 and 494, the projection is not necessarily provided in the substrate 400. The transistors 493 and 494 may be formed using a silicon on insulator (SOI) substrate, for example.

<Transistor 490>

Figure 36A:
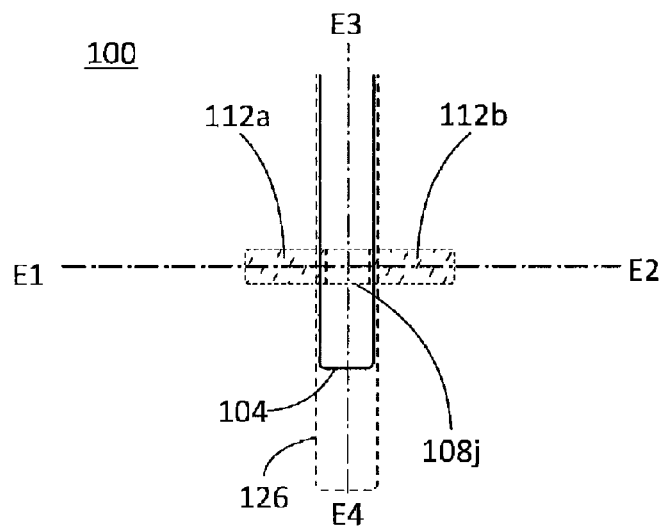
FIGS. 36A and 36B are a top view and a cross-sectional view of a transistor.
Figure 36B:
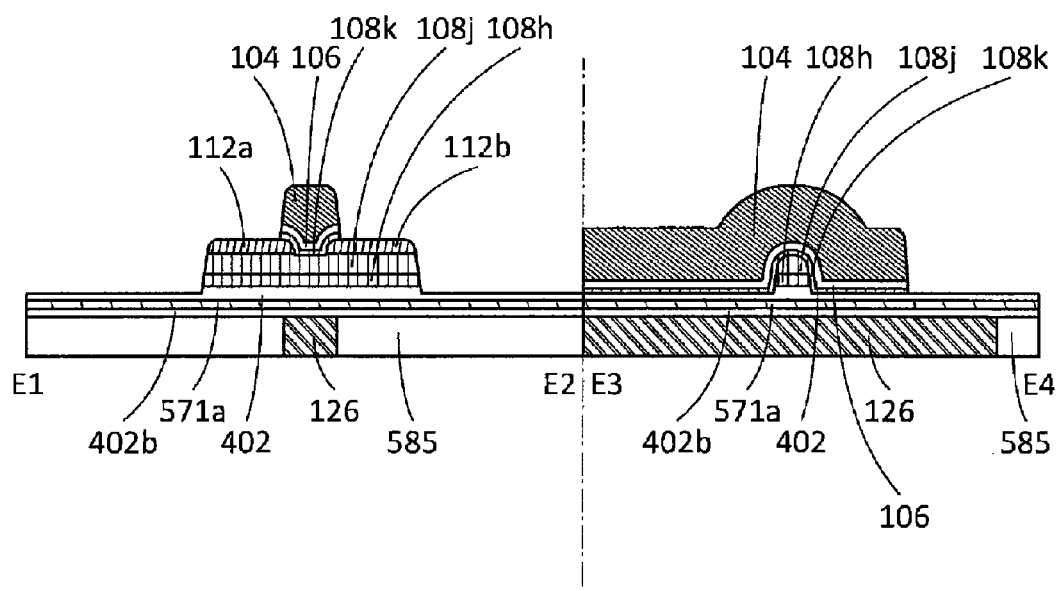

FIG. 36A is a top view of the transistor 490 in FIGS. 35A and 35B. FIG. 36B is a cross-sectional view taken along the dashed-dotted line E1-E2 and dashed-dotted line E3-E4 in FIG. 36A.

As illustrated in FIG. 36B, the oxide semiconductor 108j can be electrically surrounded by an electric field of the conductor 104 (a structure in which a semiconductor is electrically surrounded by an electric field of a conductor is referred to as a surrounded channel (s-channel) structure). Therefore, a channel is formed in the entire oxide semiconductor 108j (bulk) in some cases. In the s-channel structure, a large amount of current can flow between a source and a drain of a transistor, so that a high on-state current can be obtained.

The s-channel structure is suitable for a miniaturized transistor because a high on-state current can be obtained. A device including a miniaturized transistor can have a high integration degree and high density. For example, the transistor includes a region having a channel length preferably less than or equal to 40 nm, further preferably less than or equal to 30 nm, and still further preferably less than or equal to 20 nm, and a region having a channel width preferably less than or equal to 40 nm, further preferably less than or equal to 30 nm, and still further preferably less than or equal to 20 nm.

Figure 37A:
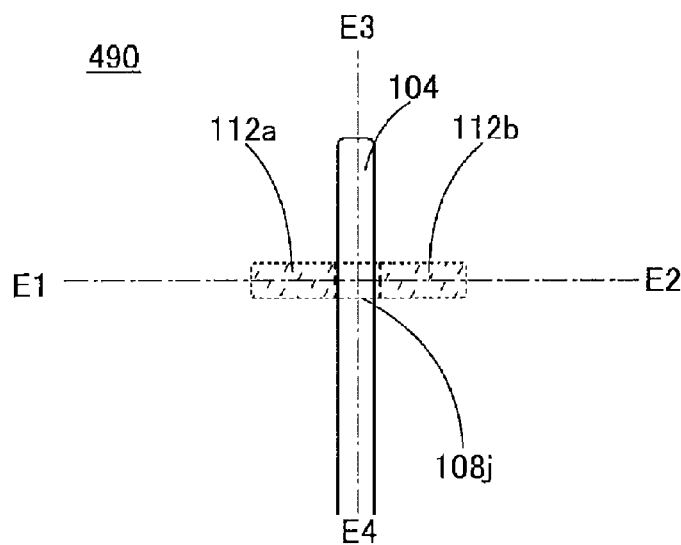
FIGS. 37A and 37B are a top view and a cross-sectional view of a transistor.
Figure 37B:
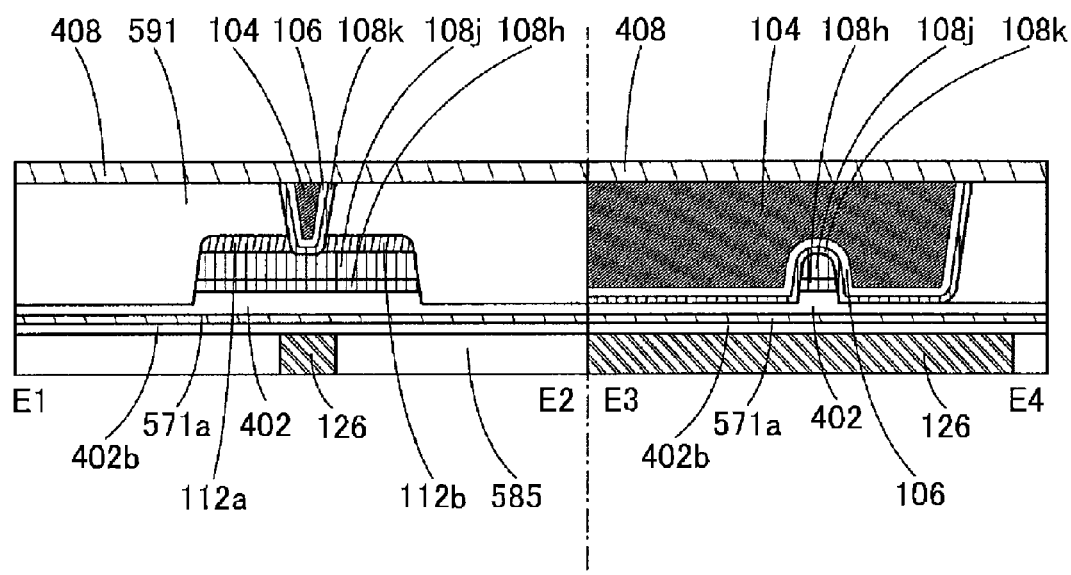

FIGS. 37A and 37B illustrate the structure of the transistor 490 different from that in FIGS. 36A and 36B. FIG. 37A is a top view of the transistor. FIG. 37B is a cross-sectional view taken along the dashed-dotted line E1-E2 and the dashed-dotted line E3-E4 shown in FIG. 37A. In FIG. 37B, the insulator 106 is stacked over the oxide semiconductor 108k. The conductor 104 is formed such that the opening covered with the oxide semiconductor 108k and the insulator 106 is filled. The oxide semiconductor 108k and the insulator 106 are formed on a side surface of an opening in the insulator 591.

<Circuit Operation>

The operation of the circuit in FIG. 35A is described. The circuit in FIG. 35A has a feature that the gate potential of the transistor 494 can be held, and thus enables writing, holding, and reading of data as follows.

Writing and holding of data is described. First, the potential of a terminal WL is set to a potential at which the transistor 490 is turned on, so that the transistor 490 is turned on. Accordingly, the potential of a terminal BL is supplied to a node FN where a gate of the transistor 494 and one electrode of the capacitor C1 are electrically connected to each other. That is, predetermined electric charge is supplied to the gate of the transistor 494 (writing). Here, one of two kinds of electric charge providing different potential levels (hereinafter referred to as low-level electric charge and high-level electric charge) is supplied. After that, the potential of the terminal WL is set to a potential at which the transistor 490 is turned off. Thus, the electric charge is held in the node FN (holding).

The transistor 490 in which an oxide semiconductor is used for a semiconductor layer can have an extremely low off-state current; therefore, the electric charge of the node FN is held for a long period of time.

Next, reading of data is described. An appropriate potential (a reading potential) is supplied to a terminal CL while a predetermined potential (a constant potential) is supplied to the terminal BL, whereby the potential of the terminal SL changes in accordance with the amount of electric charge held in the node FN. This is because in the case of using an n-channel transistor as the transistor 494, an apparent threshold voltage $V_{th\_H}$ at the time when the high-level electric charge is supplied to the gate of the transistor 494 is lower than an apparent threshold voltage $V_{th\_L}$ at the time when the low-level electric charge is supplied to the gate of the transistor 494. Here, the apparent threshold voltage refers to the potential of the terminal CL that is needed to turn on the transistor 494. Thus, the potential of the terminal CL is set to a potential $V_0$ which is between $V_{th\_H}$ and $V_{th\_L}$, whereby electric charge supplied to the node FN can be determined. For example, in the case where the high-level electric charge is supplied to the node FN in writing and the potential of the terminal CL is $V_0$ ($>V_{th\_H}$), the transistor 494 is turned on. On the other hand, in the case where the low-level electric charge is supplied to the node FN in writing, even when the potential of the terminal CL is $V_0$ ($<V_{th}$ a the transistor 494 remains off. Thus, the data held in the node FN can be read out by determining the potential of the terminal SL.

In the case where memory cells are arrayed, it is necessary that data of a desired memory cell be read out in read operation. For example, a configuration in which only data of a desired memory cell can be read out by supplying a potential at which the transistor 494 is turned off regardless of the electric charge supplied to the node FN, that is, a potential lower than $V_{th\_H}$, to the terminal CL of memory cells from which data is not read may be employed so that data of the memory cells other than the desired memory cell are not read. Alternatively, a configuration in which only data of a desired memory cell can be read out by supplying a potential at which the transistor 494 is turned on regardless of the electric charge supplied to the node FN, that is, a potential higher than $V_{th\_L}$, to the terminal CL of memory cells from which data is not read may be employed.

With a transistor including an oxide semiconductor and having an extremely low off-state current, the above-described semiconductor device can hold stored data for a long period of time. In other words, the power consumption of the semiconductor device can be reduced because refresh operation becomes unnecessary or the frequency of refresh operation can be extremely low. Moreover, stored data can be held for a long period of time even when power is not supplied (note that the potential is preferably fixed).

In the semiconductor device, high voltage is not needed for writing data and elements are less likely to deteriorate. Unlike in a conventional nonvolatile memory, for example, it is not necessary to inject and extract electrons into and from a floating gate; thus, a problem such as deterioration of an insulator is not caused. That is, the semiconductor device of one embodiment of the present invention does not have a limit on the number of times data can be rewritten, which is a problem of a conventional nonvolatile memory, and the reliability thereof is drastically improved. Furthermore, data is written depending on the on/off state of the transistor, whereby high-speed operation can be achieved.

EXAMPLE 1

In this example, a sample including a transistor having the structure in FIG. 1A (hereinafter referred to as a transistor s) on its plane and a sample including a transistor having the structure in FIG. 15C (hereinafter referred to as a transistor d) on its plane were fabricated and the characteristics thereof were evaluated.

<Fabrication of Transistor>

Two samples of Sample A-1 and Sample A-2 were fabricated. Methods for fabricating the transistors of the samples will be described. The description of part of the fabricating method of Sample A-2 which is the same as that of Sample A-1 is omitted, and only a different part of the fabricating method is described.

First, as a conductive film to be the conductor 104, a 100-nm-thick tungsten film was formed over a glass substrate. Then, a mask was formed, and the conductor 104 was formed by etching.

Next, as the insulator 106a, a 400-nm-thick silicon nitride film was formed by a PECVD method using silane, nitrogen, and ammonia as a deposition gas. Then, as the insulator 106b, a 50-nm thick silicon oxynitride film was formed by a PECVD method under the conditions where the pressure was 40 Pa, the RF power was 100 W, the substrate temperature was 350° C., and the gas flow rates of silane and dinitrogen monoxide were 20 sccm and 3000 sccm, respectively.

Next, an oxide semiconductor film to be the oxide semiconductor 108a was formed. As the oxide semiconductor film, a 50-nm-thick In—Ga—Zn oxide film was formed by a sputtering method using a polycrystalline metal oxide target. Sample A-1 was fabricated under the conditions where a target with an atomic ratio of In:Ga:Zn:4:2:4.1 was used, oxygen and argon were used as a gas, the proportion of oxygen to the total gas flow rate of oxygen and argon was 30%, the AC power was 2.5 kW, the pressure was 0.6 Pa, and the substrate temperature was 170° C. Sample A-2 was fabricated under the conditions where a target with an atomic ratio of In:Ga:Zn:1:1:1.2 was used, oxygen and argon were used as a gas, the proportion of oxygen to the total gas flow rate of oxygen and argon was 50%, the AC power was 2.5 kW, the pressure was 0.6 Pa, and the substrate temperature was 170° C.

Next, heat treatment was performed at 450° C. in a nitrogen atmosphere for one hour, and then another heat treatment was performed at 450° C. in an oxygen atmosphere for one hour.

Then, as a conductive film to be the conductors 112a and 112b, a 50-nm-thick tungsten film, a 400-nm-thick aluminum film, and a 100-nm-thick titanium film were formed in this order. Then, a mask was formed, and the conductors 112a and 112b were formed by etching. After that, treatment was performed for 15 seconds using a solution in which 85% phosphoric acid was diluted 100 times.

Next, as the insulator 114, a 40-nm-thick silicon oxynitride film was formed by a PECVD method under the conditions where the pressure was 200 Pa, the RF power was 100 W, the substrate temperature was 220° C., and the gas flow rates of silane and dinitrogen monoxide were 50 sccm and 2000 sccm, respectively. After that, as the insulator 116, a 400-nm-thick silicon oxynitride film was formed by a PECVD method under the conditions where the pressure was 200 Pa, the power was 1500 W, the substrate temperature was 220° C., and the gas flow rates of silane and dinitrogen monoxide were 160 sccm and 4000 sccm, respectively.

Next, first heat treatment was performed at 350° C. in a nitrogen atmosphere for one hour. After that, a 5-nm-thick film of indium tin oxide containing silicon oxide (hereinafter referred to as an ITSO film) was formed by a sputtering method under the conditions where a target having a weight ratio of $In_2O_3$:$SnO_2$:$SiO_2$=85:10:5 was used and argon and oxygen were used as a deposition gas.

Next, oxygen addition treatment was performed on the insulator 116 through the ITSO film. The oxygen addition treatment was performed with an ashing apparatus under the conditions where the substrate temperature was 40° C., an oxygen gas at a gas flow rate of 250 sccm was introduced into a chamber, the pressure was 15 Pa, and an RF power of 4500 W was supplied for 120 seconds between parallel-plate electrodes provided in the asking apparatus so that a bias would be applied to the substrate side.

Then, the ITSO film was removed to expose the insulator 116. The ITSO film was removed by a wet etching method.

Next, as the insulator 118, a 100-nm-thick silicon nitride film was formed by a PECVD method under the conditions where silane, nitrogen, and ammonia were used as a deposition gas and the substrate temperature was 350° C.

Next, the opening 142c reaching the conductor 112b and the openings 142a and 142b reaching the conductor 104 were formed. The openings 142a, 142b, and 142c were formed with a dry etching apparatus.

Next, a conductive film was formed over the insulator 118 to cover the openings 142a, 142b, and 142c and processed to form the conductors 120a and 120b. In the transistor structure in FIG. 1A, the conductor 120b was not provided. As the conductors 120a and 120b, a 100-nm-thick ITSO film was formed with a sputtering apparatus. The composition of a target used for forming the ITSO film was the same as that used for forming the ITSO film described above.

Then, second heat treatment was performed. The second heat treatment was performed at 250° C. in a nitrogen gas atmosphere for one hour.

Through the above processes, Sample A-1 and Sample A-2 including the transistors were fabricated.

<Evaluation of Transistor>

Figure 38A:
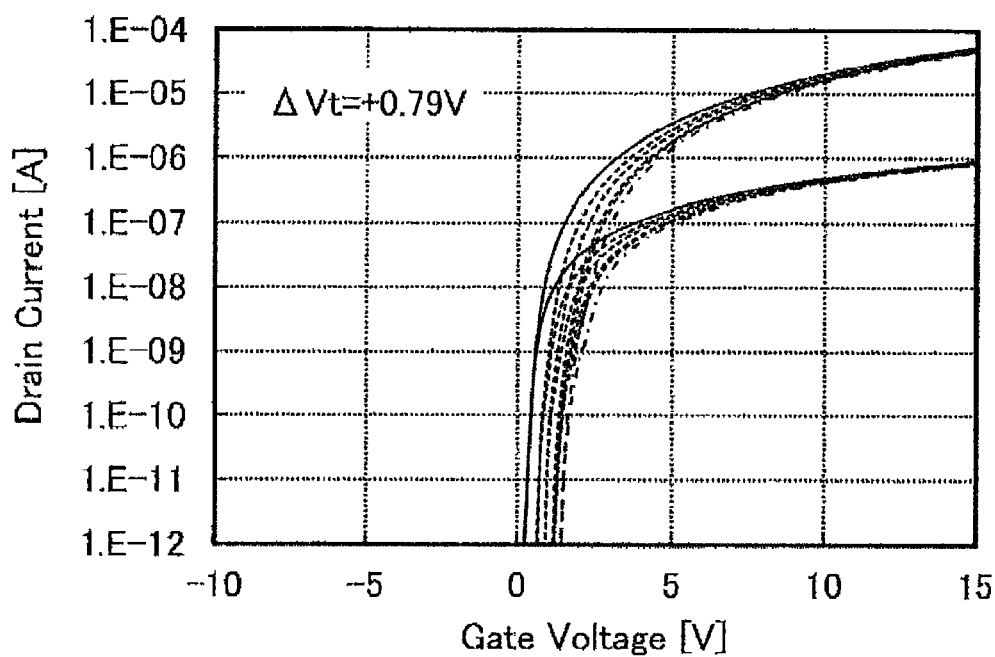
FIGS. 38A and 38B each show $I_{ds}$–$V_{gs}$ characteristics of transistors.
Figure 38B:
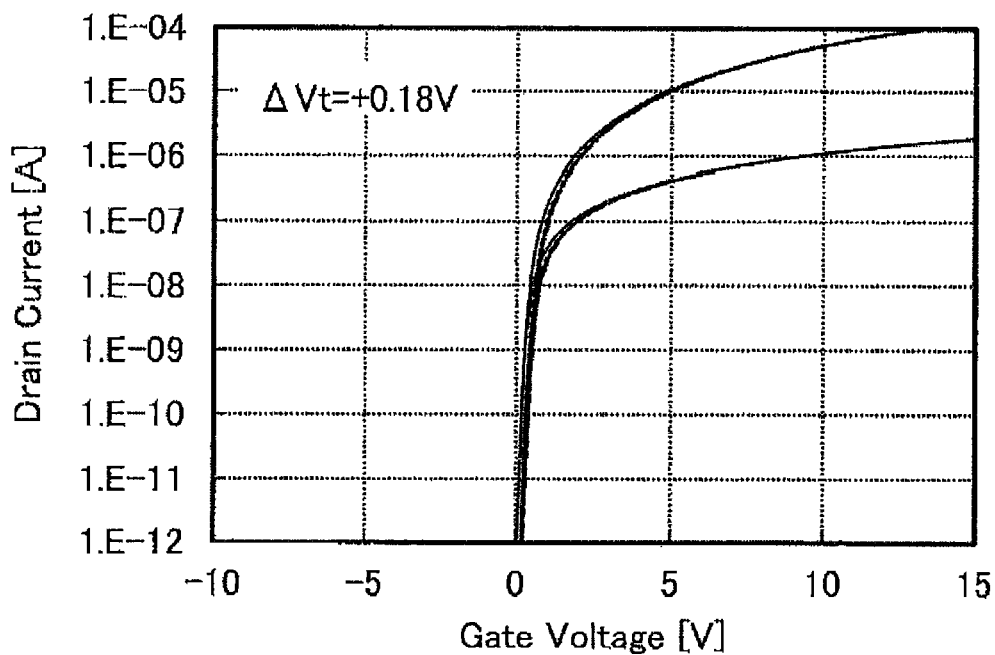

Next, as stress, the temperature of 60° C. and $V_{gs}$ of 30 V were applied for one hour to the transistors of Sample A-1 and Sample A-2 which were fabricated. The transistors, each of which had a channel length L of 6 μm and a channel width W of 50 μm, were evaluated. FIGS. 38A and 38B each show the $I_{ds}$-$V_{gs}$ characteristics of the transistors before the stress application and after a lapse of 100 seconds, 500 seconds, 1500 seconds, 2000 seconds, and one hour (3600 seconds). The $I_{ds}$-$V_{gs}$ characteristics were measured under two conditions of $V_{ds}$ of 0.1 V and 10 V. Here, $V_{gs}$ was applied to the conductor 104 of the transistor s, whereas $V_{gs}$ was applied to the conductor 104 and the conductor 120b of the transistor d so that the conductor 104 and the conductor 120b had the same potentials.

FIG. 38A shows the $I_{ds}$-$V_{ds}$ characteristics of the transistor d of Sample A-1, whereas FIG. 38B shows the $I_{ds}$-$V_{ds}$ characteristics of the transistor s of Sample A-2. The amounts of change in threshold value ($\Delta V_{th}$) after one hour were 0.17 V and 0.18 V in the transistor s and the transistor d in Sample A-1, respectively, whereas the amounts of change in threshold value ($\Delta V_{th}$) after one hour were 0.79 V and 1.26 V in the transistor s and the transistor d in Sample A-2, respectively. The above results indicate that more excellent characteristics can be obtained in Sample A-1. This is presumably because the conduction band minimum of the oxide semiconductor 108a used in Sample A-1 is lower and the energy gap of the oxide semiconductor 108a is smaller than those of the oxide semiconductor 108a used in Sample A-2, for example.

EXAMPLE 2

In this example, the transistor having the structure in FIG. 15C was fabricated and the characteristics thereof were evaluated.

<Fabrication of Transistor>

Two samples of Sample B-1 and Sample B-2 were fabricated. Methods for fabricating the transistors of the samples will be described. The description of part of the fabricating method of Sample B-2 which is the same as that of Sample B-1 is omitted, and only a different part of the fabricating method is described.

First, as a conductive film to be the conductor 104, a 100-nm-thick tungsten film was formed over a glass substrate. Then, a mask was formed, and the conductor 104 was formed by etching.

Next, as the insulator 106a, a 400-nm-thick silicon nitride film was formed by a PECVD method using silane, nitrogen, and ammonia as a deposition gas. Then, as the insulator 106b, a 50-nm thick silicon oxynitride film was formed by a PECVD method under the conditions where the pressure was 40 Pa, the RF power was 100 W, the substrate temperature was 350° C., and the gas flow rates of silane and dinitrogen monoxide were 20 sccm and 3000 sccm, respectively.

Next, an oxide semiconductor film to be the oxide semiconductor 108a was formed. As the oxide semiconductor film, a 25-nm-thick In—Ga—Zn oxide film was formed by a sputtering method using a polycrystalline metal oxide target. Sample B-1 was fabricated under the conditions where a target with an atomic ratio of In:Ga:Zn:=4:2:4.1 was used, oxygen and argon were used as a gas, the proportion of oxygen to the total gas flow rate of oxygen and argon was 30%, the AC power was 2.5 kW, the pressure was 0.6 Pa, and the substrate temperature was 170° C. Sample B-2 was fabricated under the conditions where a target with an atomic ratio of In:Ga:Zn:=1:1:1.2 was used, oxygen and argon were used as a gas, the proportion of oxygen to the total gas flow rate of oxygen and argon was 50%, the AC power was 2.5 kW, the pressure was 0.6 Pa, and the substrate temperature was 170° C.

Next, heat treatment was performed at 450° C. in a nitrogen atmosphere for one hour, and then another heat treatment was performed at 450° C. in an oxygen atmosphere for one hour.

Then, as a conductive film to be the conductors 112a and 112b, a 50-nm-thick tungsten film, a 400-nm-thick aluminum film, and a 100-nm-thick titanium film were formed in this order. Then, a mask was formed, and the conductors 112a and 112b were formed by etching. After that, treatment was performed for 15 seconds using a solution in which 85% phosphoric acid was diluted 100 times.

Next, as the insulator 114, a silicon oxynitride film was formed by a PECVD method under the conditions where the pressure was 20 Pa, the RF power was 100 W, the substrate temperature was 220° C., and the gas flow rates of silane and dinitrogen monoxide were 50 sccm and 2000 sccm, respectively. After that, as the insulator 116, a silicon oxynitride film was formed by a PECVD method under the conditions where the pressure was 200 Pa, the power was 1500 W, the substrate temperature was 220° C., and the gas flow rates of silane and dinitrogen monoxide were 160 sccm and 4000 sccm, respectively.

Next, first heat treatment was performed at 350° C. in a nitrogen atmosphere for one hour. After that, a 5-nm-thick ITSO film was formed by a sputtering method under the conditions where a target having a weight ratio of $In_2O_3$:$SnO_2$:$SiO_2$=85:10:5 was used and argon and oxygen were used as a deposition gas.

Next, oxygen addition treatment was performed on the insulator 116 through the ITSO film. The oxygen addition treatment was performed with an ashing apparatus under the conditions where the substrate temperature was 40° C., an oxygen gas at a gas flow rate of 250 sccm was introduced into a chamber, the pressure was 15 Pa, and an RF power of 4500 W was supplied for 120 seconds between parallel-plate electrodes provided in the ashing apparatus so that a bias would be applied to the substrate side.

Then, the ITSO film was removed to expose the insulator 116. The ITSO film was removed by a wet etching method.

Next, as the insulator 118, a 100-nm-thick silicon nitride film was formed by a PECVD method under the conditions where silane, nitrogen, and ammonia were used as a deposition gas and the substrate temperature was 350° C.

Next, the opening 142c reaching the conductor 112b and the openings 142a and 142b reaching the conductor 104 were formed. The openings 142a, 142b, and 142c were formed with a dry etching apparatus.

Next, a conductive film was formed over the insulator 118 to cover the openings 142a, 142b, and 142c and processed to form the conductors 120a and 120b. As the conductors 120a and 120b, a 100-nm-thick ITSO film was formed with a sputtering apparatus. The composition of a target used for forming the ITSO film was the same as that used for forming the ITSO film described above.

Then, second heat treatment was performed. The second heat treatment was performed at 250° C. in a nitrogen gas atmosphere for one hour.

Through the above processes, Sample B-1 and Sample B-2 including the transistors were fabricated.

<Evaluation of Transistor>

Next, as stress, $V_{gs}$ of 30 V was applied for one hour to the transistors of Sample B-1 and Sample B-2 which were fabricated. Here, $V_{gs}$ was applied to the conductor 104 and the conductor 120b of the transistor d so that the conductor 104 and the conductor 120b had the same potentials. The measurement temperature was set at 40° C., 60° C., 70° C., 80° C., 100° C., and 110° C. (only at 70° C. and 110° C. for Sample B-1).

The transistors, each of which had a channel length L of 6 μm and a channel width W of 50 were evaluated. The $I_{ds}$–$V_{gs}$ characteristics of the transistors before the stress application and after a lapse of 100 seconds, 500 seconds, 1500 seconds, 2000 seconds, and one hour (3600 seconds) when $V_{ds}$ was 0.1 V and 10 V were measured, and the threshold values were calculated from the $I_{ds}$–$V_{gs}$ characteristics when $V_{ds}$ was 10 V. The threshold values before stress application at a measurement temperature of 40° C. was 0.8 V for Sample B-1 and 1.0 V for Sample B-2. Here, the threshold values were each obtained as $V_{gs}$ at which $I_{ds}$ [A]×L [μm]÷W [μm] was calculated to be $1\times10^{-9}$ [A].

Figure 39A:
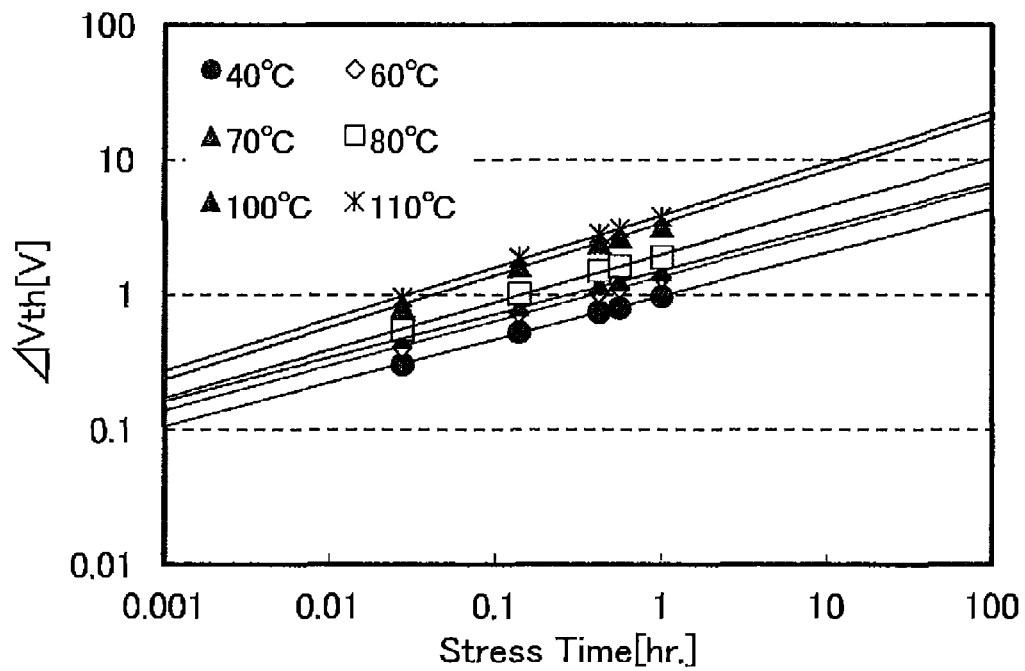
FIGS. 39A and 39B each show the relationship between stress time and a change in threshold value.
Figure 39B:
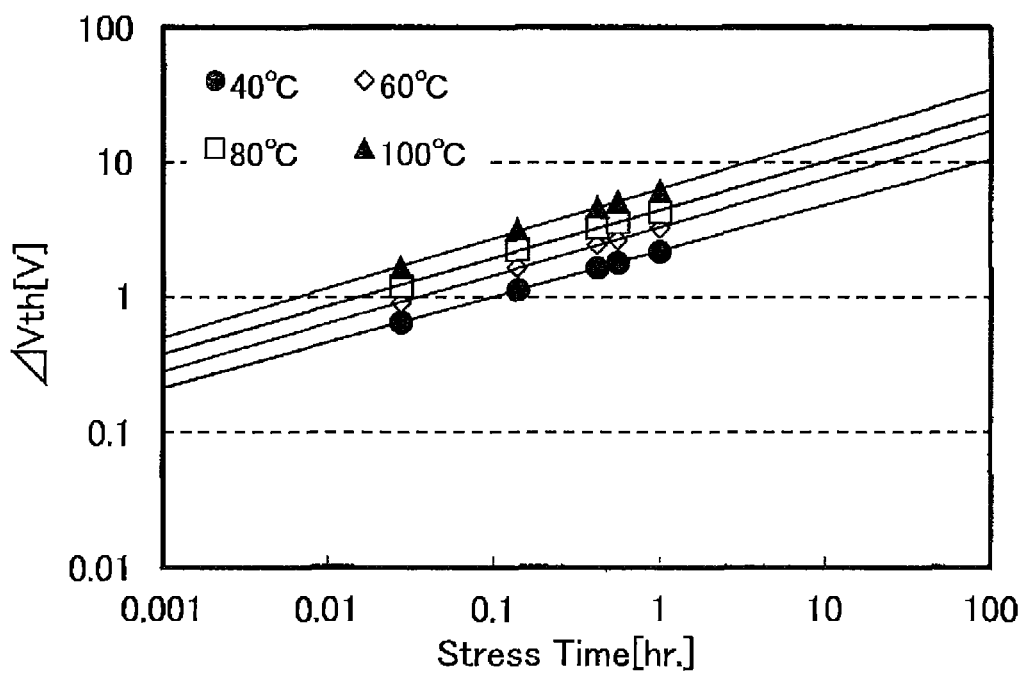
Figure 40A:
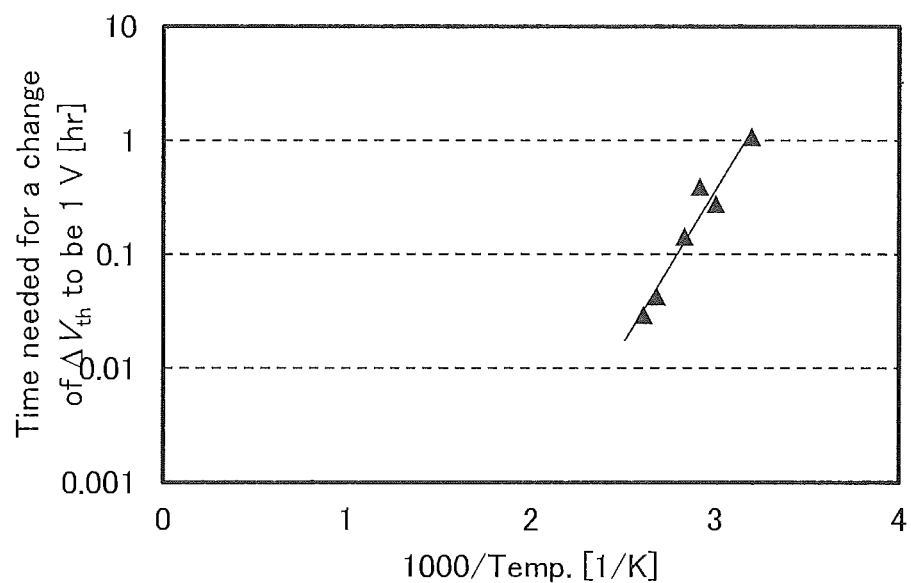
FIGS. 40A and 40B show the relationship between stress temperature and a change in threshold value.
Figure 40B:
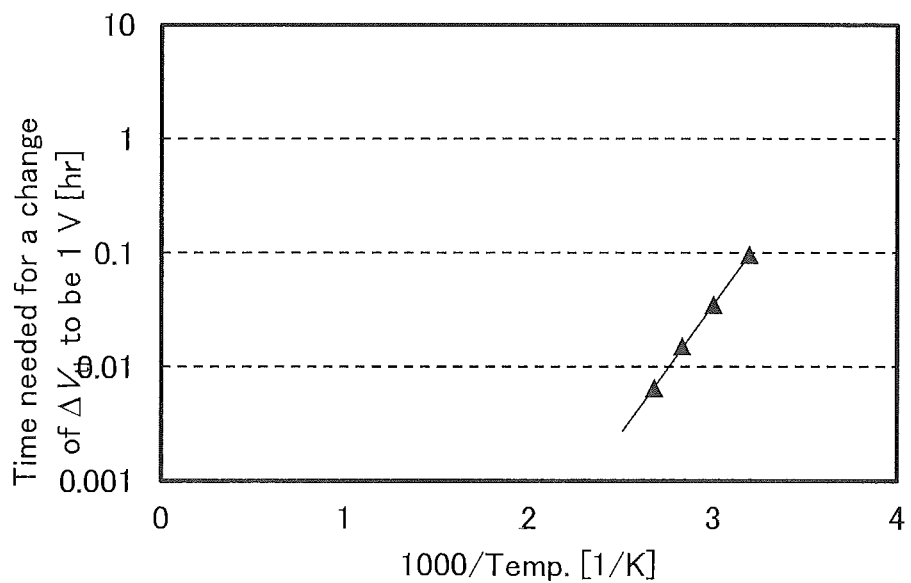

FIGS. 39A and 39B each show the relationship between stress time and the amount of change in threshold value ($\Delta V_{th}$) in Sample B-1 and Sample B-2. In FIGS. 40A and 40B, the value of 1000/T is plotted on the horizontal axis, and the time needed for a change of $\Delta V_{th}$ to be 1 V is plotted on the vertical axis. Here, FIGS. 40A and 40B show the results of Sample B-1 and Sample B-2, respectively. An activation energy $E_a$ was obtained by Formula 1 based on these results. The activation energy $E_a$ was 0.53 eV for Sample B-1 and 0.45 eV for Sample B-2. It is presumable that fewer carriers are trapped in defect states of the insulator 106a as the activation energy gets larger. This is presumably because the activation energy is higher when the conduction band minimum of the oxide semiconductor 108a is lower and the energy gap of the oxide semiconductor 108a is smaller, for example.

EXAMPLE 3

In this example, a transistor having the structure in FIGS. 43A to 43C was fabricated and the characteristics thereof were evaluated.

<Fabrication of Transistor>

Two samples of Sample C-1 and Sample C-2 were fabricated. Methods for fabricating the transistors of the samples will be described. The description of part of the fabricating method of Sample C-2 which is the same as that of Sample C-1 is omitted, and only a different part of the fabricating method is described.

First, the conductor 105 was formed over a glass substrate. For Sample C-1, as a conductive film to be the conductor 105, a 100-nm-thick tungsten film was formed. Then, a mask was formed, and the conductor 105 was formed by etching. For Sample C-2, a 10-nm-thick titanium film was formed and then a 100-nm-thick copper film was formed thereover as the conductive film to be the conductor 105. Then, a mask was formed, and the conductor 105 was formed by etching.

Next, as the insulator 101, a stack of a 400-nm-thick silicon nitride film and a 50-nm-thick silicon oxynitride film was used. First, the silicon nitride film was formed by a PECVD method using silane, nitrogen, and ammonia as a deposition gas. After that, the silicon oxynitride film was formed by a PECVD method under the conditions where the pressure was 40 Pa, the RF power was 100 W, the substrate temperature was 350° C., and the gas flow rates of silane and dinitrogen monoxide were 20 sccm and 3000 sccm, respectively.

Next, an oxide semiconductor film to be the layer 108_2 was formed. As the oxide semiconductor film, an In—Ga—Zn oxide film was formed by a sputtering method using a polycrystalline metal oxide target. For Sample C-1, a 40-nm-thick In—Ga—Zn oxide film was formed under the conditions where a target with an atomic ratio of In:Ga:Zn:=4:2:4.1 was used, oxygen and argon were used as a gas, the proportion of oxygen to the total gas flow rate of oxygen and argon was 10%, the AC power was 2.5 kW, the pressure was 0.6 Pa, and the substrate temperature was 130° C. For Sample C-2, a 40-nm-thick In—Ga—Zn oxide film was formed under the conditions where a target with an atomic ratio of In:Ga:Zn:=1:1:1.2 was used, oxygen and argon were used as a gas, the proportion of oxygen to the total gas flow rate of oxygen and argon was 50%, the AC power was 2.5 kW, the pressure was 0.6 Pa, and the substrate temperature was 170° C.

Next, as the insulator 106, a stack of three silicon oxynitride films was formed by a PECVD method as follows: a 30-nm-thick silicon oxynitride film was formed for a first layer under the conditions where the pressure was 200 Pa, the RF power was 100 W, the substrate temperature was 350° C., and the gas flow rates of silane and dinitrogen monoxide were 20 sccm and 3000 sccm, respectively; a 100-nm-thick silicon oxynitride film was formed for a second layer under the conditions where the pressure was 200 Pa, the RF power was 1500 W, the substrate temperature was 220° C., and the gas flow rates of silane and dinitrogen monoxide were 160 sccm and 4000 sccm, respectively; and a 20-nm-thick silicon oxynitride film was formed for a third layer under the same conditions as those for the first layer.

Next, heat treatment was performed at 350° C. in a nitrogen atmosphere for one hour.

Next, the conductor 104 was formed. First, a 100-nm-thick In—Ga—Zn oxide film was formed by a sputtering method. After that, the In—Ga—Zn oxide film and the insulator 106 were processed into an island shape. Plasma treatment was performed with a mask in a reduced-pressure atmosphere using argon and nitrogen as a gas. After that, a silicon nitride film was formed as the insulator 122, a silicon oxynitride film was formed as the insulator 124, and hydrogen was supplied from the silicon nitride film to the In—Ga—Zn oxide film to form the conductor 104. The silicon nitride film was formed to a thickness of 100 nm by a PECVD method under the conditions where the pressure was 100 Pa, the RF power was 1000 W, the substrate temperature was 220° C., and the gas flow rates of silane, nitrogen, and ammonia were 50 sccm, 5000 sccm, and 100 sccm, respectively. The silicon oxynitride film was formed to a thickness of 300 nm by a PECVD method under the conditions where the pressure was 200 Pa, the RF power was 1500 W, the substrate temperature was 220° C., and the gas flow rates of silane and nitrous oxide were 160 sccm and 4000 sccm, respectively.

After that, in Sample C-1, a 300-nm-thick silicon oxynitride film was formed by a PECVD method and then subjected to heat treatment at 350° C. in a nitrogen atmosphere for one hour.

Next, in Sample C-1 and Sample C-2, the opening 141a and the like were provided in the insulator 122 and the insulator 124, the conductors 112a and 112b were formed, a 1.5-μm-thick acrylic resin film was formed, and then heat treatment was performed at 250° C. in a nitrogen atmosphere for one hour.

Through the above processes, the transistors having the structure in FIGS. 43A to 43C were formed in Sample C-1 and Sample C-2.

<Evaluation of Transistor>

Figure 45A:
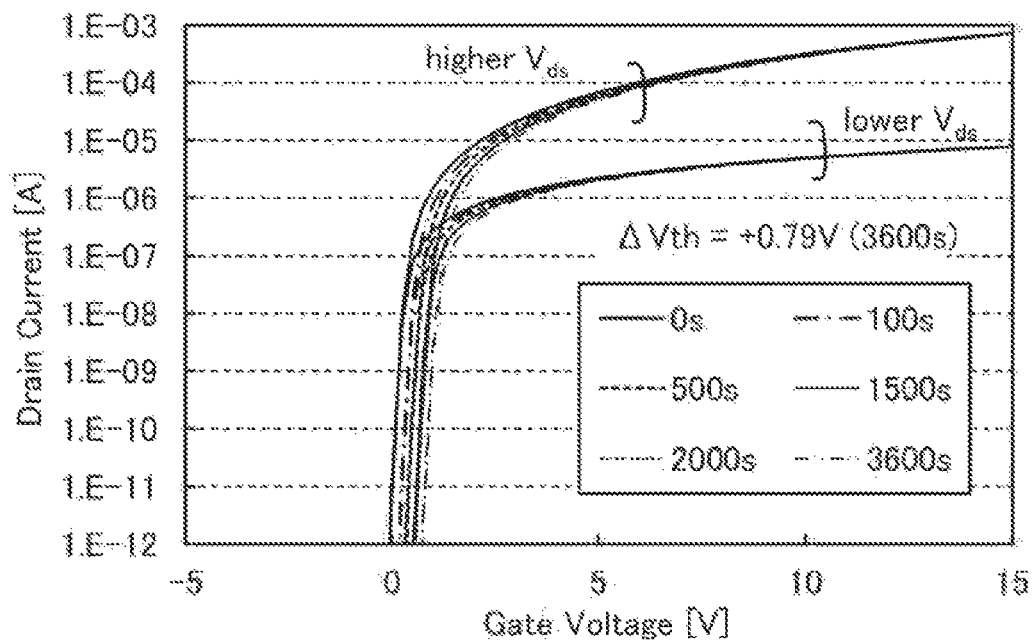
FIGS. 45A and 45B each show $I_{ds}$–$V_{gs}$ characteristics of transistors.
Figure 45B:
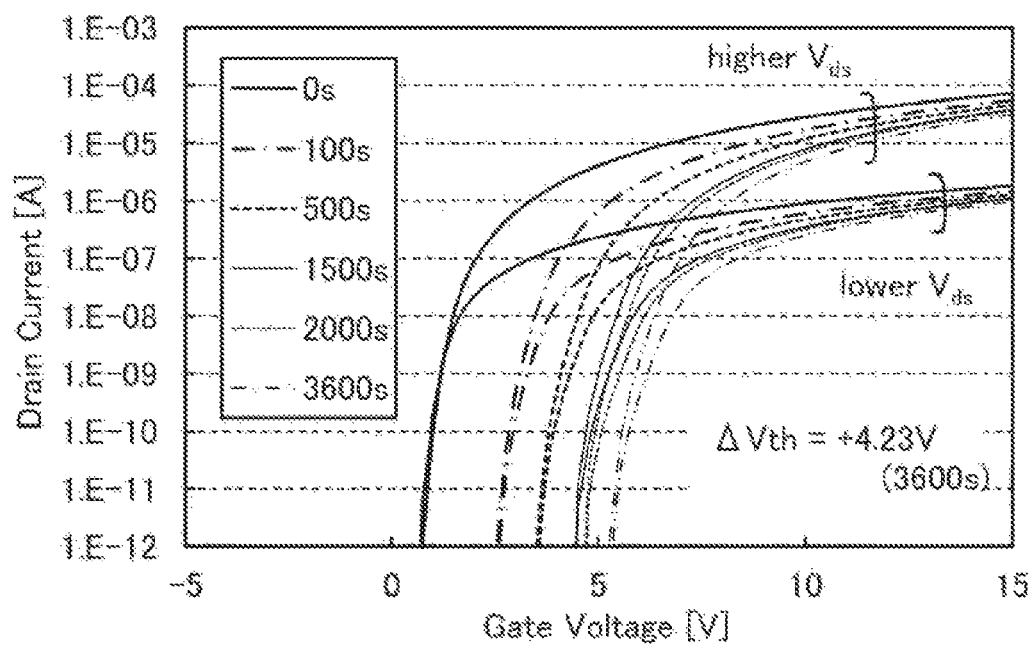

Next, as stress, the temperature of 60° C. and $V_{gs}$ of 30 V was applied for one hour to the transistors of Sample C-1 and Sample C-2 which were fabricated. The transistors, each of which had a channel length L of 3 μm and a channel width W of 50 μm, were evaluated. FIGS. 45A and 45B each show the $I_{ds}$-$V_{gs}$ characteristics of the transistors before the stress application and after a lapse of 100 seconds, 500 seconds, 1500 seconds, 2000 seconds, and one hour (3600 seconds). FIGS. 45A and 45B show the results of the transistors of Sample C-1 and Sample C-2, respectively. For Sample C-1, the $I_{ds}$-$V_{gs}$ characteristics were measured under two conditions of $V_{ds}$ of 0.1 V and 10 V, whereas for Sample C-2, the $I_{ds}$-$V_{gs}$ characteristics were measured under two conditions of $V_{ds}$ of 0.1 V and 5 V. Here, $V_{gs}$ was applied to the conductor 104 and the conductor 105 so that the conductor 104 and the conductor 105 had the same potentials. The amount of change in threshold value ($\Delta V_{th}$) after one hour was 0.79 V in the transistor in Sample C-1, whereas the amount of change in threshold value ($\Delta V_{th}$) after one hour was 4.23 V in the transistor in Sample C-2.

Figure 46:
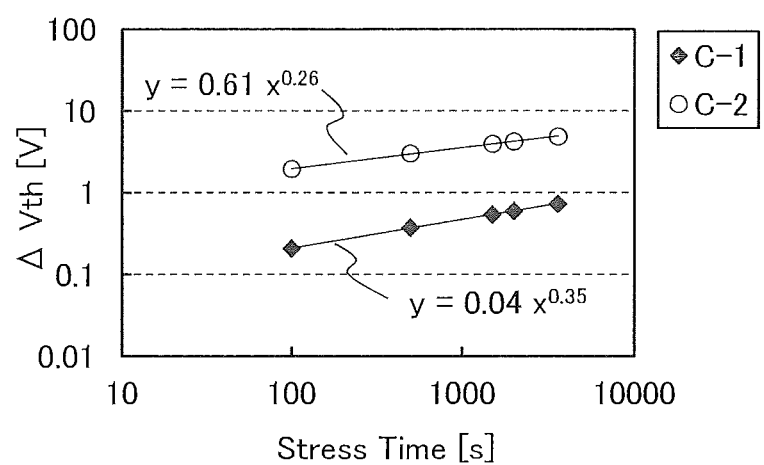
FIG. 46 shows the relationship between stress time and a change in threshold value.

In FIG. 46, stress applied time is plotted on the horizontal axis, and A $V_{th}$ is plotted on the vertical axis. Here, the results obtained from FIG. 46 were approximated by Formula 2 shown in Embodiment 1 to obtain α and β. For Sample C-1, α was 0.04 and β was 0.35, whereas for Sample C-2, α was 0.61 and β was 0.26.

For Sample C-1, α was small. This is presumably because the conduction band minimum of the layer 108_2 used in Sample C-1 is lower and the energy gap of the layer 108_2 is smaller than those of the layer 108_2 used in Sample C-2, for example.

EXAMPLE 4

In this example, results of measuring temperature dependence of the Hall mobility of an oxide semiconductor will be shown.

<Fabrication of Sample>

A sample for the evaluation was fabricated. First, a 100-nm-thick silicon nitride film was formed over a glass substrate and then a 150-nm-thick silicon oxynitride film was formed thereover. The silicon oxynitride film was formed by a PECVD method using a silane gas and a nitrous oxide gas.

Next, the conductor 104 functioning as a first gate electrode was formed by forming and patterning a tungsten film. Note that a region where the conductor 104 was not formed was used to measure the Hall mobility. After that, a 200-nm-thick silicon oxynitride film was formed as the insulator 106b by a PECVD method under the conditions where the gas flow rates of silane and nitrous oxide were 20 sccm and 3000 sccm, respectively, the substrate temperature was 350° C., the power was 100 W, and the pressure was 40 Pa.

Next, the oxide semiconductor 108a was formed. As the oxide semiconductor 108a, a 100-nm-thick In—Ga—Zn oxide film was formed by a sputtering method. An In—Ga—Zn oxide target with an atomic ratio of In:Ga:Zn=1:1:1 was used. For the formation conditions, argon and oxygen were used as a gas, the proportion of oxygen to the whole gas was 10%, the pressure was controlled to 0.7 Pa, the substrate temperature was 100° C., and a power of 5 kW was applied from a DC power source.

Then, heat treatment at 350° C. in a nitrogen atmosphere for one hour and heat treatment at 350° C. in an oxygen gas atmosphere for one hour were successively performed.

Next, a 50-nm-thick tungsten film, a 400-nm-thick aluminum film, and a 100-nm-thick titanium film were formed in this order and then patterned to form electrodes such as the conductors 112a and 112b.

Next, heat treatment was performed at 300° C. in an oxygen atmosphere for one hour. After that, a 400-nm-thick silicon oxide film was formed by a sputtering method.

Next, heat treatment was performed at 350° C. in an oxygen atmosphere for one hour. After that, heat treatment was performed at 250° C. in a nitrogen atmosphere for one hour.

Through the above processes, the sample for measuring the effect was fabricated.

<Measurement of Sample>

Hall effect measurement of the fabricated sample was performed to measure the Hall mobility. Note that ResiTest8300 series manufactured by TOYO Corporation was used for the Hall effect measurement.

Figure 50:
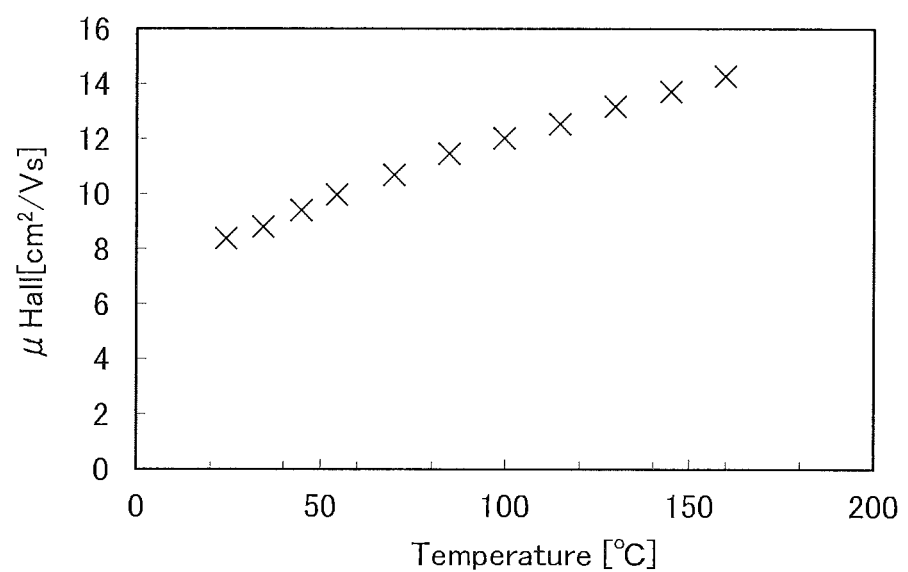
FIG. 50 shows temperature dependence of electron mobility of an oxide semiconductor.

FIG. 50 shows temperature dependence of the Hall mobility of electrons obtained by the Hall effect measurement. The horizontal axis indicates measurement temperature, and the vertical axis indicates the Hall mobility. The Hall mobility tends to increase as the temperature rises, which indicates that the effect of phonon scattering on the movement of electrons is not dominant in the In—Ga—Zn oxide film.

EXAMPLE 5

In some cases, the composition, impurity concentration, and crystallinity are changed by irradiating an oxide semiconductor with a laser beam. Examples of such an oxide semiconductor will be shown below.

As a sample for evaluation, Sample A was fabricated as a metal oxide film to a thickness of 35 nm using an In—Ga—Zn oxide target with an atomic ratio of In:Ga:Zn=1:1:1 over a quartz substrate, and was irradiated with a laser beam.

Sample A was formed under the conditions where a sputtering target with an atomic ratio of In:Ga:Zn=1:1:1 was used, argon and oxygen were supplied to a treatment chamber of a sputtering apparatus as a sputtering gas at gas flow rates of 30 sccm and 15 sccm, respectively, the pressure in the treatment chamber was controlled to 0.4 Pa, and a DC power of 0.5 kW was supplied. Note that the substrate temperature in the deposition of the In—Ga—Zn oxide film was set at room temperature (25° C.).

For laser treatment, an XeCl excimer laser (Lambda STEEL 2000) with a wavelength λ of 308 nm and a pulse width of 25 nsec (full width at half maximum) was used. The laser beam was made in a linear shape, and the substrate was scanned in a direction perpendicular to the longitudinal axis of the linear beam while being sprayed with $N_2$ at the room temperature (25° C.) so that Sample A was irradiated with the linear laser beam. The scanning was performed at 1 mm/sec under such conditions that the beam width of the linear beam was about 320 μm and the repetition rate was 30 Hz; the number of shots of the laser beam with which one portion was irradiated was about 10. The conditions for laser energy density were as follows: the laser beam was not delivered and the laser beams were delivered with laser energy densities of 200 mJ/cm$^2$, 290 mJ/cm$^2$, 392 mJ/cm$^2$, and 445 mJ/cm$^2$.

Next, the crystallinity of the sample was evaluated by an out-of-plane method using XRD.

FIG. 50 shows laser energy density dependence of XRD patterns obtained by an out-of-plane method.

Figure 51A:
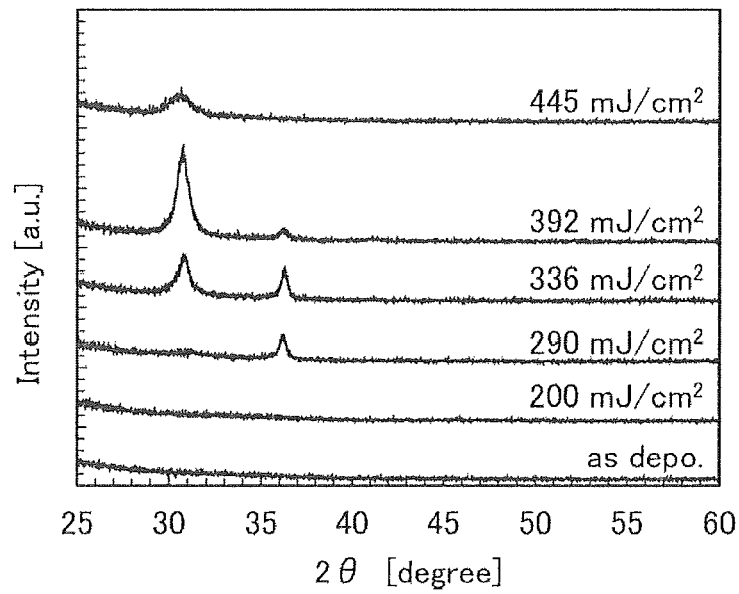
FIGS. 51A and 51B show measurement results by X-ray diffraction.
Figure 51B:
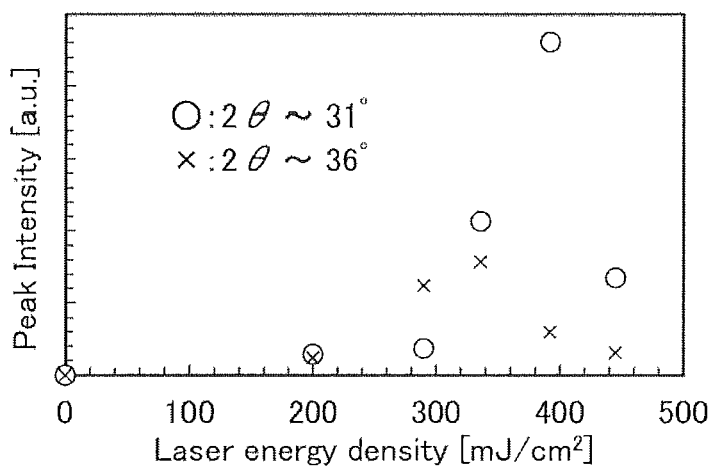
Figure 52A:
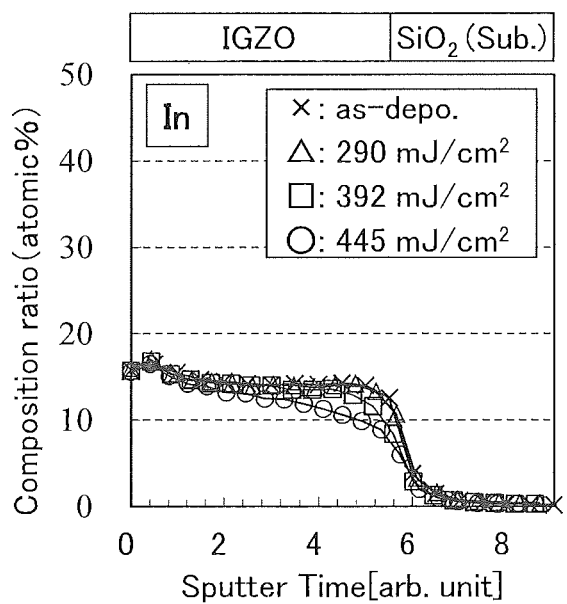
FIGS. 52A and 52B show XPS analysis results.
Figure 52B:
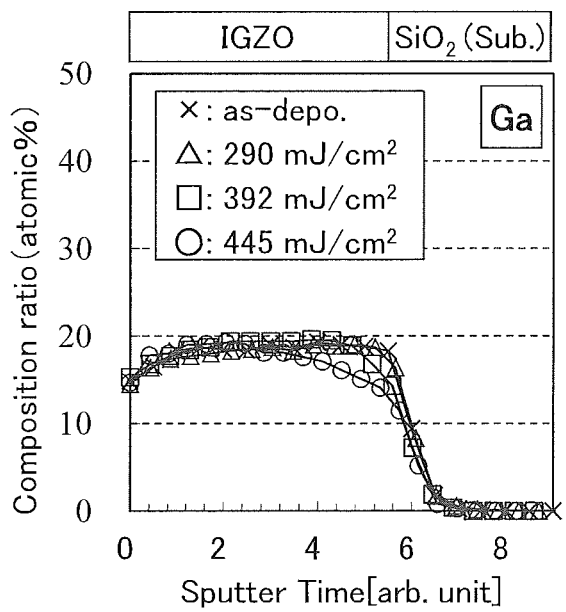
Figure 53A:
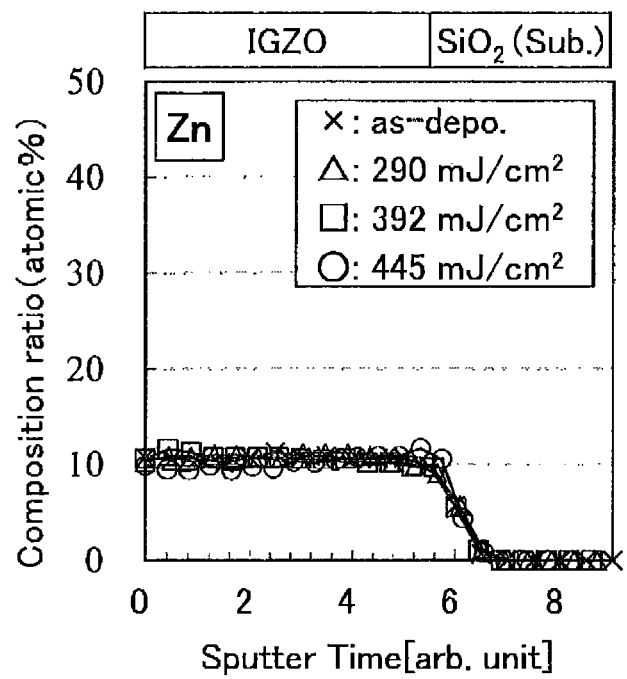
FIGS. 53A and 53B show XPS analysis results.
Figure 53B:
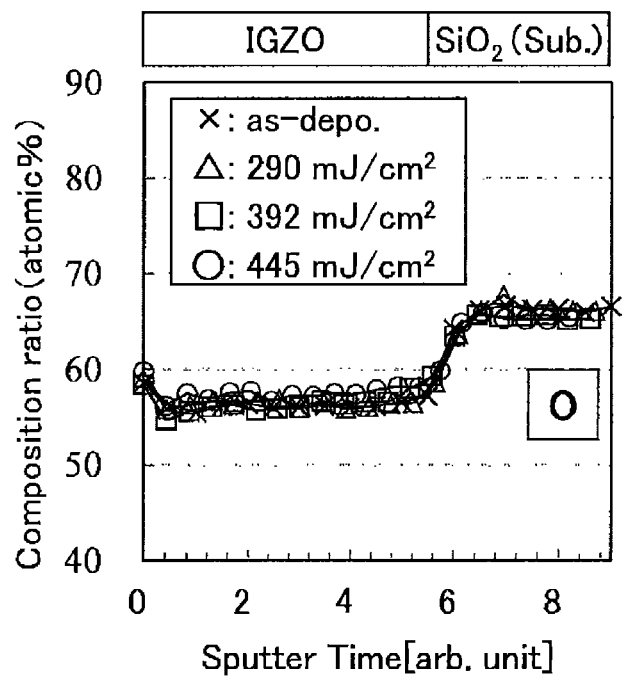
Figure 54:
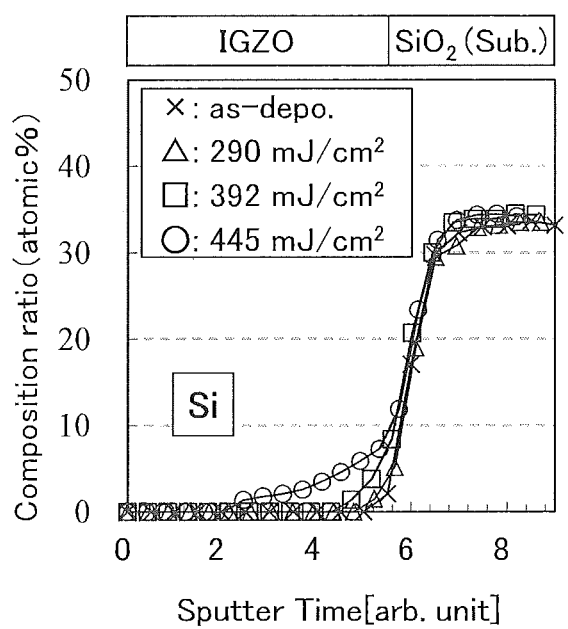
FIG. 54 shows XPS analysis results.

As shown in FIGS. 51A and 51B, peaks appeared at 2θ around 31° and 36° in Sample A when the laser energy density was higher than or equal to 290 mJ/cm$^2$. The peak appeared at 2θ around 31° with a laser energy density of 445 mJ/cm$^2$ tends to be lower than that with a laser energy density of 392 mJ/cm$^2$, and almost no peak appeared at 2θ around 36° with a laser energy density of 445 mJ/cm$^2$.

The sample was measured by X-ray photoelectron spectroscopy (XPS). Specifically, the composition ratios of indium, gallium, zinc, oxygen, and silicon with respect to the depth of Sample A were obtained.

FIGS. 52A and 52B, FIGS. 53A and 53B, and FIG. 54 show analysis results of XPS. In each of FIGS. 52A and 52B, FIGS. 53A and 53B, and FIG. 54, the horizontal axis indicates the sputtering time (min), and the vertical axis indicates the composition ratios (atomic %). FIG. 52A, FIG. 52B, FIG. 53A, FIG. 53B, and FIG. 54 show the results of indium, gallium, zinc, oxygen, and silicon, respectively.

The composition when the laser energy density was 445 mJ/cm$^2$ tends to change gradually. There is a possibility that this is due to the effect of the film surface, which has become rougher, for example. Alternatively, there is a possibility that part of the substrate and part of the metal oxide film are mixed.

Next, Sample A was analyzed in the depth direction by SIMS.

Figure 55:
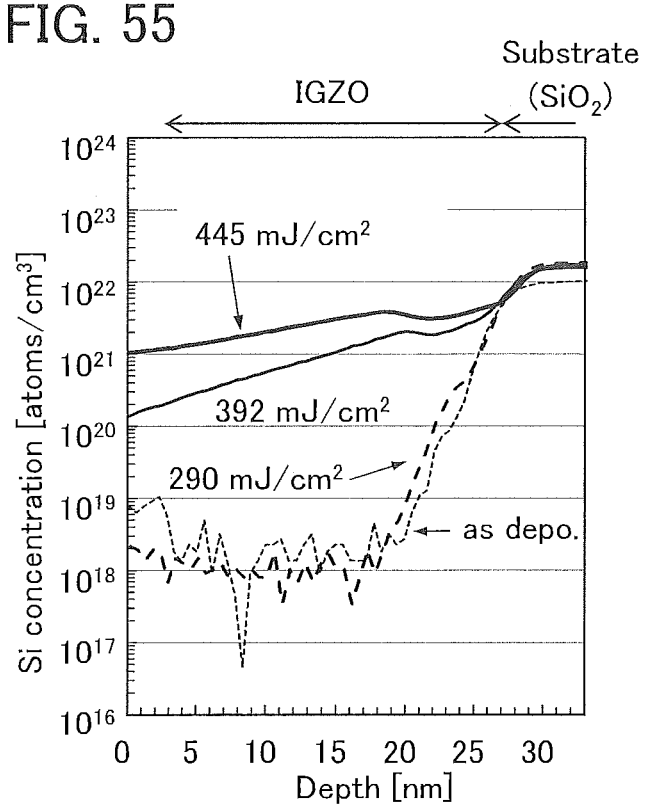
FIG. 55 shows SIMS analysis results.

FIG. 55 shows the results of the concentration distribution of silicon in the depth direction measured by SIMS under the conditions where the laser beam was not delivered and the laser beams were delivered with laser energy densities of 290 mJ/cm$^2$, 392 mJ/cm$^2$, and 445 mJ/cm$^2$.

The concentration of silicon was higher than or equal to $1 \times 10^{20}$ atoms/cm$^3$ with a laser energy density of 392 mJ/cm$^2$, and higher than or equal to $1 \times 10^{21}$ atoms/cm$^3$ with a laser energy density of 445 mJ/cm$^2$. It was found that under the conditions where the laser beam was not delivered and the laser beam was delivered with a laser energy density of 290 mJ/cm$^2$, the concentration of silicon was able to be kept $1 \times 10^{19}$ atoms/cm$^3$ or lower in most of the regions.

The sample was evaluated by TEM observation and electron di action.

Figure 56A:
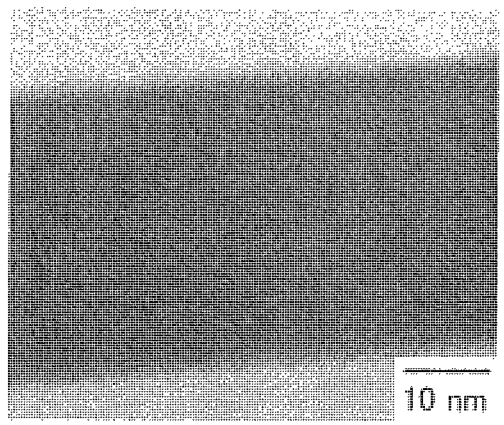
FIGS. 56A to 56D show the results of cross-sectional TEM observation.
Figure 56B:
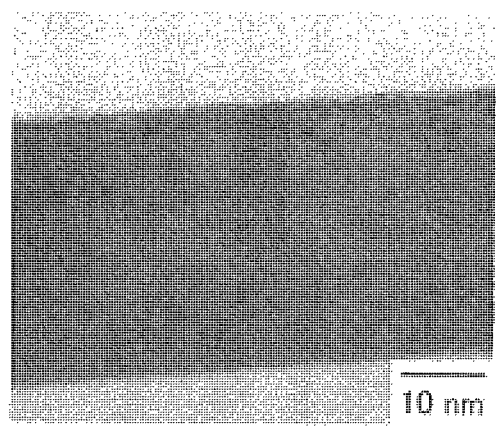
Figure 56C:
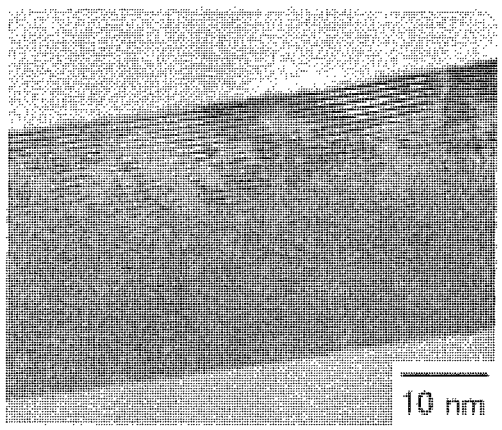
Figure 56D:
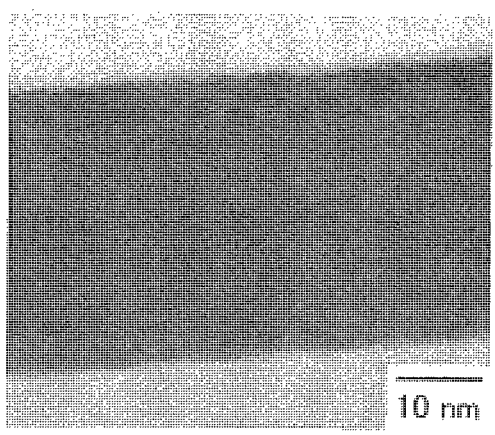

FIGS. 56A to 56D show the results of cross-sectional TEM observation. The cross-sectional TEM observation was performed with H-9000NAR manufactured by Hitachi High-Technologies Corporation. FIG. 56A shows the state where the laser beam was not delivered, and FIGS. 56B, 56C, and 56D show the states where the laser beams were delivered with laser energy densities of 290 mJ/cm$^2$, 392 mJ/cm$^2$, and 445 mJ/cm$^2$, respectively. Lattice fringes can be observed as the laser energy density gets higher, which suggests crystallization by laser irradiation. However, as indicated from the results of XRD, the lattice fringes observed when the laser energy density was 445 mJ/cm$^2$ tend to be vaguer than those observed when the laser energy density was 392 mJ/cm$^2$.

Figure 57A:
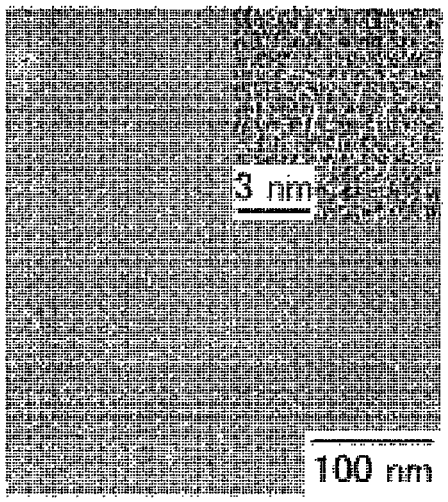
FIGS. 57A to 57D show the results of plan-view TEM observation.
Figure 57B:
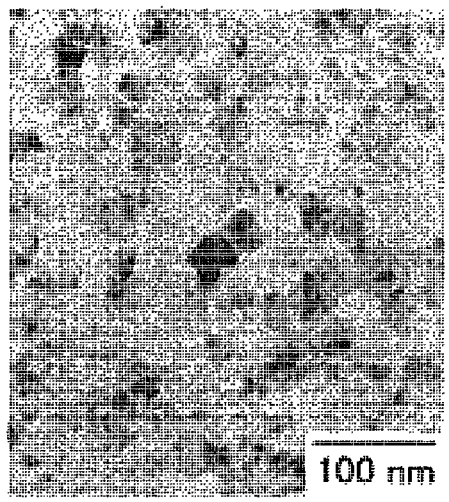
Figure 57C:
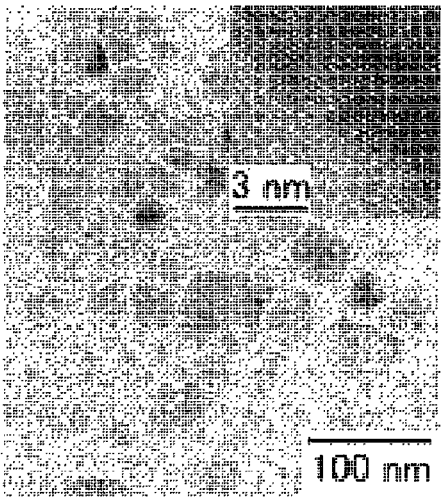
Figure 57D:
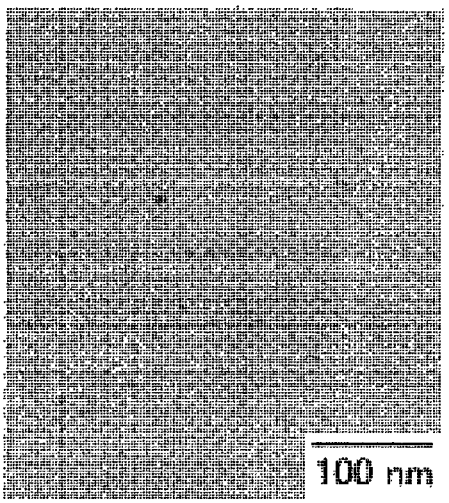

Next, FIGS. 57A to 57D show the results of plan-view TEM observation. FIG. 57A shows the state where the laser beam was not delivered, and FIGS. 57B, 57C, and 57D show the states where the laser beams were delivered with laser energy densities of 290 mJ/cm$^2$, 392 mJ/cm$^2$, and 445 mJ/cm$^2$, respectively. Crystal grains can be observed more clearly as the laser energy density gets higher, which suggests crystallization by laser irradiation. However, as indicated from the results of XRD and the cross-sectional TEM observation, the crystal grains when the laser energy density was 445 mJ/cm$^2$ cannot be observed as clearly as those when the laser energy density was 392 mJ/cm$^2$.

Figure 58:
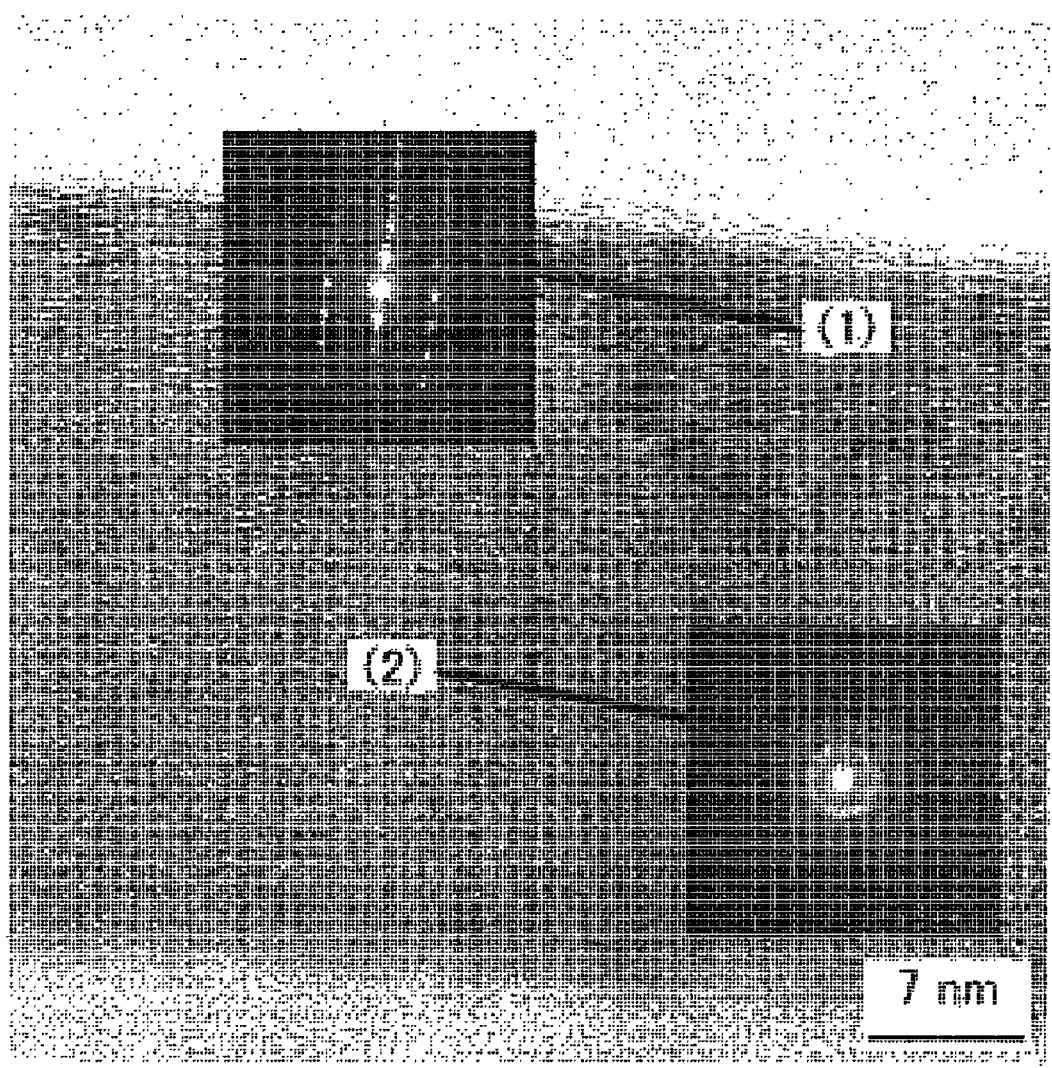
FIG. 58 shows the result of electron diffraction observation.

FIG. 58 shows the result of electron diffraction observation of the cross section of the metal oxide film when the laser energy density was 392 mJ/cm$^2$. The electron diffraction was performed with HF-2000 manufactured by Hitachi High-Technologies Corporation. The electron-beam diameter was approximately 1 nmϕ. In a region (1) where lattice fringes are observed, the result corresponding to JCPDS card No. 38-1114 was obtained. In a region (2) in the vicinity of the center in the thickness direction, a plurality of bright spots arranged in a ring pattern, which indicate the crystal structure of a nanocrystal (nc), are observed.

This application is based on Japanese Patent Application serial no. 2015-242567 filed with Japan Patent Office on Dec. 11, 2015, Japanese Patent Application serial no. 2016-101521 filed with Japan Patent Office on May 20, 2016, and Japanese Patent Application serial no. 2016-161264 filed with Japan Patent Office on Aug. 19, 2016, the entire contents of which are hereby incorporated by reference.

What is claimed is:
1. A transistor comprising:
an oxide semiconductor;
a gate insulator; and
a gate electrode,
wherein a channel region is formed in the oxide semiconductor,
wherein the channel region contains indium, an element M and zinc,
wherein the element M is one or more selected from aluminum, gallium, yttrium, tin, boron, silicon, titanium, iron, nickel, germanium, zirconium, molybdenum, lanthanum, cerium, neodymium, hafnium, tantalum, tungsten, and magnesium,
wherein the gate insulator contains silicon and oxygen,
wherein in the gate insulator, the number of oxygen atoms is 1.5 times or more as large as the number of silicon atoms,
wherein the carrier density of the channel region is higher than or equal to 1×10$^9$ cm$^{-3}$ and lower than or equal to 5×10$^{16}$ cm$^{-3}$,
wherein the energy gap of the channel region is higher than or equal to 2.7 eV and lower than or equal to 3.1 eV,
wherein the gate insulator has a defect state, and
wherein an energy difference between the defect state and the conduction band minimum of the channel region is 0.2 eV or more and 1.0 eV or less.

2. The transistor according to claim 1,
wherein the gate insulator is in contact with either an upper surface or a lower surface of the first region,
wherein the atomic proportions of the indium, the element M and the zinc are expressed by x, y, and z, respectively,
wherein x/(x+y+z) is greater than or equal to 0.33 and less than or equal to 0.7, and
wherein y/(x+y+z) is greater than or equal to 0.08 and less than or equal to 0.33.

3. The transistor according to claim 1,
wherein a channel length of the transistor is greater than or equal to 0.01 μm and less than or equal to 15 μm in a region, and
wherein a threshold value when a potential difference of 0.1 V or more and 30 V or less is applied between a drain and a source of the transistor is greater than or equal to −0.5 V and less than or equal to 2 V.

4. The transistor according to claim 3, wherein the gate insulator comprises a region having a thickness greater than or equal to 5 nm and less than or equal to 200 nm.

5. A circuit comprising the transistor according to claim 1, wherein voltage higher than or equal to −1 V and lower than or equal to 20 V is applied between the source and the gate electrode of the transistor.

6. A semiconductor device comprising the circuit according to claim 5.

7. An electronic device comprising the semiconductor device according to claim 6.

8. A display device comprising the electronic device according to claim 7.

9. A display device comprising the circuit according to claim 5, wherein the circuit is a gate driver of the display device.

10. The display device according to claim 8, comprising any one or more of a touch sensor, a speaker, and an imaging device.

11. An electronic device comprising the display device according to claim 8.

12. A transistor comprising:
a first oxide semiconductor;
a second oxide semiconductor;
a gate insulator; and
a gate electrode,
wherein the first oxide semiconductor comprises a first region,
wherein the second oxide semiconductor comprises a second region in contact with the first oxide semiconductor,
wherein the gate insulator comprises a region in contact with the second region,
wherein a channel region is formed in the first region,
wherein the first region and the second region contain indium, an element M, and zinc,
wherein the element M is one or more selected from aluminum, gallium, yttrium, tin, boron, silicon, titanium, iron, nickel, germanium, zirconium, molybdenum, lanthanum, cerium, neodymium, hafnium, tantalum, tungsten, and magnesium, wherein the gate insulator contains silicon and oxygen, wherein in the gate insulator, the number of oxygen atoms is 1.5 times or more as large as the number of silicon atoms, wherein the carrier density of the first region is higher than or equal to $1\times10^9$ cm$^{-3}$ and lower than or equal to $5\times10^{16}$ cm$^{-3}$, wherein the energy gap of the first region is higher than or equal to 2.7 eV and lower than or equal to 3.1 eV, and wherein the energy gap of the second region is larger than the energy gap of the first region by 0.15 eV or more and 2 eV or less.

13. The transistor according to claim 12, wherein the atomic proportions of the indium, the element M, and the zinc contained in the first region are expressed by x1, y1, and z1, respectively, wherein x1/(x1+y1+z1) is greater than or equal to 0.33 and less than or equal to 0.7, and wherein y1/(x1+y1+z1) is greater than or equal to 0.08 and less than or equal to 0.33.

14. The transistor according to claim 12, wherein the gate insulator has a trap state, wherein an energy difference between the trap state and the conduction band minimum of the first region is 0.2 eV or more and 1.0 eV or less, and wherein an energy difference between the trap state and the conduction band minimum of the second region is −0.2 eV or more and 0.8 eV or less.

15. The transistor according to claim 12, wherein a thickness of the second region is greater than or equal to 1 nm and less than or equal to 20 nm.

16. The transistor according to claim 12, wherein a channel length of the transistor is greater than or equal to 0.01 μm and less than or equal to 15 μm in a region, and wherein a threshold value when a potential difference of 0.1 V or more and 30 V or less is applied between a drain and a source of the transistor is greater than or equal to −0.5 V and less than or equal to 2 V.

17. The transistor according to claim 16, wherein the gate insulator comprises a region having a thickness greater than or equal to 5 nm and less than or equal to 200 nm.

18. A circuit comprising the transistor according to claim 12, wherein voltage higher than equal to −1 V and lower than or equal to 20 V is applied between the source and the gate electrode of the transistor.

19. A semiconductor device comprising the circuit according to claim 18.

20. An electronic device comprising the semiconductor device according to claim 19.

21. A display device comprising the electronic device according to claim 20.

22. A display device comprising the circuit according to claim 18, wherein the circuit is a gate driver of the display device.

23. The display device according to claim 21, comprising any one or more of a touch sensor, a speaker, and an imaging device.

24. An electronic device comprising the display device according to claim 21.

* * * * *